(12) United States Patent
Takahashi

(10) Patent No.: US 12,113,533 B2
(45) Date of Patent: *Oct. 8, 2024

(54) SEMICONDUCTOR DEVICE

(71) Applicant: ROHM CO., LTD., Kyoto (JP)

(72) Inventor: Naoki Takahashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/448,285

(22) Filed: Aug. 11, 2023

(65) Prior Publication Data

US 2023/0387888 A1 Nov. 30, 2023

Related U.S. Application Data

(63) Continuation of application No. 17/612,364, filed as application No. PCT/JP2020/022083 on Jun. 4, 2020, now Pat. No. 11,764,758.

(30) Foreign Application Priority Data

Jun. 6, 2019 (JP) ................. 2019-106417

(51) Int. Cl.
*H03K 3/011* (2006.01)
*H01L 29/40* (2006.01)
(Continued)

(52) U.S. Cl.
CPC ............ *H03K 3/011* (2013.01); *H01L 29/407* (2013.01); *H01L 29/7813* (2013.01); *H01L 29/7815* (2013.01); *H03K 17/6871* (2013.01)

(58) Field of Classification Search
CPC .. H03K 3/011; H03K 17/6871; H01L 29/407; H01L 29/7815
See application file for complete search history.

(56) References Cited

U.S. PATENT DOCUMENTS

| 11,764,758 B2 * | 9/2023 | Takahashi ........... H01L 29/7815 |
| | | 327/109 |
| 2015/0091082 A1 | 4/2015 | Tanaka et al. |

(Continued)

FOREIGN PATENT DOCUMENTS

| JP | 2015070193 | 4/2015 |
| JP | 2017073872 | 4/2017 |

(Continued)

OTHER PUBLICATIONS

International Search Report in International Appln. No. PCT/JP2020/022083, dated Aug. 25, 2020, 4 pages (with English Translation).

*Primary Examiner* — Metasebia T Retebo
(74) *Attorney, Agent, or Firm* — Fish & Richardson P.C.

(57) ABSTRACT

A semiconductor device includes first and second insulated-gate transistors in parallel with each other, a charger-discharger, and a gate voltage correction circuit. The charger-discharger can perform first control to charge both of the gates of the first and second transistors, second control to discharge both of the gates of the first and second transistors, and third control to charge one of the gates of the first and second transistors. The gate voltage correction circuit corrects the gate voltages of the first and second transistors to eliminate the difference between those voltages in at least one of the first control, the second control, and protection operation in which the first and second transistors are forcibly kept off.

10 Claims, 66 Drawing Sheets

(51) Int. Cl.
 *H01L 29/78* (2006.01)
 *H03K 17/687* (2006.01)

(56) References Cited

U.S. PATENT DOCUMENTS

| | | |
|---|---|---|
| 2018/0048140 A1 | 2/2018 | Takuma et al. |
| 2019/0260371 A1 | 8/2019 | Wada et al. |
| 2022/0247387 A1 | 8/2022 | Takahashi |

FOREIGN PATENT DOCUMENTS

| | | |
|---|---|---|
| JP | 2017077138 | 4/2017 |
| JP | 2018037932 | 3/2018 |
| JP | 2019037079 | 3/2019 |
| JP | 2019080436 | 5/2019 |

* cited by examiner

SEMICONDUCTOR DEVICE

CROSS-REFERENCE TO RELATED APPLICATIONS

This application is a continuation of U.S. application Ser. No. 17/612,364, filed Nov. 18, 2021, which is a U.S. National Phase application under 35 U.S.C. § 371 of International Patent Application No. PCT/JP2020/022083, filed on Jun. 4, 2020, which claims the priority of Japanese Patent Application No. 2019-106417, filed on Jun. 6, 2019, the disclosure of which is incorporated herein by reference in its entirety.

TECHNICAL FIELD

The present invention relates to a semiconductor device having an insulation gate-type transistor (insulated-gate transistor).

BACKGROUND ART

A patent literature 1 discloses a planar gate-type semiconductor device as an example of a semiconductor device having an insulation gate-type transistor. This semiconductor device includes a semiconductor layer having a main surface, a gate insulation layer formed on the main surface, a gate electrode formed on the gate insulation layer, and a channel facing the gate electrode across the gate insulation layer at a surface layer portion of the semiconductor layer.

CITATION LIST

Patent Literature

Patent Literature 1: Japanese Patent Application Publication No. 2015-70193

SUMMARY OF THE INVENTION

Technical Problem

A semiconductor device having an insulation gate-type transistor is sometimes connected to an inductive load as an example of a manner of use. In this case, as electrical characteristics, an excellent ON resistance and an excellent active clamp capability are required. The ON resistance is a resistance value of the semiconductor device in normal operation. The active clamp capability is a capability of the transistor in active clamp operation.

More specifically, the active clamp capability is a capability of the transistor with respect to a counter electromotive force caused by energy accumulated in the inductive load in transition when the transistor is switched from an ON state to an OFF state. The active clamp operation is a transistor operation when the counter electromotive force is consumed (absorbed) by the transistor.

The ON resistance and the active clamp capability are adjusted by an area of channel of the transistor as an example. When the area of channel is increased, a current path can be increased in the normal operation, so that the ON resistance can be reduced. However, in this case, the active clamp capability is reduced by a sharp temperature rise due to the counter electromotive force in the active clamp operation.

In contrast thereto, in a case in which the area of channel is reduced, the current path is reduced in the normal operation, so that the ON resistance is increased. However, in this case, since the sharp temperature rise due to the counter electromotive force can be suppressed in the active clamp operation, the active clamp capability can be improved. As described above, the adjustment method based on the area of channel has a trade-off relationship and therefore there is a difficulty in realizing an excellent ON resistance and an excellent active clamp capability at the same time.

Even if an excellent ON resistance and an excellent active clamp capability are realized at the same time, increased variations in the characteristics of a semiconductor device are undesirable.

A preferred embodiment of the present invention provides a semiconductor device capable of realizing an excellent ON resistance and an excellent active clamp capability at the same time and in addition capable of suppressing variations in characteristics.

Solution to Problem

A preferred embodiment of the present invention provides a semiconductor device including a semiconductor layer, an insulation gate-type first transistor which is formed in the semiconductor layer, an insulation gate-type second transistor which is formed in the semiconductor layer, and a control wiring which is formed on the semiconductor layer such as to be electrically connected to the first transistor and the second transistor, and transmits control signals that control the first transistor and the second transistor to be in ON states in normal operation and that control the first transistor to be in an OFF state and the second transistor to be in an ON state in active clamp operation.

According to the semiconductor device, in the normal operation, a current is allowed to flow by using the first transistor and the second transistor. Thereby, it is possible to reduce an ON resistance. On the other hand, in the active clamp operation, a current is allowed to flow by using the second transistor in a state where the first transistor is stopped. Thereby, it is possible to consume (absorb) a counter electromotive force by the second transistor while suppressing a sharp temperature rise due to the counter electromotive force. As a result, it is possible to improve an active clamp capability. Therefore, it is possible to realize an excellent ON resistance and an excellent active clamp capability at the same time.

A preferred embodiment of the present invention provides a semiconductor device including a semiconductor layer, an insulation gate-type first transistor which is formed in the semiconductor layer, an insulation gate-type second transistor which is formed in the semiconductor layer, and a control circuit which is formed in the semiconductor layer such as to be electrically connected to the first transistor and the second transistor, controls the first transistor and the second transistor to be in ON states in normal operation, and controls the first transistor to be in an OFF state and the second transistor to be in an ON state in active clamp operation.

According to the semiconductor device, in the normal operation, a current is allowed to flow by using the first transistor and the second transistor. Thereby, it is possible to reduce an ON resistance. On the other hand, in the active clamp operation, in a state where the first transistor is stopped, a current is allowed to flow by using the second transistor. Thereby, it is possible to consume (absorb) a counter electromotive force by the second transistor while suppressing a sharp temperature rise due to the counter electromotive force. As a result, it is possible to improve an active clamp capability. Therefore, it is possible to realize an excellent ON resistance and an excellent active clamp capability at the same time.

A preferred embodiment of the present invention provides a semiconductor device including a semiconductor layer, an insulation gate-type first transistor which includes a first channel and is formed in the semiconductor layer, an insulation gate-type second transistor which includes a second channel and is formed in the semiconductor layer, and a control wiring which is formed on the semiconductor layer such as to be electrically connected to the first transistor and the second transistor, and transmits control signals that control the first transistor and the second transistor such that utilization rates of the first channel and the second channel in active clamp operation becomes in excess of zero and less than utilization rates of the first channel and the second channel in normal operation.

According to the semiconductor device, in the normal operation, the utilization rates of the first channel and the second channel are relatively increased. Thereby, a current path is relatively increased, and it becomes possible to reduce an ON resistance. On the other hand, in the active clamp operation, the utilization rates of the first channel and the second channel are relatively reduced. Thereby, it is possible to suppress a sharp temperature rise due to the counter electromotive force and therefore it is possible to improve an active clamp capability. Therefore, it is possible to realize an excellent ON resistance and an excellent active clamp capability at the same time.

A preferred embodiment of the present invention provides a semiconductor device including a semiconductor layer, an insulation gate-type first transistor which includes a first channel and is formed in the semiconductor layer, an insulation gate-type second transistor which includes a second channel and is formed in the semiconductor layer, and a control circuit which is formed in the semiconductor layer such as to be electrically connected to the first transistor and the second transistor, and controls the first transistor and the second transistor such that utilization rates of the first channel and the second channel in active clamp operation becomes in excess of zero and less than utilization rates of the first channel and the second channel in normal operation.

According to the semiconductor device, in the normal operation, the utilization rates of the first channel and the second channel are relatively increased. Thereby, a current path is relatively increased, and it becomes possible to reduce an ON resistance. On the other hand, in the active clamp operation, the utilization rates of the first channel and the second channel are relatively reduced. Thereby, it is possible to suppress a sharp temperature rise due to the counter electromotive force and therefore it is possible to improve an active clamp capability. Therefore, it is possible to realize an excellent ON resistance and an excellent active clamp capability at the same time.

A preferred embodiment of the present invention provides a semiconductor device including: a first transistor and a second transistor connected in parallel with each other; an active clamp circuit connected to the gate of the first transistor; and a gate control circuit that controls the respective gates of the first and second transistors so as to keep the first and second transistors on in a first operation state and keep the first and second transistors off in a second operation state. The gate control circuit short-circuits between the gate and source of the second transistor after a transition from the first operation state to the second operation state, before the active clamp circuit operates.

With this semiconductor device, it is possible to obtain an enhanced active clamp capability with a simple circuit configuration. It is thus possible to achieve an excellent ON resistance and an excellent active clamp capability at the same time.

A preferred embodiment of the present invention provides a semiconductor device including: a first transistor of an insulated gate type and a second transistor of an insulated gate type, the first and second transistors being connected in parallel with each other; a charger-discharger; and a gate voltage correction circuit. The charger-discharger is configured to be capable of performing first control in which the charger-discharger charges both of the respective gates of the first and second transistors, second control in which the charger-discharger discharges both of the respective gates of the first and second transistors, and third control in which the charger-discharger discharges only one of the respective gates of the first and second transistors. The gate voltage correction circuit is configured to correct the respective gate voltages of the first and second transistors so as to eliminate the difference between the respective gate voltages of the first and second transistors in at least one of the first control, the second control, and protection operation in which the first and second transistors are forcibly kept off.

With this semiconductor device, it is possible to achieve an excellent ON resistance and an excellent active clamp capability at the same time. Moreover, with this semiconductor device, the respective gate voltages of the first and second transistors are corrected so as to eliminate the difference between them in at least one of the first operation, the second operation, and the protection operation. This helps suppress variations in characteristics.

DETAILED DESCRIPTION OF PREFERRED EMBODIMENTS

Embodiments of the present invention will be described below with reference to the accompanying drawings.

Figure 1:
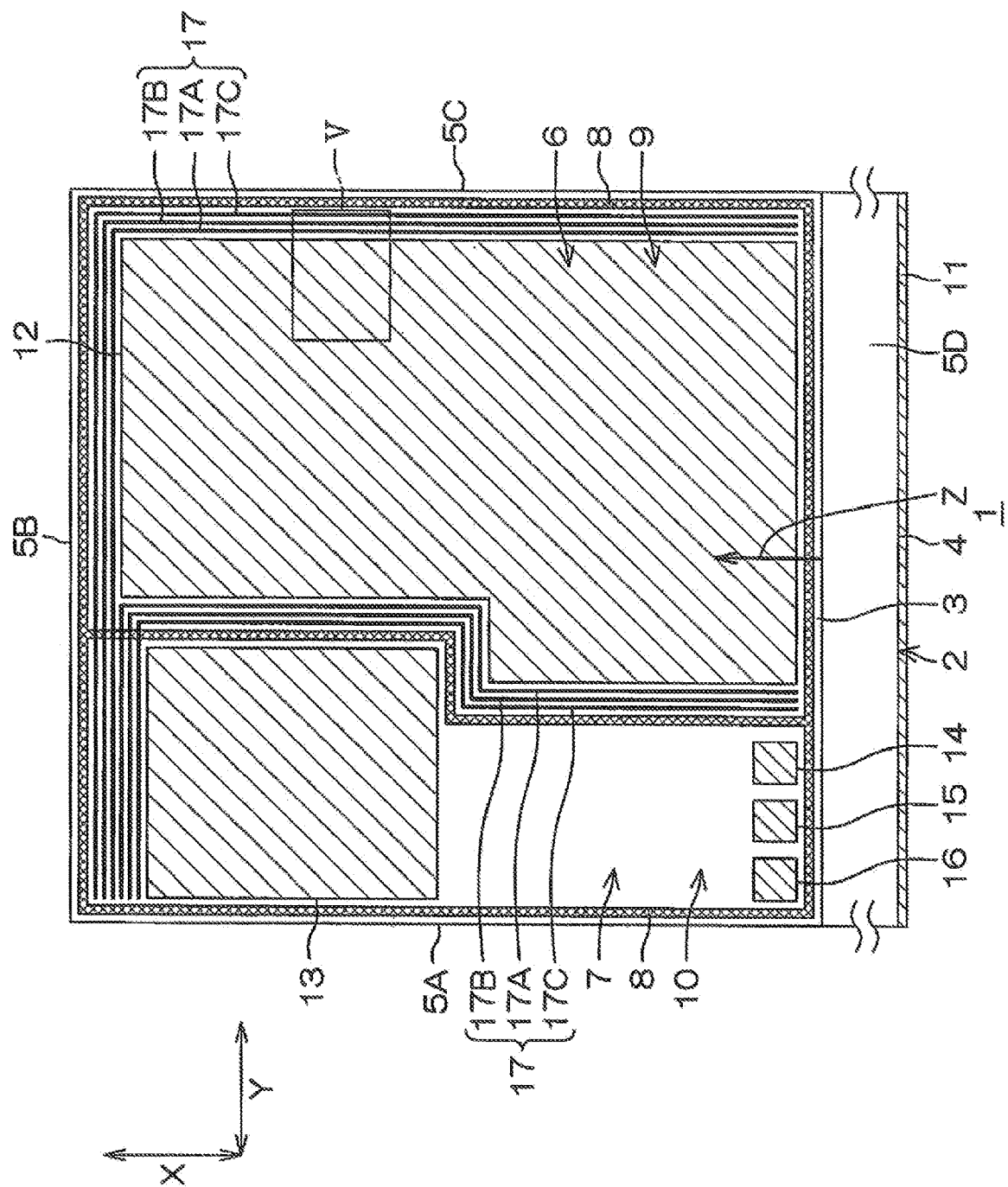
FIG. 1 is a perspective view of a semiconductor device according to a first preferred embodiment of the present invention which is viewed from one direction.

FIG. 1 is a perspective view of a semiconductor device 1 according to a first preferred embodiment of the present invention which is viewed from one direction. Hereinafter, a description will be given of a configuration example in which the semiconductor device 1 is a high-side switching device. However, the semiconductor device 1 is not restricted to the high-side switching device. The semiconductor device 1 can also be provided as a low-side switching device by adjusting electrical connection configurations and functions of various structures.

With reference to FIG. 1, the semiconductor device 1 includes a semiconductor layer 2. The semiconductor layer 2 includes silicon. The semiconductor layer 2 is formed in a rectangular parallelepiped chip shape. The semiconductor layer 2 has a first main surface 3 on one side, a second main surface 4 on the other side, and side surfaces 5A, 5B, 5C, and 5D connecting the first main surface 3 and the second main surface 4.

The first main surface 3 and the second main surface 4 are each formed in a rectangular shape in plan view when viewed from a normal direction Z thereof (hereinafter, simply referred to as "plan view"). The side surface 5A and the side surface 5C extend along a first direction X and face each other in a second direction Y which intersects the first direction X. The side surface 5B and the side surface 5D extend along the second direction Y and face each other in the first direction X. Specifically, the second direction Y is orthogonal to the first direction X.

An output region 6 and an input region 7 are defined in the semiconductor layer 2. The output region 6 is defined in a region at the side surface 5C side. The input region 7 is defined in a region at the side surface 5A side. In plan view, an area SOUT of the output region 6 is equal to or larger than an area SIN of the input region 7 (SIN≤SOUT).

A ratio SOUT/SIN of the area SOUT with respect to the area SIN may be from not less than 1 to not more than 10 (1≤SOUT/SIN≤10). The ratio SOUT/SIN may be from not less than 1 to not more than 2, from not less than 2 to not more than 4, from not less than 4 to not more than 6, from not less than 6 to not more than 8, or from not less than 8 to not more than 10. Planar shapes of the input region 7 and the output region 6 are arbitrary and not restricted to particular shapes. As a matter of course, the ratio SOUT/SIN may be in excess of 0 and less than 1.

The output region 6 includes a power MISFET (Metal Insulator Semiconductor Field Effect Transistor) 9 as an example of an insulation gate type transistor. The power MISFET 9 includes a gate, a drain, and a source.

The input region 7 includes a control IC (Integrated Circuit) 10 as an example of a control circuit. The control IC 10 includes plural types of functional circuits which realize various functions. The plural types of functional circuits include a circuit generating gate control signals which drive and control the power MISFET 9 based on an external electrical signal. The control IC 10 forms a so-called IPD (Intelligent Power Device) together with the power MISFET 9. The IPD is also referred to as an IPM (Intelligent Power Module).

The input region 7 is electrically insulated from the output region 6 by a region separation structure 8. In FIG. 1, the region separation structure 8 is indicated by hatching. Although a specific description shall be omitted, the region separation structure 8 may have a trench insulating structure in which an insulator is embedded in the trench.

On the semiconductor layer 2, a plurality of (in this embodiment, six) of electrodes 11, 12, 13, 14, 15, and 16 are formed. In FIG. 1, the plurality of electrodes 11 to 16 are indicated by hatching. Each of the electrodes 11 to 16 is formed as a terminal electrode to be externally connected by a lead wire (for example, bonding wire), etc. The number, the arrangement, and the shape of the plurality of electrodes 11 to 16 are arbitrary and are not restricted to the configuration shown in FIG. 1.

The number, the arrangement, and the shape of the plurality of electrodes 11 to 16 are adjusted according to the specification of the power MISFET 9 and/or the specification of the control IC 10. In this embodiment, the plurality of electrodes 11 to 16 include a drain electrode 11 (power supply electrode), a source electrode 12 (output electrode), an input electrode 13, a reference voltage electrode 14, an ENABLE electrode 15, and a SENSE electrode 16.

The drain electrode 11 is formed on the second main surface 4 of the semiconductor layer 2. The drain electrode 11 is electrically connected to the second main surface 4 of the semiconductor layer 2. The drain electrode 11 transmits a power supply voltage VB to the drain of the power MISFET 9 and to various types of circuits of the control IC 10.

The drain electrode 11 may include at least any one of a Ti layer, a Ni layer, an Au layer, an Ag layer and an Al layer. The drain electrode 11 may have a single layer structure which includes a Ti layer, a Ni layer, an Au layer, an Ag layer, or an Al layer. The drain electrode 11 may have a laminated structure in which at least two of a Ti layer, a Ni layer, an Au layer, an Ag layer, and an Al layer are laminated in any given manner.

The source electrode 12 is formed on the output region 6 in the first main surface 3. The source electrode 12 is electrically connected to the source of the power MISFET 9.

The source electrode 12 transmits an electrical signal generated by the power MISFET 9 to the outside.

The input electrode 13, the reference voltage electrode 14, the ENABLE electrode and the SENSE electrode 16 are each formed on the input region 7 in the first main surface 3. The input electrode 13 transmits an input voltage for driving the control IC 10.

The reference voltage electrode 14 transmits the reference voltage (for example, a ground voltage) to the control IC 10. The ENABLE electrode 15 transmits an electrical signal for partially or totally enabling or disabling functions of the control IC 10. The SENSE electrode 16 transmits an electrical signal for detecting malfunction of the control IC 10.

A gate control wiring 17 as an example of a control wiring is also formed anywhere on the semiconductor layer 2. The gate control wiring 17 is selectively laid around on the output region 6 and on the input region 7. The gate control wiring 17 is electrically connected to the gate of the power MISFET 9 in the output region 6 and electrically connected to the control IC 10 in the input region 7.

The gate control wiring 17 transmits gate control signals generated by the control IC 10 to the gate of the power MISFET 9. The gate control signals include an ON signal Von and an OFF signal Voff, and control an ON state and an OFF state of the power MISFET 9.

The ON signal Von is higher than a gate threshold voltage Vth of the power MISFET 9 (Vth≤Von). The OFF signal Voff is lower than the gate threshold voltage Vth of the power MISFET 9 (Voff<Vth). The OFF signal Voff may be the reference voltage (for example, the ground voltage).

In this embodiment, the gate control wiring 17 includes a first gate control wiring 17A, a second gate control wiring 17B, and a third gate control wiring 17C. The first gate control wiring 17A, the second gate control wiring 17B, and the third gate control wiring 17C are electrically insulated from each other.

In this embodiment, two first gate control wirings 17A are laid around in different regions. Two second gate control wirings 17B are also laid around in different regions. Further, two third gate control wirings 17C are laid around in different regions.

The first gate control wiring 17A, the second gate control wiring 17B, and the third gate control wiring 17C transmit the same gate control signal or different gate control signals to the gate of the power MISFET 9. The number, the arrangement, and the shape, etc., of the gate control wiring 17 are arbitrary and adjusted in accordance with a transmitted distance of the gate control signals and/or the number of the gate control signals to be transmitted.

The source electrode 12, the input electrode 13, the reference voltage electrode 14, the ENABLE electrode 15, the SENSE electrode 16, and the gate control wiring 17 may each include at least any one of nickel, palladium, aluminum, copper, an aluminum alloy, and a copper alloy.

The source electrode 12, the input electrode 13, the reference voltage electrode 14, the ENABLE electrode 15, the SENSE electrode 16, and the gate control wiring 17 may each include at least any one of an Al—Si—Cu (aluminum-silicon-copper) alloy, an Al—Si (aluminum-silicon) alloy, and an Al—Cu (aluminum-copper) alloy.

The source electrode 12, the input electrode 13, the reference voltage electrode 14, the ENABLE electrode 15, the SENSE electrode 16, and the gate control wiring 17 may include the same type of electrode material or may include an electrode material which is different from each other.

Figure 2:
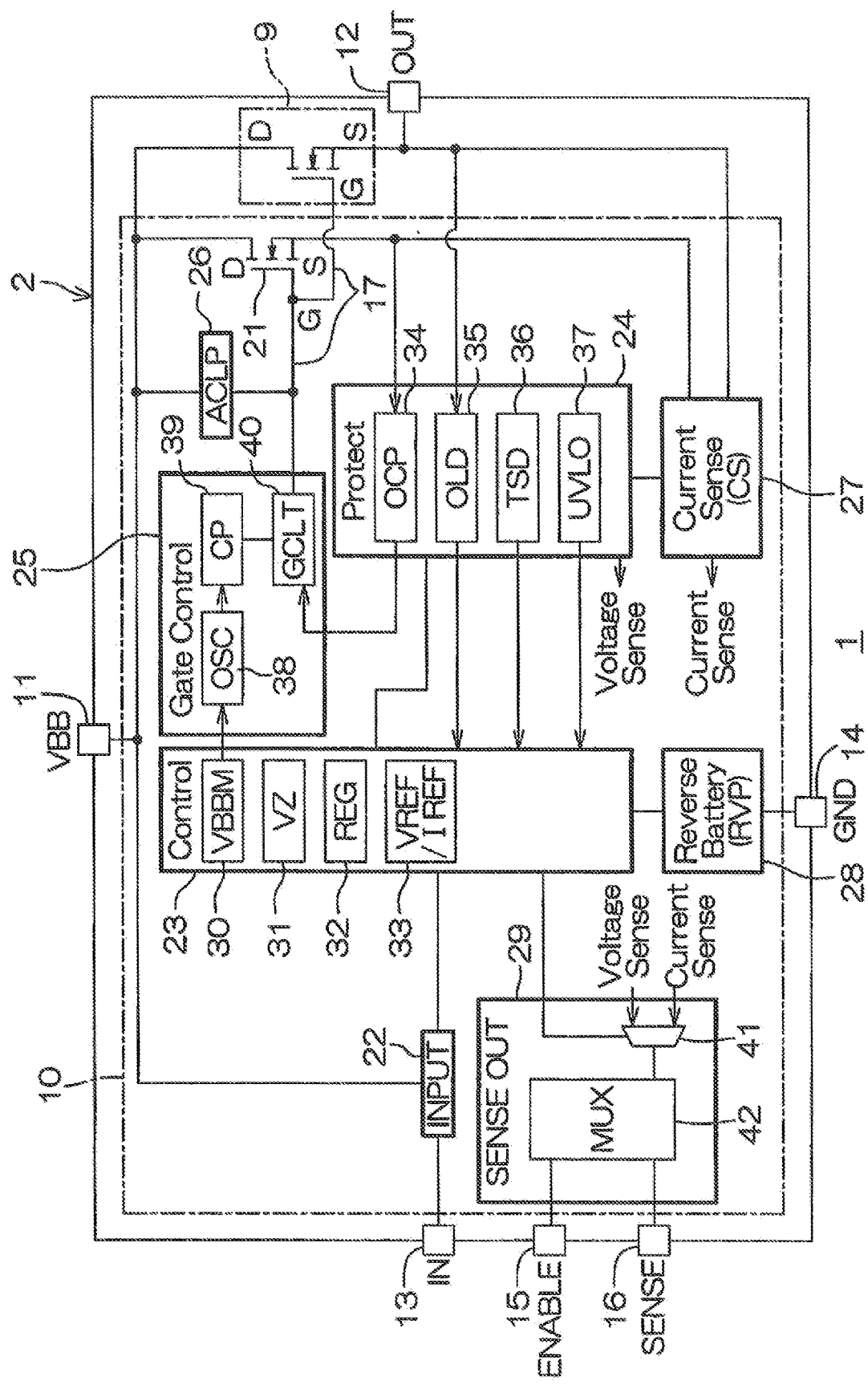
FIG. 2 is a block circuit diagram which shows an electrical configuration of the semiconductor device shown in FIG. 1.

FIG. 2 is a block circuit diagram which shows an electrical configuration of the semiconductor device 1 shown in FIG. 1. Hereinafter, a description will be given of an example in which the semiconductor device 1 is adopted into a vehicle.

The semiconductor device 1 includes a drain electrode 11, a source electrode 12, an input electrode 13, the reference voltage electrode 14, an ENABLE electrode 15, a SENSE electrode 16, a gate control wiring 17, a power MISFET 9, and a control IC 10.

The drain electrode 11 is connected to a power supply. The drain electrode 11 supplies a power supply voltage VB to the power MISFET 9 and the control IC 10. The power supply voltage VB may be from not less than 10 V to not more than 20 V. The source electrode 12 is connected to a load.

The input electrode 13 may be connected to an MCU (Micro Controller Unit), a DC/DC converter, an LDO (Low Drop Out), etc. The input electrode 13 supplies an input voltage to the control IC 10. The input voltage may be from not less than 1 V to not more than 10 V. The reference voltage electrode 14 is connected to the reference voltage wiring. The reference voltage electrode 14 supplies the reference voltage to the power MISFET 9 and the control IC 10.

The ENABLE electrode 15 may be connected to an MCU. An electrical signal partially or totally enabling or disabling functions of the control IC 10 is input to the ENABLE electrode 15. The SENSE electrode 16 may be connected to a resistor.

The gate of the power MISFET 9 is connected to the control IC 10 (a gate control circuit 25 to be described later) through the gate control wiring 17. The drain of the power MISFET 9 is connected to the drain electrode 11. The source of the power MISFET 9 is connected to the control IC 10 (a current detecting circuit 27 to be described later) and the source electrode 12.

The control IC 10 includes a sensor MISFET 21, an input circuit 22, a current-voltage control circuit 23, a protection circuit 24, a gate control circuit 25, an active clamp circuit 26, a current detecting circuit 27, a power-supply reverse connection protection circuit 28, and a malfunction detection circuit 29.

A gate of the sensor MISFET 21 is connected to the gate control circuit 25. A drain of the sensor MISFET 21 is connected to the drain electrode 11. A source of the sensor MISFET 21 is connected to the current detecting circuit 27.

The input circuit 22 is connected to the input electrode 13 and the current-voltage control circuit 23. The input circuit 22 may include a Schmitt trigger circuit. The input circuit 22 shapes a waveform of an electrical signal applied to the input electrode 13. The signal generated by the input circuit 22 is input to the current-voltage control circuit 23.

The current-voltage control circuit 23 is connected to the protection circuit 24, the gate control circuit 25, the power-supply reverse connection protection circuit 28, and the malfunction detection circuit 29. The current-voltage control circuit 23 may include a logic circuit.

The current-voltage control circuit 23 generates various voltages according to an electrical signal from the input circuit 22 and an electrical signal from the protection circuit 24. In this embodiment, the current-voltage control circuit 23 includes a driving voltage generation circuit 30, a first constant voltage generation circuit 31, a second constant voltage generation circuit 32, and the reference voltage-reference current generation circuit 33.

The driving voltage generation circuit 30 generates a driving voltage by which the gate control circuit 25 is driven. The driving voltage may be set at a value obtained by subtracting a predetermined value from the power supply voltage VB. The driving voltage generation circuit 30 may generate a driving voltage of not less than 5 V to not more than 15 V which is obtained by subtracting 5 V from the power supply voltage VB. The driving voltage is input to the gate control circuit 25.

The first constant voltage generation circuit 31 generates a first constant voltage for driving the protection circuit 24. The first constant voltage generation circuit 31 may include a Zener diode and/or a regulator circuit (here, the Zener diode is included). The first constant voltage may be from not less than 1 V to not more than 5 V. The first constant voltage is input to the protection circuit 24 (specifically, a load open detection circuit 35 to be described, etc.).

The second constant voltage generation circuit 32 generates a second constant voltage for driving the protection circuit 24. The second constant voltage generation circuit 32 may include a Zener diode and/or a regulator circuit (here, the regulator circuit). The second constant voltage may be from not less than 1 V to not more than 5 V. The second constant voltage is input to the protection circuit 24 (more specifically, an overheat protection circuit 36 and a low-voltage malfunction suppression circuit 37 which are to be described later).

The reference voltage-reference current generation circuit 33 generates the reference voltage and a reference current of various types of circuits. The reference voltage may be from not less than 1 V to not more than 5 V. The reference current may be from not less than 1 mA to not more than 1 A. The reference voltage and the reference current are input to various types of circuits. In a case where various types of circuits include a comparator, the reference voltage and the reference current may be input to the comparator.

The protection circuit 24 is connected to the current-voltage control circuit 23, the gate control circuit 25, the malfunction detection circuit 29, the source of the power MISFET 9, and the source of the sensor MISFET 21. The protection circuit 24 includes an overcurrent protection circuit 34, a load open detection circuit 35, an overheat protection circuit 36, and a low-voltage malfunction suppression circuit 37.

The overcurrent protection circuit 34 protects the power MISFET 9 from an overcurrent. The overcurrent protection circuit 34 is connected to the gate control circuit 25 and the source of the sensor MISFET 21. The overcurrent protection circuit 34 may include a current monitor circuit. A signal generated by the overcurrent protection circuit 34 is input to the gate control circuit 25 (more specifically, a driving signal output circuit 40 to be described later).

The load open detection circuit 35 detects a short state or an open state of the power MISFET 9. The load open detection circuit 35 is connected to the current-voltage control circuit 23 and the source of the power MISFET 9. A signal generated by the load open detection circuit 35 is input to the current-voltage control circuit 23.

The overheat protection circuit 36 monitors a temperature of the power MISFET 9 to protect the power MISFET 9 from an excessive temperature rise. The overheat protection circuit 36 is connected to the current-voltage control circuit 23. The overheat protection circuit 36 may include a temperature sensitive device such as a diode and a thermistor. A signal generated by the overheat protection circuit 36 is input to the current-voltage control circuit 23.

The low-voltage malfunction suppression circuit 37 suppresses malfunction of the power MISFET 9 in a case where the power supply voltage VB is less than a predetermined value. The low-voltage malfunction suppression circuit 37 is connected to the current-voltage control circuit 23. A signal generated by the low-voltage malfunction suppression circuit 37 is input to the current-voltage control circuit 23.

The gate control circuit 25 controls an ON state and an OFF state of the power MISFET 9 as well as an ON state and an OFF state of the sensor MISFET 21. The gate control circuit 25 is connected to the current-voltage control circuit 23, the protection circuit 24, the gate of the power MISFET 9, and the gate of the sensor MISFET 21.

The gate control circuit 25 generates plural types of gate control signals in accordance with the number of the gate control wirings 17 in response to an electrical signal from the current-voltage control circuit 23 and an electrical signal from the protection circuit 24. The plural types of gate control signals are each input to the gate of the power MISFET 9 and the gate of the sensor MISFET 21 through the gate control wiring 17.

More specifically, gate control circuit 25 may include an oscillation circuit 38, a charge pump circuit 39, and a driving signal output circuit 40. The oscillation circuit 38 oscillates in response to the electrical signal from the current-voltage control circuit 23 to generate a predetermined electrical signal. The electrical signal generated by the oscillation circuit 38 is input to the charge pump circuit 39. The charge pump circuit 39 boosts the electrical signal sent from the oscillation circuit 38. The electrical signal which is boosted by the charge pump circuit 39 is input to the driving signal output circuit 40.

The driving signal output circuit 40 generates plural types of gate control signals in response to the electrical signal from the charge pump circuit 39 and the electrical signal from the protection circuit 24 (more specifically, the overcurrent protection circuit 34). The plural types of gate control signals are input to the gate of the power MISFET 9 and the gate of the sensor MISFET 21 through the gate control wiring 17. The sensor MISFET 21 and the power MISFET 9 are controlled at the same time by the gate control circuit 25.

The active clamp circuit 26 protects the power MISFET 9 from a counter electromotive force. The active clamp circuit 26 is connected to the drain electrode 11, the gate of the power MISFET 9, and the gate of the sensor MISFET 21. The active clamp circuit 26 may include a plurality of diodes.

The active clamp circuit 26 may include a plurality of diodes which are connected to each other in a forward-biased manner. The active clamp circuit 26 may include a plurality of diodes which are connected to each other in a reverse-biased manner. The active clamp circuit 26 may include a plurality of diodes which are connected to each other in a forward-biased manner and a plurality of diodes which are connected to each other in a reverse-biased manner.

The plurality of diodes may include a pn junction diode or a Zener diode, or a pn junction diode and a Zener diode. The active clamp circuit 26 may include a plurality of Zener diodes which are connected to each other in a biased manner. The active clamp circuit 26 may include a Zener diode and a pn junction diode which are connected to each other in a reverse-biased manner.

The current detecting circuit 27 detects a current which flows through the power MISFET 9 and the sensor MISFET 21. The current detecting circuit 27 is connected to the protection circuit 24, the malfunction detection circuit 29, the source of the power MISFET 9, and the source of the sensor MISFET 21. The current detecting circuit 27 generates a current detection signal in response to an electrical signal generated by the power MISFET 9 and an electrical signal generated by the sensor MISFET 21. The current detection signal is input to the malfunction detection circuit 29.

The power-supply reverse connection protection circuit 28 protects the current-voltage control circuit 23, the power MISFET 9, etc., from a reverse voltage when a power supply is connected reversely. The power-supply reverse connection protection circuit 28 is connected to the reference voltage electrode 14 and the current-voltage control circuit 23.

The malfunction detection circuit 29 monitors a voltage of the protection circuit 24. The malfunction detection circuit 29 is connected to the current-voltage control circuit 23, the protection circuit 24, and the current detecting circuit 27. In a case where malfunction (change in voltage, etc.) occurs in any of the overcurrent protection circuit 34, the load open detection circuit 35, the overheat protection circuit 36, and the low-voltage malfunction suppression circuit 37, the malfunction detection circuit 29 generates and outputs to the outside a malfunction detecting signal in accordance with a voltage of the protection circuit 24.

More specifically, the malfunction detection circuit 29 includes a first multiplexer circuit 41 and a second multiplexer circuit 42. The first multiplexer circuit 41 includes two input portions, one output portion, and one selection control input portion. The protection circuit 24 and the current detecting circuit 27 are each connected to the input portions of the first multiplexer circuit 41. The second multiplexer circuit 42 is connected to the output portion of the first multiplexer circuit 41. The current-voltage control circuit 23 is connected to the selection control input portion of the first multiplexer circuit 41.

The first multiplexer circuit 41 generates a malfunction detecting signal in response to an electrical signal from the current-voltage control circuit 23, a voltage detecting signal from the protection circuit 24, and a current detection signal from the current detecting circuit 27. The malfunction detecting signal generated by the first multiplexer circuit 41 is input to the second multiplexer circuit 42.

The second multiplexer circuit 42 includes two input portions and one output portion. The output portion of the second multiplexer circuit 42 and the ENABLE electrode 15 are each connected to the input portions of the second multiplexer circuit 42. The SENSE electrode 16 is connected to the output portion of the second multiplexer circuit 42.

In a case where the MCU is connected to the ENABLE electrode 15 and the resistor is connected to the SENSE electrode 16, an ON signal is input from the MCU to the ENABLE electrode 15 and a malfunction detecting signal is taken out from the SENSE electrode 16. The malfunction detecting signal is converted to an electrical signal by the resistor connected to the SENSE electrode 16. A malfunction state of the semiconductor device 1 is detected based on the electrical signal.

Figure 3:
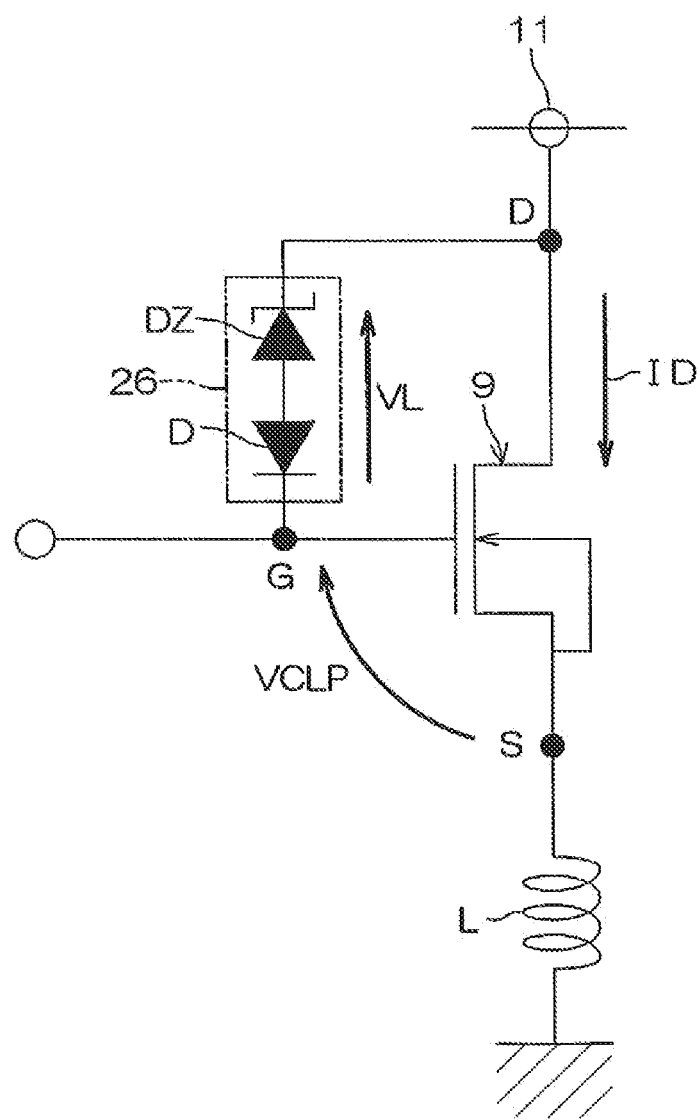
FIG. 3 is a circuit diagram for describing normal operation and active clamp operation of the semiconductor device shown in FIG. 1.
Figure 4:
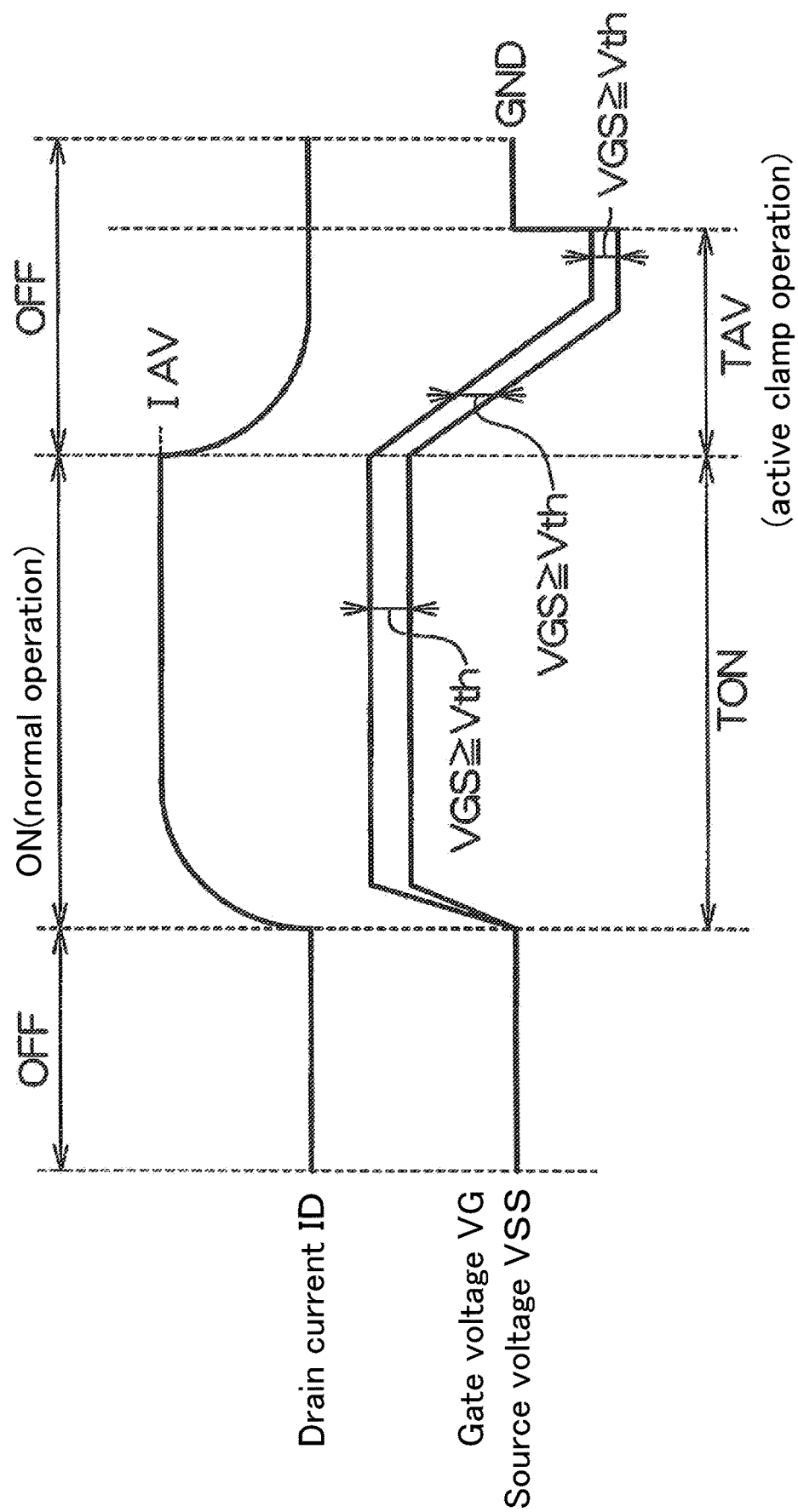
FIG. 4 is a waveform chart of a main electrical signal applied to the circuit diagram shown in FIG. 3.

FIG. 3 is a circuit diagram for describing active clamp operation of the semiconductor device 1 shown in FIG. 1. FIG. 4 is a waveform chart of a main electrical signal of the circuit diagram shown in FIG. 3.

Here, a circuit example in which an inductive load L is connected to the power MISFET 9 is used to describe normal operation and active clamp operation of the semiconductor device 1. A device which uses a winding (coil) such as a solenoid, a motor, a transformer, a relay, etc., is shown as an example of the inductive load L. The inductive load L is also called an L load.

With reference to FIG. 3, the source of the power MISFET 9 is electrically connected to the inductive load L. The drain of the power MISFET 9 is electrically connected to the drain electrode 11. The gate and the drain of the power MISFET 9 are connected to the active clamp circuit 26. In this circuit example, the active clamp circuit 26 includes the m number (m is a natural number) of Zener diodes DZ and the n number (n is a natural number) of pn junction diodes D. The pn junction diode D is connected to the Zener diode DZ in a reverse-biased manner.

With reference to FIG. 3 and FIG. 4, when an ON signal Von is input to the gate of the power MISFET 9 in an OFF state, the power MISFET 9 is switched from the OFF state to an ON state (normal operation). The ON signal Von has a voltage equal to or larger than the gate threshold voltage Vth (Vth≤Von). The power MISFET 9 is kept in the ON state only for a predetermined in time TON.

When the power MISFET 9 is switched to the ON state, a drain current ID starts to flow from the drain of the power MISFET 9 to the source. The drain current ID increases from zero to a predetermined value and saturates. The inductive load L allows an inductive energy to accumulate due to an increase in the drain current ID.

When an OFF signal Voff is input to the gate of the power MISFET 9, the power MISFET 9 is switched from the ON state to the OFF state. The OFF signal Voff has a voltage less than the gate threshold voltage Vth (Voff<Vth). The OFF signal Voff may be the reference voltage (for example, the ground voltage).

In transition when the power MISFET 9 is switched from the ON state to the OFF state, an inductive energy of the inductive load L is applied as a counter electromotive force to the power MISFET 9. Thereby, the power MISFET 9 is shifted to an active clamp state (active clamp operation). When the power MISFET 9 is shifted to the active clamp state, a source voltage VSS sharply lowers to a negative voltage less than the reference voltage (ground voltage).

At this time, the source voltage VSS is limited to a voltage equal to or more than a voltage obtained by subtracting a limit voltage VL and a clamp ON voltage VCLP from a power supply voltage VB due to operation of the active clamp circuit 26 (VSS≥VB−VL−VCLP).

In other words, when the power MISFET 9 is shifted to an active clamp state, a drain voltage VDS between the drain and the source of the power MISFET 9 sharply rises to a clamp voltage VDSSCL. The clamp voltage VDSSCL is limited to a voltage equal to or less than a voltage obtained by adding a clamp ON voltage VCLP and a limit voltage VL (VDS≤VCLP+VL) by the power MISFET 9 and the active clamp circuit 26.

In this embodiment, the limit voltage VL is a sum of a voltage between terminals VZ of a Zener diode DZ and a voltage between terminals VF of a pn junction diode in the active clamp circuit 26 (VL=m·VZ+n·VF).

The clamp ON voltage VCLP is a positive voltage (that is, a gate voltage VGS) applied between the gate and the source of the power MISFET 9. The clamp ON voltage VCLP is equal to or more than the gate threshold voltage Vth (Vth≤VCLP). Therefore, the power MISFET 9 keeps the ON state in an active clamp state.

In a case where the clamp voltage VDSSCL exceeds a maximum rated drain voltage VDSS (VDSS<VDSSCL), the power MISFET 9 reaches breakdown. The power MISFET 9 is designed such that the clamp voltage VDSSCL becomes equal to or less than the maximum rated drain voltage VDSS (VDSSCL≤VDSS).

In a case where the clamp voltage VDSSCL is equal to or less than the maximum rated drain voltage VDSS (VDSSCL≤VDSS), a drain current ID continuously flows from the drain of the power MISFET 9 to the source thereof, and an inductive energy of the inductive load L is consumed (absorbed) in the power MISFET 9.

Through an active clamp time TAV, the drain current ID is reduced to zero from a peak value IAV which is immediately before the power MISFET 9 becomes the OFF state. Thereby, the gate voltage VGS becomes the reference voltage (for example, the ground voltage) and the power MISFET 9 is switched from the ON state to the OFF state.

The active clamp capability Eac of the power MISFET 9 is defined by the capability of the power MISFET 9 in the active clamp operation. More specifically, the active clamp capability Eac is defined by the capability of the power MISFET 9 with respect to the counter electromotive force caused by the inductive energy of the inductive load L in transition when the power MISFET 9 is switched from the ON state to the OFF state.

More specifically, the active clamp capability Eac is defined by the capability of the power MISFET 9 with respect to the energy caused by the clamp voltage VDSSCL. For example, the active clamp capability Eac is expressed by a formula of Eac=(VL+VCLP)×ID×TAV by using the limit voltage VL, the clamp ON voltage VCLP, the drain current ID, and the active clamp time TAV.

Figure 5:
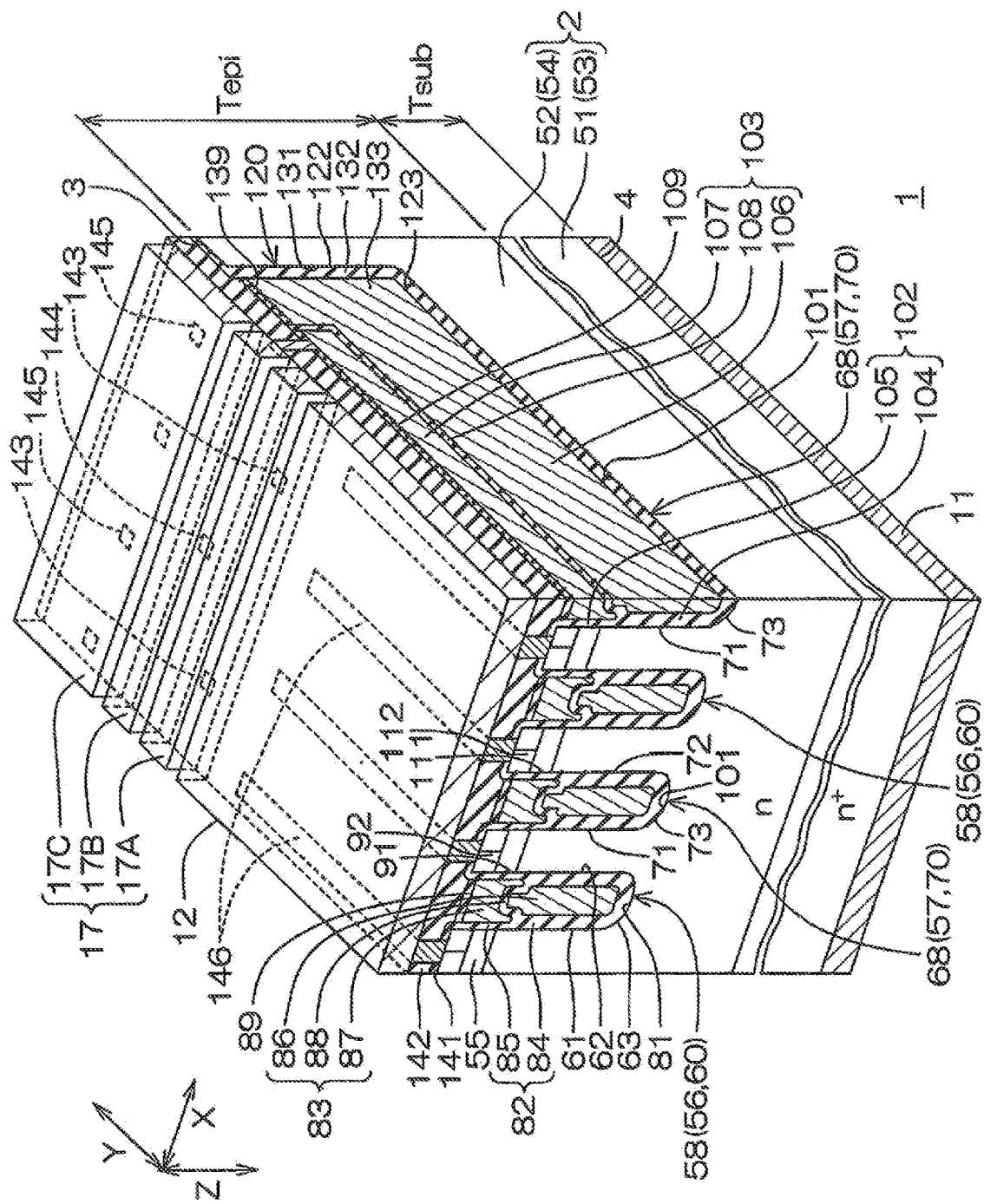
FIG. 5 is a sectional perspective view of a region V shown in FIG. 1.
Figure 6:
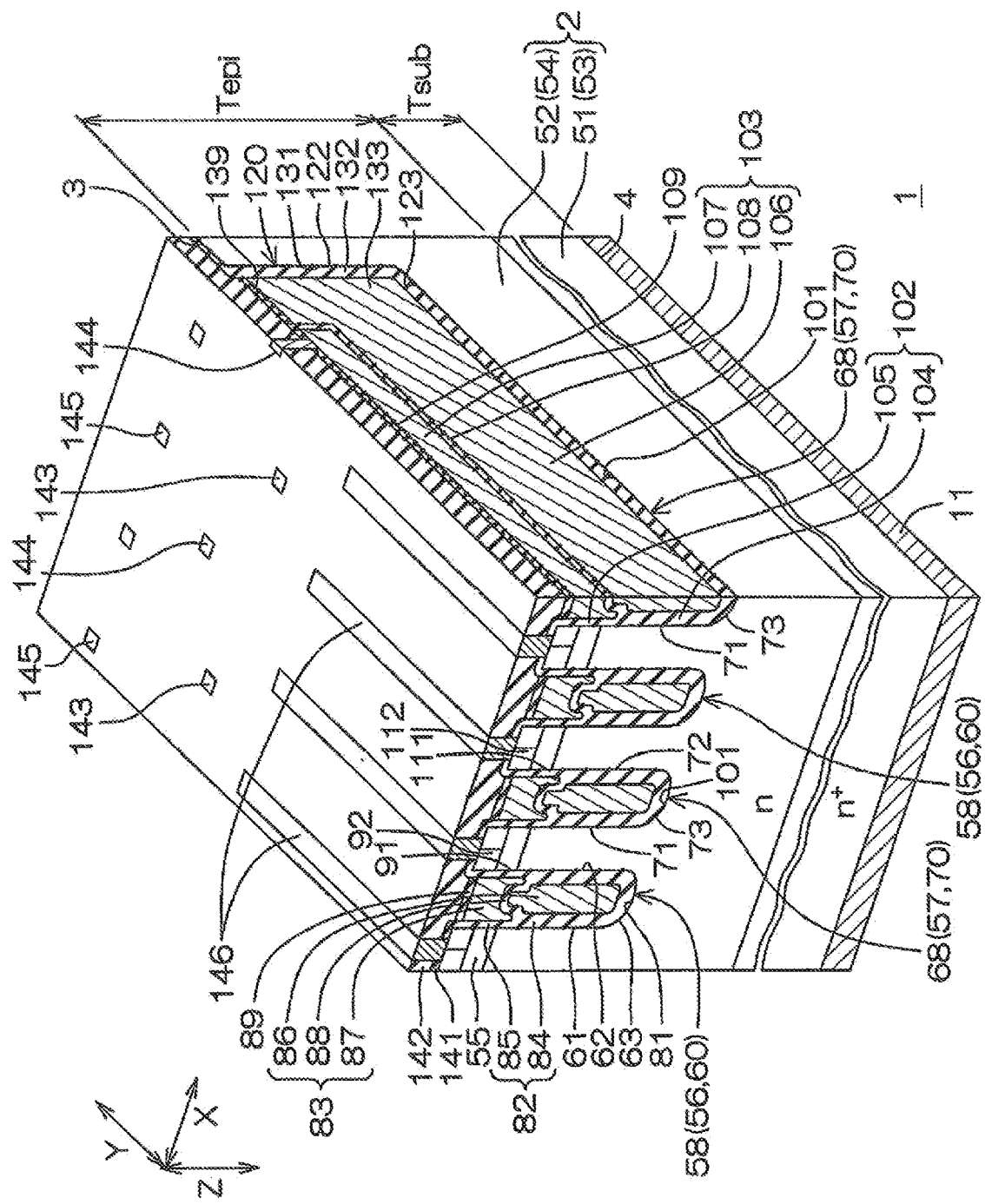
FIG. 6 is a sectional perspective view in which an electrode is removed from FIG. 5.
Figure 7:
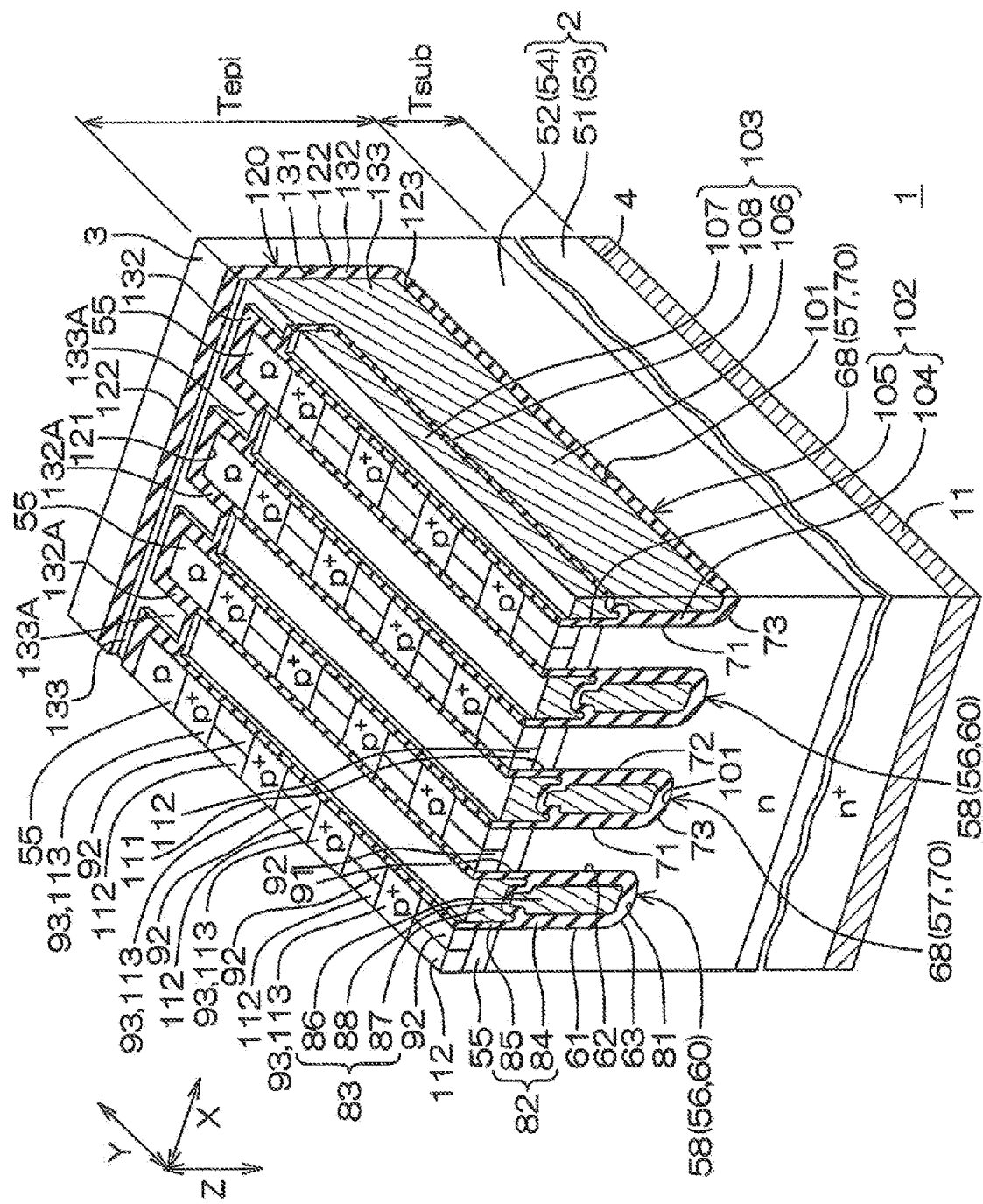
FIG. 7 is a sectional perspective view in which structures on a semiconductor layer are removed from FIG. 6 and is a sectional perspective view which shows a channel structure according to a first configuration example.

FIG. 5 is a sectional perspective view of a region V shown in FIG. 1. FIG. 6 is a sectional perspective view in which the source electrode 12 and the gate control wiring 17 are removed from FIG. 5. FIG. 7 is a sectional perspective view in which an interlayer insulation layer 142 is removed from FIG. 6 and is a sectional perspective view which shows a configuration of the channel structure according to the first configuration example.

Figure 8:
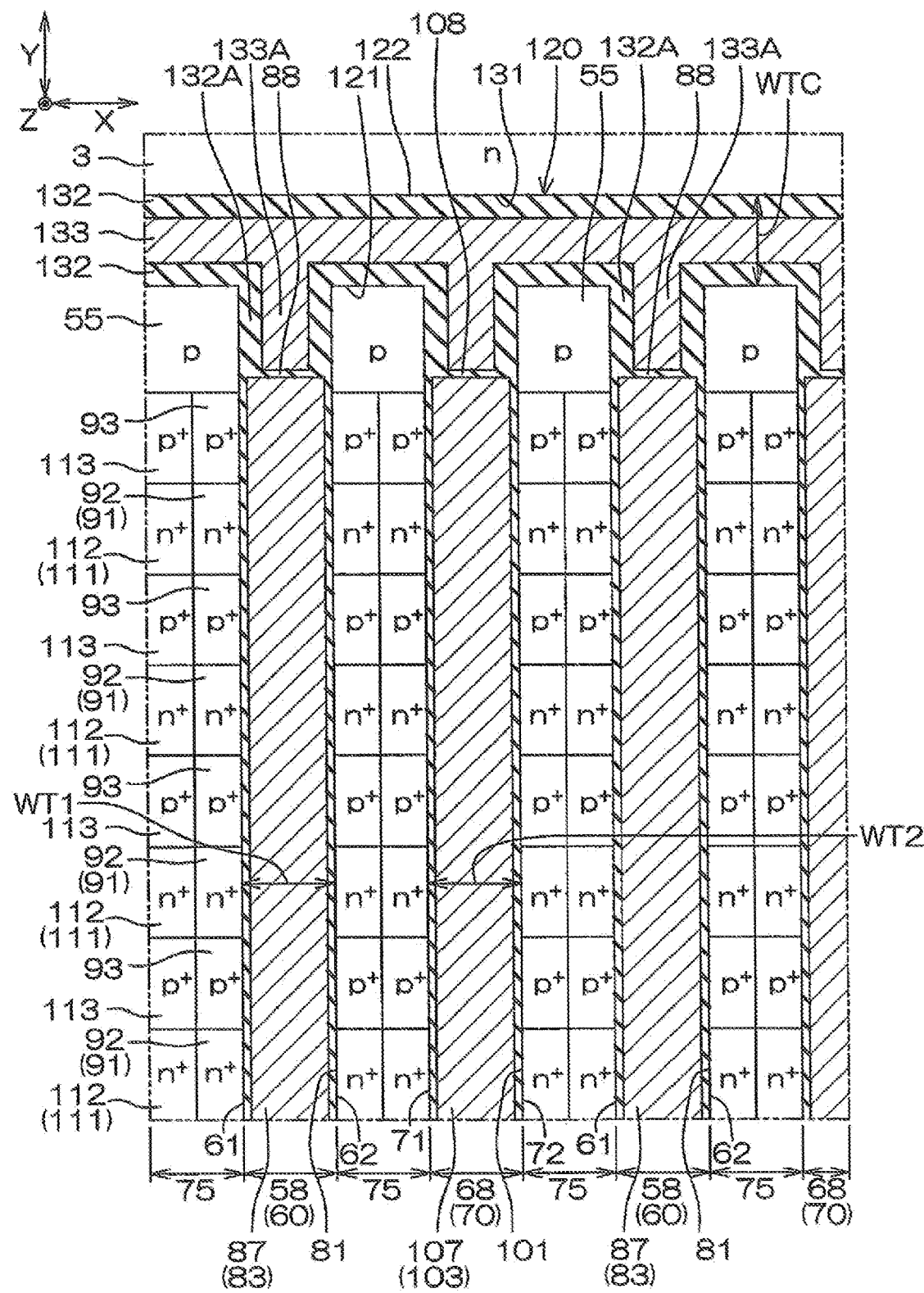
FIG. 8 is a plan view of the semiconductor layer shown in FIG. 7.
Figure 9:
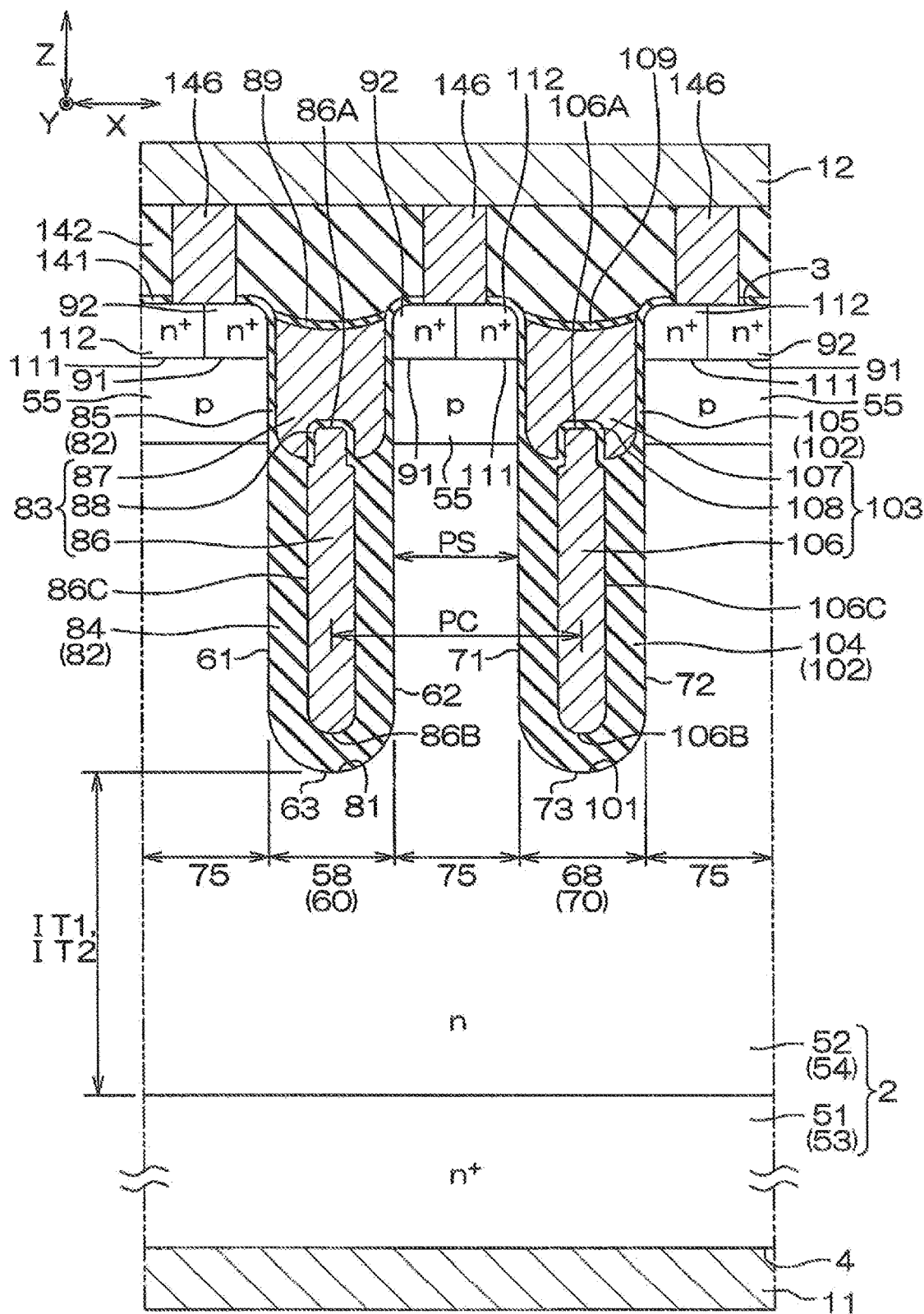
FIG. 9 is an enlarged sectional view of a region which includes a first trench gate structure and a second trench gate structure shown in FIG. 5.
Figure 10:
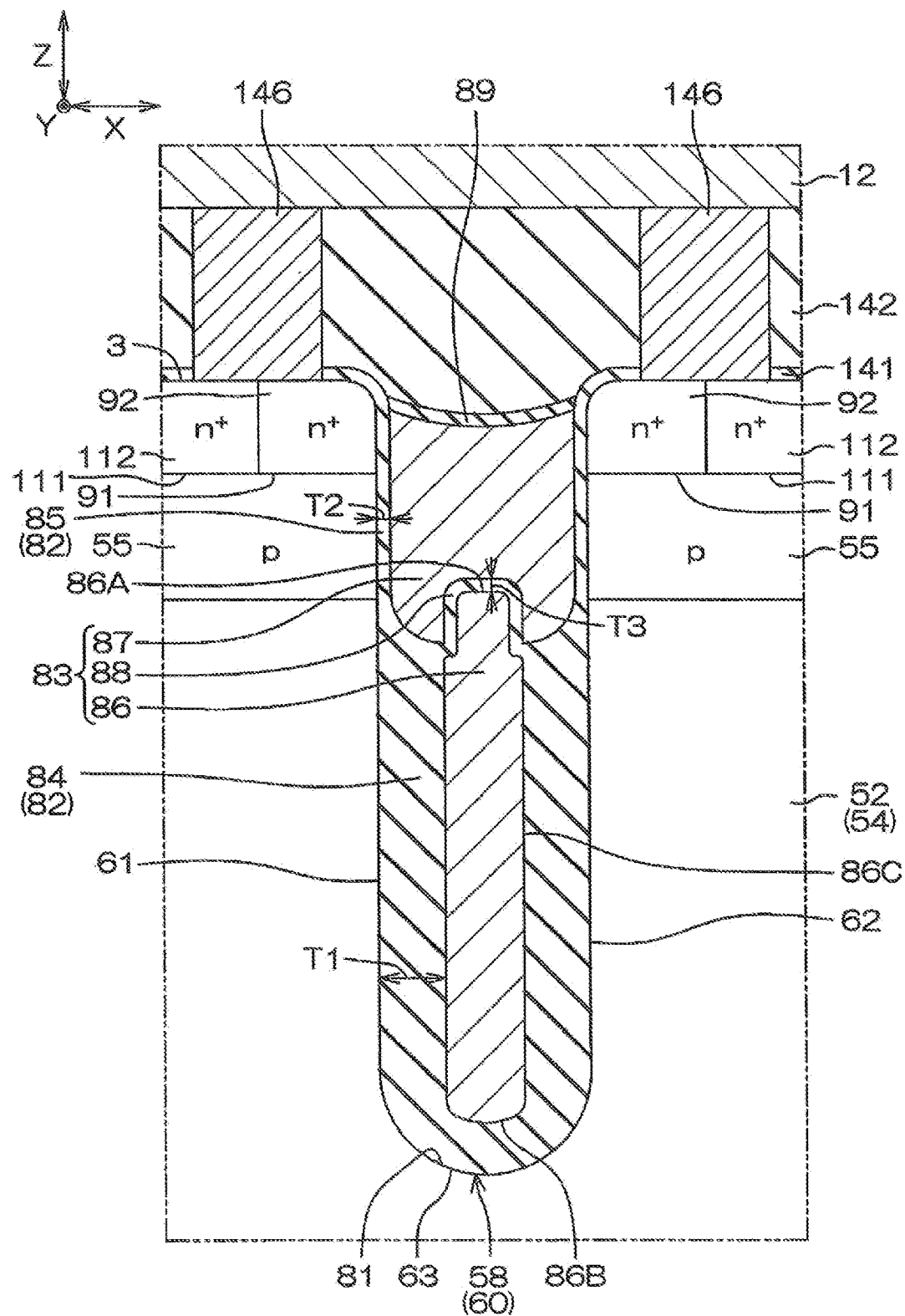
FIG. 10 is an enlarged sectional view of the first trench gate structure shown in FIG. 5.
Figure 11:
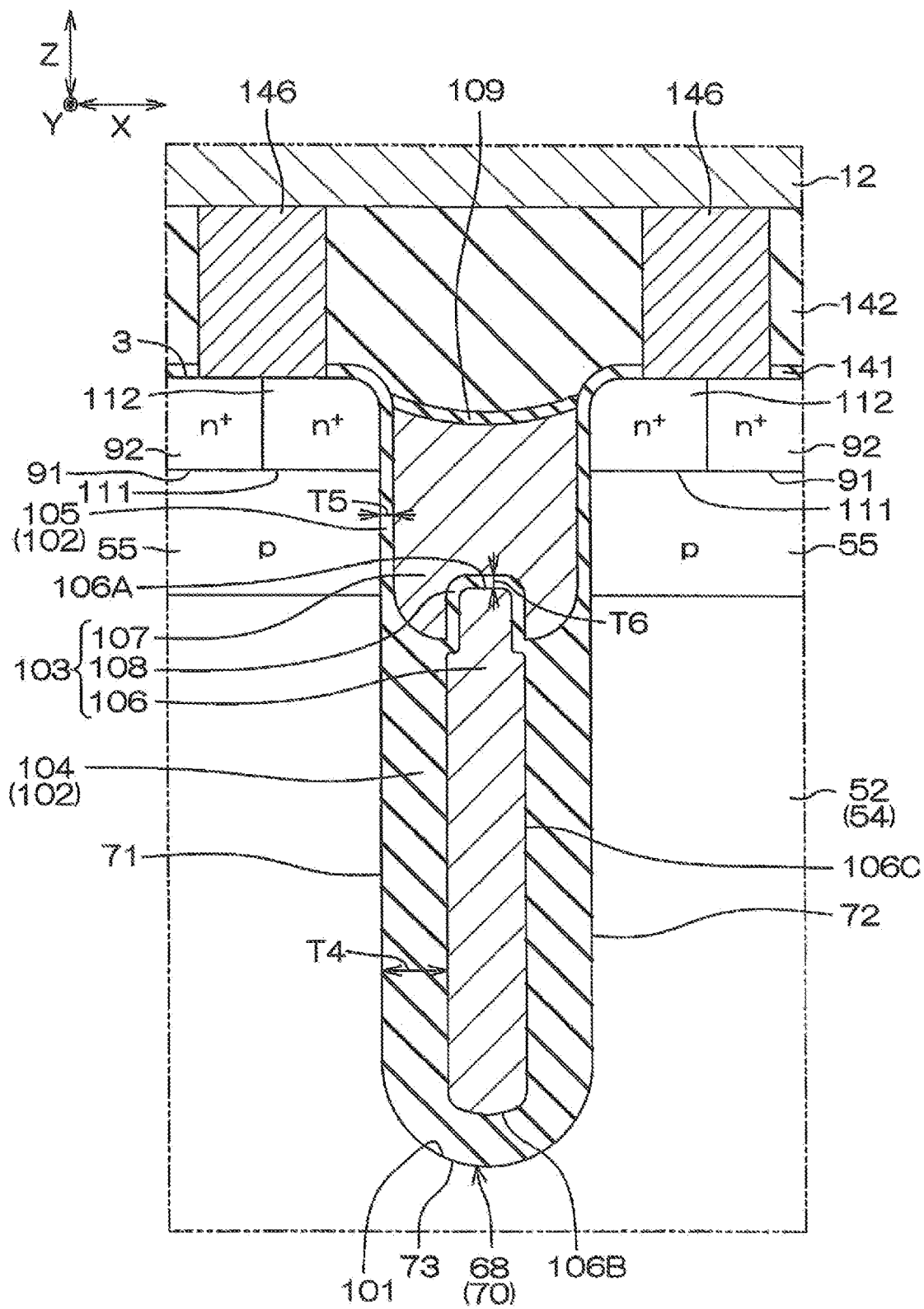
FIG. 11 is an enlarged sectional view of the second trench gate structure shown in FIG. 5

FIG. 8 is a plan view of FIG. 7. FIG. 9 is an enlarged sectional view of a region which includes a first trench gate structure 60 (first gate structure) and a second trench gate structure 70 (second gate structure) shown in FIG. 5. FIG. 10 is an enlarged sectional view of the first trench gate structure 60 shown in FIG. 5. FIG. 11 is an enlarged sectional view of the second trench gate structure 70 shown in FIG. 5.

With reference to FIG. 5 to FIG. 11, in this embodiment, the semiconductor layer 2 has a laminated structure including an n⁺-type semiconductor substrate 51 and an n-type epitaxial layer 52. The second main surface 4 of the semiconductor layer 2 is formed by the semiconductor substrate 51. The first main surface 3 of the semiconductor layer 2 is formed by the epitaxial layer 52. The side surfaces 5A to 5D of the semiconductor layer 2 are formed by the semiconductor substrate 51 and the epitaxial layer 52.

The epitaxial layer 52 has an n-type impurity concentration less than an n-type impurity concentration of the semiconductor substrate 51. The n-type impurity concentration of the semiconductor substrate 51 may be from not less than $1\times10^{18}$ cm$^{-3}$ to not more than $1\times10^{20}$ cm$^{-3}$. The n-type impurity concentration of the epitaxial layer 52 may be from not less than $1\times10^{15}$ cm$^{-3}$ to not more than $1\times10^{18}$ cm$^{-3}$.

The epitaxial layer 52 has a thickness Tepi less than a thickness Tsub of the semiconductor substrate 51 (Tepi<Tsub). The thickness Tsub may be from not less than 50 μm to not more than 450 The thickness Tsub may be from not less than 50 μm to not more than 150 from not less than 150 μm to not more than 250 from not less than 250 μm to not more than 350 or from not less than 350 μm to not more than 450 μm.

By reducing the thickness Tsub, it becomes possible to reduce a resistance value. The thickness Tsub is adjusted by grinding. In this case, the second main surface 4 of the semiconductor layer 2 may be a ground surface having a grinding mark.

The thickness Tepi of the epitaxial layer 52 is preferably not more than 1/10 of the thickness Tsub. The thickness Tepi may be from not less than 5 μm to not more than 20 μm. The thickness Tepi may be from not less than 5 μm to not more than 10 μm, from not less than 10 μm to not more than 15 μm, or from not less than 15 μm to not more than 20 μm. The thickness Tepi is preferably from not less than 5 μm to not more than 15 μm.

The semiconductor substrate 51 is formed in the second main surface 4 side of the semiconductor layer 2 as a drain region 53. The epitaxial layer 52 is formed in a surface layer portion of the first main surface 3 of the semiconductor layer 2 as a drift region 54 (drain drift region). A bottom portion of the drift region 54 is formed by a boundary between the semiconductor substrate 51 and the epitaxial layer 52. Hereinafter, the epitaxial layer 52 is referred to as the drift region 54.

A p-type body region 55 is formed in a surface layer portion of the first main surface 3 of the semiconductor layer 2 in the output region 6. The body region 55 is a region which serves as a base of the power MISFET 9. A p-type impurity concentration of the body region may be from not less than $1\times10^{16}$ cm$^{-3}$ to not more than $1\times10^{18}$ cm$^{-3}$.

The body region 55 is formed in a surface layer portion of the drift region 54. A bottom portion of the body region 55 is formed in a region in the first main surface 3 side with respect to the bottom portion of the drift region 54. A thickness of the body region 55 may be from not less than 0.5 μm to not more than 2 μm. The thickness of the body region may be from not less than 0.5 μm to not more than 1 μm, from not less than 1 μm to not more than 1.5 μm, or from not less than 1.5 μm to not more than 2 μm.

The power MISFET 9 includes a first MISFET 56 (first transistor) and a second MISFET 57 (second transistor). The first MISFET 56 is electrically separated from the second MISFET 57 and controlled independently. The second MISFET 57 is electrically separated from the first MISFET 56 and controlled independently.

That is, the power MISFET 9 is configured such as to be driven when the first MISFET 56 and the second MISFET 57 are both in ON states (Full-ON control). The power MISFET 9 is also configured such as to be driven when the first MISFET 56 is in an ON state while the second MISFET 57 is in an OFF state (first Half-ON control). Further, the power MISFET 9 is configured such as to be driven when the first MISFET 56 is in an OFF state while the second MISFET 57 is in an ON state (second Half-ON control).

In the case of Full-ON control, the power MISFET 9 is driven in a state where all current paths are opened. Therefore, an ON resistance inside the semiconductor layer 2 is relatively reduced. On the other hand, in the case of first Half-ON control or second Half-ON control, the power MISFET 9 is driven in a state where some of the current paths are blocked. Therefore, the ON resistance inside the semiconductor layer 2 is relatively increased.

Specifically, the first MISFET 56 includes a plurality of first FET (Field Effect Transistor) structures 58. The plurality of first FET structures 58 are arrayed at intervals along the first direction X, and extend in a band shape along the second direction Y, respectively, in plan view. The plurality of first FET structures 58 are formed in a stripe shape as a whole in plan view.

In FIG. 5 to FIG. 8, a region of the first FET structure 58 at one end portion side is shown, while a region of the first FET structure 58 at the other end portion side is omitted. The region of the first FET structure 58 at the other end portion side is substantially similar in structure to the region of the first FET structure 58 at one end portion side. Hereinafter, the structure of the region of the first FET structure 58 at one end portion side is described as an example, and a description of the structure of the region of the first FET structure 58 at the other end portion side shall be omitted.

In this embodiment, each of the first FET structures 58 includes a first trench gate structure 60. A first width WT1 of the first trench gate structure 60 may be from not less than 0.5 μm to not more than 5 μm. The first width WT1 is a width in a direction (first direction X) orthogonal to a direction (second direction Y) in which the first trench gate structure 60 extends.

The first width WT1 may be from not less than 0.5 μm to not more than 1 from not less than 1 μm to not more than 1.5 from not less than 1.5 μm to not more than 2 from not less than 2 μm to not more than 2.5 from not less than 2.5 μm to not more than 3 from not less than 3 μm to not more than 3.5 from not less than 3.5 μm to not more than 4 from not less than 4 μm to not more than 4.5 or from not less than 4.5 μm to not more than 5 μm. The first width WT1 is preferably from not less than 0.8 μm to not more than 1.2 μm.

The first trench gate structure 60 penetrates through the body region 55 and reaches the drift region 54. A first depth DT1 of the first trench gate structure 60 may be from not less than 1 μm to not more than 10 μm. The first depth DT1 may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The first depth DT1 is preferably from not less than 2 μm to not more than 6 μm.

The first trench gate structure 60 includes a first side wall 61 on one side, a second side wall 62 on the other side, and a bottom wall 63 which connects the first side wall 61 and the second side wall 62. Hereinafter, the first side wall 61, the second side wall 62, and the bottom wall 63 may be collectively referred to as "an inner wall" or "an outer wall."

An absolute value of an angle (taper angel) formed between the first side wall 61 and the first main surface 3 inside the semiconductor layer 2 may be in excess of 90° and not more than 95° (for example, approximately 91°). The absolute value of an angle (taper angel) formed between the second side wall 62 and the first main surface 3 inside the semiconductor layer 2 may be in excess of 90° and not more than 95° (for example, approximately 91°). The first trench gate structure 60 may be formed in a shape (tapered shape) that the first width WT1 is made narrow from the first main surface 3 side to the bottom wall 63 side in sectional view.

The bottom wall 63 of the first trench gate structure 60 is positioned in a region at the first main surface 3 side with respect to the bottom portion of the drift region 54. The bottom wall 63 of the first trench gate structure 60 is formed in a convex curved shape (U letter shape) toward the bottom portion of the drift region 54.

The bottom wall 63 of the first trench gate structure 60 is positioned in a region at the first main surface 3 side with a first interval IT1 of not less than 1 μm to not more than 10 μm from the bottom portion of the drift region 54. The first interval IT1 may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The first interval IT1 is preferably from not less than 1 μm to not more than 5 μm.

In this embodiment, the second MISFET 57 includes a plurality of second FET structures 68. The plurality of second FET structures 68 are arrayed at intervals along the first direction X, and extend in a band shape along the second direction Y, respectively, in plan view.

The plurality of second FET structures 68 extend along the same direction as the plurality of first FET structures 58. The plurality of second FET structures 68 are formed in a stripe shape as a whole in plan view. In this embodiment, the plurality of second FET structures 68 are arrayed alternately with the plurality of first FET structures 58 in a manner that one first FET structure 58 is held therebetween.

In FIG. 5 to FIG. 8, a region of the second FET structure 68 at one end portion side is shown in the drawing, while a region of the second FET structure 68 at the other end portion side is omitted. The region of the second FET structure 68 at the other end portion side is substantially similar in structure to the region of the second FET structure 68 at one end portion side. Hereinafter, the structure of the region of the second FET structure 68 at one end portion side is described as an example, and a description of the structure of the region of the second FET structure 68 at the other end portion side shall be omitted.

In this embodiment, each of the second FET structures 68 includes a second trench gate structure 70. A second width WT2 of the second trench gate structure 70 may be from not less than 0.5 μm to not more than 5 μm. The second width WT2 is a width in a direction (first direction X) orthogonal to a direction (second direction Y) in which the second trench gate structure 70 extends.

The second width WT2 may be from not less than 0.5 μm to not more than 1 μm, from not less than 1 μm to not more than 1.5 μm, from not less than 1.5 μm to not more than 2 μm, from not less than 2 μm to not more than 2.5 μm, from not less than 2.5 μm to not more than 3 μm, from not less than 3 μm to not more than 3.5 μm, from not less than 3.5 μm to not more than 4 μm, from not less than 4 μm to not more than 4.5 μm, or from not less than 4.5 μm to not more than 5 μm. The second width WT2 is preferably from not less than 0.8 μm to not more than 1.2 μm.

The second width WT2 of the second trench gate structure 70 may be equal to or more than the first width WT1 of the first trench gate structure 60 (WT1≤WT2). The second width WT2 may be equal to or less than the first width WT1 (WT1≥WT2). It is preferable that the second width WT2 is equal to the first width WT1 (WT1=WT2).

The second trench gate structure 70 penetrates through the body region 55 and reaches the drift region 54. A second depth DT2 of the second trench gate structure 70 may be from not less than 1 μm to not more than 10 μm. The second depth DT2 may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The second depth DT2 is preferably from not less than 2 μm to not more than 6 μm.

The second depth DT2 of the second trench gate structure 70 may be equal to or more than the first depth DT1 of the first trench gate structure 60 (DT1≤DT2). The second depth DT2 may be equal to or less than the first depth DT1 (DT1≥DT2). It is preferable that the second depth DT2 is equal to the first depth DT1 (DT1=DT2).

The second trench gate structure 70 includes a first side wall 71 on one side, a second side wall 72 on the other side, and a bottom wall 73 which connects the first side wall 71 and the second side wall 72. Hereinafter, the first side wall 71, the second side wall 72, and the bottom wall 73 may be collectively referred to as "an inner wall" or "an outer wall."

An absolute value of an angle (taper angel) formed between the first side wall 71 and the first main surface 3 inside the semiconductor layer 2 may be in excess of 90° and not more than 95° (for example, approximately 91°). The absolute value of an angle (taper angel) formed between the second side wall 72 and the first main surface 3 inside the semiconductor layer 2 may be in excess of 90° and not more than 95° (for example, approximately 91°). The second trench gate structure 70 may be formed in a shape (tapered shape) that the second width WT2 is made narrow from the first main surface 3 side to the bottom wall 73 side in sectional view.

The bottom wall 73 of the second trench gate structure 70 is positioned in a region at the first main surface 3 side with respect to the bottom portion of the drift region 54. The bottom wall 73 of the second trench gate structure 70 is formed in a convex curved shape (U letter shape) toward the bottom portion of the drift region 54.

The bottom wall 73 of the second trench gate structure 70 is positioned in a region at the first main surface 3 side with a second interval IT2 of not less than 1 μm to not more than 10 μm from the bottom portion of the drift region 54. The second interval IT2 may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The second interval IT2 is preferably from not less than 1 μm to not more than 5 μm.

Cell regions 75 are each defined in regions between the plurality of first trench gate structures 60 and the plurality of second trench gate structures 70. The plurality of cell regions 75 are arrayed at intervals along the first direction X, and extend in a band shape along the second direction Y, respectively, in plan view. The plurality of cell regions 75 extend along the same direction as the first trench gate structure 60 and the second trench gate structure 70. The plurality of cell regions 75 are formed in a stripe shape as a whole in plan view.

A first depletion layer spreads inside the drift region 54 from an outer wall of the first trench gate structure 60. The first depletion layer spreads toward a direction along the first main surface 3 from the outer wall of the first trench gate structure 60 and toward the normal direction Z. Similarly, a second depletion layer spreads inside the drift region 54 from the outer wall of the second trench gate structure 70. The second depletion layer spreads toward a direction along the first main surface 3 from the outer wall of the second trench gate structure 70 and toward the normal direction Z.

The second trench gate structure 70 is arrayed at an interval from the first trench gate structure 60 in a manner that the second depletion layer overlaps with the first depletion layer. That is, the second depletion layer overlaps with the first depletion layer in a region at the first main surface 3 side with respect to the bottom wall 73 of the second trench gate structure 70 in the cell region 75. According to the above described structure, since it is possible to suppress an electric field concentration on the first trench gate structure 60 and the second trench gate structure 70, it is possible to suppress a reduction in breakdown voltage.

It is preferable that the second depletion layer overlaps with the first depletion layer in a region at the bottom portion side of the drift region 54 with respect to the bottom wall 73 of the second trench gate structure 70. According to the above described structure, since it is possible to suppress an electric field concentration in the bottom wall 63 of the first trench gate structure 60 and the bottom wall 73 of the second trench gate structure 70, it is possible to appropriately suppress a reduction in breakdown voltage.

A pitch PS between a side wall of the first trench gate structure 60 and that of the second trench gate structure 70 may be from not less than 0.2 μm to not more than 2 μm. The pitch PS is a distance in a direction (first direction X) orthogonal to a direction (second direction Y) in which the first trench gate structure 60 and the second trench gate structure extend between the first side wall 61 (second side wall 62) of the first trench gate structure and the second side wall 72 (first side wall 71) of the second trench gate structure 70.

The pitch PS may be from not less than 0.2 μm to not more than 0.4 μm, from not less than 0.4 μm to not more than 0.6 μm, from not less than 0.6 μm to not more than 0.8 μm, from not less than 0.8 μm to not more than 1.0 μm, from not less than 1.0 μm to not more than 1.2 μm, from not less than 1.2 μm to not more than 1.4 μm, from not less than 1.4 μm to not more than 1.6 μm, from not less than 1.6 μm to not more than 1.8 μm, or from not less than 1.8 μm to not more than 2.0 μm. The pitch PS is preferably from not less than 0.3 μm to not more than 1.5 μm.

A pitch PC between a central portion of the first trench gate structure 60 and that of the second trench gate structure 70 may be from not less than 1 μm to not more than 7 μm. The pitch PC is a distance in a direction (the first direction X) orthogonal to a direction (the second direction Y) in which the first trench gate structure 60 and the second trench gate structure 70 extend between the central portion of the first trench gate structure 60 and the central portion of the second trench gate structure 70.

The pitch PC may be from not less than 1 μm to not more than 2 μm, from not less than 2 μm to not more than 3 μm, from not less than 3 μm to not more than 4 μm, from not less than 4 μm to not more than 5 μm, from not less than 5 μm to not more than 6 μm, or from not less than 6 μm to not more than 7 μm. The pitch PC is preferably from not less than 1 μm to not more than 3 μm.

With reference to FIG. 9 and FIG. 10, more specifically, the first trench gate structure 60 includes a first gate trench 81, a first insulation layer 82, and a first electrode 83. The first gate trench 81 is formed by digging down the first main surface 3 toward the second main surface 4 side.

The first gate trench 81 defines the first side wall 61, the second side wall 62, and the bottom wall 63 of the first trench gate structure 60. Hereinafter, the first side wall 61, the second side wall 62, and the bottom wall 63 of the first trench gate structure 60 shall also be referred to as the first side wall 61, the second side wall 62, and the bottom wall 63 of the first gate trench 81.

The first insulation layer 82 is formed in a film shape along an inner wall of the first gate trench 81. The first insulation layer 82 defines a concave space inside the first gate trench 81. A portion which covers the bottom wall 63 of the first gate trench 81 in the first insulation layer 82 is conformally formed along the bottom wall 63 of the first gate trench 81. Thereby, the first insulation layer 82 defines a U letter space which is recessed in a U letter shape inside the first gate trench 81.

The first insulation layer 82 includes at least any one of silicon oxide ($SiO_2$), silicon nitride (SiN), aluminum oxide ($Al_2O_3$), zirconium oxide ($ZrO_2$), and tantalum oxide ($Ta_2O_3$).

The first insulation layer 82 may have a laminated structure including an SiN layer and an $SiO_2$ layer formed in that order from the semiconductor layer 2 side. The first insulation layer 82 may have a laminated structure including an $SiO_2$ layer and an SiN layer formed in that order from the semiconductor layer 2 side. The first insulation layer 82 has a single layer structure composed of an $SiO_2$ layer or an SiN layer. In this embodiment, the first insulation layer 82 has a single layer structure composed of an $SiO_2$ layer.

The first insulation layer 82 includes a first bottom-side insulation layer 84 and a first opening-side insulation layer 85 which are formed in this order from the bottom wall 63 side of the first gate trench 81 to the first main surface 3 side.

The first bottom-side insulation layer 84 covers the inner wall of the first gate trench 81 at the bottom wall 63 side. More specifically, the first bottom-side insulation layer 84 covers the inner wall of the first gate trench 81 at the bottom wall 63 side with respect to the bottom portion of the body region 55. The first bottom-side insulation layer 84 defines a U letter space at the bottom wall 63 side of the first gate trench 81. The first bottom-side insulation layer 84 has a smooth inner wall surface which defines the U letter space. The first bottom-side insulation layer 84 is in contact with the drift region 54. A part of the first bottom-side insulation layer 84 may be in contact with the body region 55.

The first opening-side insulation layer 85 covers the inner wall of the first gate trench 81 at the opening side. More specifically, the first opening-side insulation layer 85 covers the first side wall 61 and the second side wall 62 of the first gate trench 81 in a region at the opening side of the first gate trench 81 with respect to the bottom portion of the body region 55. The first opening-side insulation layer 85 is in contact with the body region 55. A part of the first opening-side insulation layer 85 may be in contact with the drift region 54.

The first bottom-side insulation layer 84 has a first thickness Ti. The first opening-side insulation layer 85 has a second thickness T2 less than the first thickness T1 (T2<T1). The first thickness T1 is a thickness of the first bottom-side insulation layer 84 along a normal direction of the inner wall of the first gate trench 81. The second thickness T2 is a thickness of the first opening-side insulation layer 85 along the normal direction of the inner wall of the first gate trench 81.

A first ratio T1/WT1 of the first thickness T1 with respect to the first width WT1 of the first gate trench 81 may be from not less than 0.1 to not more than 0.4. Instead, the first ratio T1/WT1 may be from not less than 0.1 to not more than 0.15, from not less than 0.15 to not more than 0.2, from not less than 0.2 to not more than 0.25, from not less than 0.25 to not more than 0.3, from not less than 0.3 to not more than 0.35, or from not less than 0.35 to not more than 0.4. The first ratio T1/WT1 is preferably from not less than 0.25 to not more than 0.35.

The first thickness T1 of the first bottom-side insulation layer 84 may be from not less than 1500 Å to not more than 4000 Å. The first thickness Ti may be from not less than 1500 Å to not more than 2000 Å, from not less than 2000 Å to not more than 2500 Å, from not less than 2500 Å to not more than 3000 Å, from not less than 3000 Å to not more than 3500 Å, or from not less than 3500 Å to not more than 4000 Å. The first thickness T1 is preferably from not less than 1800 Å to not more than 3500 Å.

The first thickness T1 may be adjusted to a range from not less than 4000 Å to not more than 12000 Å according to the first width WT1 of the first gate trench 81. The first thickness Ti may be from not less than 4000 Å to not more than 5000 Å, from not less than 5000 Å to not more than 6000 Å, from not less than 6000 Å to not more than 7000 Å, from not less than 7000 Å to not more than 8000 Å, from not less than 8000 Å to not more than 9000 Å, from not less than 9000 Å to not more than 10000 Å, from not less than 10000 Å to not more than 11000 Å, or from not less than 11000 Å to not more than 12000 Å. In this case, by increasing the thickness of the first bottom-side insulation layer 84, it becomes possible to increase a withstand voltage of the semiconductor device 1.

The second thickness T2 of the first opening-side insulation layer 85 may be from not less than 1/100 to not more than 1/10 of the first thickness T1 of the first bottom-side insulation layer 84. The second thickness T2 may be from not less than 100 Å to not more than 500 Å. The second thickness T2 may be from not less than 100 Å to not more than 200 Å, from not less than 200 Å to not more than 300 Å, from not less than 300 Å to not more than 400 Å, or from not less than 400 Å to not more than 500 Å. The second thickness T2 is preferably from not less than 200 Å to not more than 400 Å.

The first bottom-side insulation layer 84 is formed in a manner that the first thickness T1 is reduced from a part which covers the first side wall 61 and the second side wall 62 of the first gate trench 81 toward a part which covers the bottom wall 63 of the first gate trench 81.

The part which covers the bottom wall 63 of the first gate trench 81 in the first bottom-side insulation layer 84 is smaller in thickness than the part which covers the first side wall 61 and the second side wall 62 of the first gate trench 81 in the first bottom-side insulation layer 84. An opening width of the U letter space in the bottom wall side defined by the first bottom-side insulation layer 84 is expanded by an amount of a reduction in the first thickness Ti. Thereby, the U letter space is suppressed from being tapered. The above-described U letter space is formed, for example, by an etching method (for example, a wet etching method) to the inner wall of the first bottom-side insulation layer 84.

The first electrode 83 is embedded in the first gate trench 81 across the first insulation layer 82. First gate control signals (first control signals) including an ON signal Von and an OFF signal Voff are applied to the first electrode 83. In this embodiment, the first electrode 83 has an insulated separation type split electrode structure including a first bottom-side electrode 86, a first opening-side electrode 87, and a first intermediate insulation layer 88.

The first bottom-side electrode 86 is embedded in the bottom wall 63 side of the first gate trench 81 across the first insulation layer 82. More specifically, the first bottom-side electrode 86 is embedded in the bottom wall 63 side of the first gate trench 81 across the first bottom-side insulation layer 84. The first bottom-side electrode 86 faces the drift region 54 across the first bottom-side insulation layer 84. A part of the first bottom-side electrode 86 may face the body region 55 across the first bottom-side insulation layer 84.

The first bottom-side electrode 86 includes a first upper end portion 86A, a first lower end portion 86B, and a first wall portion 86C. The first upper end portion 86A is positioned at the opening side of the first gate trench 81. The first lower end portion 86B is positioned at the bottom wall 63 side of the first gate trench 81. The first wall portion 86C connects the first upper end portion 86A and the first lower end portion 86B and extends in a wall shape along the inner wall of the first gate trench 81.

The first upper end portion 86A is exposed from the first bottom-side insulation layer 84. The first upper end portion 86A protrudes to the first main surface 3 side with respect to the first bottom-side insulation layer 84. Thereby, the first bottom-side electrode 86 defines an inverted concave recess in sectional view between the first bottom-side insulation layer 84 and the first opening-side insulation layer 85 at the opening side of the first gate trench 81. A width of the first upper end portion 86A is less than a width of the first wall portion 86C.

The first lower end portion 86B is formed in a convex curved shape toward the bottom wall 63 of the first gate trench 81. More specifically, the first lower end portion 86B is conformally formed along the bottom wall of the U letter space defined by the first bottom-side insulation layer 84 and formed in a smooth convex curved shape toward the bottom wall 63 of the first gate trench 81.

According to the above-described structure, since it is possible to suppress a local electric field concentration on the first bottom-side electrode 86, it is possible to suppress a reduction in breakdown voltage. In particular, by embedding the first bottom-side electrode 86 into an expanded U letter space of the first bottom-side insulation layer 84, it becomes possible to appropriately suppress the first bottom-side electrode 86 from being tapered from the first upper end portion 86A to the first lower end portion 86B. Thereby, it is possible to appropriately suppress a local electric field concentration on the first lower end portion 86B of the first bottom-side electrode 86.

The first bottom-side electrode 86 may include at least any one of conductive polysilicon, tungsten, aluminum, copper, an aluminum alloy, and a copper alloy. In this embodiment, the first bottom-side electrode 86 includes conductive polysilicon. The conductive polysilicon may include an n-type impurity or a p-type impurity. The conductive polysilicon preferably includes an n-type impurity.

The first opening-side electrode 87 is embedded into the opening side of the first gate trench 81 across the first insulation layer 82. More specifically, the first opening-side electrode 87 is embedded in the inverted concave recess defined at the opening side of the first gate trench 81 across the first opening-side insulation layer 85. The first opening-side electrode 87 faces the body region 55 across the first opening-side insulation layer 85. A part of the first opening-side electrode 87 may face the drift region 54 across the first opening-side insulation layer 85.

The first opening-side electrode 87 may include at least any one of conductive polysilicon, tungsten, aluminum, copper, an aluminum alloy, and a copper alloy. The first opening-side electrode 87 preferably includes the same type of conductive material as the first bottom-side electrode 86. In this embodiment, the first opening-side electrode 87 includes conductive polysilicon. The conductive polysilicon may include an n-type impurity or a p-type impurity. The conductive polysilicon preferably includes an n-type impurity.

The first intermediate insulation layer 88 is interposed between the first bottom-side electrode 86 and the first opening-side electrode 87 to electrically insulate the first bottom-side electrode 86 and the first opening-side electrode 87. More specifically, the first intermediate insulation layer 88 covers the first bottom-side electrode 86 exposed from the first bottom-side insulation layer 84 in a region between the first bottom-side electrode 86 and the first opening-side electrode 87. The first intermediate insulation layer 88 covers the first upper end portion 86A (more specifically, protruded portion) of the first bottom-side electrode 86. The first intermediate insulation layer 88 is continuous with the first insulation layer 82 (first bottom-side insulation layer 84).

The first intermediate insulation layer 88 has a third thickness T3. The third thickness T3 is less than the first thickness T1 of the first bottom-side insulation layer 84 (T3<T1). The third thickness T3 may be from not less than $1/100$ to not more than $1/10$ of the thickness T1. The third thickness T3 may be from not less than 100 Å to not more than 500 Å. The third thickness T3 may be from not less than 100 Å to not more than 200 Å, from not less than 200 Å to not more than 300 Å, from not less than 300 Å to not more than 400 Å, or from not less than 400 Å to not more than 500 Å. The third thickness T3 is preferably from not less than 200 Å to not more than 400 Å.

The first intermediate insulation layer 88 includes at least any one of silicon oxide ($SiO_2$), silicon nitride (SiN), aluminum oxide ($Al_2O_3$), zirconium oxide ($ZrO_2$), and tantalum oxide ($Ta_2O_3$). In this embodiment, the first intermediate insulation layer 88 has a single layer structure composed of an $SiO_2$ layer.

In this embodiment, an exposed portion which is exposed from the first gate trench 81 in the first opening-side electrode 87 is positioned at the bottom wall 63 side of the first gate trench 81 with respect to the first main surface 3. The exposed portion of the first opening-side electrode 87 is formed in a curved shape toward the bottom wall 63 of the first gate trench 81.

The exposed portion of the first opening-side electrode 87 is covered by a first cap insulation layer 89 formed in a film shape. The first cap insulation layer 89 is continuous with the first insulation layer 82 (first opening-side insulation layer 85) inside the first gate trench 81. The first cap insulation layer 89 may include silicon oxide ($SiO_2$).

Each of the first FET structures 58 further includes a p-type first channel region 91 (first channel). The first channel region 91 is formed in a region which faces the first electrode 83 (first opening-side electrode 87) across the first insulation layer 82 (first opening-side insulation layer 85) in the body region 55.

The first channel region 91 is formed along the first side wall 61 or the second side wall 62 of the first trench gate structure 60, or along the first side wall 61 and the second side wall 62 thereof. In this embodiment, the first channel region 91 is formed along the first side wall 61 and the second side wall 62 of the first trench gate structure 60.

Each of the first FET structure 58 further includes an $n^+$-type first source region 92 formed in a surface layer portion of the body region 55. The first source region 92 demarcates the first channel region 91 with the drift region 54 inside the body region 55. An n-type impurity concentration of the first source region 92 is in excess of an n-type impurity concentration of the drift region 54. The n-type impurity concentration of the first source region 92 may be from not less than $1\times10^{19}$ $cm^{-1}$ to not more than $1\times10^{21}$ $cm^{-3}$.

In this embodiment, each of the first FET structures 58 includes the plurality of first source regions 92. The plurality of first source regions 92 are formed in the surface layer portion of the body region 55 at an interval along the first trench gate structure 60. More specifically, the plurality of first source regions 92 are formed along the first side wall 61 or the second side wall 62 of the first trench gate structure 60, or along the first side wall 61 and the second side wall 62 thereof. In this embodiment, the plurality of first source regions 92 are formed at an interval along the first side wall 61 and the second side wall 62 of the first trench gate structure 60.

The bottom portions of the plurality of first source regions 92 are positioned in a region at the first main surface 3 side with respect to the bottom portion of the body region 55. Thereby, the plurality of first source regions 92 face the first electrode 83 (first opening-side electrode 87) across the first insulation layer 82 (first opening-side insulation layer 85). Thus, the first channel region 91 of the first MISFET 56 is formed in a region which is held between the plurality of first source regions 92 and the drift region 54 in the body region 55.

Each of the first FET structures 58 further includes a $p^+$-type first contact region 93 formed in the surface layer portion of the body region 55. A p-type impurity concentration of the first contact region 93 is in excess of a p-type impurity concentration of the body region 55. The p-type impurity concentration of the first contact region 93 may be, for example, from not less than $1 \times 10^{19}$ cm$^{-3}$ to not more than $1 \times 10^{21}$ cm$^{-3}$.

In this embodiment, each of the first FET structure 58 includes a plurality of first contact regions 93. The plurality of first contact regions 93 are formed in the surface layer portion of the body region 55 at an interval along the first trench gate structure 60. More specifically, the plurality of first contact regions 93 are formed along the first side wall 61 or the second side wall 62 of the first trench gate structure 60, or along the first side wall 61 and the second side wall 62 thereof.

In this embodiment, the plurality of first contact regions 93 are formed at an interval along the first side wall 61 and the second side wall 62 of the first trench gate structure 60. More specifically, the plurality of first contact regions 93 are formed in the surface layer portion of the body region 55 in a manner that the plurality of first contact regions 93 are alternately arrayed with the plurality of first source regions 92. The bottom portions of the plurality of first contact regions 93 are positioned in a region at the first main surface 3 side with respect to the bottom portion of the body region 55.

With reference to FIG. 9 and FIG. 11, the second trench gate structure 70 includes a second gate trench 101, a second insulation layer 102, and a second electrode 103. The second gate trench 101 is formed by digging down the first main surface 3 toward the second main surface 4 side.

The second gate trench 101 defines the first side wall 71, the second side wall 72, and the bottom wall 73 of the second trench gate structure 70. Hereinafter, the first side wall 71, the second side wall 72, and the bottom wall 73 of the second trench gate structure 70 are also referred to as the first side wall 71, the second side wall 72, and the bottom wall 73 of the second gate trench 101.

The second insulation layer 102 is formed in a film shape along an inner wall of the second gate trench 101. The second insulation layer 102 defines a concave space inside the second gate trench 101. A part which covers the bottom wall 73 of the second gate trench 101 in the second insulation layer 102 is conformally formed along the bottom wall 73 of the second gate trench 101. Thereby, the second insulation layer 102 defines a U letter space recessed in a U letter shape inside the second gate trench 101.

The second insulation layer 102 includes at least any one of silicon oxide ($SiO_2$), silicon nitride (SiN), aluminum oxide ($Al_2O_3$), zirconium oxide ($ZrO_2$), and tantalum oxide ($Ta_2O_3$).

The second insulation layer 102 may have a laminated structure including an SiN layer and an $SiO_2$ layer formed in that order from the semiconductor layer 2 side. The second insulation layer 102 may have a laminated structure including an $SiO_2$ layer and an SiN layer formed in that order from the semiconductor layer 2 side. The second insulation layer 102 has a single layer structure composed of an $SiO_2$ layer or an SiN layer. In this embodiment, the second insulation layer 102 has a single layer structure composed of an $SiO_2$ layer.

The second insulation layer 102 includes a second bottom-side insulation layer 104 and a second opening-side insulation layer 105 which are formed in this order from the bottom wall 73 side of the second gate trench 101 to the first main surface 3 side.

The second bottom-side insulation layer 104 covers the inner wall of the second gate trench 101 at the bottom wall 73 side. More specifically, the second bottom-side insulation layer 104 covers the inner wall of the second gate trench 101 at the bottom wall 73 side with respect to the bottom portion of the body region 55. The second bottom-side insulation layer 104 defines a U letter space at the bottom wall 73 side of the second gate trench 101. The second bottom-side insulation layer 104 has a smooth inner wall surface which defines the U letter space. The second bottom-side insulation layer 104 is in contact with the drift region 54. A part of the second bottom-side insulation layer 104 may be in contact with the body region 55.

The second opening-side insulation layer 105 covers the inner wall of the second gate trench 101 at the opening side. More specifically, the second opening-side insulation layer 105 covers the first side wall 71 and the second side wall 72 of the second gate trench 101 in a region of the second gate trench 101 at the opening side with respect to the bottom portion of the body region 55. The second opening-side insulation layer 105 is in contact with the body region 55. A part of the second opening-side insulation layer 105 may be in contact with the drift region 54.

The second bottom-side insulation layer 104 has a fourth thickness T4. The second opening-side insulation layer 105 has a fifth thickness T5 less than the fourth thickness T4 (T5<T4). The fourth thickness T4 is a thickness of the second bottom-side insulation layer 104 along a normal direction of the inner wall of the second gate trench 101. The fifth thickness T5 is a thickness of the second opening-side insulation layer 105 along the normal direction of the inner wall of the second gate trench 101.

A second ratio T4/WT2 of the fourth thickness T4 with respect to the second width WT2 of the second gate trench 101, may be from not less than 0.1 to not more than 0.4. The second ratio T4/WT2 may be, for example, from not less than 0.1 to not more than 0.15, from not less than 0.15 to not more than 0.2, from not less than 0.2 to not more than 0.25, from not less than 0.25 to not more than 0.3, from not less than 0.3 to not more than 0.35, or from not less than 0.35 to not more than 0.4. The second ratio T4/WT2 is preferably from not less than 0.25 to not more than 0.35.

The second ratio T4/WT2 may be equal to or less than the first ratio T1/WT1 (T4/WT2≤T1/WT1). The second ratio T4/WT2 may be equal to or more than the first ratio T1/WT1 (T4/WT2≥T1/WT1). Instead, the second ratio T4/WT2 may be equal to the first ratio T1/WT1 (T4/WT2=T1/WT1).

The fourth thickness T4 of the second bottom-side insulation layer 104 may be from not less than 1500 Å to not more than 4000 Å. The fourth thickness T4 may be from not less than 1500 Å to not more than 2000 Å, from not less than 2000 Å to not more than 2500 Å, from not less than 2500 Å to not more than 3000 Å, from not less than 3000 Å to not more than 3500 Å, or from not less than 3500 Å to not more than 4000 Å. The fourth thickness T4 is preferably from not less than 1800 Å to not more than 3500 Å.

The fourth thickness T4 may be from not less than 4000 Å to not more than 12000 Å according to the second width WT2 of the second gate trench 101. The fourth thickness T4 may be from not less than 4000 Å to not more than 5000 Å, from not less than 5000 Å to not more than 6000 Å, from not less than 6000 Å to not more than 7000 Å, from not less than 7000 Å to not more than 8000 Å, from not less than 8000 Å to not more than 9000 Å, from not less than 9000 Å to not more than 10000 Å, from not less than 10000 Å to not more than 11000 Å, or from not less than 11000 Å to not more than 12000 Å. In this case, by increasing the thickness of the second bottom-side insulation layer 104, it becomes possible to increase a withstand voltage of the semiconductor device 1.

The fourth thickness T4 may be equal to or less than the first thickness Ti (T4≤Ti). The fourth thickness T4 may be equal to or more than the first thickness T1 (T4≥T1). The fourth thickness T4 may be equal to the first thickness T1 (T4=T1).

The fifth thickness T5 of the second opening-side insulation layer 105 is less than the fourth thickness T4 of the second bottom-side insulation layer 104 (T5<T4). The fifth thickness T5 may be from not less than 1/100 of the fourth thickness T4 to not more than 1/10. The fifth thickness T5 may be from not less than 100 Å to not more than 500 Å. The fifth thickness T5 may be from not less than 100 Å to not more than 200 Å, from not less than 200 Å to not more than 300 Å, from not less than 300 Å to not more than 400 Å, or from not less than 400 Å to not more than 500 Å. The fifth thickness T5 is preferably from not less than 200 Å to not more than 400 Å.

The fifth thickness T5 may be equal to or less than the second thickness T2 (T5≤T2). The fifth thickness T5 may be equal to or more than the second thickness T2 (T5≥T2). The fifth thickness T5 may be equal to the second thickness T2 (T5=T2).

The second bottom-side insulation layer 104 is formed in a manner that the fourth thickness T4 is reduced from a part which covers the first side wall 71 and the second side wall 72 of the second gate trench 101 toward a part which covers the bottom wall 73 of the second gate trench 101.

The part which covers the bottom wall 73 of the second gate trench 101 in the second bottom-side insulation layer 104 is smaller in thickness than the part which covers the first side wall 71 and the second side wall 72 of the second gate trench 101 in the second bottom-side insulation layer 104. An opening width of the U letter space defined by the second bottom-side insulation layer 104 at the bottom wall side is expanded by an amount of a reduction in the fourth thickness T4. Thereby, the U letter space is suppressed from being tapered. The above-described U letter space is formed, for example, by an etching method (for example, a wet etching method) to the inner wall of the second bottom-side insulation layer 104.

The second electrode 103 is embedded in the second gate trench 101 across the second insulation layer 102. Second gate control signals (second control signals) including an ON signal Von and an OFF signal Voff are applied to the second electrode 103.

In this embodiment, the second electrode 103 has an insulated-separation type split electrode structure including a second bottom-side electrode 106, a second opening-side electrode 107, and a second intermediate insulation layer 108. In this embodiment, the second bottom-side electrode 106 is electrically connected to the first bottom-side electrode 86. The second opening-side electrode 107 is electrically insulated from the first opening-side electrode 87.

The second bottom-side electrode 106 is embedded in the bottom wall 73 side of the second gate trench 101 across the second insulation layer 102. More specifically, the second bottom-side electrode 106 is embedded in the bottom wall 73 side of the second gate trench 101 across the second bottom-side insulation layer 104. The second bottom-side electrode 106 faces the drift region 54 across the second bottom-side insulation layer 104. A part of the second bottom-side electrode 106 may face the body region 55 across the second bottom-side insulation layer 104.

The second bottom-side electrode 106 includes a second upper end portion 106A, a second lower end portion 106B, and a second wall portion 106C. The second upper end portion 106A is positioned at an opening side of the second gate trench 101. The second lower end portion 106B is positioned at the bottom wall 73 side of the second gate trench 101. The second wall portion 106C connects the second upper end portion 106A and the second lower end portion 106B and extends in a wall shape along the inner wall of the second gate trench 101.

The second upper end portion 106A is exposed from the second bottom-side insulation layer 104. The second upper end portion 106A protrudes to the first main surface 3 side with respect to the second bottom-side insulation layer 104. Thereby, the second bottom-side electrode 106 defines an inverted concave recess in sectional view between the second bottom-side insulation layer 104 and the second opening-side insulation layer 105 at the opening side of the second gate trench 101. A width of the second upper end portion 106A is less than a width of the second wall portion 106C.

The second lower end portion 106B is formed in a convex curved shape toward the bottom wall 73 of the second gate trench 101. More specifically, the second lower end portion 106B is conformally formed along a bottom wall of the U letter space defined by the second bottom-side insulation layer 104 and formed in a smooth convex curved shape toward the bottom wall 73 of the second gate trench 101.

According to the above-described structure, since it is possible to suppress a local electric field concentration on the second bottom-side electrode 106, it is possible to suppress a reduction in breakdown voltage. In particular, by embedding the second bottom-side electrode 106 into the U letter space expanded by the second bottom-side insulation layer 104, it becomes possible to appropriately suppress the second bottom-side electrode 106 from being tapered from the second upper end portion 106A to the second lower end portion 106B. Thereby, it is possible to appropriately suppress a local electric field concentration at the second lower end portion 106B of the second bottom-side electrode 106.

The second bottom-side electrode 106 may include at least any one of conductive polysilicon, tungsten, aluminum, copper, an aluminum alloy, and a copper alloy. In this embodiment, the second bottom-side electrode 106 includes conductive polysilicon. The conductive polysilicon may include an n-type impurity or a p-type impurity. The conductive polysilicon preferably includes an n-type impurity.

The second opening-side electrode 107 is embedded in the opening side of the second gate trench 101 across the second insulation layer 102. More specifically, the second opening-side electrode 107 is embedded in the inverted concave recess defined at the opening side of the second gate trench 101 across the second opening-side insulation layer 105. The second opening-side electrode 107 faces the body region 55 across the second opening-side insulation layer 105. A part of the second opening-side electrode 107 may face the drift region 54 across the second opening-side insulation layer 105.

The second opening-side electrode 107 may include at least any one of conductive polysilicon, tungsten, aluminum, copper, an aluminum alloy, and a copper alloy. The second opening-side electrode 107 preferably includes the same type of conductive material as the second bottom-side electrode 106. In this embodiment, the second opening-side electrode 107 includes conductive polysilicon. The conductive polysilicon may include an n-type impurity or a p-type impurity. The conductive polysilicon preferably includes an n-type impurity.

The second intermediate insulation layer 108 is interposed between the second bottom-side electrode 106 and the second opening-side electrode 107 to electrically insulate the second bottom-side electrode 106 and the second opening-side electrode 107. More specifically, the second intermediate insulation layer 108 covers the second bottom-side electrode 106 exposed from the second bottom-side insulation layer 104 in a region between the second bottom-side electrode 106 and the second opening-side electrode 107. The second intermediate insulation layer 108 covers the second upper end portion 106A of the second bottom-side electrode 106 (more specifically, a protruded portion). The second intermediate insulation layer 108 is continuous with the second insulation layer 102 (second bottom-side insulation layer 104).

The second intermediate insulation layer 108 has a sixth thickness T6. The sixth thickness T6 is less than the fourth thickness T4 of the second bottom-side insulation layer 104 (T6<T4). The sixth thickness T6 may be from not less than 1/100 of the fourth thickness T4 to not more than 1/10. The sixth thickness T6 may be from not less than 100 Å to not more than 500 Å. The sixth thickness T6 may be from not less than 100 Å to not more than 200 Å, from not less than 200 Å to not more than 300 Å, from not less than 300 Å to not more than 400 Å, or from not less than 400 Å to not more than 500 Å. The sixth thickness T6 is preferably from not less than 200 Å to not more than 400 Å.

The sixth thickness T6 may be equal to or less than the third thickness T3 (T6≤T3). The sixth thickness T6 may be equal to or more than the third thickness T3 (T6≥T3). The sixth thickness T6 may be equal to the third thickness T3 (T6=T3).

The second intermediate insulation layer 108 includes at least any one of silicon oxide ($SiO_2$), silicon nitride (SiN), aluminum oxide ($Al_2O_3$), zirconium oxide ($ZrO_2$), and tantalum oxide ($Ta_2O_3$). In this embodiment, the second intermediate insulation layer 108 has a single layer structure composed of an $SiO_2$ layer.

In this embodiment, an exposed portion which is exposed from the second gate trench 101 in the second opening-side electrode 107 is positioned at the bottom wall 73 side of the second gate trench 101 with respect to the first main surface 3. The exposed portion of the second opening-side electrode 107 is formed in a curved shape toward the bottom wall 73 of the second gate trench 101.

The exposed portion of the second opening-side electrode 107 is covered by a second cap insulation layer 109 formed in a film shape. The second cap insulation layer 109 is continuous with the second insulation layer 102 (second opening-side insulation layer 105) inside the second gate trench 101. The second cap insulation layer 109 may include silicon oxide ($SiO_2$).

Each of the second FET structures 68 further includes a p-type second channel region 111 (second channel). More specifically, the second channel region 111 is formed in a region which faces the second electrode 103 (second opening-side electrode 107) across the second insulation layer 102 (second opening-side insulation layer 105) in the body region 55.

More specifically, the second channel region 111 is formed along the first side wall 71 or the second side wall 72 of the second trench gate structure 70, or along the first side wall 71 and the second side wall 72 thereof. In this embodiment, the second channel region 111 is formed along the first side wall 71 and the second side wall 72 of the second trench gate structure 70.

Each of the second FET structures 68 further includes an n+-type second source region 112 formed in the surface layer portion of the body region 55. The second source region 112 demarcates the second channel region 111 with the drift region 54 inside the body region 55.

An n-type impurity concentration of the second source region 112 is in excess of an n-type impurity concentration of the drift region 54. The n-type impurity concentration of the second source region 112 may be from not less than $1\times10^{19}$ cm$^{-3}$ to not more than $1\times10^{21}$ cm$^{-3}$. It is preferable that the n-type impurity concentration of the second source region 112 is equal to the n-type impurity concentration of the first source region 92.

In this embodiment, each of the second FET structures 68 includes the plurality of second source regions 112. The plurality of second source regions 112 are formed in the surface layer portion of the body region 55 at an interval along the second trench gate structure 70. Specifically, the plurality of second source regions 112 are formed along the first side wall 71 or the second side wall 72 of the second trench gate structure 70, or along the first side wall 71 and the second side wall 72 thereof. In this embodiment, the plurality of second source regions 112 are formed at an interval along the first side wall 71 and the second side wall 72 of the second trench gate structure 70.

In this embodiment, each of the second source regions 112 faces each of the first source regions 92 along the first direction X. Each of the second source regions 112 is integrally formed with each of the first source regions 92. FIG. 7 and FIG. 8 show that the first source region 92 and the second source region 112 are distinguished from each other by a boundary line. However, in actuality, there is no clear boundary line in a region between the first source region 92 and the second source region 112.

The second source regions 112 may be each formed such as to be shifted from each of the first source regions 92 in the second direction Y such as not to face some of or all of the first source regions 92 along the first direction X. That is, the plurality of first source regions 92 and the plurality of second source regions 112 may be arrayed in a staggered manner in plan view.

The bottom portions of the plurality of second source regions 112 are positioned in a region at the first main surface 3 side with respect to the bottom portion of the body region Thereby, the plurality of second source regions 112 face the second electrode 103 (second opening-side electrode 107) across the second insulation layer 102 (second opening-side insulation layer 105). Thus, the second channel region 111 of the second MISFET 57 is formed in a region held between the plurality of second source regions 112 and the drift region 54 in the body region 55.

Each of the second FET structures 68 further includes a p+-type second contact region 113 formed in the surface layer portion of the body region 55. A p-type impurity concentration of the second contact region 113 is in excess of a p-type impurity concentration of the body region 55. The p-type impurity concentration of the second contact region 113 may be from not less than $1\times10^{19}$ cm$^{-3}$ to not more than $1\times10^{21}$ cm$^{-3}$. It is preferable that the p-type impurity concentration of the second contact region 113 is equal to the p-type impurity concentration of the first contact region 93.

In this embodiment, each of the second FET structures 68 includes the plurality of second contact regions 113. The plurality of second contact regions 113 are formed in the surface layer portion of the body region 55 at an interval along the second trench gate structure 70. More specifically, the plurality of second contact regions 113 are formed along the first side wall 71 or the second side wall 72 of the second trench gate structure 70, or along the first side wall 71 and the second side wall 72 thereof. The bottom portions of the plurality of second contact regions 113 are positioned in a region in the first main surface 3 side with respect to the bottom portion of the body region 55.

In this embodiment, the plurality of second contact regions 113 are formed at an interval along the first side wall 71 and the second side wall 72 of the second trench gate structure 70. More specifically, the plurality of second contact regions 113 are formed in the surface layer portion of the body region 55 in a manner that the plurality of second contact regions 113 are arrayed alternately with the plurality of second source regions 112.

With reference to FIG. 7 and FIG. 8, in this embodiment, each of the second contact regions 113 faces each of the first contact regions 93 along the first direction X. Each of the second contact regions 113 is integrally formed with each of the first contact regions 93.

In FIG. 7, in order to distinguish the first contact region 93 and the second contact region 113 from the first source region 92 and the second source region 112, the first contact region 93 and the second contact region 113 are collectively indicated by a reference sign of "p+." Further, in FIG. 8, it is shown that the first contact region 93 is distinguished from the second contact region 113 by a boundary line. However, in actuality, there is no clear boundary line in a region between the first contact region 93 and the second contact region 113.

Each of the second contact regions 113 may be formed such as to be shifted from each of the first contact regions 93 in the second direction Y such as not to face some of or all of the first contact regions 93 along the first direction X. That is, the plurality of first contact regions 93 and the plurality of second contact regions 113 may be arrayed in a staggered manner in plan view.

With reference to FIG. 7 and FIG. 8, in this embodiment, the body region 55 is exposed from a region between one end portion of the first trench gate structure 60 and one end portion of the second trench gate structure 70 in the first main surface 3 of the semiconductor layer 2. Any of the first source region 92, the first contact region 93, the second source region 112, and the second contact region 113 is not formed in the region held between one end portion of the first trench gate structure 60 and one end portion of the second trench gate structure 70 in the first main surface 3.

Similarly, although not shown in the drawings, in this embodiment, the body region is exposed from a region between the other end portion of the first trench gate structure and the other end portion of the second trench gate structure 70 in the first main surface 3 of the semiconductor layer 2. Any of the first source region 92, the first contact region 93, the second source region 112, and the second contact region 113 is not formed in the region held between the other end portion of the first trench gate structure 60 and the other end portion of the second trench gate structure 70.

With reference to FIG. 5 to FIG. 8, a plurality of (Here, two) trench contact structures 120 are formed in the first main surface 3 of the semiconductor layer 2. The plurality of trench contact structures 120 include a trench contact structure 120 at one side and a trench contact structure 120 at the other side.

The trench contact structure 120 at one side is positioned in a region at the side of one end portion of the first trench gate structure 60 and one end portion of the second trench gate structure 70. The trench contact structure 120 at the other side is positioned in a region at the side of the other end portion of the first trench gate structure 60 and at the other end portion of the second trench gate structure 70.

The trench contact structure 120 at the other side is substantially similar in structure to the trench contact structure 120 at one side. Hereinafter, a structure of the trench contact structure 120 at one side shall be described as an example, and a specific description of a structure of the trench contact structure 120 at the other side shall be omitted.

The trench contact structure 120 is connected to one end portion of the first trench gate structure 60 and one end portion of the second trench gate structure 70. In this embodiment, the trench contact structure 120 extends in a band shape along the first direction X in plan view.

A width WTC of the trench contact structure 120 may be from not less than 0.5 μm to not more than 5 μm. The width WTC is a width in a direction (second direction Y) orthogonal to a direction (first direction X) in which the trench contact structure 120 extends.

The width WTC may be from not less than 0.5 μm to not more than 1 μm, from not less than 1 μm to not more than 1.5 μm, from not less than 1.5 μm to not more than 2 μm, from not less than 2 μm to not more than 2.5 μm, from not less than 2.5 μm to not more than 3 μm, from not less than 3 μm to not more than 3.5 μm, from not less than 3.5 μm to not more than 4 μm, from not less than 4 μm to not more than 4.5 μm, or from not less than 4.5 μm to not more than 5 μm. The width WTC is preferably from not less than 0.8 μm to not more than 1.2 μm.

It is preferable that the width WTC is equal to the first width WT1 of the first trench gate structure 60 (WTC=WT1). It is preferable that the width WTC is equal to the second width WT2 of the second trench gate structure 70 (WTC=WT2).

The trench contact structure 120 penetrates through the body region 55 and reaches the drift region 54. A depth DTC of the trench contact structure 120 may be from not less than 1 μm to not more than 10 μm. The depth DTC may be from may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The depth DTC is preferably from not less than 2 μm to not more than 6 μm.

It is preferable that the depth DTC is equal to the first depth DT1 of the first trench gate structure 60 (DTC=DT1). It is preferable that the depth DTC is equal to the second depth DT2 of the second trench gate structure 70 (DTC=DT2).

The trench contact structure 120 includes a first side wall 121 on one side, a second side wall 122 on the other side, and a bottom wall 123 which connects the first side wall 121 and the second side wall 122. Hereinafter, the first side wall 121, the second side wall 122, and the bottom wall 123 may be collectively referred to as "an inner wall." The first side wall 121 is a connection surface which is connected to the first trench gate structure 60 and the second trench gate structure 70.

The first side wall 121, the second side wall 122, and the bottom wall 123 are positioned inside the drift region 54. The first side wall 121 and the second side wall 122 extend along the normal direction Z. The first side wall 121 and the second side wall 122 may be formed perpendicularly to the first main surface 3.

An absolute value of an angle (taper angel) formed between the first side wall 121 and the first main surface 3 inside semiconductor layer 2 may be in excess of 90° and not more than 95° (for example, approximately 91°). The absolute value of an angle (taper angel) formed between the second side wall 122 and the first main surface 3 inside the semiconductor layer 2 may be in excess of 90° and not more than 95° (for example, approximately 91°). The trench contact structure 120 may be formed in a shape (tapered shape) that the width WTC is made narrow from the first main surface 3 side of the semiconductor layer 2 to the bottom wall 123 side in sectional view.

The bottom wall 123 is positioned in a region at the first main surface 3 side with respect to the bottom portion of the drift region 54. The bottom wall 123 is formed in a convex curved shape toward the bottom portion of the drift region 54. The bottom wall 123 is positioned in a region at the first main surface 3 side with an interval ITC of not less than 1 μm to not more than 10 μm from the bottom portion of the drift region 54. The interval ITC may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The interval ITC is preferably from not less than 1 μm to not more than 5 μm.

It is preferable that the interval ITC is equal to the first interval IT1 of the first trench gate structure 60 (ITC=IT1). It is preferable that the interval ITC is equal to the second interval IT2 of the second trench gate structure 70 (ITC=IT2).

The trench contact structure 120 includes a contact trench 131, a contact insulation layer 132, and a contact electrode 133. The contact trench 131 is formed by digging down the first main surface 3 of the semiconductor layer 2 toward the second main surface 4 side.

The contact trench 131 defines the first side wall 121, the second side wall 122, and the bottom wall 123 of the trench contact structure 120. Hereinafter, the first side wall 121, the second side wall 122, and the bottom wall 123 of the trench contact structure 120 are also referred to as the first side wall 121, the second side wall 122, and the bottom wall 123 of the contact trench 131.

The first side wall 121 of the contact trench 131 communicates with the first side wall 61 and the second side wall 62 of the first gate trench 81. The first side wall 121 of the contact trench 131 communicates with the first side wall 71 and the second side wall 72 of the second gate trench 101. The contact trench 131 forms one trench with the first gate trench 81 and the second gate trench 101.

The contact insulation layer 132 is formed in a film shape along an inner wall of the contact trench 131. The contact insulation layer 132 defines a concave space inside the contact trench 131. A part which covers the bottom wall 123 of the contact trench 131 in the contact insulation layer 132 is conformally formed along the bottom wall 123 of the contact trench 131.

The contact insulation layer 132 defines a U letter space recessed in a U letter shape inside the contact trench 131 in a manner similar to the first bottom-side insulation layer 84 (second bottom-side insulation layer 104). That is, the contact insulation layer 132 defines a U letter space in which a region of the contact trench 131 at the bottom wall 123 side is expanded and suppressed from being tapered. The above-described U letter space is formed, for example, by an etching method (for example, a wet etching method) to the inner wall of the contact insulation layer 132.

The contact insulation layer 132 has a seventh thickness T7. The seventh thickness T7 may be from not less than 1500 Å to not more than 4000 Å. The seventh thickness T7 may be from not less than 1500 Å to not more than 2000 Å, from not less than 2000 Å to not more than 2500 Å, from not less than 2500 Å to not more than 3000 Å, from not less than 3000 Å to not more than 3500 Å, or from not less than 3500 Å to not more than 4000 Å. The seventh thickness T7 is preferably from not less than 1800 Å to not more than 3500 Å.

The seventh thickness T7 may be from not less than 4000 Å to not more than 12000 Å according to the width WTC of the trench contact structure 120. The seventh thickness T7 may be from not less than 4000 Å to not more than 5000 Å, from not less than 5000 Å to not more than 6000 Å, from not less than 6000 Å to not more than 7000 Å, from not less than 7000 Å to not more than 8000 Å, from not less than 8000 Å to not more than 9000 Å, from not less than 9000 Å to not more than 10000 Å, from not less than 10000 Å to not more than 11000 Å, or from not less than 11000 Å to not more than 12000 Å. In this case, by increasing the thickness of the contact insulation layer 132, it becomes possible to increase a withstand voltage of the semiconductor device 1.

It is preferable that the seventh thickness T7 is equal to the first thickness T1 of the first bottom-side insulation layer 84 (T7=Ti). It is preferable that the seventh thickness T7 is equal to the fourth thickness T4 of the second bottom-side insulation layer 104 (T7=T4).

The contact insulation layer 132 includes at least any one of silicon oxide ($SiO_2$), silicon nitride (SiN), aluminum oxide ($Al_2O_3$), zirconium oxide ($ZrO_2$), and tantalum oxide ($Ta_2O_3$).

The contact insulation layer 132 may have a laminated structure including an SiN layer and an $SiO_2$ layer formed in that order from the semiconductor layer 2 side. The contact insulation layer 132 may have a laminated structure including an $SiO_2$ layer and an SiN layer formed in that order from the semiconductor layer 2 side. The contact insulation layer 132 has a single layer structure composed of an $SiO_2$ layer or an SiN layer. In this embodiment, the contact insulation layer 132 has a single layer structure composed of an $SiO_2$ layer. The contact insulation layer 132 is preferably composed of the same insulating material as the first insulation layer 82 (second insulation layer 102).

The contact insulation layer 132 is integrally formed with the first insulation layer 82 in a communication portion between the first gate trench 81 and the contact trench 131. The contact insulation layer 132 is integrally formed with the second insulation layer 102 in a communication portion between the second gate trench 101 and the contact trench 131.

In this embodiment, the contact insulation layer 132 has a lead-out insulation layer 132A which is led out to one end portion of the first gate trench 81 and one end portion of the second gate trench 101. The lead-out insulation layer 132A crosses the communication portion to cover an inner wall of one end portion of the first gate trench 81. The lead-out insulation layer 132A crosses the communication portion to cover an inner wall of one end portion of the second gate trench 101.

The lead-out insulation layer 132A is integrally formed with the first bottom-side insulation layer 84 and the first opening-side insulation layer 85 inside the first gate trench 81. The lead-out insulation layer 132A defines a U letter space together with the first bottom-side insulation layer 84 at the inner wall of one end portion of the first gate trench 81.

The lead-out insulation layer 132A is integrally formed with the second bottom-side insulation layer 104 and the second opening-side insulation layer 105 inside the second gate trench 101. The lead-out insulation layer 132A defines the U letter space together with the second bottom-side insulation layer 104 at the inner wall of one end portion of the second gate trench 101.

The contact electrode 133 is embedded in the contact trench 131 across the contact insulation layer 132. The contact electrode 133 is embedded in the contact trench 131 as an integrated member unlike the first electrode 83 and the second electrode 103. The contact electrode 133 has an upper end portion exposed from the contact trench 131 and a lower end portion in contact with the contact insulation layer 132.

The lower end portion of the contact electrode 133 is formed in a convex curved shape toward the bottom wall 123 of the contact trench 131 in a manner similar to the first bottom-side electrode 86 (second bottom-side electrode 106). More specifically, the lower end portion of the contact electrode 133 is conformally formed along the bottom wall of the U letter space defined by the contact insulation layer 132 and formed in a smooth convex curved shape toward the bottom wall 123.

According to the above-described structure, since it is possible to suppress a local electric field concentration on the contact electrode 133, it is possible to suppress a reduction in breakdown voltage. In particular, by embedding the contact electrode 133 into the expanded U letter space of the contact insulation layer 132, it becomes possible to appropriately suppress the contact electrode 133 from being tapered from the upper end portion to the lower end portion. Thereby, it is possible to appropriately suppress a local electric field concentration on the lower end portion of the contact insulation layer 132.

The contact electrode 133 is electrically connected to the first bottom-side electrode 86 at the connection portion between the first gate trench 81 and the contact trench 131. The contact electrode 133 is electrically connected to the second bottom-side electrode 106 at the connection portion between the second gate trench 101 and the contact trench 131. Thereby, the second bottom-side electrode 106 is electrically connected to the first bottom-side electrode 86.

More specifically, the contact electrode 133 has a lead-out electrode 133A which is led out to one end portion of the first gate trench 81 and one end portion of the second gate trench 101. The lead-out electrode 133A crosses the communication portion between the first gate trench 81 and the contact trench 131 and is positioned inside the first gate trench 81. The lead-out electrode 133A also crosses the communication portion between the second gate trench 101 and the contact trench 131 and is positioned inside the second gate trench 101.

The lead-out electrode 133A is embedded in a U letter space defined by the contact insulation layer 132 inside the first gate trench 81. The lead-out electrode 133A is integrally formed with the first bottom-side electrode 86 inside the first gate trench 81. Thereby, the contact electrode 133 is electrically connected to the first bottom-side electrode 86.

The first intermediate insulation layer 88 is interposed between the contact electrode 133 and the first opening-side electrode 87 inside the first gate trench 81. Thereby, the contact electrode 133 is electrically insulated from the first opening-side electrode 87 inside the first gate trench 81.

The lead-out electrode 133A is embedded in the U letter space defined by the contact insulation layer 132 inside the second gate trench 101. The lead-out electrode 133A is integrally formed with the second bottom-side electrode 106 inside the second gate trench 101. Thereby, the contact electrode 133 is electrically connected to the second bottom-side electrode 106.

The second intermediate insulation layer 108 is interposed between the contact electrode 133 and the second opening-side electrode 107 inside the second gate trench 101. Thereby, the contact electrode 133 is electrically insulated from the second opening-side electrode 107 inside the second gate trench 101.

The contact electrode 133 may include at least any one of conductive polysilicon, tungsten, aluminum, copper, an aluminum alloy, and a copper alloy. In this embodiment, the contact electrode 133 may include conductive polysilicon. The conductive polysilicon may include an n-type impurity or a p-type impurity. The conductive polysilicon preferably includes an n-type impurity. It is preferable that the contact electrode 133 includes the same conductive material as the first bottom-side electrode 86 and the second bottom-side electrode 106.

In this embodiment, an exposed portion which is exposed from the contact trench 131 in the contact electrode 133 is positioned at the bottom wall 123 side of the contact trench 131 with respect to the first main surface 3. The exposed portion of the contact electrode 133 is formed in a curved shape toward the bottom wall 123 of the contact trench 131.

The exposed portion of the contact electrode 133 is covered by a third cap insulation layer 139 which is formed in a film shape. The third cap insulation layer 139 is continuous with the contact insulation layer 132 inside the contact trench 131. The third cap insulation layer 139 may include silicon oxide ($SiO_2$).

With reference to FIG. 5 to FIG. 11, the semiconductor device 1 includes a main surface insulation layer 141 which is formed on the first main surface 3 of the semiconductor layer 2. The main surface insulation layer 141 selectively covers the first main surface 3. The main surface insulation layer 141 is continuous with the first insulation layer 82, the second insulation layer 102, and the contact insulation layer 132. The main surface insulation layer 141 includes at least any one of silicon oxide ($SiO_2$), silicon nitride (SiN), aluminum oxide ($Al_2O_3$), zirconium oxide ($ZrO_2$), and tantalum oxide ($Ta_2O_3$).

The main surface insulation layer 141 may have a laminated structure including an SiN layer and an $SiO_2$ layer formed in that order from the semiconductor layer 2 side. The main surface insulation layer 141 may have a laminated structure including an $SiO_2$ layer and an SiN layer formed in that order from the semiconductor layer 2 side. The main surface insulation layer 141 has a single layer structure composed of an $SiO_2$ layer or an SiN layer. In this embodiment, the main surface insulation layer 141 has a single layer structure composed of an $SiO_2$ layer. In this embodiment, the main surface insulation layer 141 has a single layer structure composed of an $SiO_2$ layer. The main surface insulation layer 141 is preferably composed of the same insulating material as the first insulation layer 82, the second insulation layer 102, and the contact insulation layer 132.

The semiconductor device 1 includes an interlayer insulation layer 142 is formed over the main surface insulation layer 141. The interlayer insulation layer 142 may have a thickness in excess of a thickness of the main surface insulation layer 141. The interlayer insulation layer 142 covers a substantially entire region of the main surface insulation layer 141. The interlayer insulation layer 142 includes, for example, at least any one of silicon oxide ($SiO_2$), silicon nitride (SiN), aluminum oxide ($Al_2O_3$), zirconium oxide ($ZrO_2$), and tantalum oxide ($Ta_2O_3$).

Here, the interlayer insulation layer 142 includes a USG (Undoped Silica Glass) layer as an example of silicon oxide. The interlayer insulation layer 142 may have a single layer structure composed of a USG layer. The interlayer insulation layer 142 may have a flattened main surface. The main surface of the interlayer insulation layer 142 may be a ground surface which is ground by a CMP (Chemical Mechanical Polishing) method.

The interlayer insulation layer 142 may include PSG (Phosphor Silicate Glass) and/or BPSG (Boron Phosphor Silicate Glass) as an example of silicon oxide. The interlayer insulation layer 142 may have a laminated structure which includes a PSG layer and a BPSG layer which are laminated in this order from the semiconductor layer 2 side. The interlayer insulation layer 142 may have a laminated structure including a BPSG layer and a PSG layer which are laminated in this order from the first main surface 3 side.

With reference to FIG. 5 and FIG. 6, a first plug electrode 143, a second plug electrode 144, a third plug electrode 145, and a fourth plug electrode 146 are embedded in the interlayer insulation layer 142 in the output region 6. In this embodiment, the plurality of first plug electrodes 143, the plurality of second plug electrodes 144, the plurality of third plug electrodes 145, and the plurality of fourth plug electrodes 146 are embedded in the interlayer insulation layer 142. The first plug electrode 143, the second plug electrode 144, the third plug electrode 145, and the fourth plug electrode 146 may each include tungsten.

The plurality of first plug electrodes 143 are each embedded in a part which covers the first opening-side electrode 87 of the first trench gate structure 60 in the interlayer insulation layer 142. In this embodiment, the plurality of first plug electrodes 143 penetrate through the interlayer insulation layer 142 in a region of the first trench gate structure 60 at one end portion side and are connected to the plurality of first opening-side electrodes 87 in a one-to-one correspondence.

As a matter of course, the plurality of first plug electrodes 143 may be connected to one first opening-side electrode 87. Although not shown in the drawing, the plurality of first plug electrodes 143 are also embedded in a part which covers a region of the first trench gate structure 60 at the other end portion side of the interlayer insulation layer 142 in a manner similar to a region thereof at one end portion side.

In this embodiment, the plurality of first plug electrodes 143 are arrayed on a line at an interval along the first direction X. Each of the first plug electrodes 143 may be formed in a polygonal shape such as a triangular shape, a rectangular shape, a pentagonal shape, a hexagonal shape, etc., or in a circular shape or an elliptical shape in plan view. Here, each of the first plug electrodes 143 is formed in a rectangular shape in plan view.

The plurality of second plug electrodes 144 are each embedded in a part which covers the second opening-side electrode 107 of the second trench gate structure 70 in the interlayer insulation layer 142. In this embodiment, the plurality of second plug electrodes 144 penetrate through the interlayer insulation layer 142 in a region of the second trench gate structure 70 at one end portion side and are connected to the plurality of second opening-side electrodes 107 in a one-to-one correspondence.

As a matter of course, the plurality of second plug electrodes 144 may be connected to one second opening-side electrode 107. Although not shown in the drawing, the plurality of second plug electrodes 144 are also embedded in a part which covers a region of the second trench gate structure 70 at the other end portion side of the interlayer insulation layer 142 in a manner similar to a region thereof at one end portion side.

In this embodiment, the plurality of second plug electrodes 144 are arrayed on a line at an interval along the first direction X. Each of the second plug electrodes 144 may be formed in a polygonal shape such as a triangular shape, a rectangular shape, a pentagonal shape, a hexagonal shape, etc., or in a circular shape or an elliptical shape in plan view. Here, the second plug electrode 144 is formed in a rectangular shape in plan view.

The plurality of third plug electrodes 145 are each embedded in a part which covers the contact electrode 133 in the interlayer insulation layer 142. The plurality of third plug electrodes 145 penetrate through the interlayer insulation layer 142 and are connected to the contact electrode 133.

Although not shown in the drawing, the plurality of third plug electrodes 145 are also embedded in a part which covers the contact electrode 133 of the trench contact structure 120 at the other side of the interlayer insulation layer 142 in a manner similar to a region thereof at one end portion side.

In this embodiment, the plurality of third plug electrodes 145 are arrayed on a line at an interval along the first direction X. Each of the third plug electrodes 145 may be formed in a polygonal shape such as a triangular shape, a rectangular shape, a pentagonal shape, a hexagonal shape, etc., or in a circular shape or an elliptical shape in plan view. Here, each of the third plug electrodes 145 is formed in a rectangular shape in plan view.

The plurality of fourth plug electrodes 146 are each embedded in parts which cover the plurality of cell regions 75 in the interlayer insulation layer 142. Each of the fourth plug electrodes 146 penetrates through the interlayer insulation layer 142 and is connected to each of the cell regions 75. More specifically, each of the fourth plug electrodes 146 is electrically connected to the first source region 92, the first contact region 93, the second source region 112, and the second contact region 113 in each of the cell regions 75.

Each of the fourth plug electrodes 146 is formed in a band shape extending along the each of the cell regions 75 in plan view. A length of each fourth plug electrode 146 in the second direction Y may be less than a length of each cell region 75 in the second direction Y.

As a matter of course, the plurality of fourth plug electrodes 146 may be connected to each of the cell regions 75. In this case, the plurality of fourth plug electrodes 146 are formed at an interval along each of the cell regions 75. Further, each of the fourth plug electrodes 146 may be formed in a polygonal shape such as a triangular shape, a rectangular shape, a pentagonal shape, a hexagonal shape, etc., or in a circular shape or an elliptical shape in plan view.

The source electrode 12 and the gate control wiring 17 aforementioned are formed on the interlayer insulation layer 142 in the output region 6. The source electrode 12 is electrically connected to the plurality of fourth plug electrodes 146 collectively on the interlayer insulation layer 142. The reference voltage (for example, the ground voltage) is applied to the source electrode 12. The reference voltage is transmitted to the first source region 92, the first contact region 93, the second source region 112, and the second contact region 113 through the plurality of fourth plug electrodes 146.

The first gate control wiring 17A of the gate control wiring 17 is electrically connected to the plurality of first plug electrodes 143 on the interlayer insulation layer 142. The gate control signal from the control IC 10 is input to the first gate control wiring 17A. The gate control signal is transmitted to the first opening-side electrode 87 through the first gate control wiring 17A and the plurality of first plug electrodes 143.

The second gate control wiring 17B of the gate control wiring 17 is electrically connected to the plurality of second plug electrodes 144 on the interlayer insulation layer 142. The gate control signal from the control IC 10 is input to the second gate control wiring 17B. The gate control signal is transmitted to the second opening-side electrode 107 through the second gate control wiring 17B and the plurality of second plug electrodes 144.

The third gate control wiring 17C of the gate control wiring 17 is electrically connected to the plurality of third plug electrodes 145 on the interlayer insulation layer 142. The gate control signal from the control IC 10 is input to the third gate control wiring 17C. The gate control signal is transmitted to the contact electrode 133 through the third gate control wiring 17C and the plurality of third plug electrodes 145. That is, the gate control signal from the control IC 10 is transmitted to the first bottom-side electrode 86 and the second bottom-side electrode 106 through the contact electrode 133.

In a case where the first MISFET 56 (first trench gate structure 60) and the second MISFET 57 (second trench gate structure 70) are both controlled to be in the OFF states, the first channel region 91 and the second channel region 111 are both controlled to be in the OFF states.

In a case where the first MISFET 56 and the second MISFET 57 are both controlled to be in the ON states, the first channel region 91 and the second channel region 111 are both controlled to be in the ON states (Full-ON control).

In a case where the first MISFET 56 is controlled to be in the ON state while the second MISFET 57 is controlled to be in the OFF state, the first channel region 91 is controlled to be in the ON state and the second channel region 111 is controlled to be in the OFF state (first Half-ON control).

In a case where the first MISFET 56 is controlled to be in the OFF state while the second MISFET 57 is controlled to be in the ON state, the first channel region 91 is controlled to be in the OFF state and the second channel region 111 is controlled to be in the ON state (second Half-ON control).

As described above, in the power MISFET 9, the first MISFET 56 and the second MISFET 57 formed in one output region 6 are used to realize plural types of control including Full-ON control, first Half-ON control, and second Half-ON control.

When the first MISFET 56 is driven (that is, when the gate is controlled to be in the ON state), the ON signal Von may be applied to the first bottom-side electrode 86 and the ON signal Von may be applied to the first opening-side electrode 87. In this case, the first bottom-side electrode 86 and the first opening-side electrode 87 each function as a gate electrode.

Thereby, it is possible to suppress a voltage drop between the first bottom-side electrode 86 and the first opening-side electrode 87 and therefore it is possible to suppress an electric field concentration between the first bottom-side electrode 86 and the first opening-side electrode 87. It is also possible to reduce an ON resistance of the semiconductor layer 2 and therefore it is thereby possible to reduce electricity consumption.

When the first MISFET 56 is driven (that is, when the gate is controlled to be in the ON state), the OFF signal Voff (for example, the reference voltage) may be applied to the first bottom-side electrode 86 and the ON signal Von may be applied to the first opening-side electrode 87. In this case, while the first bottom-side electrode 86 functions as a field electrode, the first opening-side electrode 87 functions as a gate electrode. Thereby, it is possible to reduce a parasitic capacitance and therefore it is possible to improve a switching speed.

When the second MISFET 57 is driven (that is, when the gate is controlled to be in the ON state), the ON signal Von may be applied to the second bottom-side electrode 106 and the ON signal Von may be applied to the second opening-side electrode 107. In this case, the second bottom-side electrode 106 and the second opening-side electrode 107 each function as a gate electrode.

Thereby, it is possible to suppress a voltage drop between the second bottom-side electrode 106 and the second opening-side electrode 107 and therefore it is possible to suppress an electric field concentration between the second bottom-side electrode 106 and the second opening-side electrode 107. It is also possible to reduce an ON resistance of the semiconductor layer 2 and therefore it is possible to reduce electricity consumption.

When the second MISFET 57 is driven (that is, when the gate is controlled to be in the ON state), the OFF signal Voff (reference voltage) may be applied to the second bottom-side electrode 106 and the ON signal Von may be applied to the second opening-side electrode 107. In this case, while the second bottom-side electrode 106 functions as a field electrode, the second opening-side electrode 107 functions as a gate electrode. Thereby, it is possible to reduce a parasitic capacitance and therefore it is possible to improve a switching speed.

With reference to FIG. 7 and FIG. 8, the first channel region 91 is formed in each of the cell regions 75 at a first channel area Si. The first channel area Si is defined by a total planar area of the plurality of first source regions 92 formed in each of the cell regions 75.

The first channel region 91 is formed in each of the cell regions 75 at a first channel rate R1 (first rate) (with a first channel ratio R1 (first ratio)). The first channel rate R1 is a rate which is occupied by the first channel area Si in each of the cell regions 75 when a planar area of each cell region 75 is given as 100%.

The first channel rate R1 is adjusted to a range from not less than 0% to not more than 50%. The first channel rate R1 may be from not less than 0% to not more than 5%, from not less than 5% to not more than 10%, from not less than 10% to not more than 15%, from not less than 15% to not more than 20%, from not less than 20% to not more than 25%, from not less than 25% to not more than 30%, from not less than 30% to not more than 35%, from not less than 35% to not more than 40%, from not less than 40% to not more than 45%, or from not less than 45% to not more than 50%. The first channel rate R1 is preferably from not less than 10% to not more than 35%.

In a case where the first channel rate R1 is 50%, the first source region 92 is formed in a substantially entire region of the first side wall 61 and the second side wall 62 of the first trench gate structure 60. In this case, no first contact region 93 is formed at the first side wall 61 side or the second side wall 62 side of the first trench gate structure 60. The first channel rate R1 is preferably less than 50%.

In a case where the first channel rate R1 is 0%, no first source region 92 is formed in the first side wall 61 side or the second side wall 62 side of the first trench gate structure 60. In this case, only the body region 55 and/or the first contact region 93 are formed in the first side wall 61 side and the second side wall 62 side of the first trench gate structure 60. The first channel rate R1 is preferably in excess of 0%. In this embodiment, an example in which the first channel rate R1 is 25% is shown.

The second channel region 111 is formed in each of the cell regions 75 at a second channel area S2. The second channel area S2 is defined by a total planar area of the plurality of second source regions 112 formed in each of the cell regions 75.

The second channel region 111 is formed in each of the cell regions 75 at a second channel rate R2 (second rate) (with a second channel ratio R2 (second ratio)). The second channel rate R2 is a rate which is occupied by the second channel area S2 in each of the cell regions 75 when a planar area of each of the cell regions 75 is given as 100%.

The second channel rate R2 is adjusted to a range from not less than 0% to not more than 50%. The second channel rate R2 may be from not less than 0% to not more than 5%, from not less than 5% to not more than 10%, from not less than 10% to not more than 15%, from not less than 15% to not more than 20%, from not less than 20% to not more than 25%, from not less than 25% to not more than 30%, from not less than 30% to not more than 35%, from not less than 35% to not more than 40%, from not less than 40% to not more than 45%, or from not less than 45% to not more than 50%. The second channel rate R2 is preferably from not less than 10% to not more than 35%.

In a case where the second channel rate R2 is 50%, the second source region 112 is formed in a substantially entire region of the first side wall 71 side and the second side wall 72 side of the second trench gate structure 70. In this case, no second contact region 113 is formed in the first side wall 71 side or the second side wall 72 side of the second trench gate structure 70. The second channel rate R2 is preferably less than 50%.

In a case where the second channel rate R2 is 0%, no second source region 112 is formed in the first side wall 71 side or the second side wall 72 side of the second trench gate structure 70. In this case, only the body region 55 and/or the second contact region 113 are formed in the first side wall 71 side and the second side wall 72 side of the second trench gate structure 70. The second channel rate R2 is preferably in excess of 0%. In this embodiment, an example in which the second channel rate R2 is 25% is shown.

As described above, the first channel region 91 and the second channel region 111 are formed in each of the cell regions 75 at a total channel rate RT (RT=R1+R2) from not less than 0% to not more than 100% (preferably in excess of 0% to less than 100%).

In this embodiment, the total channel rate RT in each of the cell regions 75 is 50%. In this embodiment, the total channel rates RT are all set at an equal value. Thus, an average channel rate RAV inside the output region 6 (unit area) is given as 50%. The average channel rate RAV is such that a sum of all of the total channel rates RT is divided by a total number of the total channel rates RT.

Figure 12A:
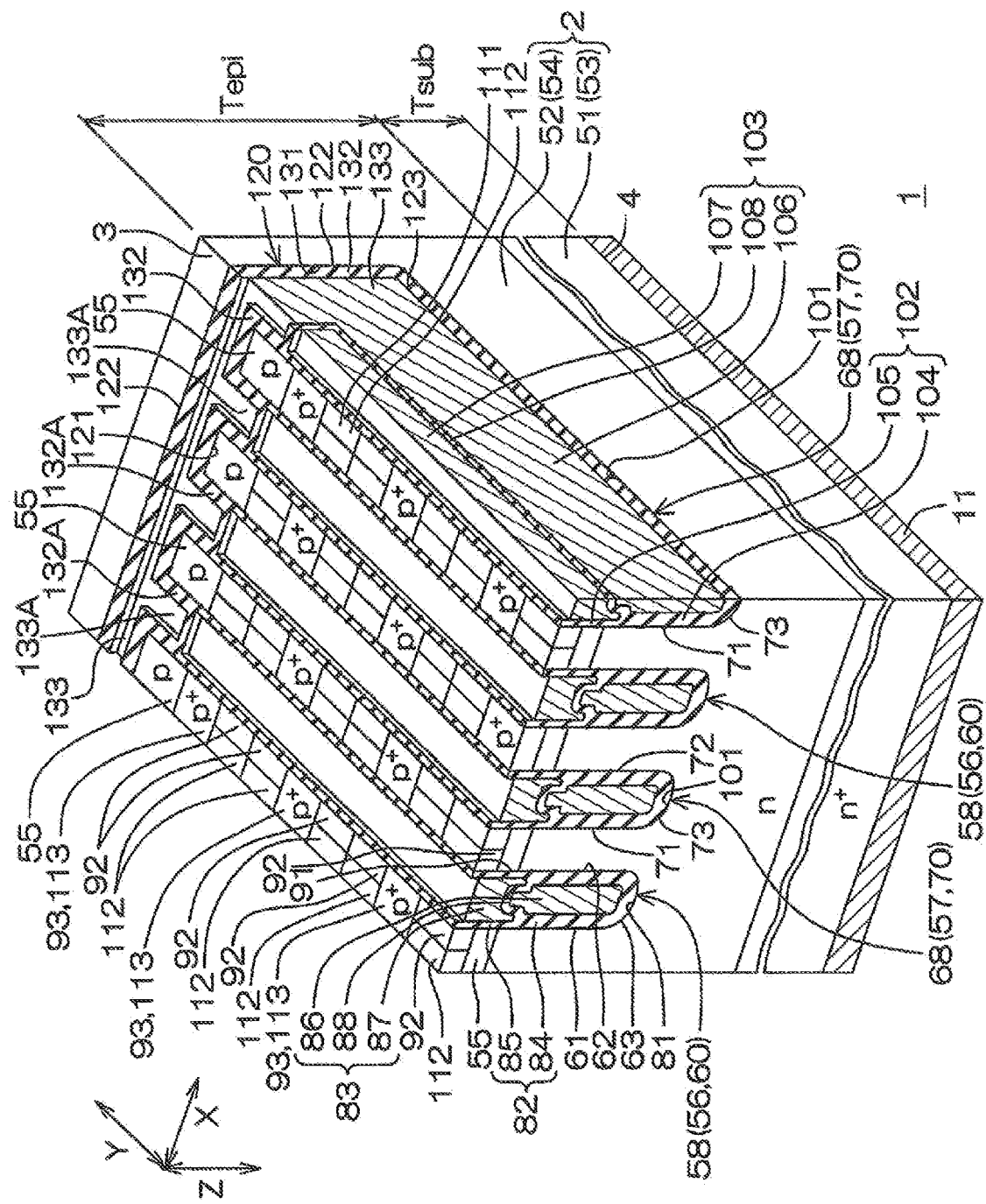
FIG. 12A is a sectional perspective view of a region corresponding to FIG. 7 and is a sectional perspective view which shows a configuration including a channel structure according to a second configuration example.
Figure 12B:
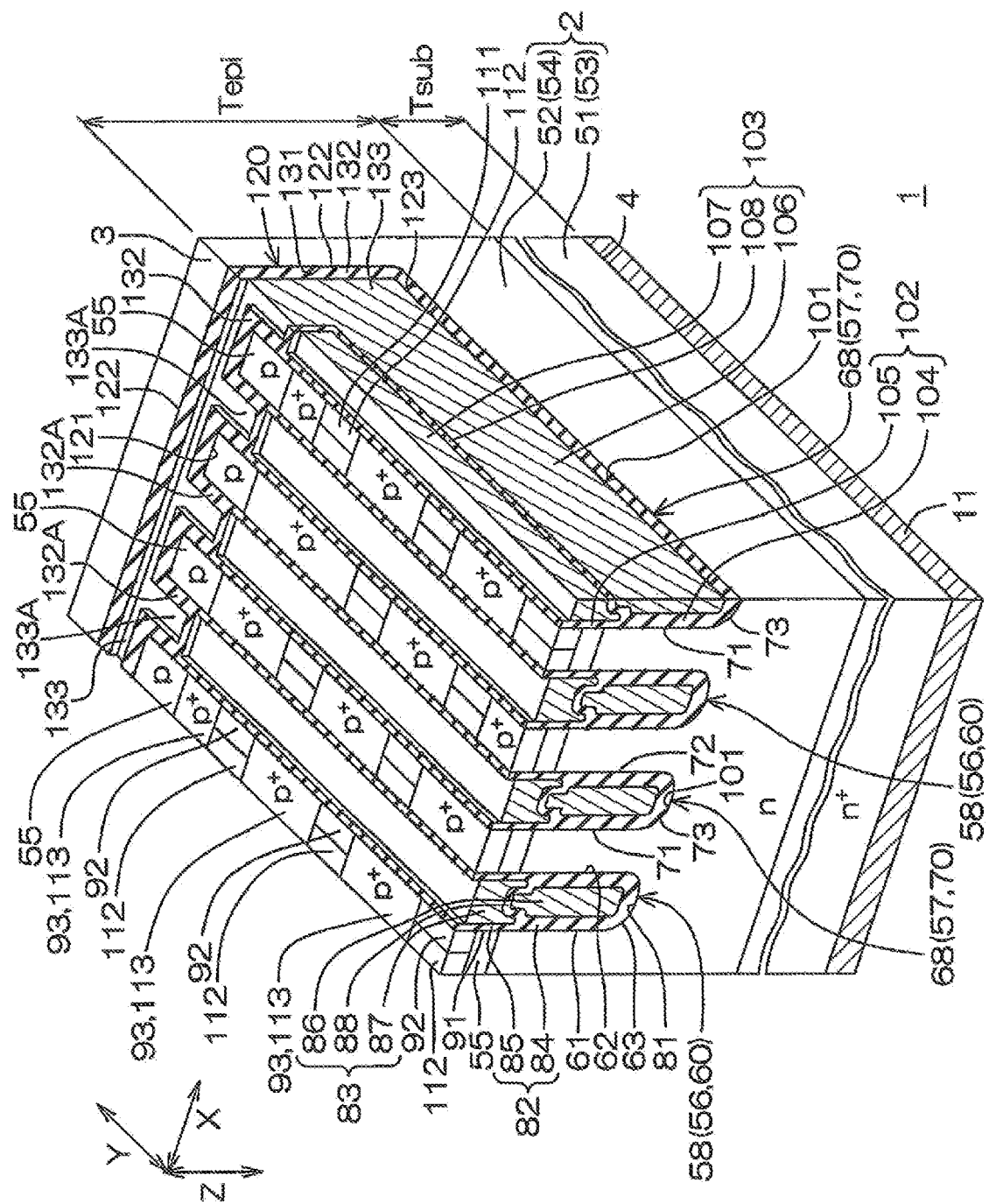
FIG. 12B is a sectional perspective view of a region corresponding to FIG. 7 and is a sectional perspective view which shows a configuration including a channel structure according to a third configuration example.

Hereinafter, in FIG. 12A and FIG. 12B, a configuration example in which the average channel rate RAV is adjusted is shown. FIG. 12A is a sectional perspective view of a region corresponding to FIG. 7 and is a sectional perspective view which shows a configuration including a channel structure according to a second configuration example. FIG. 12B is a sectional perspective view of a region corresponding to FIG. 7 and is a sectional perspective view which shows a configuration including a channel structure according to a third configuration example.

In FIG. 12A, a configuration example in which the average channel rate RAV is adjusted to approximately 66% is shown. The total channel rate RT of each of the cell regions 75 is approximately 66%. In FIG. 12B, a configuration example in which the average channel rate RAV is adjusted to 33% is shown. The total channel rate RT of each of the cell regions 75 is 33%.

The total channel rate RT may be adjusted for each cell region 75. That is, the plurality of total channel rates RT different in value from each other may be each applied to each of the cell regions 75. The total channel rate RT relates to a temperature rise of the semiconductor layer 2. For example, an increase in the total channel rate RT causes a temperature rise of the semiconductor layer 2 to occur easily. On the other hand, a reduction in the total channel rate RT causes a temperature rise of the semiconductor layer 2 not to occur easily.

By using the above, the total channel rate RT may be adjusted according to a temperature distribution of the semiconductor layer 2. For example, the total channel rate RT of a region in which a temperature rise easily occurs in the semiconductor layer 2 may be made relatively small, and the total channel rate RT of a region in which a temperature rise does not easily occur in the semiconductor layer 2 may be made relatively large.

A central portion of the output region 6 can be given as an example of a region in which a temperature rise easily occurs in the semiconductor layer 2. A peripheral portion of the output region 6 can be given as an example of a region in which a temperature rise does not easily occur in the semiconductor layer 2. As a matter of course, the average channel rate RAV may be adjusted while the total channel rate RT is adjusted according to a temperature distribution of the semiconductor layer 2.

The plurality of cell regions 75 having the total channel rate RT of not less than 20% to not more than 40% (for example, 25%) may be concentrated at a region in which a temperature rise easily occurs (for example, a central portion). The plurality of cell regions 75 having the total channel rate RT of not less than 60% to not more than 80% (for example, 75%) may be concentrated at a region in which a temperature rise does not easily occur (for example, a peripheral portion). The plurality of cell regions 75 having the total channel rate RT in excess of 40% and less than 60% (for example, 50%) may be concentrated between a region in which a temperature rise easily occurs and a region in which a temperature rise does not easily occur.

Further, the total channel rate RT of not less than 20% to not more than 40%, the total channel rate RT of not less than 40% to not more than 60%, and the total channel rate RT of not less than 60% to not more than 80% may be applied to the plurality of cell regions 75 in a regular arrangement.

As an example, three types of total channel rates RT which sequentially repeat in a pattern of 25% (low)→50% (middle)→75% (high) may be applied to the plurality of cell regions 75. In this case, the average channel rate RAV may be adjusted to 50%. In the case of the above-described structure, it is possible to suppress, with a relatively simple design, a biased temperature distribution in the semiconductor layer 2 to be formed. A specific configuration to which the above structure is applied is shown in the next preferred embodiment.

Figure 13:
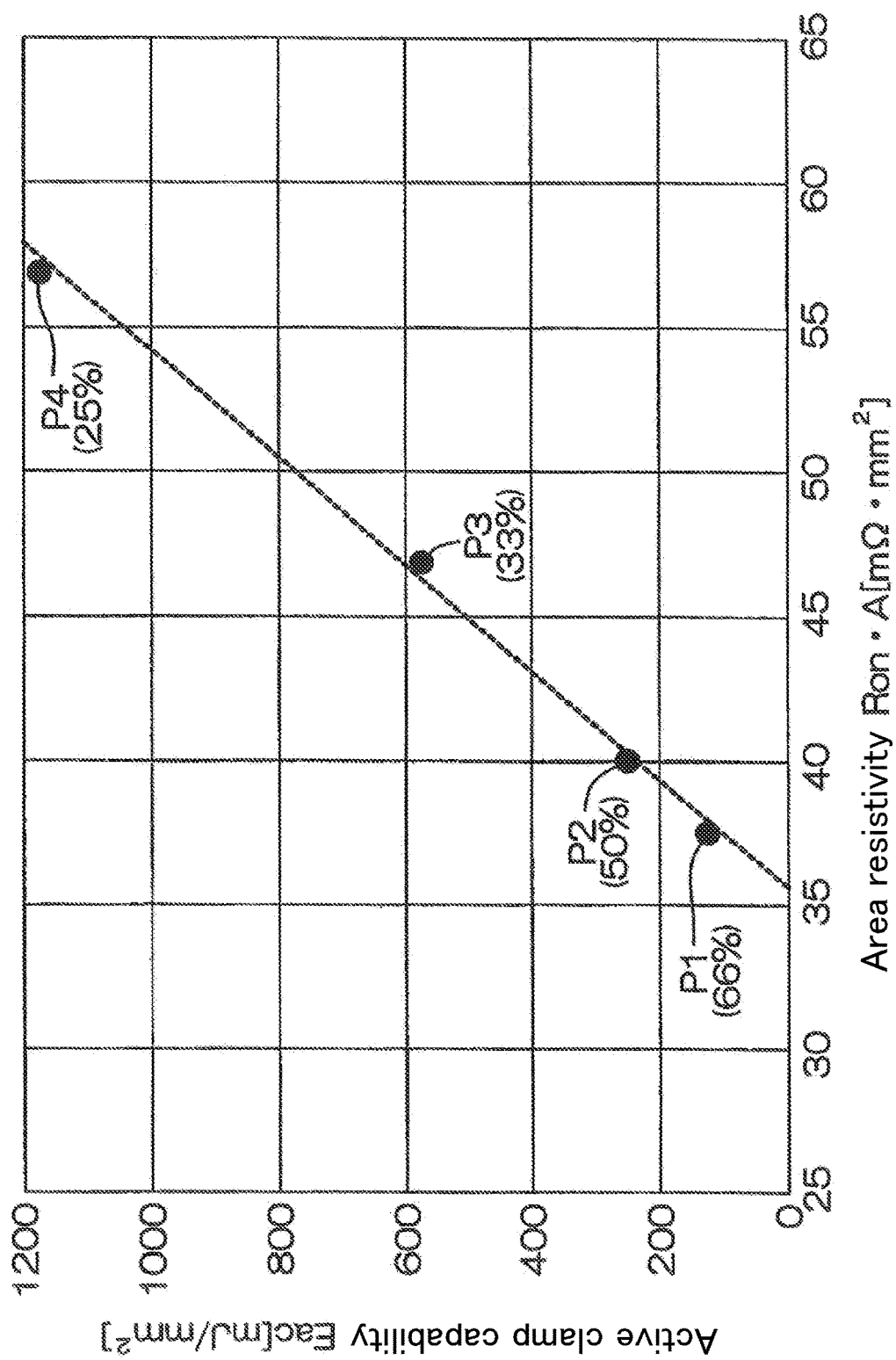
FIG. 13 is a graph which is obtained by an actual measurement of a relationship between an active clamp capability and an area resistivity.

FIG. 13 is a graph which is obtained by an actual measurement of a relationship between the active clamp capability Eac and an area resistivity Ron·A. The graph of FIG. 13 shows the characteristics where the first MISFET 56 and the second MISFET 57 are simultaneously controlled to be in the ON states and to be in the OFF states.

In FIG. 13, the vertical axis indicates the active clamp capability Eac [mJ/mm$^2$], while the horizontal axis indicates the area resistivity Ron·A [mΩ·mm$^2$]. As has been described in FIG. 3, the active clamp capability Eac is the capability with respect to the counter electromotive force. The area resistivity Ron·A expresses the ON resistance inside the semiconductor layer 2 in the normal operation.

A first plot point P1, a second plot point P2, a third plot point P3, and a fourth plot point P4 are shown in FIG. 13. The first plot point P1, the second plot point P2, the third plot point P3, and the fourth plot point P4 show the respective characteristics where the average channel rate RAV (that is, a total channel rate RT occupied in each of the cell regions 75) is adjusted to 66%, 50%, 33%, and 25%.

In a case where the average channel rate RAV was increased, the area resistivity Ron·A in the normal operation was reduced and the active clamp capability Eac in the active clamp operation was reduced. In contrast thereto, where the average channel rate RAV was reduced, the area resistivity Ron·A in the normal operation was increased and the active clamp capability Eac in the active clamp operation was improved.

In view of the area resistivity Ron·A, the average channel rate RAV is preferably not less than 33% (more specifically, from not less than 33% to less than 100%). In view of the active clamp capability Eac, the average channel rate RAV is preferably less than 33% (more specifically, in excess of 0% and less than 33%).

The area resistivity Ron·A was reduced due to an increase in the average channel rate RAV, and this is because of an increase in current path. On the other hand, the active clamp capability Eac was reduced due to an increase in the average channel rate RAV, and this is because of a sharp temperature rise due to the counter electromotive force.

In particular, in a case where the average channel rate RAV (total channel rate RT) is relatively large, it is more likely that a local and sharp temperature rise may occur in a region between the first trench gate structure 60 and the second trench gate structure 70 which are adjacent to each other. It is considered that the active clamp capability Eac was reduced due to this type of temperature rise.

On the other hand, the area resistivity Ron·A was increased due to a reduction in the average channel rate RAV, and this is because of shrinkage of the current path. The active clamp capability Eac was improved due to a reduction in the average channel rate RAV, and this is considered to be because the average channel rate RAV (total channel rate RT) was made relatively small and a local and sharp temperature rise was suppressed.

From the results of the graph of FIG. 13, it is found that an adjustment method based on the average channel rate RAV (total channel rate RT) has a trade-off relationship and therefore there is a difficulty in realizing an excellent area resistivity Ron·A and an excellent active clamp capability Eac at the same time independently of the trade-off relationship.

On the other hand, from the results of the graph of FIG. 13, it is found that, by making the power MISFET 9 operate such as to approach the first plot point P1 (RAV=66%) in the normal operation and operate such as to approach the fourth plot point P4 (RAV=25%) in the active clamp operation, it is possible to realize an excellent area resistivity Ron·A and an excellent active clamp capability Eac at the same time. Thus, in this embodiment, the following control is performed.

Figure 14A:
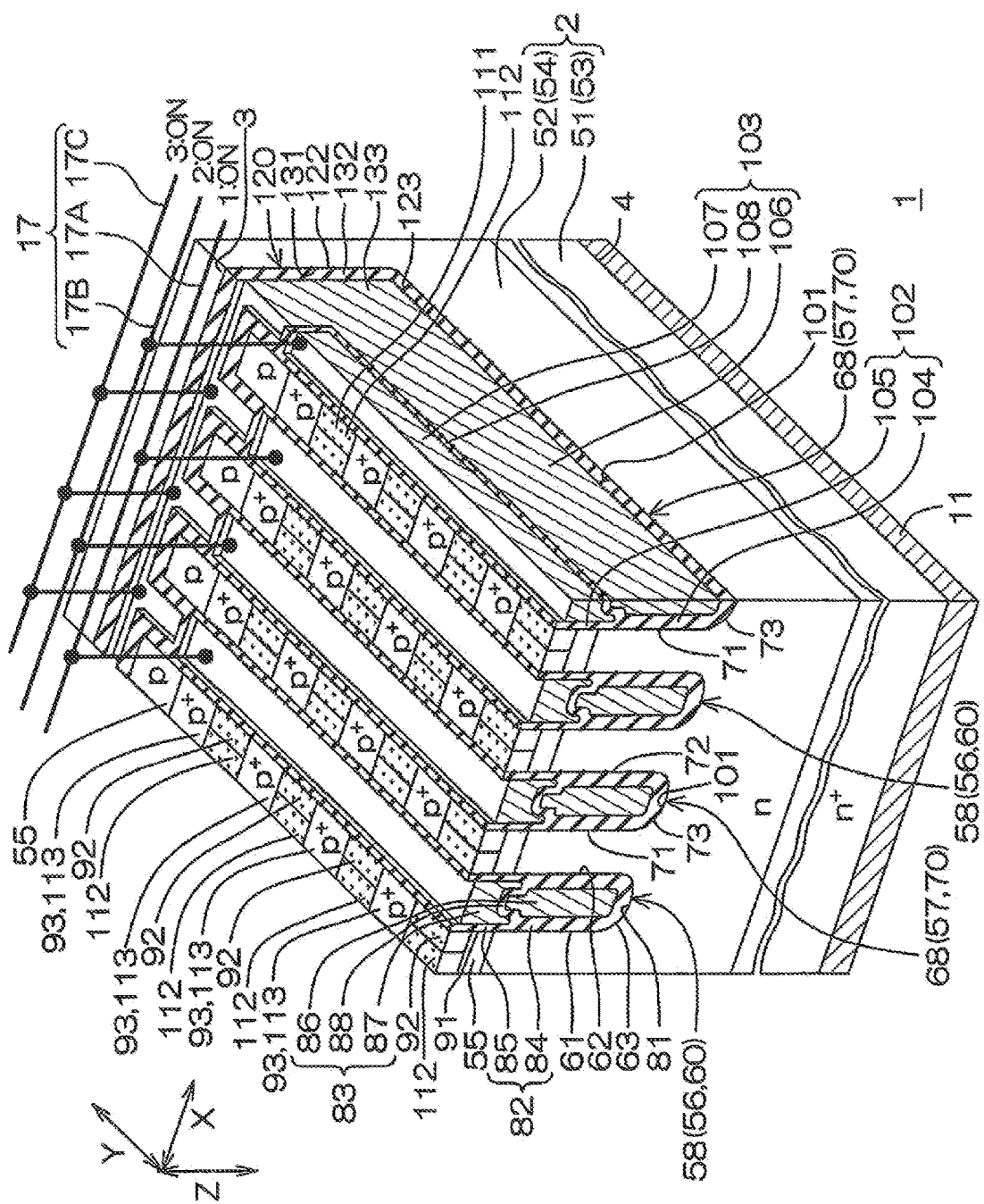
FIG. 14A is a sectional perspective view for describing normal operation according to a first control example of the semiconductor device shown in FIG. 1.
Figure 14B:
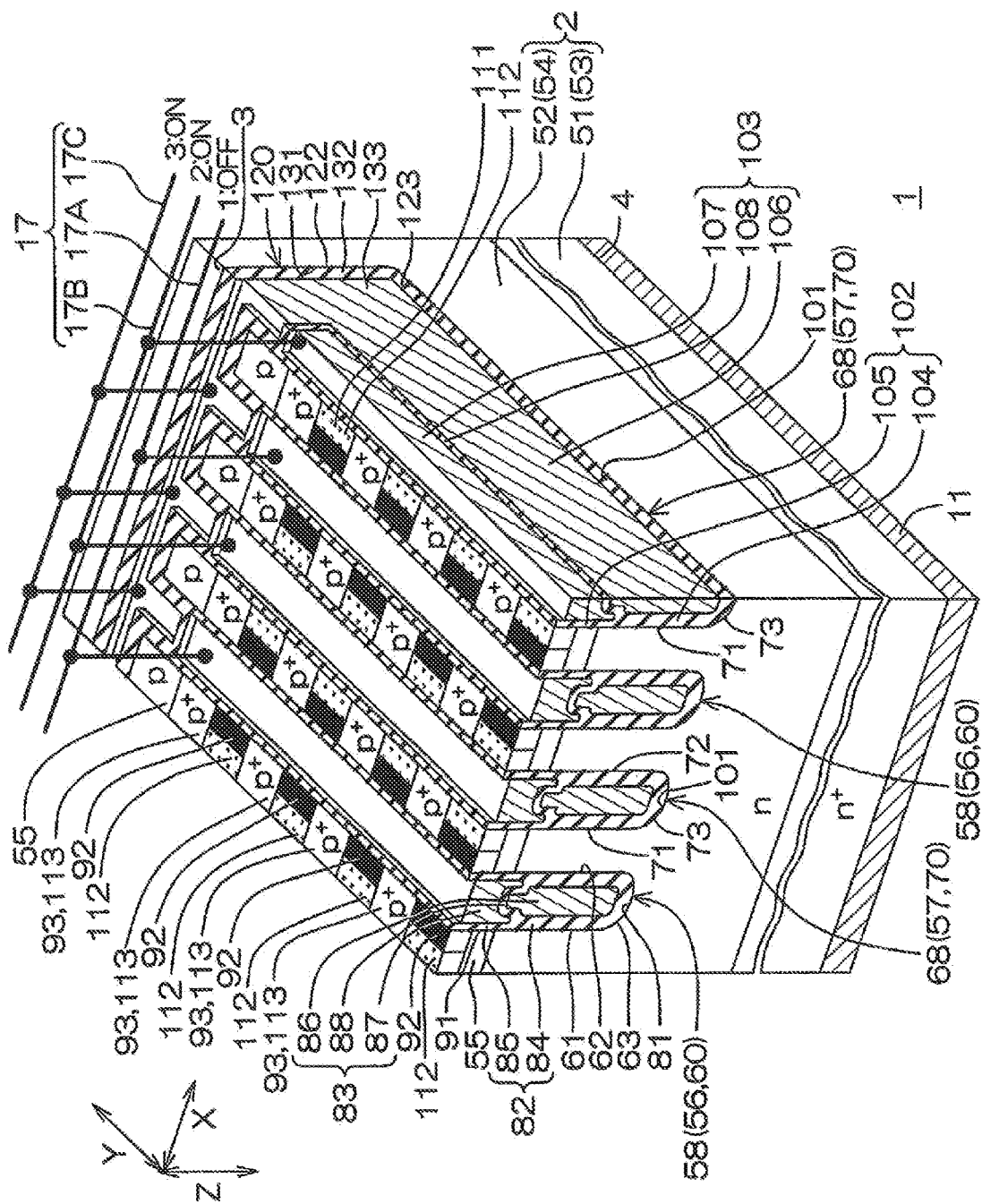
FIG. 14B is a sectional perspective view for describing active clamp operation according to the first control example of the semiconductor device shown in FIG. 1.

FIG. 14A is a sectional perspective view for describing the normal operation according to a first control example of the semiconductor device 1 shown in FIG. 1. FIG. 14B is a sectional perspective view for describing the active clamp operation according to the first control example of the semiconductor device 1 shown in FIG. 1. In FIG. 14A and FIG. 14B, for convenience of description, structures in the first main surface 3 are omitted and the gate control wiring 17 is simplified.

With reference to FIG. 14A, when the power MISFET 9 is in the normal operation, a first ON signal Von1 is input to the first gate control wiring 17A, a second ON signal Von2 is input to the second gate control wiring 17B, and a third ON signal Von3 is input to the third gate control wiring 17C.

The first ON signal Von1, the second ON signal Von2, and the third ON signal Von3 are each input from the control IC 10. The first ON signal Von1, the second ON signal Von2, and the third ON signal Von3 each have a voltage equal to or higher than the gate threshold voltage Vth. The first ON signal Von1, the second ON signal Von2, and the third ON signal Von3 may each have an equal voltage.

In this case, the first opening-side electrode 87, the second opening-side electrode 107, the first bottom-side electrode 86, and the second bottom-side electrode 106 are each put into the ON state. That is, the first opening-side electrode 87, the second opening-side electrode 107, the first bottom-side electrode 86, and the second bottom-side electrode 106 each function as a gate electrode.

Thereby, the first channel region 91 and the second channel region 111 are both controlled to be in the ON states. In FIG. 14A, the first channel region 91 and the second channel region 111 in the ON states are indicated by dotted hatching.

As a result, the first MISFET 56 and the second MISFET 57 are both driven (Full-ON control). A channel utilization rate RU in the normal operation is 100%. A characteristics channel rate RC in the normal operation is 50%. The channel utilization rate RU is a rate of the first channel region 91 and the second channel region 111 which are controlled in the ON state, of the first channel region 91 and the second channel region 111.

The characteristics channel rate RC is a value obtained by multiplying the average channel rate RAV by a channel utilization rate RU (RC=RAV×RU). The characteristics (the area resistivity Ron·A and the active clamp capability Eac) of the power MISFET 9 are determined based on the characteristics channel rate RC. Thereby, the area resistivity Ron·A approaches the area resistivity Ron·A indicated by the second plot point P2 in the graph of FIG. 13.

On the other hand, with reference to FIG. 14B, when the power MISFET 9 is in the active clamp operation, an OFF signal Voff is input to the first gate control wiring 17A, a first clamp ON signal VCon1 is input to the second gate control wiring 17B, and a second clamp ON signal VCon2 is input to the third gate control wiring 17C.

The OFF signal Voff, the first clamp ON signal VCon1, and the second clamp ON signal VCon2 are each input from the control IC 10. The OFF signal Voff has a voltage less than the gate threshold voltage Vth (for example, the reference voltage). The first clamp ON signal VCon1 and the second clamp ON signal VCon2 each have a voltage equal to or higher than the gate threshold voltage Vth. The first clamp ON signal VCon1 and the second clamp ON signal VCon2 may each have an equal voltage. The first clamp ON signal VCon1 and the second clamp ON signal VCon2 may have a voltage not more than or less than a voltage in the normal operation.

In this case, the first opening-side electrode 87 is put into the OFF state, and the first bottom-side electrode 86, the second bottom-side electrode 106, and the second opening-side electrode 107 are each put into the ON state. Thereby, the first channel region 91 is controlled to be in the OFF state, and the second channel region 111 is controlled to be in the ON state. In FIG. 14B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation.

The channel utilization rate RU in the active clamp operation is 50%. And, the characteristics channel rate RC in the active clamp operation is 25%. Thereby, the active clamp capability Eac approaches the active clamp capability Eac indicated by the fourth plot point P4 in the graph of FIG. 13.

In the first control example, a description has been given of an example in which the second Half-ON control is applied in the active clamp operation. However, the first Half-ON control may be applied in the active clamp operation.

Figure 15A:
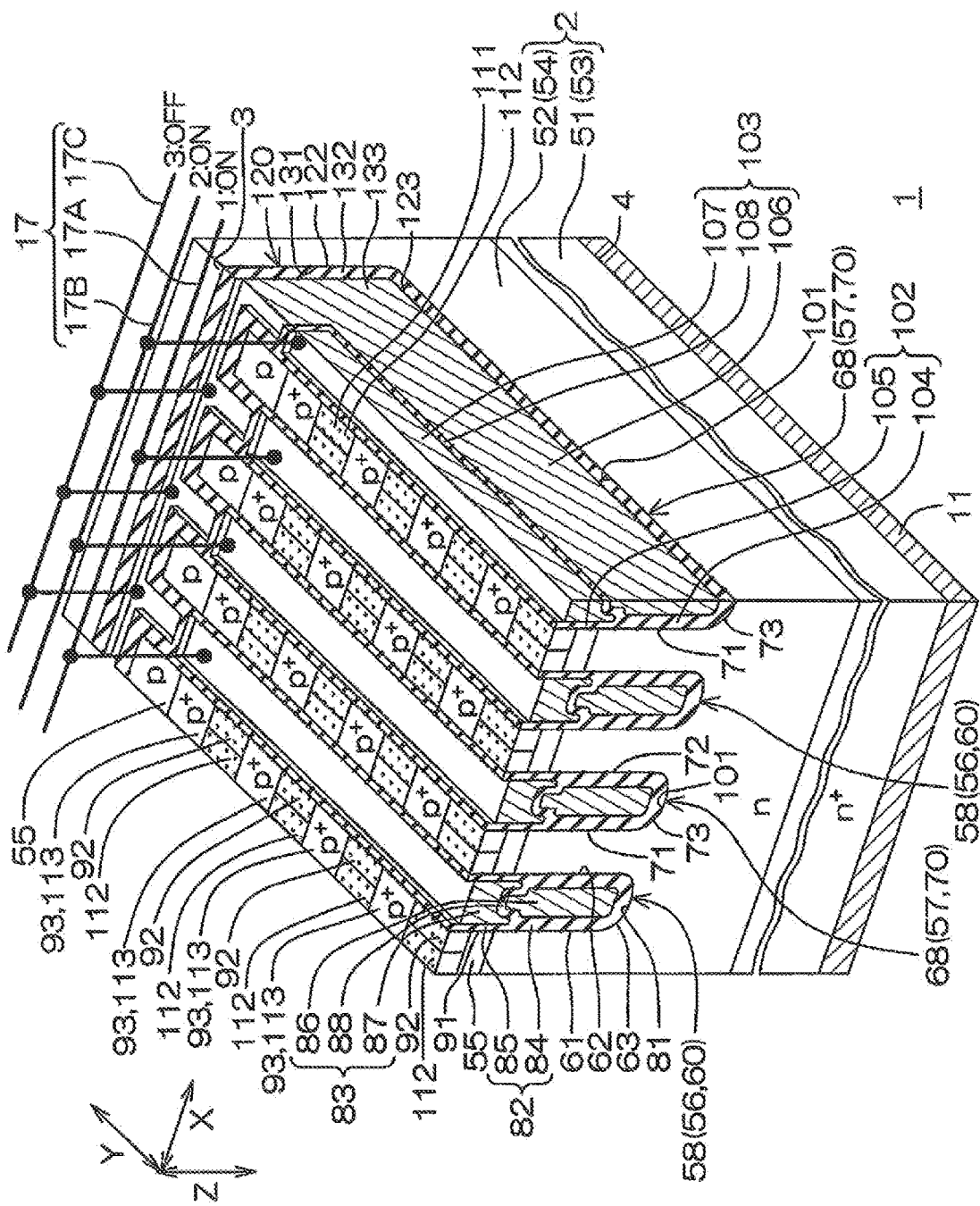
FIG. 15A is a sectional perspective view for describing normal operation according to a second control example of the semiconductor device shown in FIG. 1.
Figure 15B:
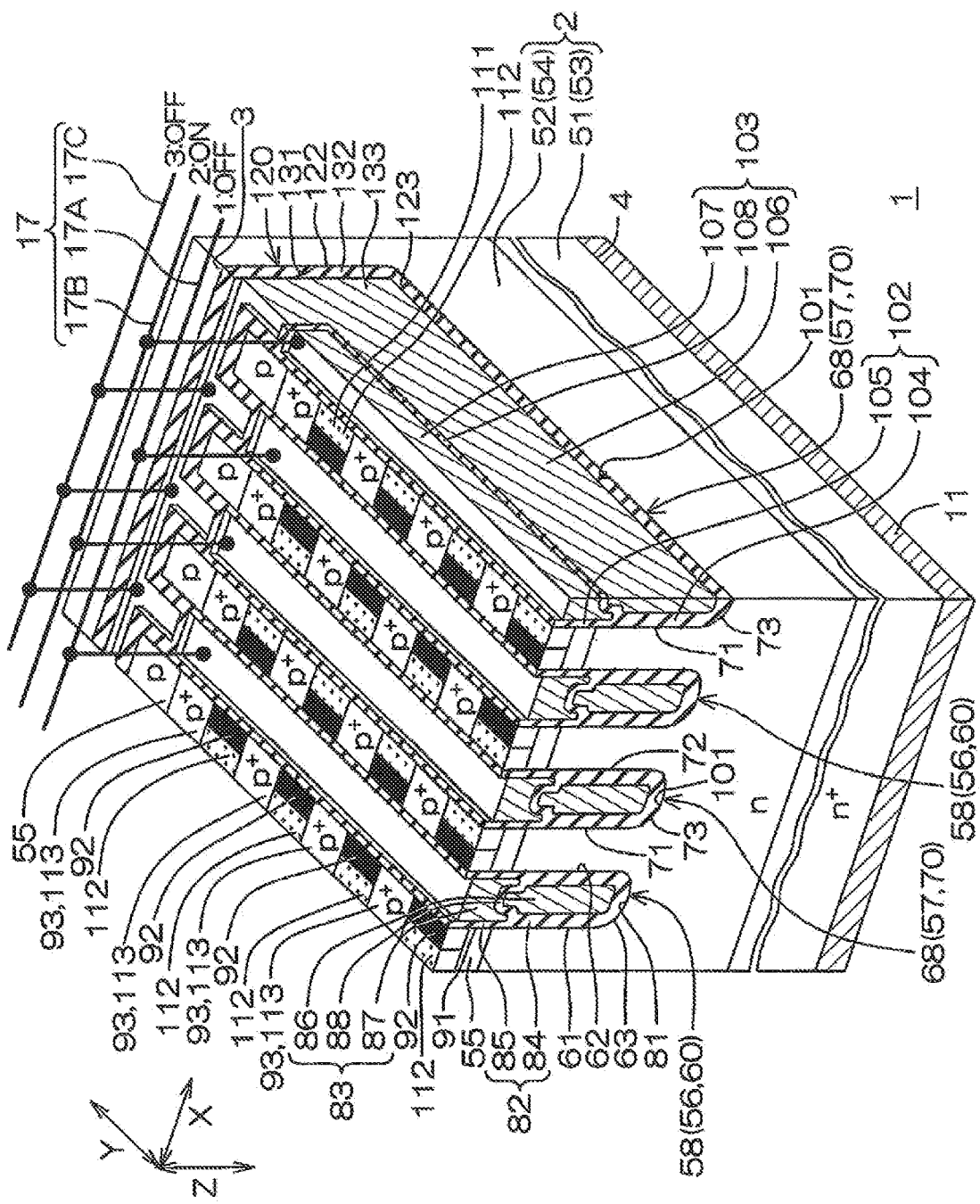
FIG. 15B is a sectional perspective view for describing active clamp operation according to the second control example of the semiconductor device shown in FIG. 1.

FIG. 15A is a sectional perspective view for describing the normal operation according to a second control example of the semiconductor device 1 shown in FIG. 1. FIG. 15B is a sectional perspective view for describing the active clamp operation according to the second control example of the semiconductor device 1 shown in FIG. 1. In FIG. 15A and FIG. 15B, for convenience of description, structures in the first main surface 3 are omitted and the gate control wiring 17 is simplified.

With reference to FIG. 15A, when the power MISFET 9 is in the normal operation, a first ON signal Von1 is input to the first gate control wiring 17A, a second ON signal Von2 is input to the second gate control wiring 17B, and the OFF signal Voff is input to the third gate control wiring 17C.

The first ON signal Von1, the second ON signal Von2, and the OFF signal Voff are each input from the control IC 10. The first ON signal Von1 and the second ON signal Von2 each have a voltage not less than the gate threshold voltage Vth. The first ON signal Von1 and the second ON signal Von2 may each have an equal voltage. The OFF signal Voff has a voltage less than the gate threshold voltage Vth (for example, the reference voltage).

In this case, the first opening-side electrode 87 and the second opening-side electrode 107 are each put into the ON state, and the first bottom-side electrode 86 and the second bottom-side electrode 106 are each put into the OFF state. That is, while the first opening-side electrode 87 and the second opening-side electrode 107 each function as a gate electrode, the first bottom-side electrode 86 and the second bottom-side electrode 106 each function as a field electrode.

Thereby, the first channel region 91 and the second channel region 111 are both controlled to be in the ON states.

In FIG. 15A, the first channel region 91 and the second channel region 111 in the ON states are indicated by dotted hatching.

As a result, the first MISFET 56 and the second MISFET 57 are both driven (Full-ON control). The channel utilization rate RU in the normal operation is 100%. The characteristics channel rate RC in the normal operation is 50%. Thereby, the area resistivity Ron·A approaches the area resistivity Ron·A indicated by the second plot point P2 in the graph of FIG. 13.

On the other hand, with reference to FIG. 15B, when the power MISFET 9 is in the active clamp operation, a first OFF signal Voff1 is input to the first gate control wiring 17A, a clamp ON signal VCon is input to the second gate control wiring 17B, and a second OFF signal Voff2 is input to the third gate control wiring 17C.

The first OFF signal Voff1, the clamp ON signal VCon, and the second OFF signal Voff2 are each input from the control IC 10. The first OFF signal Voff1 has a voltage less than the gate threshold voltage Vth (for example, the reference voltage). The clamp ON signal VCon has a voltage not less than the gate threshold voltage Vth. The clamp ON signal VCon may have a voltage not more than or less than a voltage in the normal operation. The second OFF signal Voff2 has a voltage value less than the gate threshold voltage Vth (for example, the reference voltage).

In this case, the first opening-side electrode 87, the first bottom-side electrode 86, and the second bottom-side electrode 106 are each put into the OFF state, and the second opening-side electrode 107 is put into the ON state. Thereby, the first channel region 91 is controlled to be in the OFF state, and the second channel region 111 is controlled to be in the ON state. In FIG. 15B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation.

The channel utilization rate RU in the active clamp operation is 50%. And, the characteristics channel rate RC in the active clamp operation is 25%. Thereby, the active clamp capability Eac approaches the active clamp capability Eac indicated by the fourth plot point P4 in the graph of FIG. 13.

In the second control example, a description has been given of an example in which the second Half-ON control in the active clamp operation is applied. However, in the active clamp operation, the first Half-ON control may be applied As described above, the semiconductor device 1 includes the IPD (Intelligent Power Device) formed in the semiconductor layer 2. The IPD includes the power MISFET 9 and the control IC 10 which controls the power MISFET 9. More specifically, the power MISFET 9 includes the first MISFET 56 and the second MISFET 57. The control IC 10 controls the first MISFET 56 and the second MISFET 57 individually.

More specifically, the control IC 10 controls the first MISFET 56 and the second MISFET 57 to be in the ON states in (during) the normal operation, and controls the first MISFET 56 to be in the OFF state and the second MISFET 57 to be in the ON state in (during) the active clamp operation.

Therefore, in the normal operation, a current is allowed to flow by using the first MISFET 56 and the second MISFET 57. Thereby, it is possible to reduce the area resistivity Ron·A (ON resistance).

On the other hand, in the active clamp operation, a current is allowed to flow by using the second MISFET 57 in a state where the first MISFET 56 is stopped. Therefore, the counter electromotive force can be consumed (absorbed) by the second MISFET 57. Thereby, it is possible to suppress a sharp temperature rise due to the counter electromotive force and therefore it is possible to improve the active clamp capability Eac.

More specifically, the semiconductor device 1 has the first MISFET 56 which includes the first FET structure 58 and also the second MISFET 57 which includes the second FET structure 68. The first FET structure 58 includes the first trench gate structure and the first channel region 91. The second FET structure 68 includes the second trench gate structure 70 and the second channel region 111.

In this case, the control IC 10 controls the first MISFET 56 and the second MISFET 57 such that a different characteristics channel rate RC (area of channel) can be applied between the normal operation or the active clamp operation. More specifically, the control IC 10 controls the first MISFET 56 and the second MISFET 57 such that the channel utilization rate RU in the active clamp operation becomes in excess of zero and less than the channel utilization rate RU in the normal operation.

Therefore, the characteristics channel rate RC relatively increases in the normal operation. Thereby, a current path is relatively increased, and it becomes possible to reduce the area resistivity Ron·A (ON resistance). On the other hand, the characteristics channel rate RC relatively reduces in the active clamp operation. Thereby, it is possible to suppress a sharp temperature rise due to the counter electromotive force and therefore it is possible to improve the active clamp capability Eac.

Thus, it is possible to provide the semiconductor device 1 capable of realizing both of an excellent area resistivity Ron·A and an excellent active clamp capability Eac, independently of the trade-off relationship shown in FIG. 13.

Figure 16:
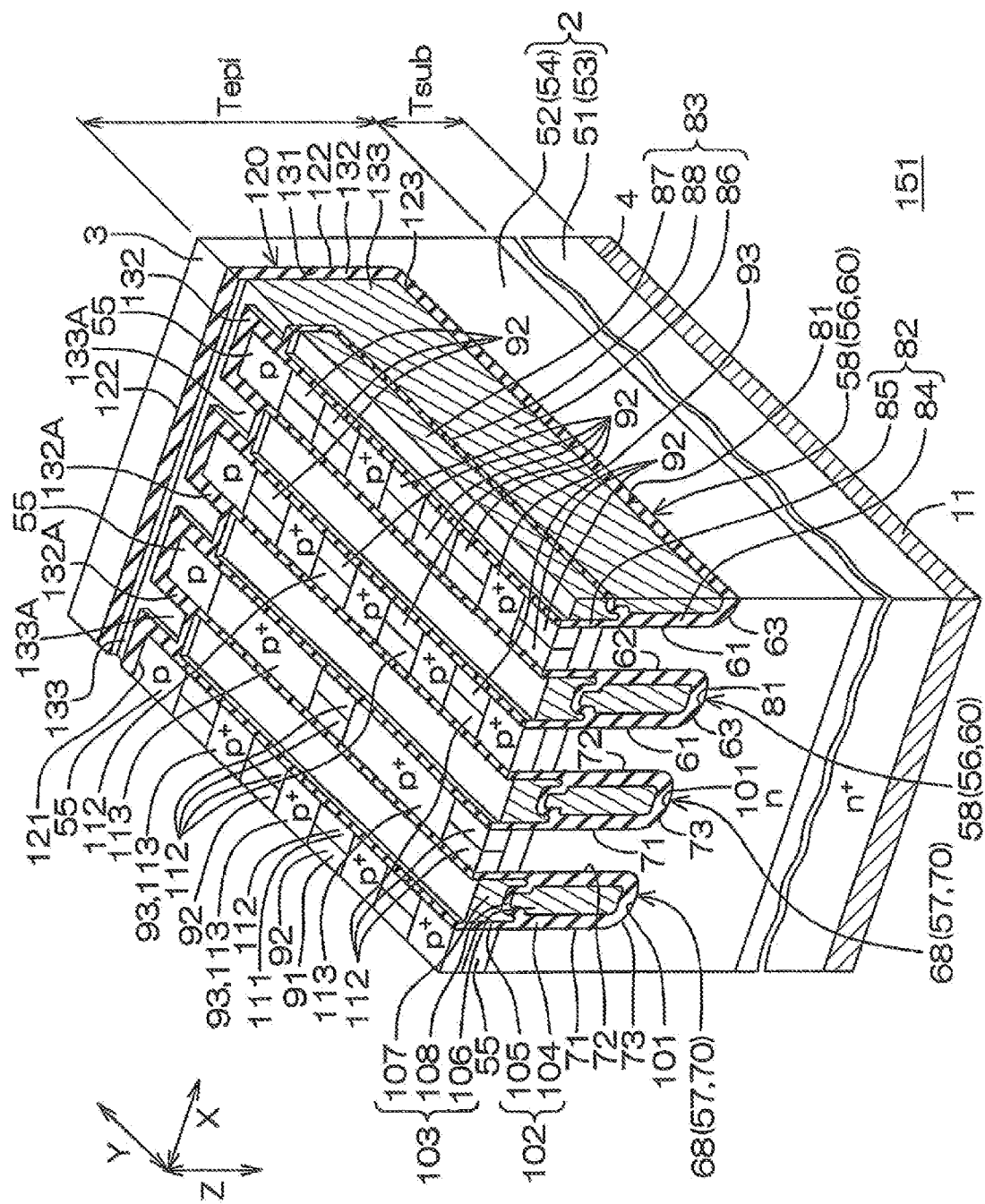
FIG. 16 is a sectional perspective view of a region corresponding to FIG. 7 and is a perspective view which shows a semiconductor device according to a second preferred embodiment of the present invention.

FIG. 16 is a sectional perspective view of a region corresponding to FIG. 7 and is a perspective view which shows a semiconductor device 151 according to the second preferred embodiment of the present invention. Hereinafter, structures corresponding to the structures described for the semiconductor device 1 shall be provided with the same reference symbols and description thereof shall be omitted.

In the semiconductor device 1, the plurality of first FET structures 58 and the plurality of second FET structures 68 are formed in the manner that one first FET structure 58 and one second FET structure 68 are alternately arrayed. In contrast, in the semiconductor device 151, the plurality of first FET structures 58 and the plurality of second FET structures 68 are formed in a manner that a group of a plurality (in this embodiment, two) of first FET structures 58 and a group of a plurality (in this embodiment, two) of second FET structures 68 are alternately arrayed.

Further, in the semiconductor device 1, the second channel rate R2 (second channel area S2) is equal to the first channel rate R1 (first channel area Si). In contrast thereto, in the semiconductor device 151, the second channel rate R2 is different from the first channel rate R1 (R1≠R2). More specifically, the second channel rate R2 is less than the first channel rate R1 (R2<R1). Hereinafter, a specific description will be given of a structure of the semiconductor device 151.

With reference to FIG. 16, in this embodiment, the plurality of cell regions 75 are each defined to a region between two first FET structures 58 which are adjacent to each other, a region between one first FET structure 58 and one second FET structure 68 which are adjacent to each other, and a region between two second FET structures 68 which are adjacent to each other.

In this embodiment, three types of total channel rates RT which are different in value from each other are applied to the plurality of cell regions 75. The three types of total channel rates RT include a first total channel rate RT1, a second total channel rate RT2, and a third total channel rate RT3.

The first total channel rate RT1 is applied to the region between two first FET structures 58 which are adjacent to each other. No second channel region 111 is formed in the region between two first FET structures 58 which are adjacent to each other, for structural reasons.

The first total channel rate RT1 is a total value of the first channel rates R1 of two first FET structures 58 which are adjacent to each other. The first total channel rate RT1 may be adjusted to a range from not less than 60% to not more than 80% as an example. In this embodiment, the first total channel rate RT1 is adjusted to 75%. In the first total channel rate RT1, the first channel rate R1 on one side and the first channel rate R1 on the other side are each 37.5%.

The second total channel rate RT2 is applied to the region between one first FET structure 58 and one second FET structure 68 which are adjacent to each other. A first channel region 91 and a second channel region 111 are formed in the region between one first FET structure 58 and one second FET structure 68 which are adjacent to each other, due to its structure.

The second total channel rate RT2 is a total value of the first channel rate R1 and the second channel rate R2. The second total channel rate RT2 may be adjusted to a range in excess of 40% and less than 60% as an example. In this embodiment, the second total channel rate RT2 is adjusted to 50%. In the second total channel rate RT2, the first channel rate R1 is 25% and the second channel rate R2 is 25%.

The third total channel rate RT3 is applied to the region between two second FET structures 68 which are adjacent to each other. No first channel region 91 is formed in the region between two second FET structures 68 which are adjacent to each other, due to its structure.

The third total channel rate RT3 is a total value of the second channel rates R2 of two second FET structures 68 which are adjacent to each other. The third total channel rate RT3 may be adjusted to a range from not less than 20% to not more than 40% as an example. In this embodiment, the third total channel rate RT3 is adjusted to 25%. In the third total channel rate RT3, the second channel rate R2 on one side and the second channel rate R2 on the other side are each 12.5%.

The first channel region 91 occupies a rate in excess of 50% (½) of a total channel. In this embodiment, the first channel region 91 occupies 62.5% of the total channel, and the second channel region 111 occupies 37.5% of the total channel. That is, the second channel rate R2 is less than the first channel rate R1 (R2<R1). In this embodiment, the average channel rate RAV is 50%. Other structures of the semiconductor device 151 are similar to those of the semiconductor device 1. In this embodiment, control which shall be described hereinafter is performed.

Figure 17A:
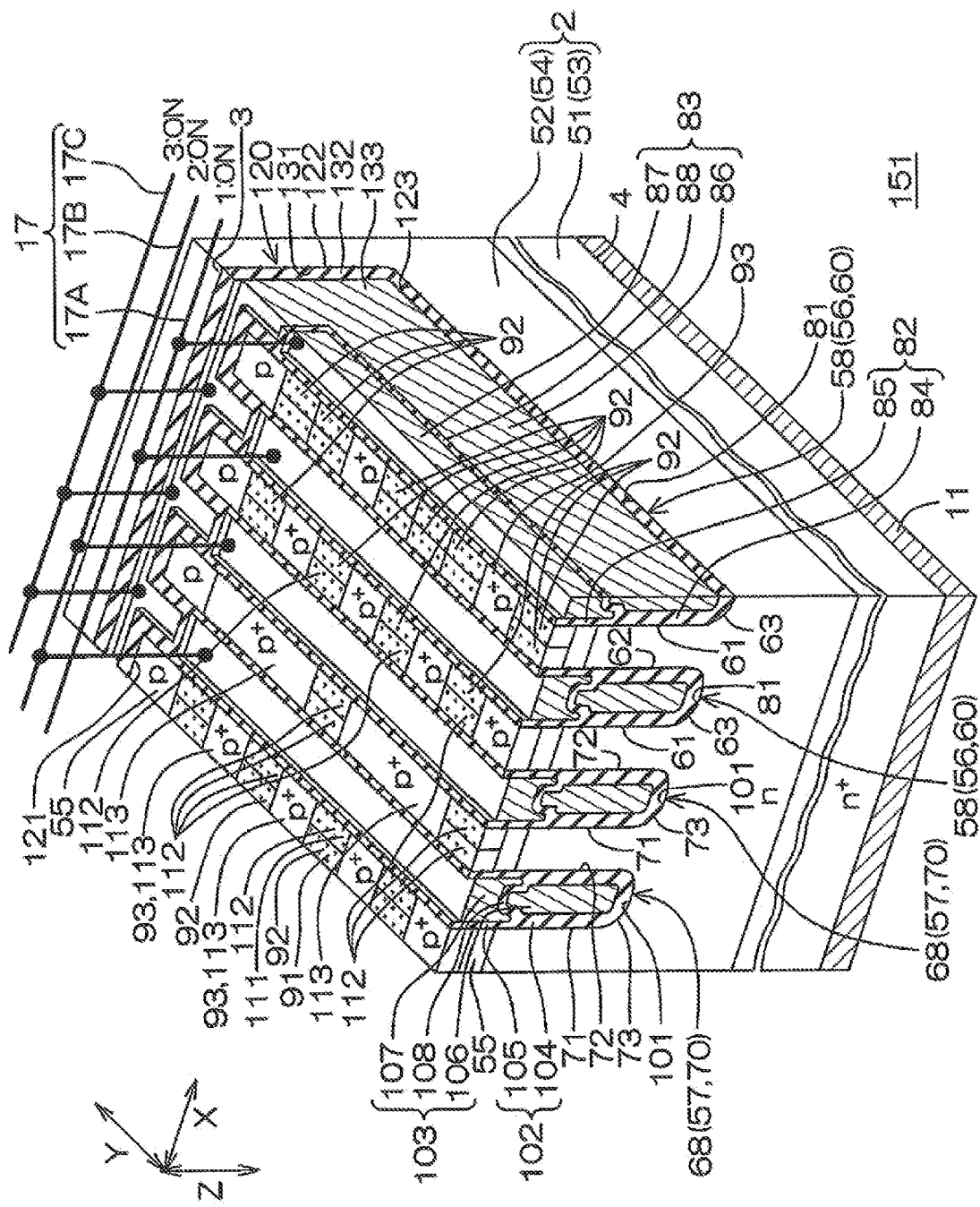
FIG. 17A is a sectional perspective view for describing normal operation according to a first control example of the semiconductor device shown in FIG. 16.
Figure 17B:
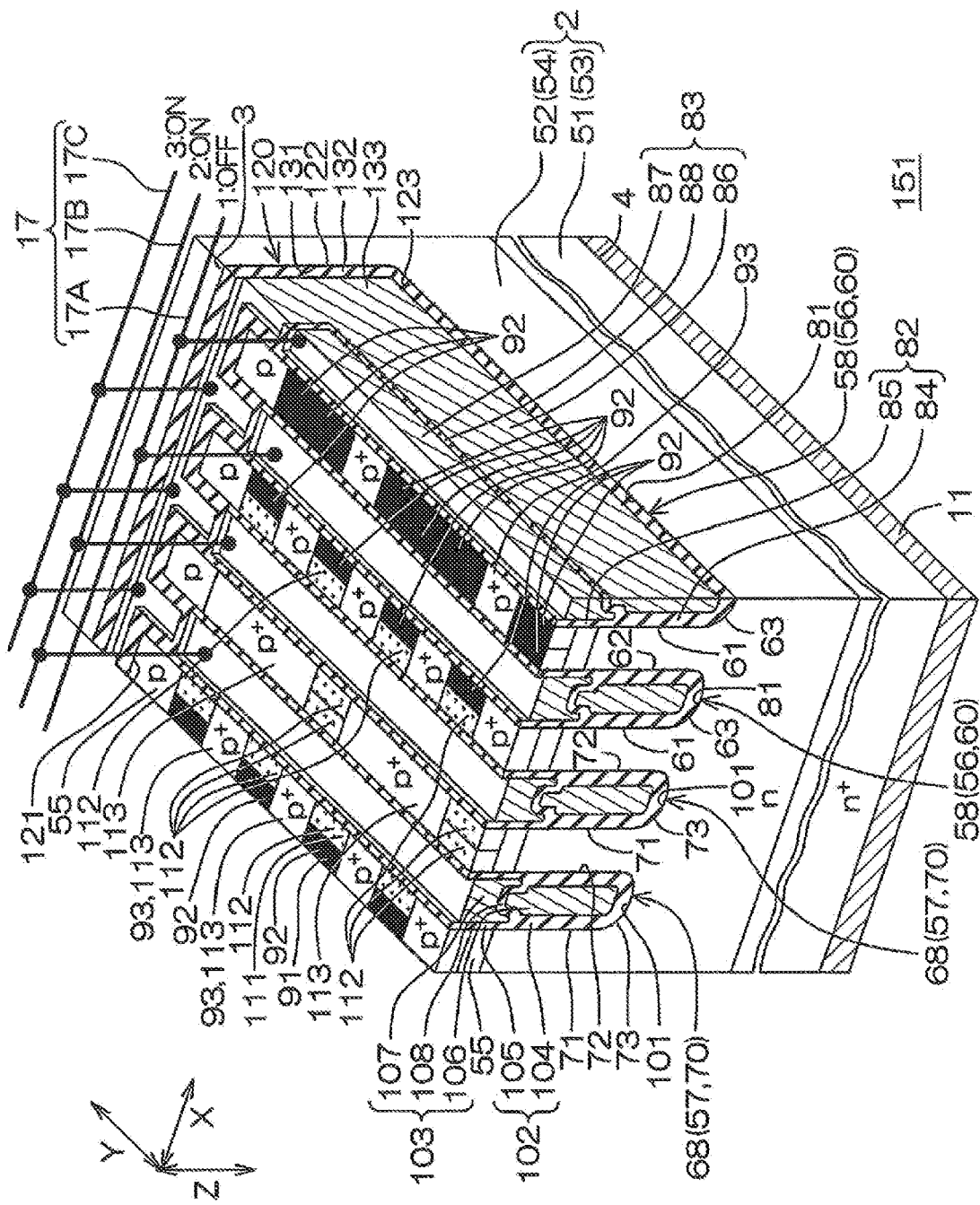
FIG. 17B is a sectional perspective view for describing active clamp operation according to the first control example of the semiconductor device shown in FIG. 16.

FIG. 17A is a sectional perspective view for describing the normal operation according to a first control example of the semiconductor device 151 shown in FIG. 1. FIG. 17B is a sectional perspective view for describing the active clamp operation according to the first control example of the semiconductor device 151 shown in FIG. 1. In FIG. 17A and FIG. 17B, for convenience of description, structure in the first main surface 3 are omitted to simplify a gate control wiring 17.

With reference to FIG. 17A, when the power MISFET 9 is in the normal operation, a first ON signal Von1 is input to the first gate control wiring 17A, a second ON signal Von2 is input to the second gate control wiring 17B, and a third ON signal Von3 is input to the third gate control wiring 17C.

The first ON signal Von1, the second ON signal Von2, and the third ON signal Von3 are each input from the control IC 10. The first ON signal Von1, the second ON signal Von2, and the third ON signal Von3 each have a voltage equal to or higher than the gate threshold voltage Vth. The first ON signal Von1, the second ON signal Von2, and the third ON signal Von3 may each have an equal voltage.

In this case, the first opening-side electrode 87, the second opening-side electrode 107, the first bottom-side electrode 86, and the second bottom-side electrode 106 are each put into the ON state. That is, the first opening-side electrode 87, the second opening-side electrode 107, the first bottom-side electrode 86, and the second bottom-side electrode 106 each function as a gate electrode.

Thereby, the first channel region 91 and the second channel region 111 are both controlled to be in the ON states. In FIG. 17A, the first channel region 91 and the second channel region 111 in the ON states are indicated by dotted hatching.

As a result, a first MISFET 56 and a second MISFET 57 are both driven (Full-ON control). The channel utilization rate Ru in the normal operation is 100%. The characteristics channel rate RC in the normal operation is 50%. Thereby, the area resistivity Ron·A approaches the area resistivity Ron·A shown by a second plot point P2 in the graph of FIG. 13.

On the other hand, with reference to FIG. 17B, when the power MISFET 9 is in the active clamp operation, an OFF signal Voff is input to the first gate control wiring 17A, a first clamp ON signal VCon1 is input to the second gate control wiring 17B, and a second clamp ON signal VCon2 is input to the third gate control wiring 17C.

The OFF signal Voff, the first clamp ON signal VCon1, and the second clamp ON signal VCon2 are each input from the control IC 10. The OFF signal Voff has a voltage less than the gate threshold voltage Vth (for example, the reference voltage). The first clamp ON signal VCon1 and the second clamp ON signal VCon2 each have a voltage equal to or higher than the gate threshold voltage Vth. The first clamp ON signal VCon1 and the second clamp ON signal VCon2 may each have an equal voltage. The first clamp ON signal VCon1 and the second clamp ON signal VCon2 may each have a voltage not more than or less than a voltage in the normal operation.

In this case, the first opening-side electrode 87 is put into the OFF state, and the second opening-side electrode 107, the first bottom-side electrode 86, and the second bottom-side electrode 106 are put into the ON states. Thereby, the first channel region 91 is controlled to be in the OFF state, and the second channel region 111 is controlled to be in the ON state. In FIG. 17B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation. More specifically, the first channel region 91 having the first channel rate R1 (R2<R1) in excess of the second channel rate R2 is controlled to be in the OFF state, and the channel utilization rate RU in the active clamp operation therefore becomes less than ½ of the channel utilization rate RU in the normal operation.

The channel utilization rate RU in the active clamp operation is 37.5%. Further, the characteristics channel rate RC in the active clamp operation is 18.75%. Thereby, the active clamp capability Eac approaches the active clamp capability Eac indicated by the fourth plot point P4 in the graph of FIG. 13 or exceeds the active clamp capability Eac concerned.

Figure 18A:
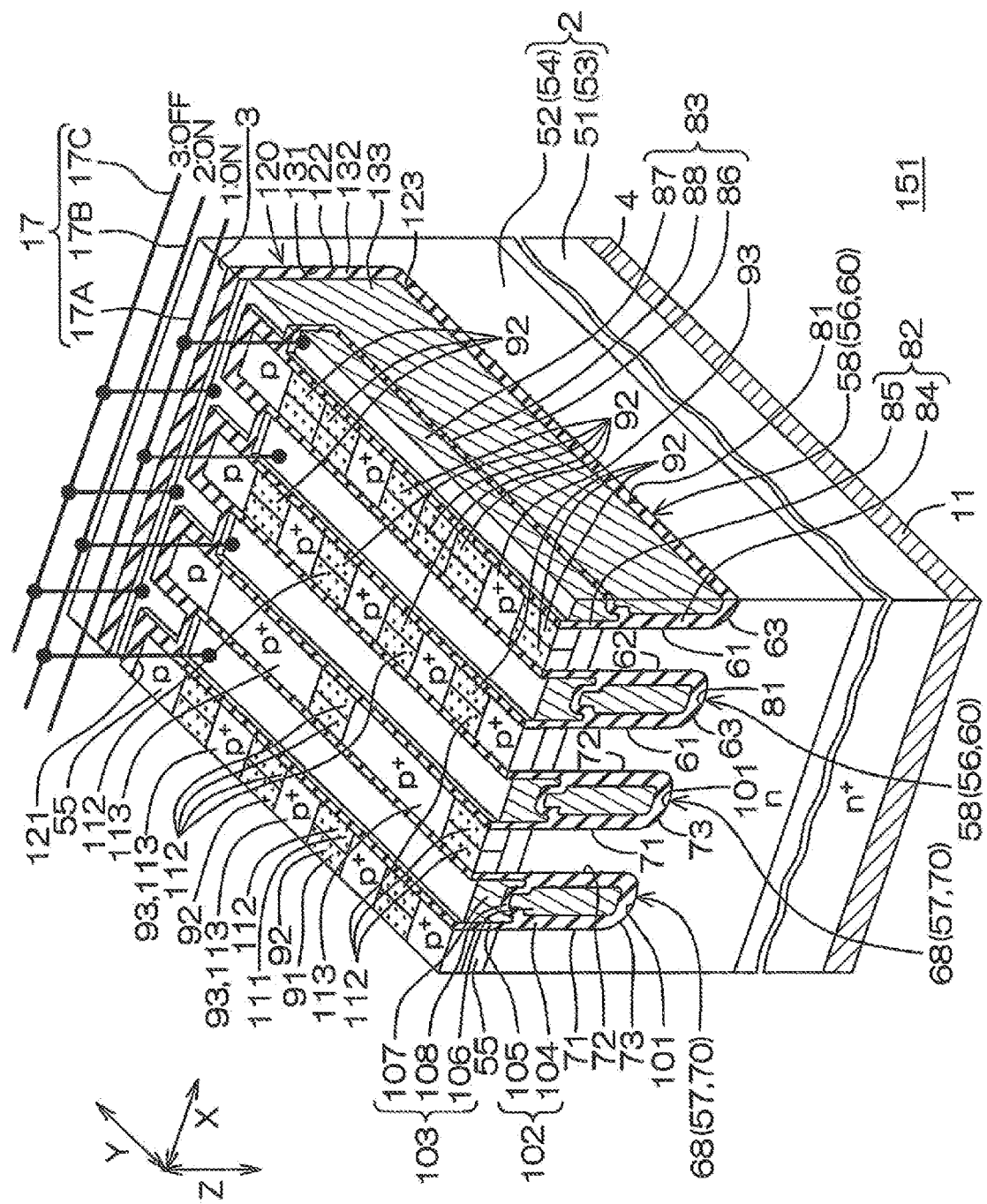
FIG. 18A is a sectional perspective view for describing normal operation according to a second control example of the semiconductor device shown in FIG. 16.
Figure 18B:
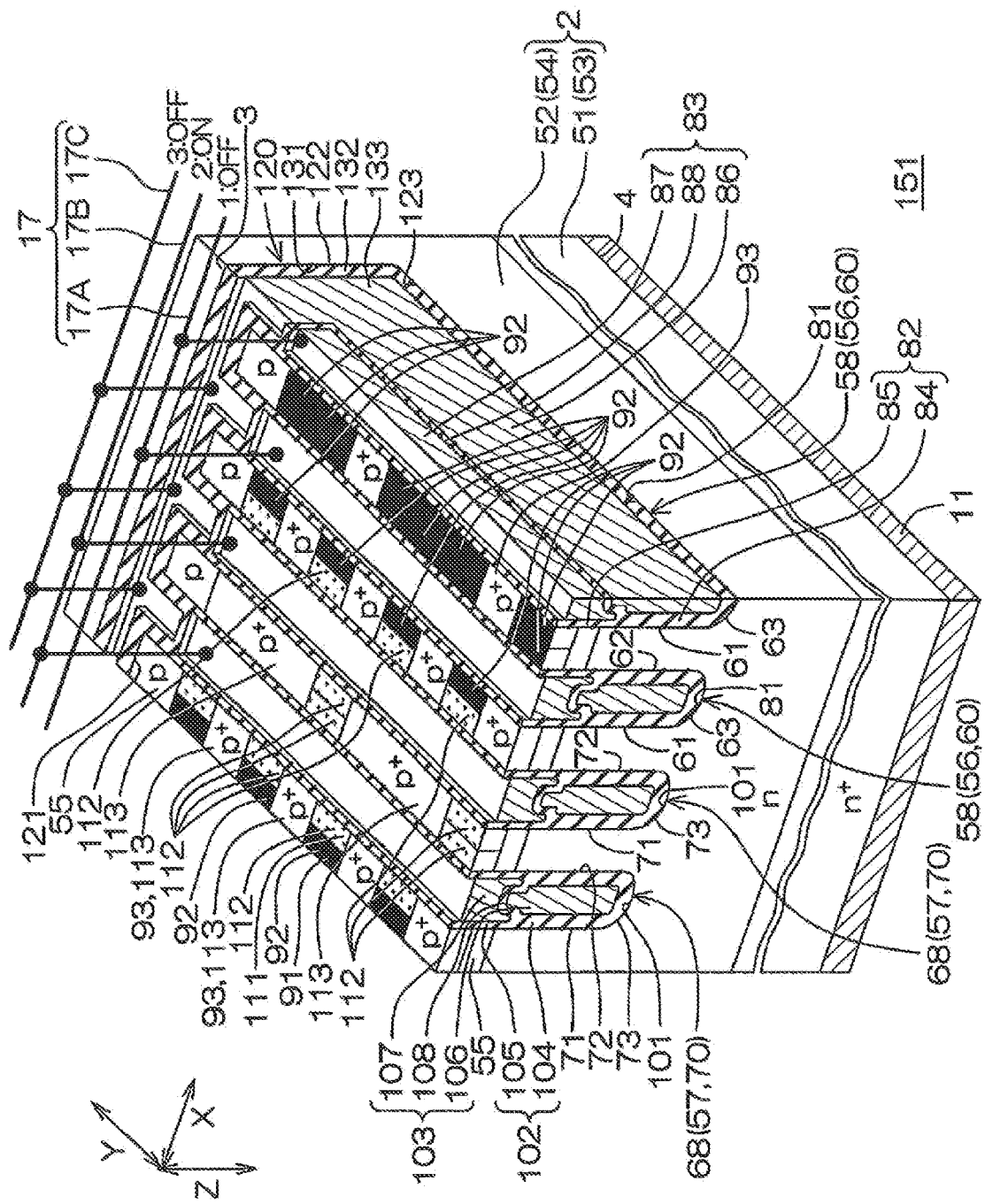
FIG. 18B is a sectional perspective view for describing active clamp operation according to the second control example of the semiconductor device shown in FIG. 16.

FIG. 18A is a sectional perspective view for describing the normal operation according to a second control example of the semiconductor device 151 shown in FIG. 16. FIG. 18B is a sectional perspective view for describing the active clamp operation according to the second control example of the semiconductor device 151 shown in FIG. 16. In FIG. 18A and FIG. 18B, for convenience of description, structures in the first main surface 3 are omitted to simplify a gate control wiring 17.

With reference to FIG. 18A, when the power MISFET 9 is in the normal operation, a first ON signal Von1 is input to the first gate control wiring 17A, a second ON signal Von2 is input to the second gate control wiring 17B, and the OFF signal Voff is input to the third gate control wiring 17C.

The first ON signal Von1, the second ON signal Von2, and the OFF signal Voff are each input from the control IC 10. The first ON signal Von1 and the second ON signal Von2 each have a voltage not less than the gate threshold voltage Vth. The first ON signal Von1 and the second ON signal Von2 may each have an equal voltage. The OFF signal Voff may be the reference voltage.

In this case, the first opening-side electrode 87 and the second opening-side electrode 107 are each put into the ON state, and the first bottom-side electrode 86 and the second bottom-side electrode 106 are each put into the OFF state. That is, while the first opening-side electrode 87 and the second opening-side electrode 107 each function as a gate electrode, the first bottom-side electrode 86 and the second bottom-side electrode 106 each function as a field electrode.

Thereby, the first channel region 91 and the second channel region 111 are both controlled to be in the ON states. In FIG. 18A, the first channel region 91 and the second channel region 111 in the ON states are indicated by dotted hatching.

As a result, the first MISFET 56 and the second MISFET 57 are both driven (Full-ON control). The channel utilization rate RU in the normal operation is 100%. The characteristics channel rate RC in the normal operation is 50%. Thereby, the area resistivity Ron·A approaches the area resistivity Ron·A indicated by the second plot point P2 in the graph of FIG. 13.

On the other hand, with reference to FIG. 18B, when the power MISFET 9 is in the active clamp operation, a first OFF signal Voff1 is input to the first gate control wiring 17A, a clamp ON signal VCon is input to the second gate control wiring 17B, and a second OFF signal Voff2 is input to the third gate control wiring 17C.

The first OFF signal Voff1, the clamp ON signal VCon, and the second OFF signal Voff2 are each input from the control IC 10. The first OFF signal Voff1 has a voltage less than the gate threshold voltage Vth (for example, the reference voltage). The clamp ON signal VCon has a voltage not less than the gate threshold voltage Vth. The clamp ON signal VCon may have a voltage not more than or less than a voltage in the normal operation. The second OFF signal Voff2 may be the reference voltage.

In this case, the first opening-side electrode 87, the first bottom-side electrode 86, and the second bottom-side electrode 106 are each put into the OFF state, and the second opening-side electrode 107 is put into the ON state. Thereby, the first channel region 91 is controlled to be in the OFF state, and the second channel region 111 is controlled to be in the ON state. In FIG. 18B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation. More specifically, the first channel region 91 having the first channel rate R1 (R2<R1) in excess of the second channel rate R2 is controlled to be in the OFF state, and the channel utilization rate RU in the active clamp operation therefore becomes less than ½ of the channel utilization rate RU in the normal operation.

The channel utilization rate RU in the active clamp operation is 37.5%. Further, the characteristics channel rate RC in the active clamp operation is 18.75%. Thereby, the active clamp capability Eac approaches the active clamp capability Eac indicated by the fourth plot point P4 in the graph of FIG. 13 or exceeds the active clamp capability Eac concerned.

Figure 19A:
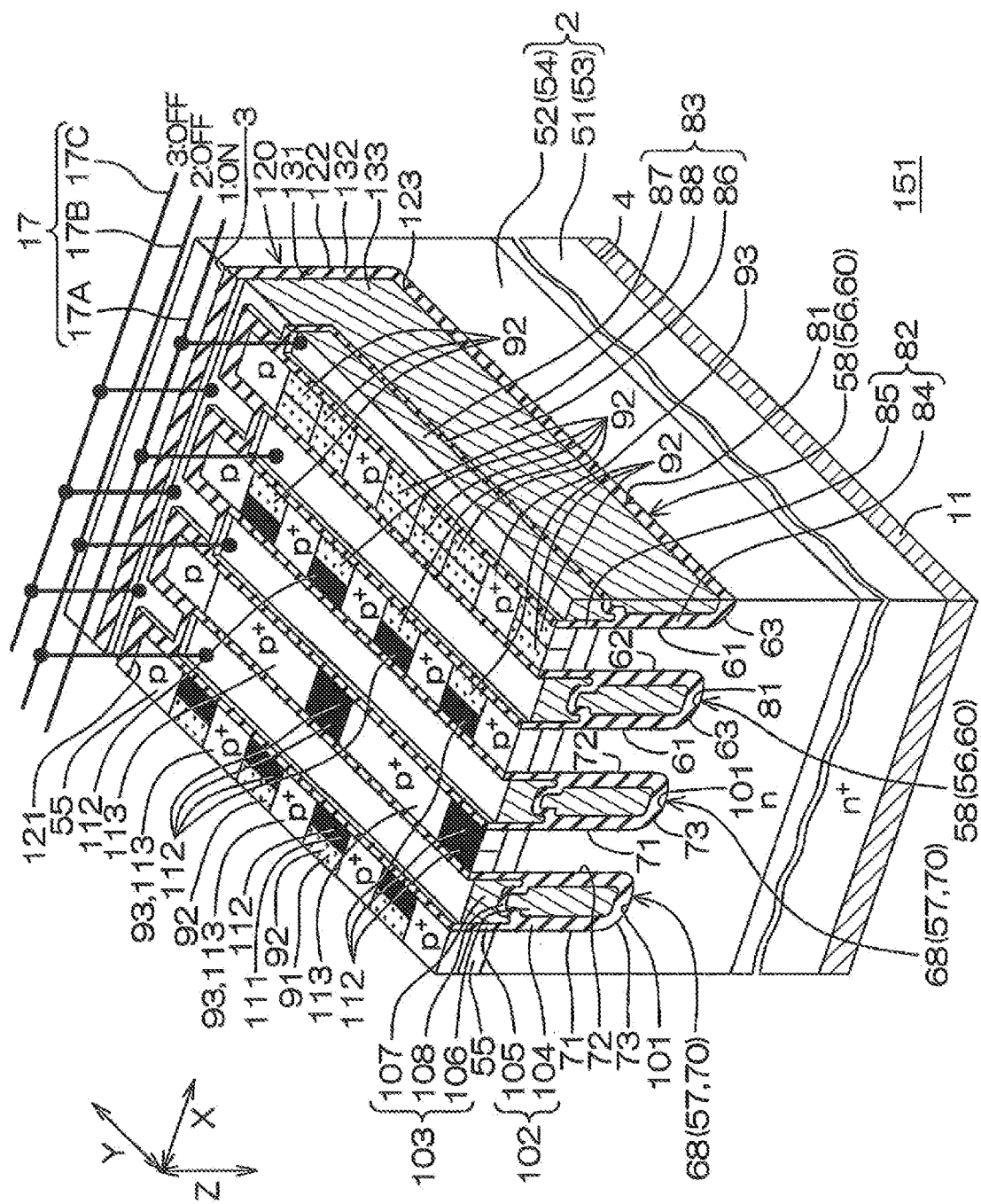
FIG. 19A is a sectional perspective view for describing normal operation according to a third control example of the semiconductor device shown in FIG. 16.
Figure 19B:
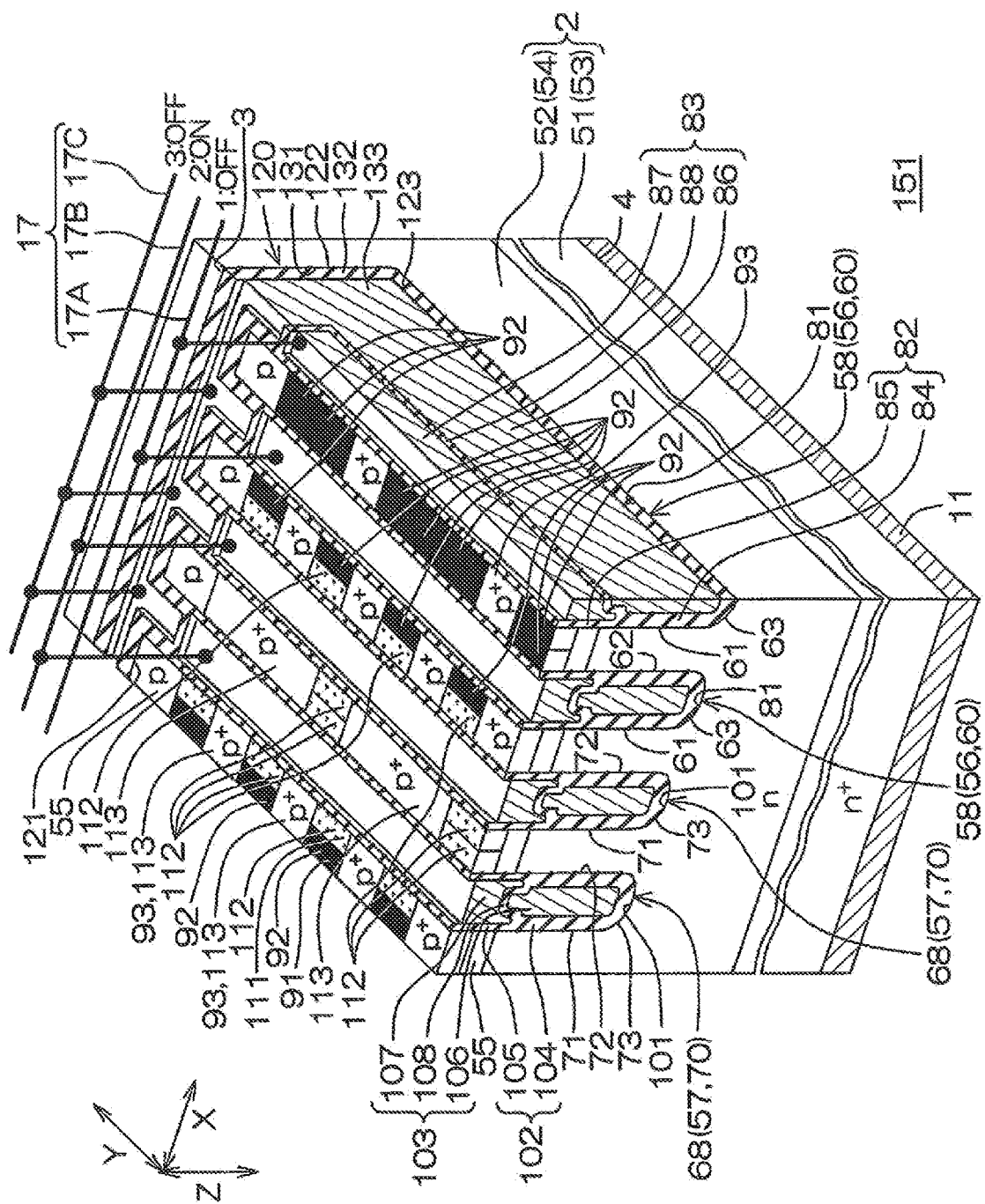
FIG. 19B is a sectional perspective view for describing active clamp operation according to the third control example of the semiconductor device shown in FIG. 16.

FIG. 19A is a sectional perspective view for describing the normal operation according to a third control example of the semiconductor device 151 shown in FIG. 16. FIG. 19B is a sectional perspective view for describing the active clamp operation according to the third control example of the semiconductor device 151 shown in FIG. 16. In FIG. 19A and FIG. 19B, for convenience of description, structures in the first main surface 3 are omitted to simplify a gate control wiring 17.

With reference to FIG. 19A, when the power MISFET 9 is in the normal operation, an ON signal Von is input to the first gate control wiring 17A, a first OFF signal Voff1 is input to the second gate control wiring 17B, and a second OFF signal Voff2 is input to the third gate control wiring 17C.

The ON signal Von, the first OFF signal Voff1, and the second OFF signal Voff2 are each input from the control IC 10. The ON signal Von has a voltage not less than the gate threshold voltage Vth. The first OFF signal Voff1 and the second OFF signal Voff2 may each have a voltage (for example, reference voltage) less than the gate threshold voltage Vth.

In this case, the first opening-side electrode 87 is put into the ON state, and the first bottom-side electrode 86, the second bottom-side electrode 106, and the second opening-side electrode 107 are each put into the OFF state. That is, while the first opening-side electrode 87 functions as a gate electrode, the first bottom-side electrode 86 and the second bottom-side electrode 106 each function as a field electrode.

Thereby, the first channel region 91 is controlled to be in the ON state, and the second channel region 111 is controlled to be in the OFF state. In FIG. 19A, the first channel region 91 in the ON state is indicated by dotted hatching, and the second channel region 111 in the OFF state is indicated by filled hatching.

As a result, while the first MISFET 56 is controlled to be in the ON state, the second MISFET 57 is controlled to be in the OFF state (first Half-ON control). Thereby, the second channel region 111 having the second channel rate R2 (R2<R1) less than the first channel rate R1 is controlled to be in the OFF state, and the characteristics channel rate RC in the normal operation therefore becomes less than the average channel rate RAV.

The channel utilization rate RU in the normal operation is 62.5%. Further, the characteristics channel rate RC in the normal operation is 31.25%. Thereby, the area resistivity Ron·A approaches the area resistivity Ron·A indicated by the third plot point P3 in the graph of FIG. 13.

On the other hand, with reference to FIG. 19B, when the power MISFET 9 is in the active clamp operation, a first OFF signal Voff1 is input to the first gate control wiring 17A, a clamp ON signal VCon is input to the second gate control wiring 17B, and a second OFF signal Voff2 is input to the third gate control wiring 17C.

The first OFF signal Voff1, the clamp ON signal VCon, and the second OFF signal Voff2 are each input from the control IC 10. The first OFF signal Voff1 has a voltage less than the gate threshold voltage Vth (for example, the reference voltage). The clamp ON signal VCon has a voltage not less than the gate threshold voltage Vth. The clamp ON signal VCon may have a voltage not more than or less than a voltage in the normal operation. The second OFF signal Voff2 may be the reference voltage.

In this case, the second opening-side electrode 107 is put into the ON state, and the first bottom-side electrode 86, the first opening-side electrode 87, and the second bottom-side electrode 106 are each put into the OFF state. That is, while the second opening-side electrode 107 functions as a gate electrode, the first bottom-side electrode 86 and the second bottom-side electrode 106 each function as a field electrode.

Thereby, the first channel region 91 is controlled to be in the OFF state, and the second channel region 111 is controlled to be in the ON state. In FIG. 19B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the first channel region 91 having the first channel rate R1 (R2<R1) in excess of the second channel rate R2 is controlled to be in the OFF state, and the channel utilization rate RU in the active clamp operation therefore becomes in excess of zero and less than the channel utilization rate RU in the normal operation.

The channel utilization rate RU in the active clamp operation is 37.5%. Further, the characteristics channel rate RC in the active clamp operation is 18.75%. Thereby, the active clamp capability Eac approaches the active clamp capability Eac indicated by the second plot point P2 in the graph of FIG. 13 or exceeds the active clamp capability Eac.

In the third control example, in the normal operation and in the active clamp operation, the OFF signal Voff is input to the third gate control wiring 17C. However, in the normal operation and in the active clamp operation, the ON signal Von may be input to the third gate control wiring 17C.

As described above, the same effects as those described for the semiconductor device 1 can be exhibited as well by the semiconductor device 151. In particular, according to the semiconductor device 151, the second channel rate R2 is different from the first channel rate R1 (R1≠R2). Specifically, the second channel rate R2 is less than the first channel rate R1 (R1>R2).

In the above-described structure, the control IC 10 controls the first MISFET 56 and the second MISFET 57 such that the channel utilization rate RU in the active clamp operation becomes in excess of zero and less than the channel utilization rate RU in the normal operation. More specifically, the control IC 10 controls the first channel region 91 to be in the OFF state and controls the second channel region 111 to be in the ON state in the active clamp operation. Thereby, it is possible to enhance the effects of improving the active clamp capability Eac.

Further, according to the semiconductor device 151, as shown in the third control example, the first Half-ON control can be applied in the normal operation and the second Half-ON control can be applied in the active clamp operation. Further, according to the semiconductor device 151, the second Half-ON control can be applied in the normal operation and the first Half-ON control can be applied in the active clamp operation.

Therefore, according to the semiconductor device 151, by only changing a control pattern, it becomes possible to realize various types of area resistivity Ron·A and active clamp capability Eac, while having the same average channel rate RAV.

Further, in the semiconductor device 151, in a manner that the group of the plurality (in this embodiment, two) of first FET structures 58 and the group of the plurality (in this embodiment, two) of second FET structures 68 are alternately arrayed, the plurality of first FET structures 58 and the plurality of second FET structures 68 are formed.

According to a structure in which the plurality of first FET structures 58 are adjacent to each other, the first channel region 91 can be formed, without being connected to the second channel region 111, in the region between the plurality of first FET structures 58 which are adjacent to each other. Therefore, it is possible to appropriately form the first channel region 91 and appropriately adjust the first channel rate R1.

Similarly, according to a structure in which the plurality of second FET structures 68 are adjacent to each other, the second channel region 111 can be formed, without being connected to the first channel region 91, in the region between the plurality of second FET structures 68 which are adjacent to each other. Therefore, it is possible to appropriately form the second channel region 111 and appropriately adjust the second channel rate R2. Thereby, the average channel rate RAV and the characteristics channel rate RC can be appropriately adjusted.

Figure 20:
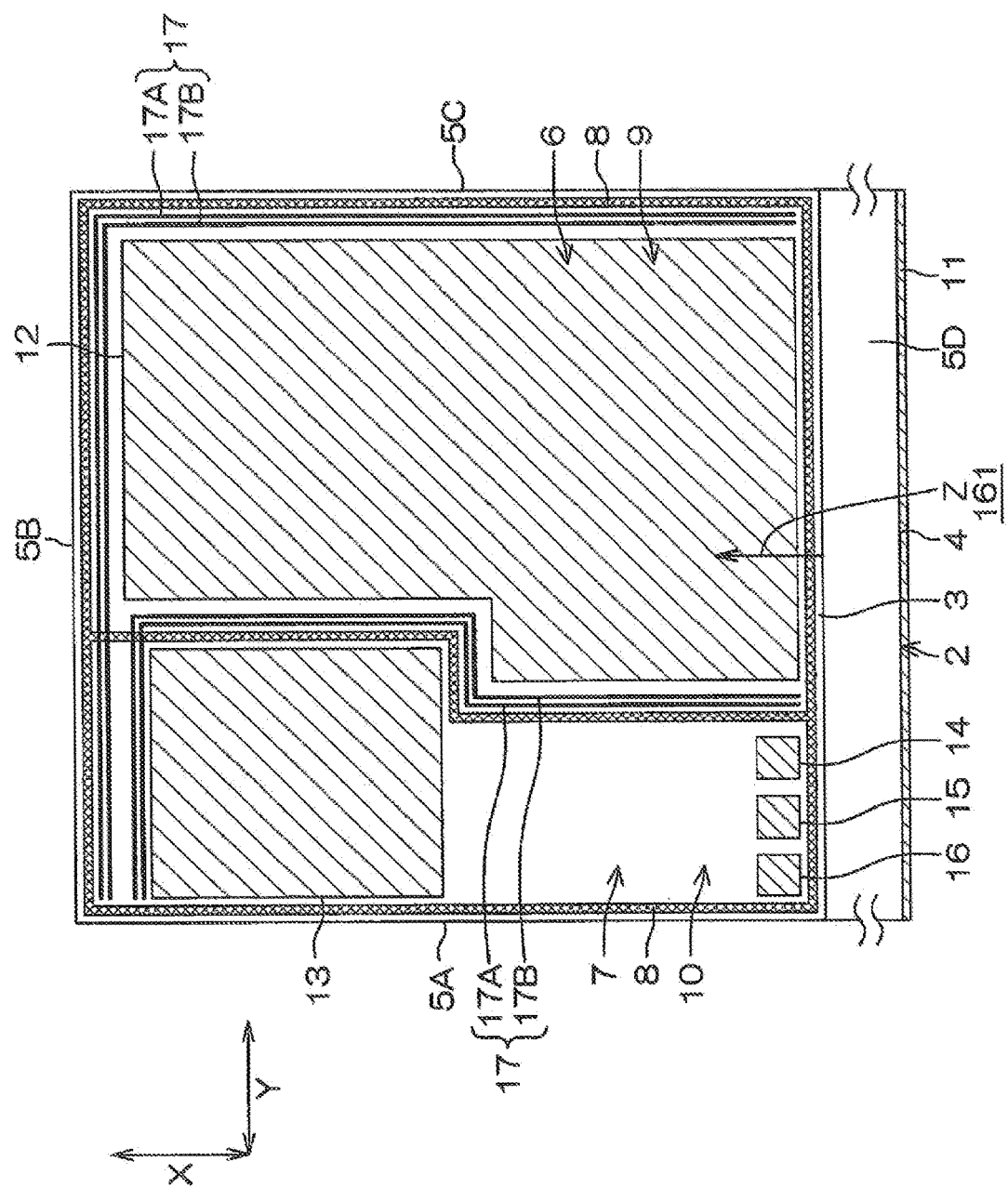
FIG. 20 is a perspective view of the semiconductor device according to the third preferred embodiment of the present invention which is viewed from one direction.
Figure 21:
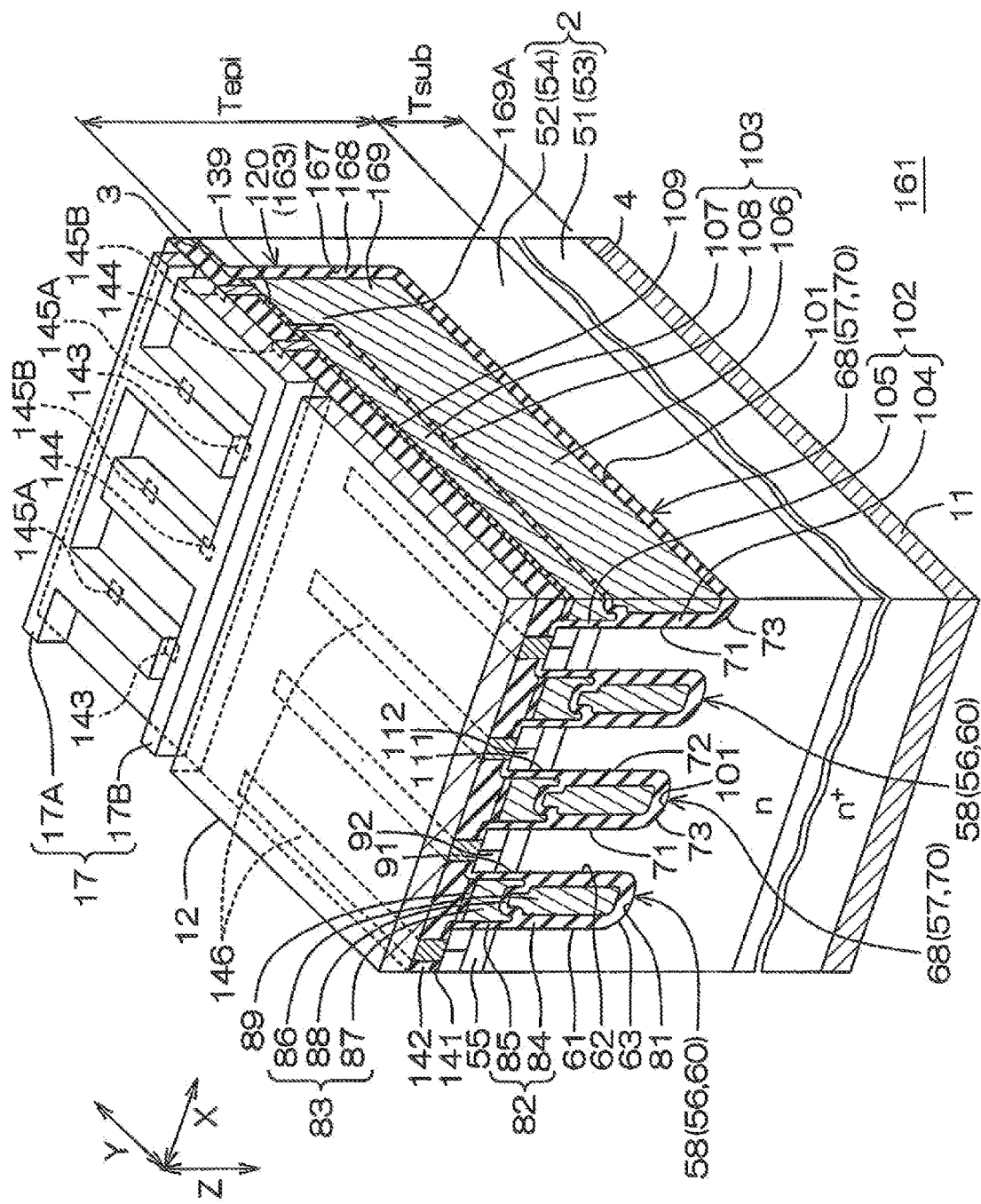
FIG. 21 is a sectional perspective view of a region XXI shown in FIG. 20.
Figure 22:
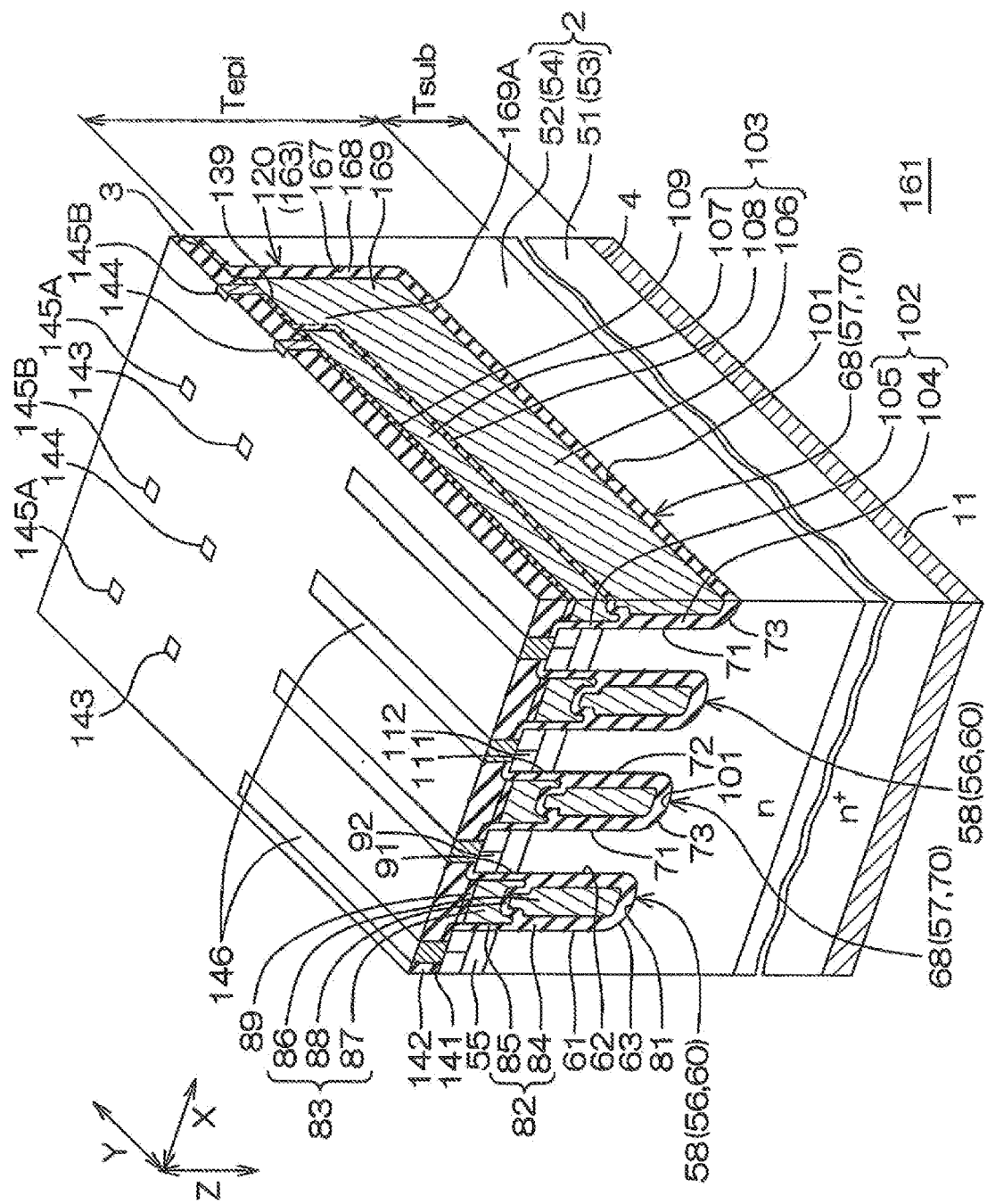
FIG. 22 is a sectional perspective view in which an electrode is removed from FIG. 21.
Figure 23:
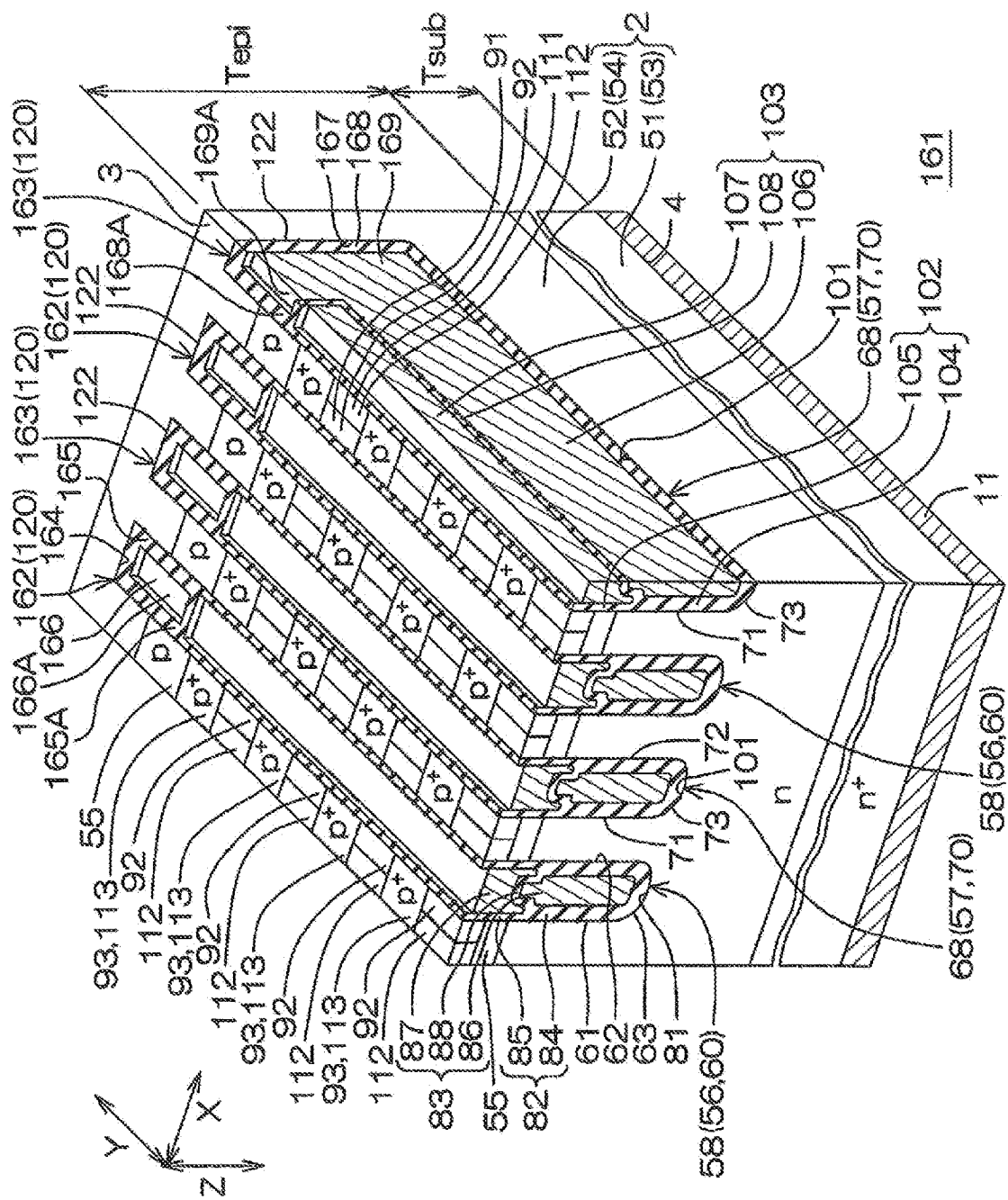
FIG. 23 is a sectional perspective view in which structures on the semiconductor layer are removed from FIG. 22.

FIG. 20 is a perspective view of a semiconductor device 161 according to a third preferred embodiment of the present invention which is viewed from one direction. FIG. 21 is a sectional perspective view of a region XXI shown in FIG. 20. FIG. 22 is a sectional perspective view in which a source electrode 12 and a gate control wiring 17 are removed from FIG. 21. FIG. 23 is a sectional perspective view in which an interlayer insulation layer 142 is removed from FIG. 22. Hereinafter, structures corresponding to the structures described for the semiconductor device 1 shall be provided with the same reference symbols and description thereof shall be omitted.

In the semiconductor device 1, the gate control wiring 17 includes the first gate control wiring 17A, the second gate control wiring 17B, and the third gate control wiring 17C. In contrast thereto, in the semiconductor device 161, the gate control wiring 17 does not have the third gate control wiring 17C and only has the first gate control wiring 17A and the second gate control wiring 17B.

Further, in the semiconductor device 1, the second bottom-side electrode 106 is electrically connected to the first bottom-side electrode 86. In contrast thereto, in the semiconductor device 161, the second bottom-side electrode 106 is electrically insulated from the first bottom-side electrode 86.

More specifically, the semiconductor device 161 includes a plurality of trench contact structures 120 which are each connected to the first trench gate structure 60 and the second trench gate structure 70 in a manner that the first trench gate structure 60 and the second trench gate structure 70 are electrically insulated from each other.

A region which is at the side of the other end portion side of a first FET structure 58 and at the side of the other end portion side of a second FET structure 68 are similar in structure to a region which is at the side of one end portion of the first FET structure 58 and at the side of one end portion of the second FET structure 68. Hereinafter, a description will be given of the structure of the region which is at the side of one end portion of the first FET structure 58 and at the side of one end portion of the second FET structure 68 as an example, and a description of the structure of the region which is at the side of the other end portion side of a first FET structure 58 and at the side of the other end portion side of a second FET structure 68 shall be omitted.

With reference to FIG. 20 to FIG. 23, the plurality of trench contact structures 120 include a plurality of first trench contact structures 162 and a plurality of second trench contact structures 163. Each of the first trench contact structures 162 is connected to one end portion of corresponding one of the plurality of first trench gate structures 60 at an interval from the plurality of second trench gate structures 70. In this embodiment, the first trench contact structures 162 are connected to the corresponding first trench gate structures 60 in a one-to-one correspondence.

Each of the second trench contact structures 163 is connected to one end portion of corresponding one of the plurality of second trench gate structures 70 at an interval from the plurality of first trench gate structures 60. In this embodiment, the second trench contact structures 163 are connected to the corresponding second trench gate structures 70 in a one-to-one correspondence.

Each of the first trench contact structure 162 includes a first contact trench 164, a first contact insulation layer 165, and a first contact electrode 166. The first contact trench 164, the first contact insulation layer 165, and the first contact electrode 166 correspond respectively to the contact trench 131, the contact insulation layer 132, and the contact electrode 133 aforementioned.

The first contact trench 164 communicates with one end portion of a first gate trench 81. With respect to the first direction X, a width WTC1 of the first contact trench 164 is equal to a first width WT1 of the first gate trench 81 (WTC1=WT1). The first contact trench 164 forms, with the first gate trench 81, one trench which extends along the second direction Y.

The first contact insulation layer 165 is integrally formed with the first insulation layer 82 in a communication portion between the first gate trench 81 and the first contact trench 164. More specifically, the first contact insulation layer 165 includes a lead-out insulation layer 165A which is led out to the inside of the first gate trench 81. The lead-out insulation layer 165A corresponds to the lead-out insulation layer 132A aforementioned. That is, the first contact insulation layer 165 crosses the communication portion and is integrally formed with the first bottom-side insulation layer 84 and the first opening-side insulation layer 85 inside the first gate trench 81.

The first contact electrode 166 is integrally formed with the first bottom-side electrode 86 in the communication portion between the first gate trench 81 and the first contact trench 164. More specifically, the first contact electrode 166 includes a lead-out electrode 166A which is led out to the inside of the first gate trench 81. The lead-out electrode 166A corresponds to the lead-out electrode 133A aforementioned.

That is, the first contact electrode 166 crosses the communication portion and is electrically connected to the first bottom-side electrode 86 inside the first gate trench 81. Inside the first gate trench 81, the first intermediate insulation layer 88 is interposed between the first contact electrode 166 and the first opening-side electrode 87.

Each of the second trench contact structures 163 includes a second contact trench 167, a second contact insulation layer 168, and a second contact electrode 169. The second contact trench 167, the second contact insulation layer 168, and the second contact electrode 169 correspond respectively to the contact trench 131, the contact insulation layer 132, and the contact electrode 133 aforementioned.

The second contact trench 167 communicates with one end portion of the second gate trench 101. With respect to the first direction X, a width WTC2 of the second contact trench 167 is equal to the second width WT2 of the second gate trench 101 (WTC2=WT2). The second contact trench 167 forms, with the second gate trench 101, one trench extending along the second direction Y.

The second contact insulation layer 168 is integrally formed with the second insulation layer 102 in a communication portion between the second gate trench 101 and the second contact trench 167. Specifically, the second contact insulation layer 168 includes a lead-out insulation layer 168A which is led out to the inside of the second gate trench 101. The lead-out insulation layer 168A corresponds to the lead-out insulation layer 132A aforementioned. That is, the second contact insulation layer 168 crosses the communication portion and is formed integrally with the second bottom-side insulation layer 104 and the second opening-side insulation layer 105 inside the second gate trench 101.

The second contact electrode 169 is integrally formed with the second bottom-side electrode 106 in the communication portion between the second gate trench 101 and the second contact trench 167. Specifically, the second contact electrode 169 includes a lead-out electrode 169A which is led out to the inside of the second gate trench 101. The lead-out electrode 169A corresponds to the aforementioned lead-out electrode 133A.

That is, the second contact electrode 169 crosses the communication portion and is electrically connected to the second bottom-side electrode 106 inside the second gate trench 101. Inside the second gate trench 101, the second intermediate insulation layer 108 is interposed between the second contact electrode 169 and the second opening-side electrode 107.

The second contact electrode 169 is electrically insulated from the first contact electrode 166. Thereby, the second bottom-side electrode 106 is electrically insulated from the first bottom-side electrode 86. That is, the first bottom-side electrode 86 and the second bottom-side electrode 106 are configured such as to be independently controlled with each other.

In this embodiment, the plurality of third plug electrodes 145 include a plurality of third plug electrodes 145A and a plurality of third plug electrodes 145B. The plurality of third plug electrodes 145A are each embedded in a part which covers the first contact electrode 166 of the first trench contact structure 162 in an interlayer insulation layer 142. The plurality of third plug electrodes 145A penetrate through the interlayer insulation layer 142 and are connected to the first contact electrode 166.

The plurality of third plug electrodes 145B are each embedded in a part which covers the second contact electrode 169 of the second trench contact structure 163 in the interlayer insulation layer 142. The plurality of third plug electrodes 145B penetrate through the interlayer insulation layer 142 and are connected to the second contact electrode 169.

The first gate control wiring 17A of the gate control wiring 17 is electrically connected to the first bottom-side electrode 86 and the first opening-side electrode 87. More specifically, the first gate control wiring 17A is electrically connected to the plurality of first plug electrodes 143 and the plurality of third plug electrodes 145A in the interlayer insulation layer 142. The wiring pattern of the first gate control wiring 17A is arbitrary.

The gate control signal from the control IC 10 is input to the first gate control wiring 17A. The gate control signal is transmitted to the first bottom-side electrode 86 and the first opening-side electrode 87 through the plurality of first plug electrodes 143 and the plurality of third plug electrodes 145A.

Therefore, in this embodiment, the first bottom-side electrode 86 and the first opening-side electrode 87 are controlled to the same voltage at the same time. Thereby, it is possible to appropriately suppress a potential difference formed between the first bottom-side electrode 86 and the first opening-side electrode 87 and therefore it is possible to appropriately suppress an electric field concentration on the first intermediate insulation layer 88. As a result, it is possible to increase a withstand voltage of the first trench gate structure 60.

The second gate control wiring 17B of the gate control wiring 17 is electrically connected to the second bottom-side electrode 106 and the second opening-side electrode 107. More specifically, the second gate control wiring 17B is electrically connected to the plurality of second plug electrodes 144 and the plurality of third plug electrodes 145B in the interlayer insulation layer 142. The wiring pattern of the second gate control wiring 17B is arbitrary.

The gate control signal from the control IC 10 is input to the second gate control wiring 17B. The gate control signal is transmitted to the second bottom-side electrode 106 and the second opening-side electrode 107 through the plurality of first plug electrodes 143 and the plurality of third plug electrodes 145B.

Therefore, in this embodiment, the second bottom-side electrode 106 and the second opening-side electrode 107 are controlled to the same voltage at the same time. Thereby, it is possible to appropriately suppress a potential difference formed between the second bottom-side electrode 106 and the second opening-side electrode 107 and therefore it is possible to appropriately suppress an electric field concentration on the second intermediate insulation layer 108. As a result, it is possible to increase a withstand voltage of the second trench gate structure 70.

Figure 24A:
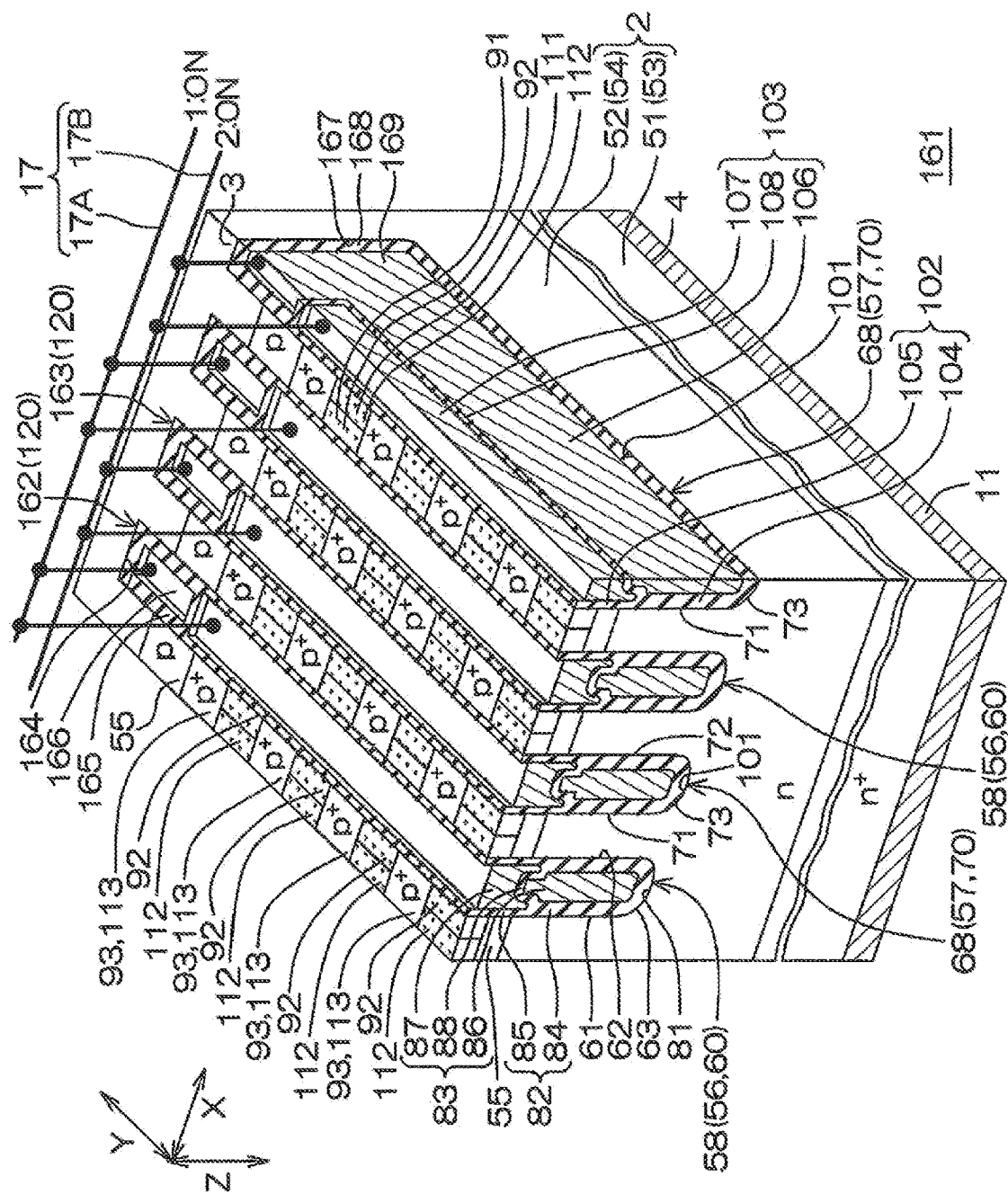
FIG. 24A is a sectional perspective view for describing normal operation of the semiconductor device shown in FIG. 23.
Figure 24B:
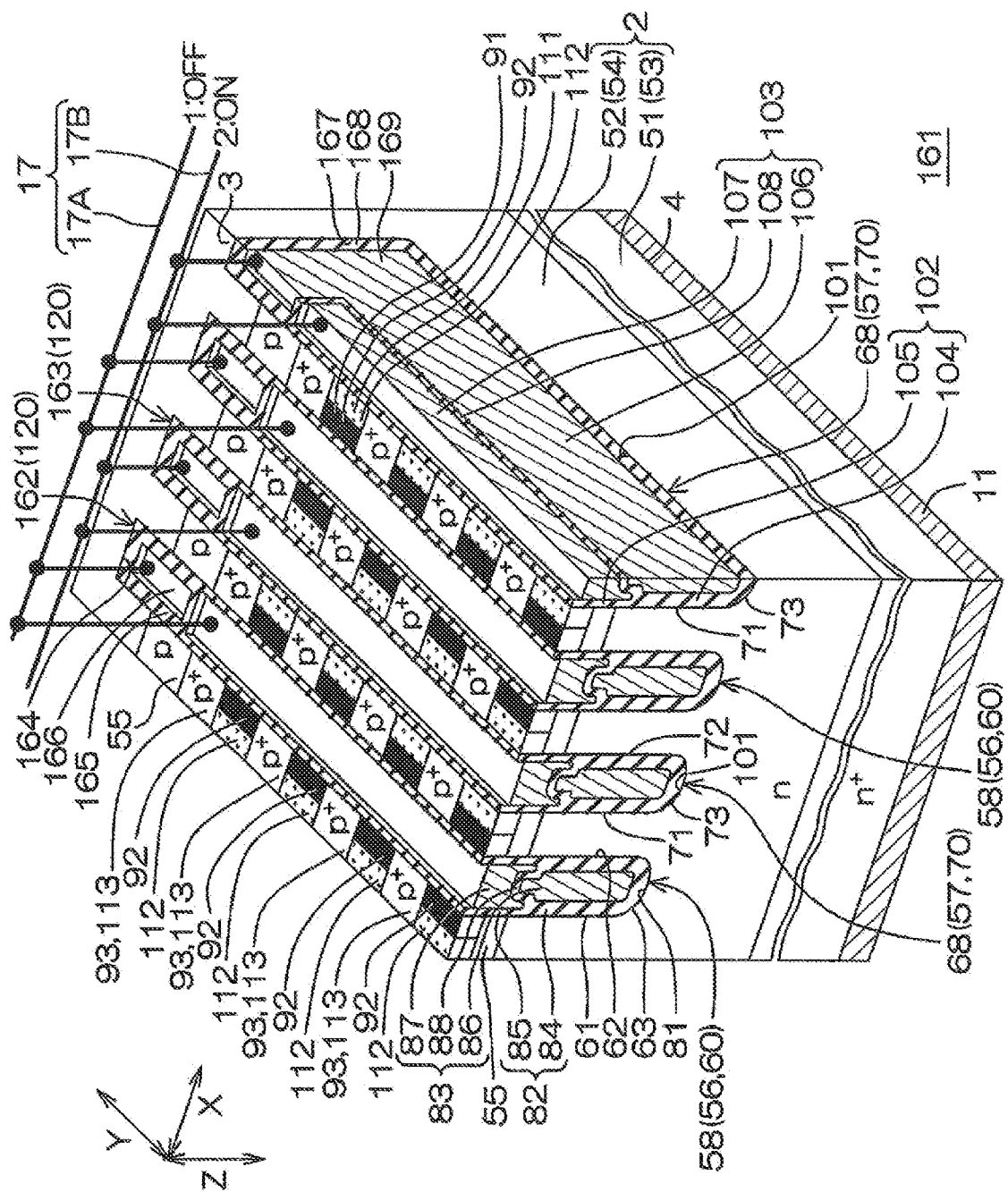
FIG. 24B is a sectional perspective view for describing active clamp operation of the semiconductor device shown in FIG. 23.

FIG. 24A is a sectional perspective view for describing the normal operation of the semiconductor device 161 shown in FIG. 23. FIG. 24B is a sectional perspective view for describing the active clamp operation of the semiconductor device 161 shown in FIG. 23. In FIG. 24A and FIG.

24B, for convenience of description, structures in the first main surface 3 are omitted to simplify the gate control wiring 17.

With reference to FIG. 24A, when the power MISFET 9 is in the normal operation, a first ON signal Von1 is input to the first gate control wiring 17A and a second ON signal Von2 is input to the second gate control wiring 17B. The first ON signal Von1 and the second ON signal Von2 are each input from the control IC 10.

The first ON signal Von1 and the second ON signal Von2 each have a voltage not less than the gate threshold voltage Vth. The first ON signal Von1 and the second ON signal Von2 may each have an equal voltage.

In this case, the first opening-side electrode 87, the second opening-side electrode 107, the first bottom-side electrode 86, and the second bottom-side electrode 106 are each put into the ON state. That is, the first opening-side electrode 87, the second opening-side electrode 107, the first bottom-side electrode 86, and the second bottom-side electrode 106 each function as a gate electrode.

Thereby, the first channel region 91 and the second channel region 111 are both controlled to be in the ON states. In FIG. 24A, the first channel region 91 and the second channel region 111 in the ON states are indicated by dotted hatching.

As a result, the first MISFET 56 and the second MISFET 57 are both driven (Full-ON control). The channel utilization rate RU in the normal operation is 100%. The characteristics channel rate RC in the normal operation is 50%. Thereby, the area resistivity Ron·A approaches the area resistivity Ron·A indicated by the second plot point P2 in the graph of FIG. 13.

On the other hand, with reference to FIG. 24B, when the power MISFET 9 is in the active clamp operation, an OFF signal Voff is input to the first gate control wiring 17A, and a clamp ON signal VCon is input to the second gate control wiring 17B.

The OFF signal Voff and the clamp ON signal VCon are each input from the control IC 10. The OFF signal Voff has a voltage (for example, the reference voltage) less than the gate threshold voltage Vth. The clamp ON signal VCon has a voltage not less than the gate threshold voltage Vth. The clamp ON signal VCon may have a voltage not more than or less than a voltage in the normal operation.

In this case, the first bottom-side electrode 86 and the first opening-side electrode 87 are each put into the OFF state, and the second bottom-side electrode 106 and the second opening-side electrode 107 are each put into the ON state. Thereby, the first channel region 91 is controlled to be in the OFF state, and the second channel region 111 is controlled to be in the ON state. In FIG. 24B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation.

The channel utilization rate RU in the active clamp operation is 50%. And, the characteristics channel rate RC in the active clamp operation is 25%. Thereby, the active clamp capability Eac approaches the active clamp capability Eac indicated by the fourth plot point P4 in the graph of FIG. 13.

In this control example, a description has been given of an example in which the second Half-ON control is applied in the active clamp operation. However, the first Half-ON control may be applied in the active clamp operation.

As described above, the same effects as those described for the semiconductor device 1 can be exhibited as well by the semiconductor device 161. In particular, according to the semiconductor device 161, the second bottom-side electrode 106 is electrically insulated from the first bottom-side electrode 86, and the second opening-side electrode 107 is electrically insulated from the first opening-side electrode 87.

In the above-described structure, the control IC 10 controls the first bottom-side electrode 86 and the first opening-side electrode 87 of the first MISFET 56 to the same voltage at the same time. Thereby, it is possible to appropriately suppress a potential difference formed between the first bottom-side electrode 86 and the first opening-side electrode 87 in the normal operation and in the active clamp operation. As a result, it is possible to appropriately suppress an electric field concentration on the first intermediate insulation layer 88 and therefore it is possible to increase a withstand voltage of the first trench gate structure 60.

Further, the control IC 10 controls the second bottom-side electrode 106 and the second opening-side electrode 107 of the second MISFET 57 to the same voltage at the same time. Thereby, it is possible to appropriately suppress a potential difference formed between the second bottom-side electrode 106 and the second opening-side electrode 107 in the normal operation and in the active clamp operation. As a result, it is possible to appropriately suppress an electric field concentration on the second intermediate insulation layer 108 and therefore it is possible to increase a withstand voltage of the second trench gate structure 70.

Figure 25:
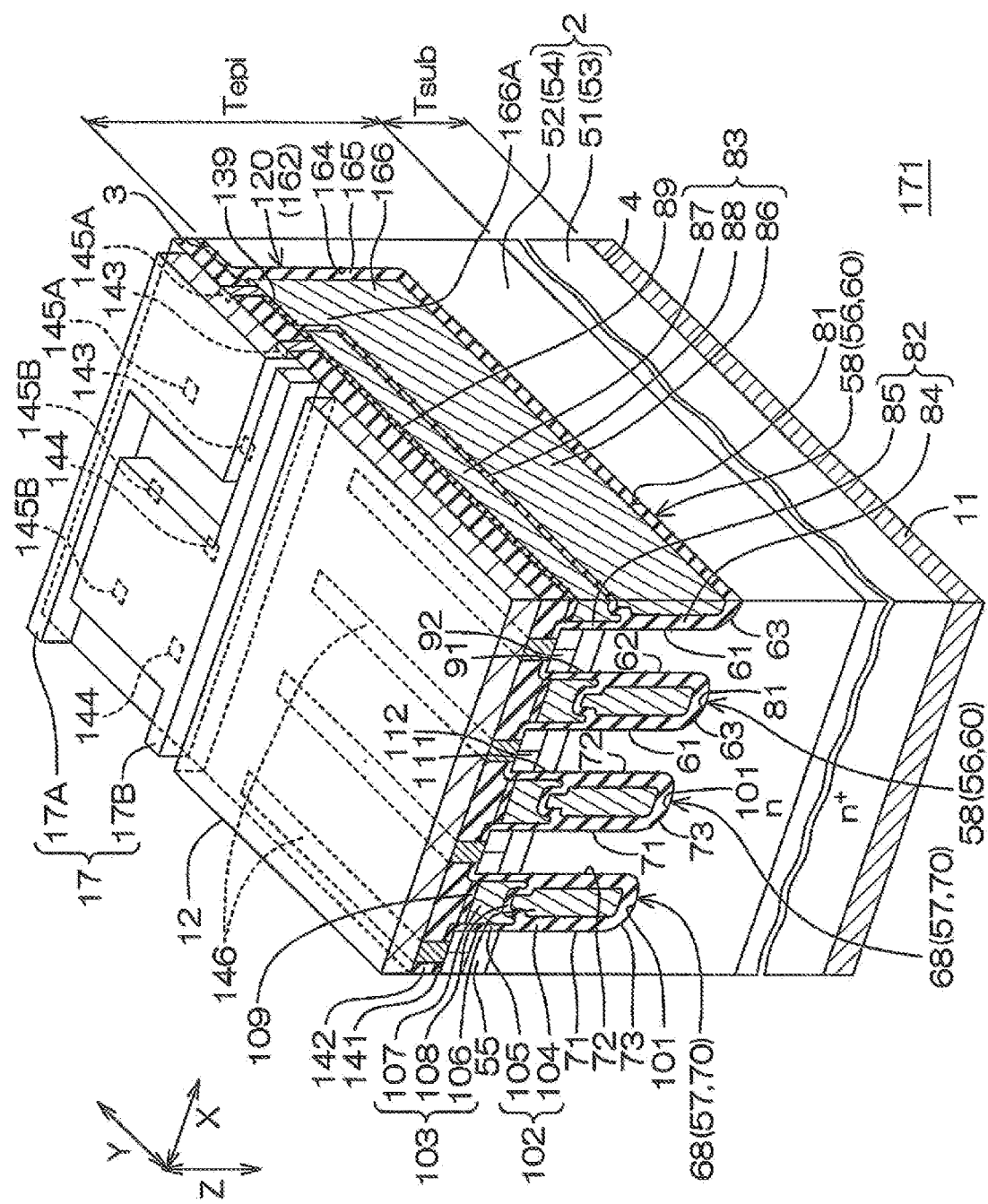
FIG. 25 is a sectional perspective view of a region corresponding to FIG. 21 and is a sectional perspective view which shows a semiconductor device according to a fourth preferred embodiment of the present invention.
Figure 26:
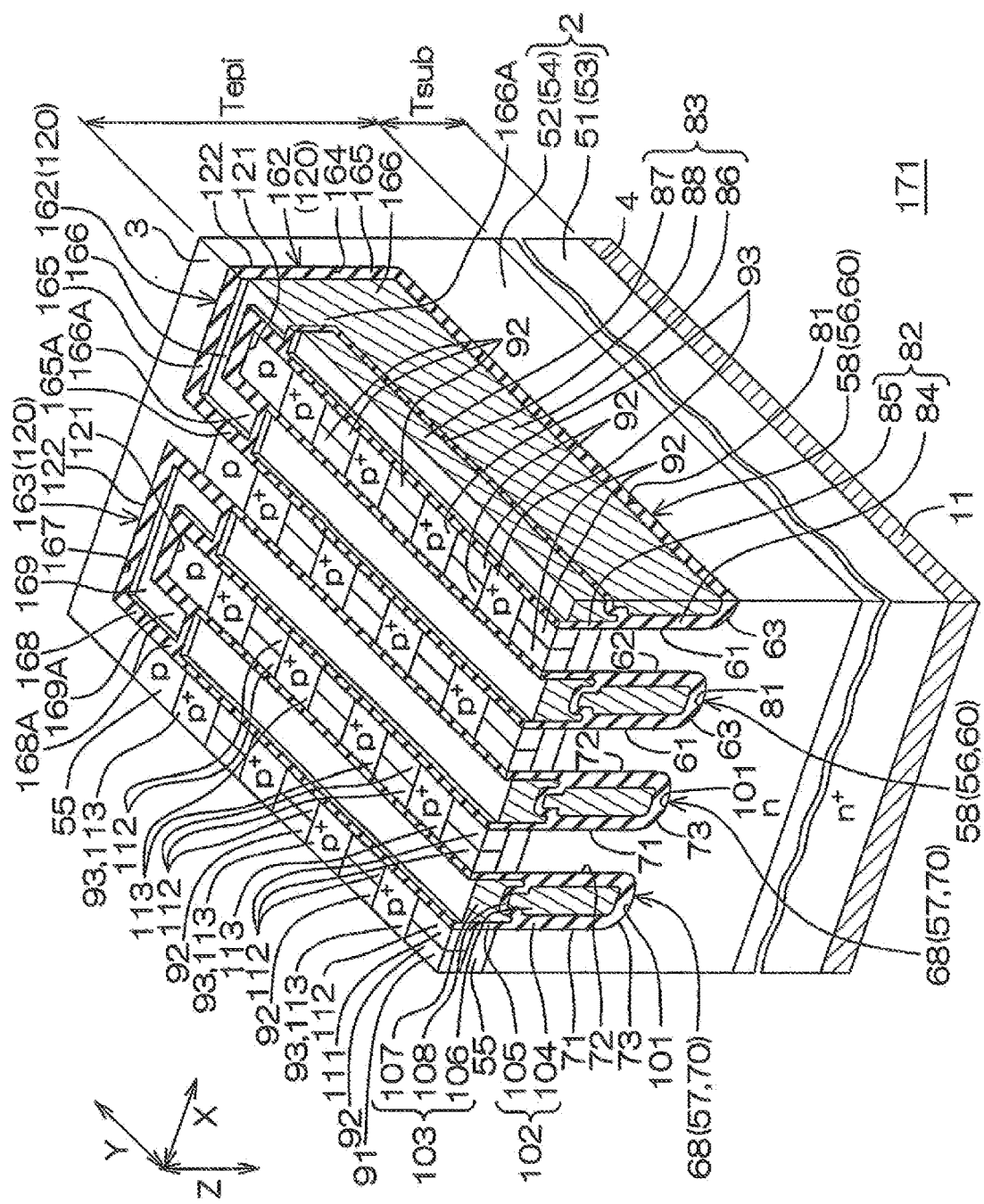
FIG. 26 is a sectional perspective view in which structures on the semiconductor layer are removed from FIG. 25.

FIG. 25 is a sectional perspective view of a region corresponding to FIG. 21 and is a sectional perspective view which shows a semiconductor device 171 according to a fourth preferred embodiment of the present invention. FIG. 26 is a sectional perspective view in which structures in a semiconductor layer 2 are removed from FIG. 25. Hereinafter, structures corresponding to the structures described for the semiconductor device 161 shall be provided with the same reference symbols and description thereof shall be omitted.

Hereinafter, a description will be given of the structure of the region which is at the side of one end portion of the first FET structure 58 and at the side of one end portion of the second FET structure 68 as an example, and a description of the structure of the region which is at the side of the other end portion side of the first FET structure 58 and at the side of the other end portion side of the second FET structure 68 shall be omitted.

In the semiconductor device 161, the plurality of first FET structures 58 and the plurality of second FET structures 68 are formed in a manner that one first FET structure 58 and one second FET structure 68 are alternately arrayed. In contrast thereto, in the semiconductor device 171, the plurality of first FET structures 58 and the plurality of second FET structures 68 are formed in a manner that a group of a plurality (in this embodiment, two) of first FET structures 58 and a group of a plurality (in this embodiment, two) of second FET structures 68 are alternately arrayed.

Further, in the semiconductor device 161, the plurality of first trench contact structures 162 are connected to the corresponding first trench gate structures 60 in a one-to-one correspondence. In contrast thereto, in the semiconductor device 171, the plurality of first trench contact structures 162 are each connected to the group of the plurality (in this embodiment, two) of first trench gate structures 60 which are adjacent to each other. The plurality of first trench contact structures 162 are formed in an arch shape in plan view.

Further, in the semiconductor device 161, the plurality of second trench contact structures 163 are connected to the corresponding second trench gate structures 70 in a one-to-one correspondence. In contrast thereto, in the semiconductor device 171, the plurality of second trench contact structures 163 are each connected to the group of the plurality (in this embodiment, two) of second trench gate structures 70 which are adjacent to each other. The plurality of second trench contact structures 163 are formed in an arch shape in plan view. Hereinafter, a specific description will be given of a structure of the semiconductor device 171.

With reference to FIG. 25 and FIG. 26, in this embodiment, the plurality of cell regions 75 are each defined to a region between two first FET structures 58 which are adjacent to each other, a region between one first FET structure 58 and one second FET structure 68 which are adjacent to each other, and a region between two second FET structures 68 which are adjacent to each other.

Here, three types of total channel rates RT are applied to the plurality of cell regions 75. The three types of total channel rates RT include a first total channel rate RT1, a second total channel rate RT2, and a third total channel rate RT3.

The first total channel rate RT1 is applied to the region between two first FET structures 58 which are adjacent to each other. No second channel region 111 is formed in the region between two first FET structures 58 which are adjacent to each other, due to its structure.

The first total channel rate RT1 is a total value of the first channel rates R1 of two first FET structures 58 which are adjacent to each other. The first total channel rate RT1 may be adjusted to a range from not less than 0% to not more than 100% (preferably, in excess of 0% and less than 100%). Here, the first total channel rate RT1 is adjusted to 50%. In the first total channel rate RT1, the first channel rate R1 at one side and the first channel rate R1 at the other side are each 25%.

The second total channel rate RT2 is applied to the region between one first FET structure 58 and one second FET structure 68 which are adjacent to each other. The first channel region 91 and the second channel region 111 are formed in the region between one first FET structure 58 and one second FET structure 68 which are adjacent to each other, due to its structure.

The second total channel rate RT2 is a total value of the first channel rate R1 and the second channel rate R2. The second total channel rate RT2 may be adjusted to a range in excess of 40% and less than 60% as an example. In this embodiment, the second total channel rate RT2 is adjusted to 50%. In the second total channel rate RT2, the first channel rate R1 is 25% and the second channel rate R2 is 25%.

The third total channel rate RT3 is applied to the region between two second FET structures 68 which are adjacent to each other. No first channel region 91 is formed in the region between two second FET structures 68 which are adjacent to each other, due to its structure.

The third total channel rate RT3 is a total value of the second channel rates R2 of two second FET structures 68 which are adjacent to each other. The third total channel rate RT3 may be adjusted to a range from not less than 0% to not more than 100% (preferably in excess of 0% and less than 100%). Here, the third total channel rate RT3 is adjusted to 50%. In the third total channel rate RT3, the second channel rate R2 on one side and the second channel rate R2 on the other side are each 25%.

The first channel region 91 occupies ½ (50%) of a total channel, and the second channel region 111 occupies ½ (50%) of the total channel. In this embodiment, the average channel rate RAV is 50%.

In each of the first trench contact structures 162, the first contact trench 164 communicates with one end portions of the plurality of first gate trenches 81 which are adjacent to each other. The first contact insulation layer 165 is integrally formed with the first insulation layer 82 at the communication portion between each of the first gate trenches 81 and the first contact trench 164.

More specifically, the first contact insulation layer 165 includes the lead-out insulation layer 165A which is led out to the inside of each of the first gate trenches 81, crosses the communication portion, and is integrally formed with the first bottom-side insulation layer 84 and the first opening-side insulation layer 85 inside each of the first gate trenches 81.

The first contact electrode 166 is integrally formed with the first bottom-side electrode 86 at the communication portion between each of the first gate trenches 81 and the first contact trench 164. More specifically, the first contact electrode 166 includes the lead-out electrode 166A which is led out to the inside of each of the first gate trenches 81, crosses the communication portion, and is electrically connected to the first bottom-side electrode 86 inside each of the first gate trenches 81. Inside each of the first gate trenches 81, the first intermediate insulation layer 88 is interposed between the first contact electrode 166 and the first opening-side electrode 87.

In each of the second trench gate structures 70, the second contact trench 167 communicates with one end portions of the plurality of second gate trenches 101 which are adjacent to each other. The second contact insulation layer 168 is integrally formed with the second insulation layer 102 at the communication portion between each of the second gate trenches 101 and the second contact trench 167.

More specifically, the second contact insulation layer 168 includes the lead-out insulation layer 168A which is led out to the inside of each of the second gate trenches 101, crosses the communication portion, and is integrally formed with the second bottom-side insulation layer 104 and the second opening-side insulation layer 105 inside each of the second gate trenches 101.

The second contact electrode 169 is integrally formed with the second bottom-side electrode 106 at the communication portion between each of the second gate trenches 101 and the second contact trench 167. More specifically, the second contact electrode 169 includes the lead-out electrode 169A which is led out to the inside of each of the second gate trenches 101, crosses the communication portion, and is electrically connected to the second bottom-side electrode 106 inside each of the second gate trenches 101. Inside each of the second gate trenches 101, the second intermediate insulation layer 108 is interposed between the second contact electrode 169 and the second opening-side electrode 107.

Figure 27A:
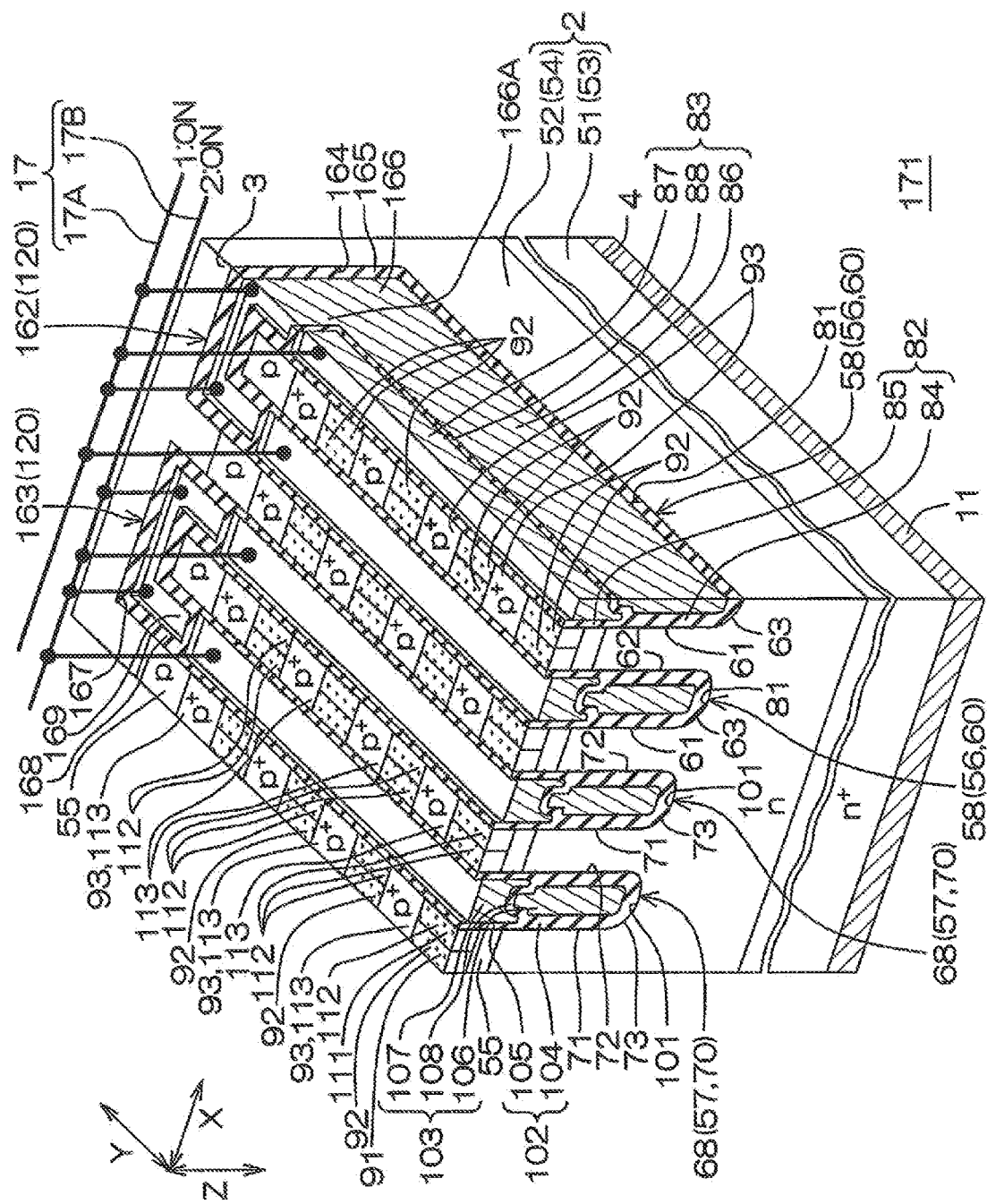
FIG. 27A is a sectional perspective view for describing normal operation of the semiconductor device shown in FIG. 25.
Figure 27B:
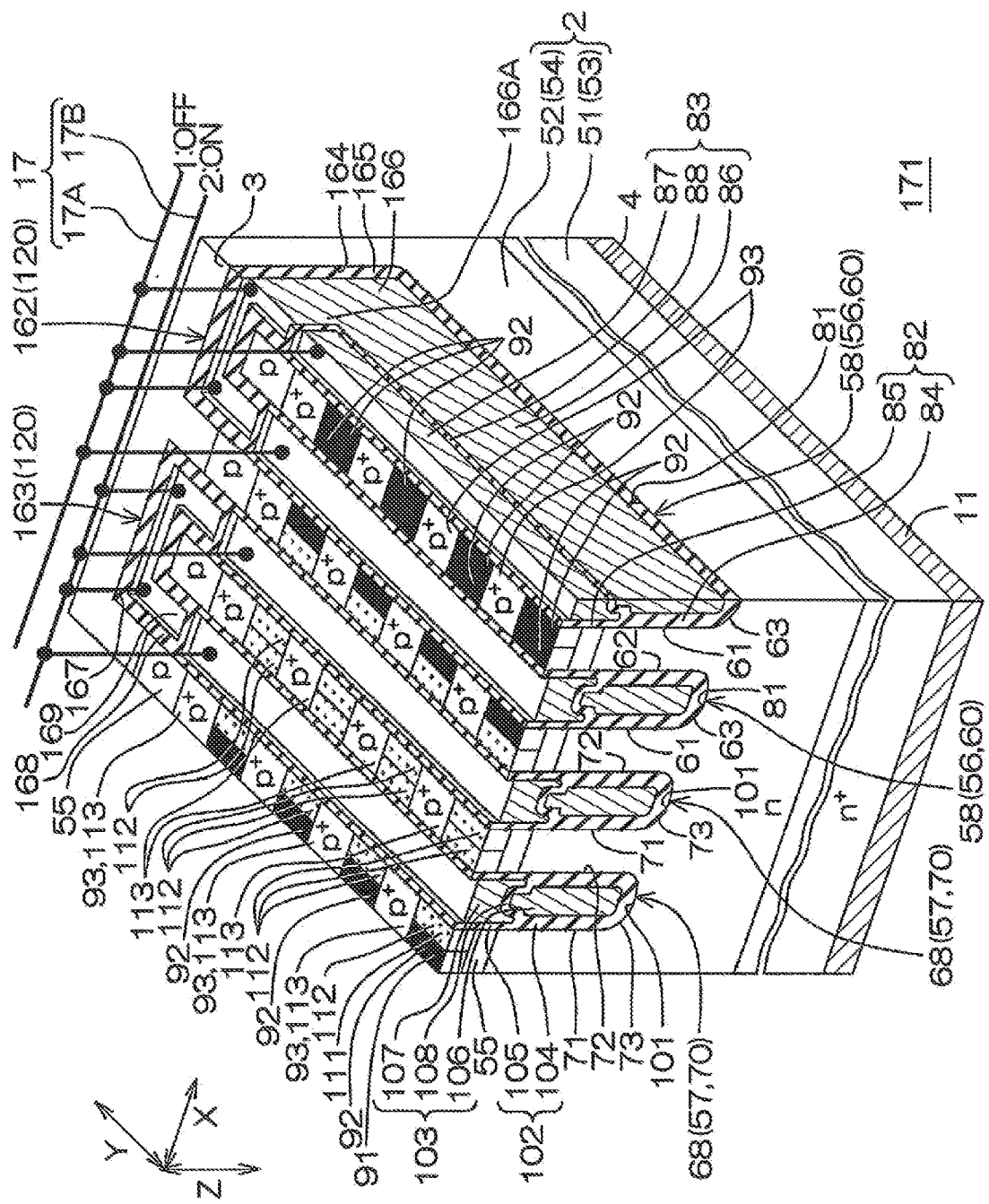
FIG. 27B is a sectional perspective view for describing active clamp operation of the semiconductor device shown in FIG. 25.

FIG. 27A is a sectional perspective view for describing the normal operation of the semiconductor device 171 shown in FIG. 25. FIG. 27B is a sectional perspective view for describing the active clamp operation of the semiconductor device 171 shown in FIG. 25. In FIG. 27A and FIG.

27B, for convenience of description, structures in the first main surface 3 are omitted to simplify the gate control wiring 17.

With reference to FIG. 27A, when the power MISFET 9 is in the normal operation, a first ON signal Von1 is input to the first gate control wiring 17A and a second ON signal Von2 is input to the second gate control wiring 17B. The first ON signal Von1 and the second ON signal Von2 are each input from the control IC 10.

The first ON signal Von1 and the second ON signal Von2 each have a voltage not less than the gate threshold voltage Vth. The first ON signal Von1 and the second ON signal Von2 may each have an equal voltage.

In this case, the first opening-side electrode 87, the second opening-side electrode 107, the first bottom-side electrode 86, and the second bottom-side electrode 106 are each put into the ON state. That is, the first opening-side electrode 87, the second opening-side electrode 107, the first bottom-side electrode 86, and the second bottom-side electrode 106 each function as a gate electrode.

Thereby, the first channel region 91 and the second channel region 111 are both controlled to be in the ON states. In FIG. 27A, the first channel region 91 and the second channel region 111 in the ON states are indicated by dotted hatching.

As a result, the first MISFET 56 and the second MISFET 57 are both driven (Full-ON control). The channel utilization rate Ru in the normal operation is 100%. The characteristics channel rate RC in the normal operation is 50%. Thereby, the area resistivity Ron·A approaches the area resistivity Ron·A shown by the second plot point P2 in the graph of FIG. 13.

On the other hand, with reference to FIG. 27B, when the power MISFET 9 is in the active clamp operation, an OFF signal Voff is input to the first gate control wiring 17A, and a clamp ON signal VCon is input to the second gate control wiring 17B.

The OFF signal Voff and the clamp ON signal VCon are each input from the control IC 10. The OFF signal Voff has a voltage (for example, the reference voltage) less than the gate threshold voltage Vth. The clamp ON signal VCon is a voltage not less than the gate threshold voltage Vth. The clamp ON signal VCon may have a voltage not more than or less than a voltage in the normal operation.

In this case, the first bottom-side electrode 86 and the first opening-side electrode 87 are each put into the OFF state, and the second bottom-side electrode 106 and the second opening-side electrode 107 are each put into the ON state. Thereby, the first channel region 91 is controlled to be in the OFF state, and the second channel region 111 is controlled to be in the ON state. In FIG. 27B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation.

The channel utilization rate RU in the active clamp operation is 50%. And, the characteristics channel rate RC in the active clamp operation is 25%. Thereby, the active clamp capability Eac approaches the active clamp capability Eac indicated by the fourth plot point P4 in the graph of FIG. 13.

In this control example, a description has been given of an example in which the second Half-ON control is applied in the active clamp operation. However, the first Half-ON control may be applied in the active clamp operation.

As described above, the same effects as those described for the semiconductor device 161 can be exhibited as well by the semiconductor device 171. Further, in the semiconductor device 171, the plurality of first FET structures 58 and the plurality of second FET structures 68 are formed in a manner that the group of the plurality (in this embodiment, two) of first FET structures 58 and the group of the plurality (in this embodiment, two) of second FET structures 68 are alternately arrayed.

According to a structure in which the plurality of first FET structures 58 are adjacent to each other, the first channel region 91 can be formed, without being connected to the second channel region 111, in the region between the plurality of first FET structures 58 which are adjacent to each other. Therefore, it is possible to appropriately form the first channel region 91 and appropriately adjust the first channel rate R1.

Similarly, according to a structure in which the plurality of second FET structures 68 are adjacent to each other, the second channel region 111 can be formed, without being connected to the first channel region 91, in the region between the plurality of second FET structures 68 which are adjacent to each other. Therefore, it is possible to appropriately form the second channel region 111 and appropriately adjust the second channel rate R2. Thereby, the average channel rate RAV and the characteristics channel rate RC can be appropriately adjusted.

Figure 28:
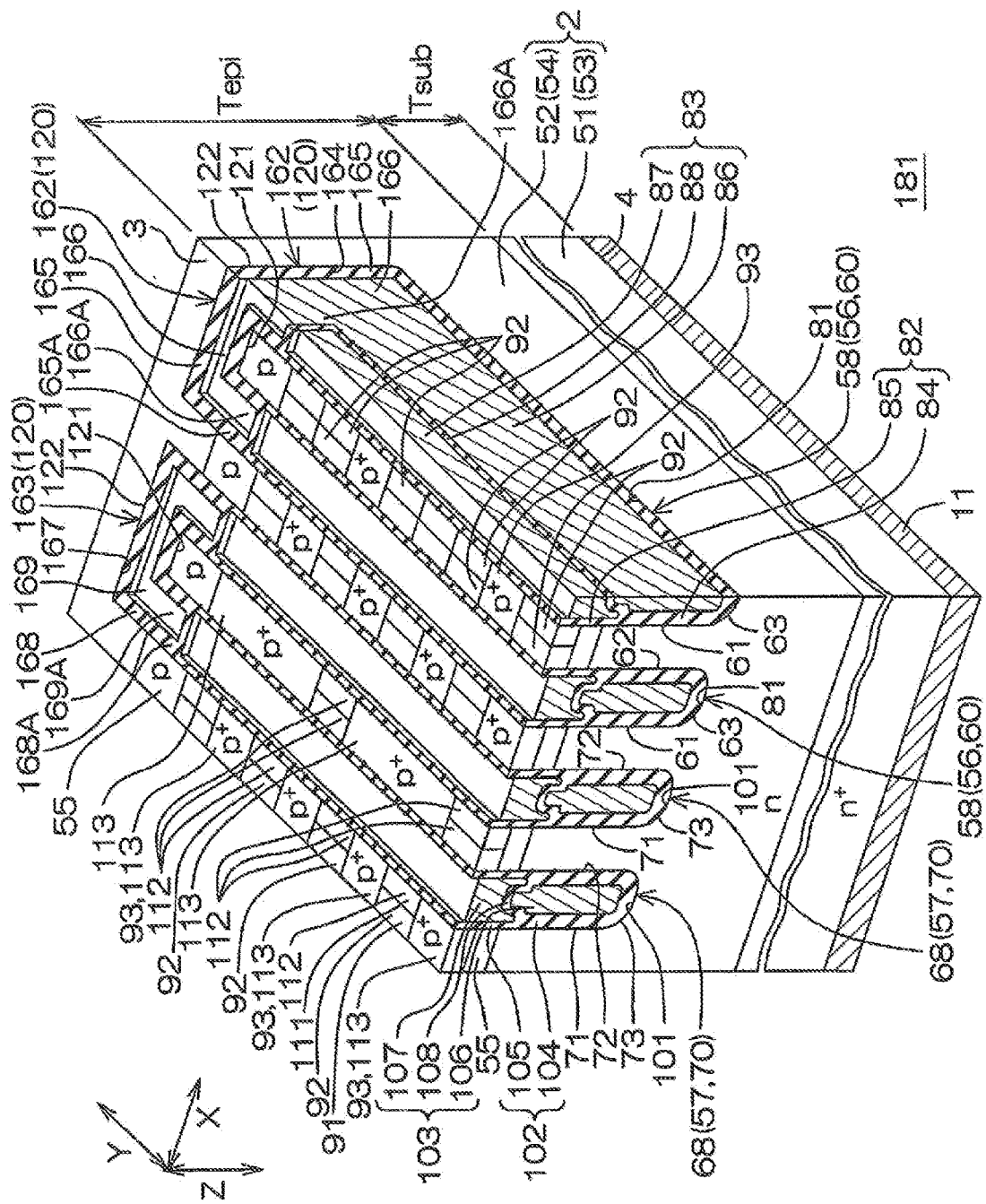
FIG. 28 is a sectional perspective view of a region corresponding to FIG. 25 and is a sectional perspective view which shows a semiconductor device according to a fifth preferred embodiment of the present invention.

FIG. 28 is a sectional perspective view of a region corresponding to FIG. 25 and is a sectional perspective view which shows a semiconductor device 181 according to a fifth preferred embodiment of the present invention. Hereinafter, structures corresponding to the structures described for the semiconductor device 171 shall be provided with the same reference symbols and description thereof shall be omitted.

In this embodiment, the first total channel rate RT1, the second total channel rate RT2, and the third total channel rate RT3, each of which has a different value from each other, are applied to the plurality of cell regions 75.

The first total channel rate RT1 may be adjusted to a range from not less than 60% to not more than 80% as an example. In this embodiment, the first total channel rate RT1 is adjusted to 75%. In the first total channel rate RT1, the first channel rate R1 in one side and the first channel rate R1 in the other side are each 37.5%.

The second total channel rate RT2 may be adjusted to a range in excess of 40% and less than 60% as an example. In this embodiment, the second total channel rate RT2 is adjusted to 50%. In the second total channel rate RT2, the first channel rate R1 is 25% and the second channel rate R2 is 25%.

The third total channel rate RT3 may be adjusted to a range from not less than 20% to not more than 40% as an example. In this embodiment, the third total channel rate RT3 is adjusted to 25%. In the third total channel rate RT3, the second channel rate R2 on one side and the second channel rate R2 on the other side are each 12.5%.

The first channel region 91 occupies a rate in excess of 50% (½) of a total channel. In this embodiment, the first channel region 91 occupies 62.5% of the total channel, and the second channel region 111 occupies 37.5% of the total channel. That is, the second channel rate R2 is less than the first channel rate R1 (R2<R1). In this embodiment, the average channel rate RAV is 50%. Other structures of the semiconductor device 181 are similar to those of the semiconductor device 171. In this embodiment, control which shall be described hereinafter is performed.

Figure 29A:
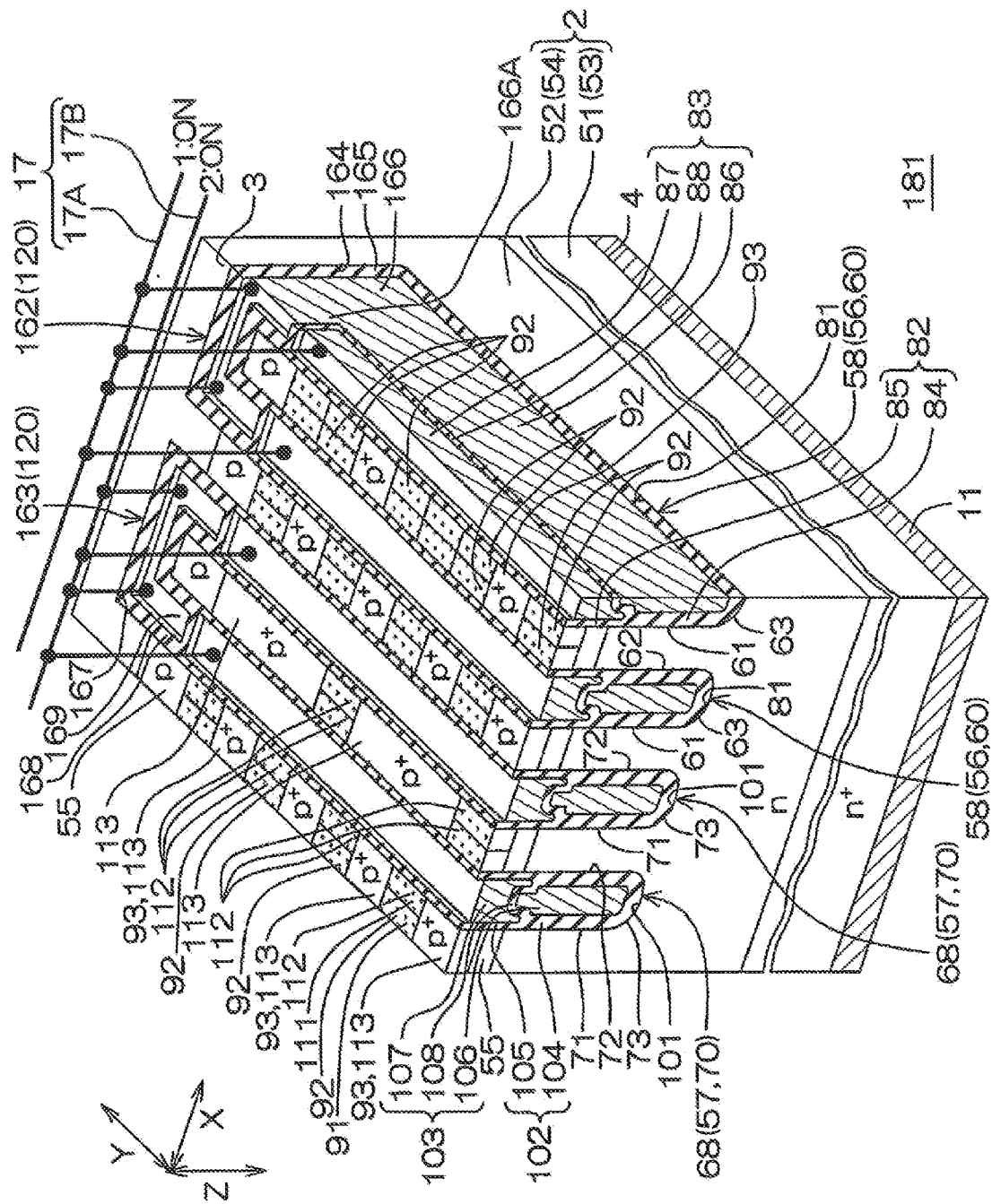
FIG. 29A is a sectional perspective view for describing normal operation according to a first control example of the semiconductor device shown in FIG. 28.
Figure 29B:
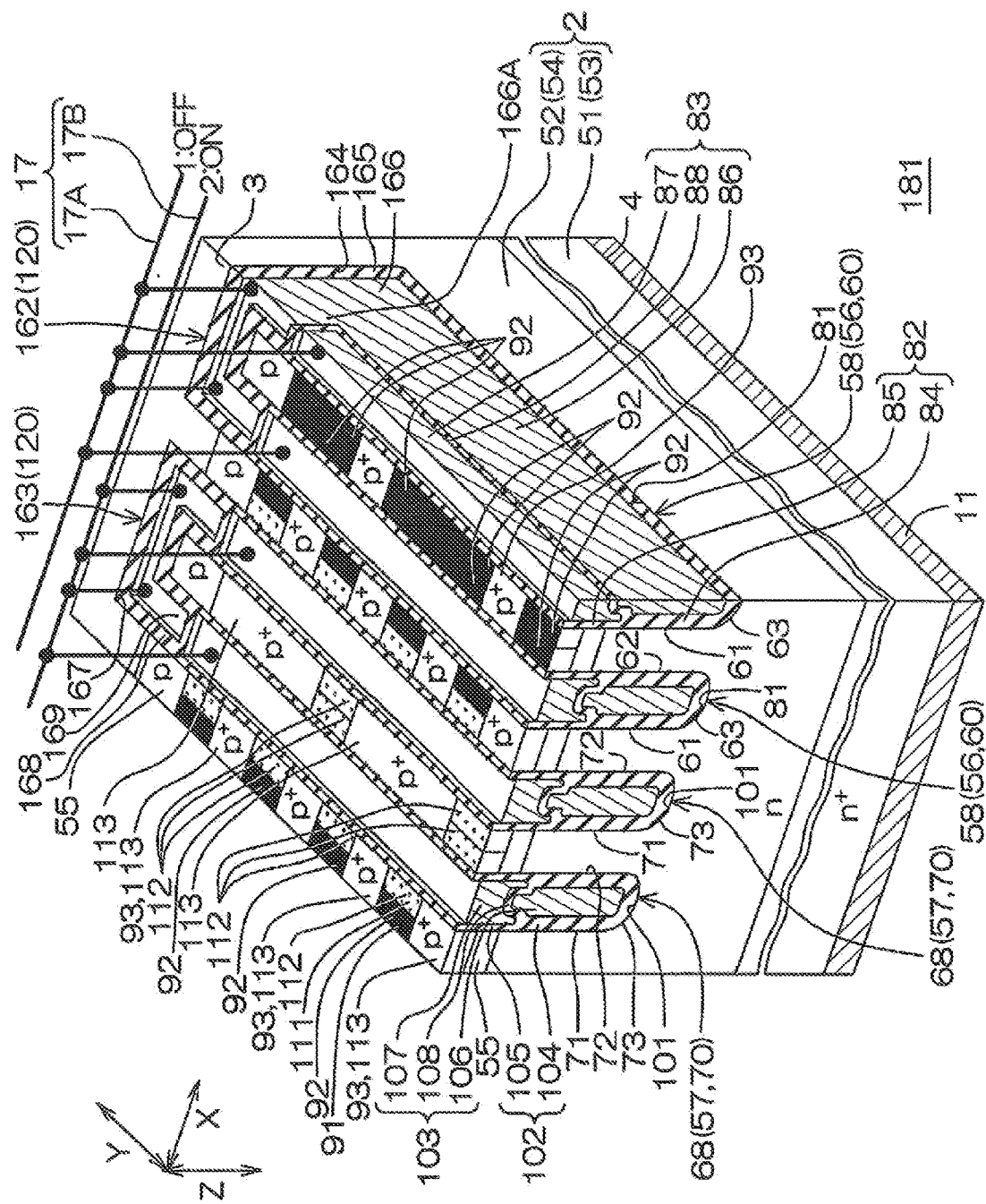
FIG. 29B is a sectional perspective view for describing active clamp operation according to the first control example of the semiconductor device shown in FIG. 28.

FIG. 29A is a sectional perspective view for describing the normal operation according to a first control example of the semiconductor device 181 shown in FIG. 28. FIG. 29B is a sectional perspective view for describing the active clamp operation according to the first control example of the semiconductor device 181 shown in FIG. 28. In FIG. 29A and FIG. 29B, for convenience of description, structures in the first main surface 3 are omitted to simplify the gate control wiring 17.

With reference to FIG. 29A, when the power MISFET 9 is in the normal operation, a first ON signal Von1 is input to the first gate control wiring 17A and a second ON signal Von2 is input to the second gate control wiring 17B. The first ON signal Von1 and the second ON signal Von2 are each input from the control IC 10.

The first ON signal Von1 and the second ON signal Von2 each have a voltage not less than the gate threshold voltage Vth. The first ON signal Von1 and the second ON signal Von2 may each have an equal voltage.

In this case, the first opening-side electrode 87, the second opening-side electrode 107, the first bottom-side electrode 86, and the second bottom-side electrode 106 are each put into the ON state. That is, the first opening-side electrode 87, the second opening-side electrode 107, the first bottom-side electrode 86, and the second bottom-side electrode 106 each function as a gate electrode.

Thereby, the first channel region 91 and the second channel region 111 are both controlled to be in the ON states. In FIG. 29A, the first channel region 91 and the second channel region 111 in the ON states are indicated by dotted hatching.

As a result, the first MISFET 56 and the second MISFET 57 are both driven (Full-ON control). The channel utilization rate RU in the normal operation is 100%. The characteristics channel rate RC in the normal operation is 50%. Thereby, the area resistivity Ron·A approaches the area resistivity Ron·A indicated by the second plot point P2 in the graph of FIG. 13.

On the other hand, with reference to FIG. 29B, when the power MISFET 9 is in the active clamp operation, an OFF signal Voff is input to the first gate control wiring 17A, and a clamp ON signal VCon is input to the second gate control wiring 17B.

The OFF signal Voff and the clamp ON signal VCon are each input from the control IC 10. The OFF signal Voff has a voltage (for example, the reference voltage) less than the gate threshold voltage Vth. The clamp ON signal VCon each has a voltage not less than the gate threshold voltage Vth. The clamp ON signal VCon may have a voltage not more than or less than a voltage in the normal operation.

In this case, the first bottom-side electrode 86 and the first opening-side electrode 87 are each put into the OFF state, and the second bottom-side electrode 106 and the second opening-side electrode 107 are each put into the ON state. Thereby, the first channel region 91 is controlled to be in the OFF state, and the second channel region 111 is controlled to be in the ON state. In FIG. 29B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation. More specifically, the channel utilization rate RU in the active clamp operation is less than ½ of the channel utilization rate RU in the normal operation.

The channel utilization rate RU in the active clamp operation is 37.5%. Further, the characteristics channel rate RC in the active clamp operation is 18.75%. Thereby, the active clamp capability Eac approaches the active clamp capability Eac indicated by the fourth plot point P4 in the graph of FIG. 13 or exceeds the active clamp capability Eac concerned.

Figure 30A:
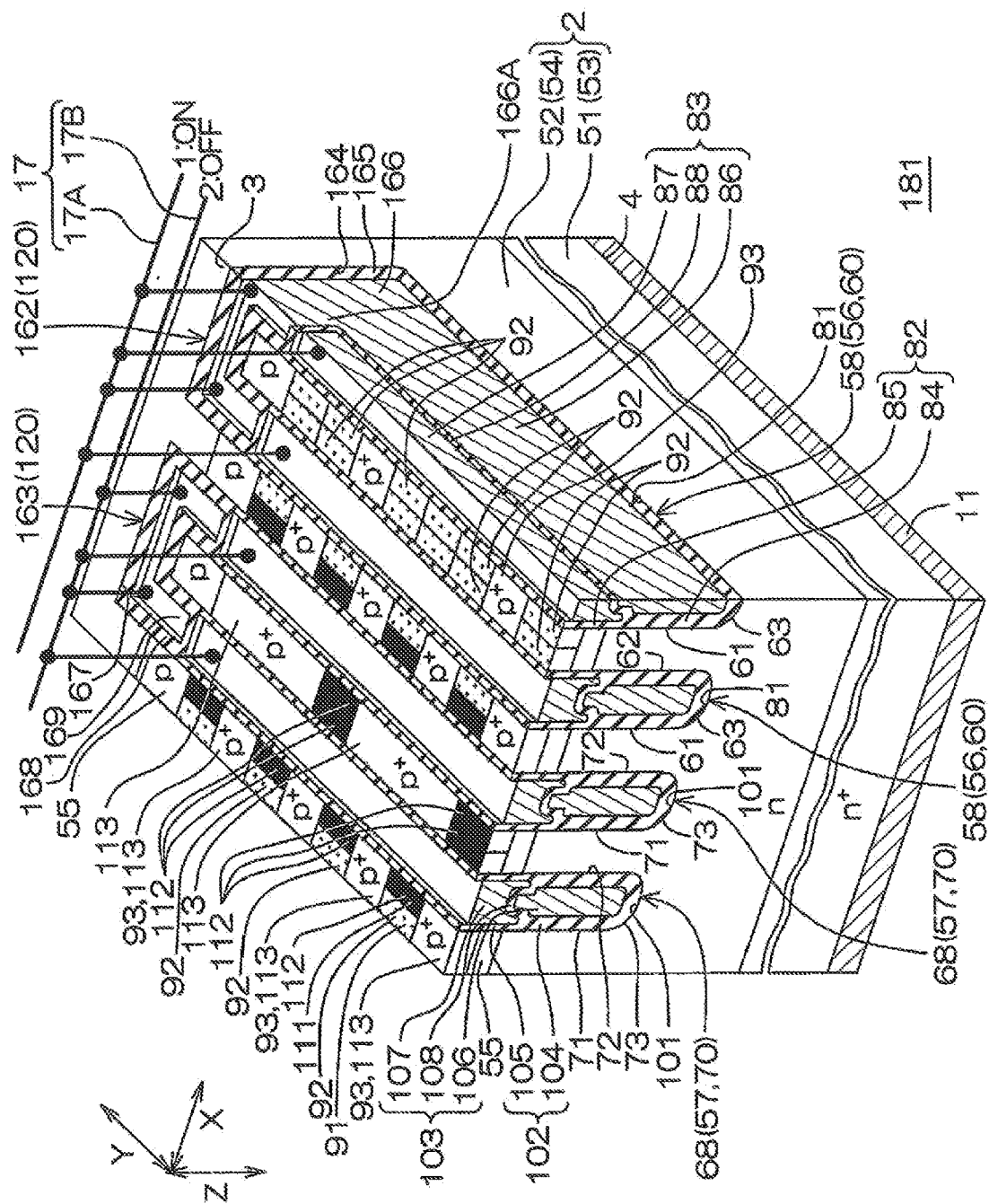
FIG. 30A is a sectional perspective view for describing normal operation according to a second control example of the semiconductor device shown in FIG. 28.
Figure 30B:
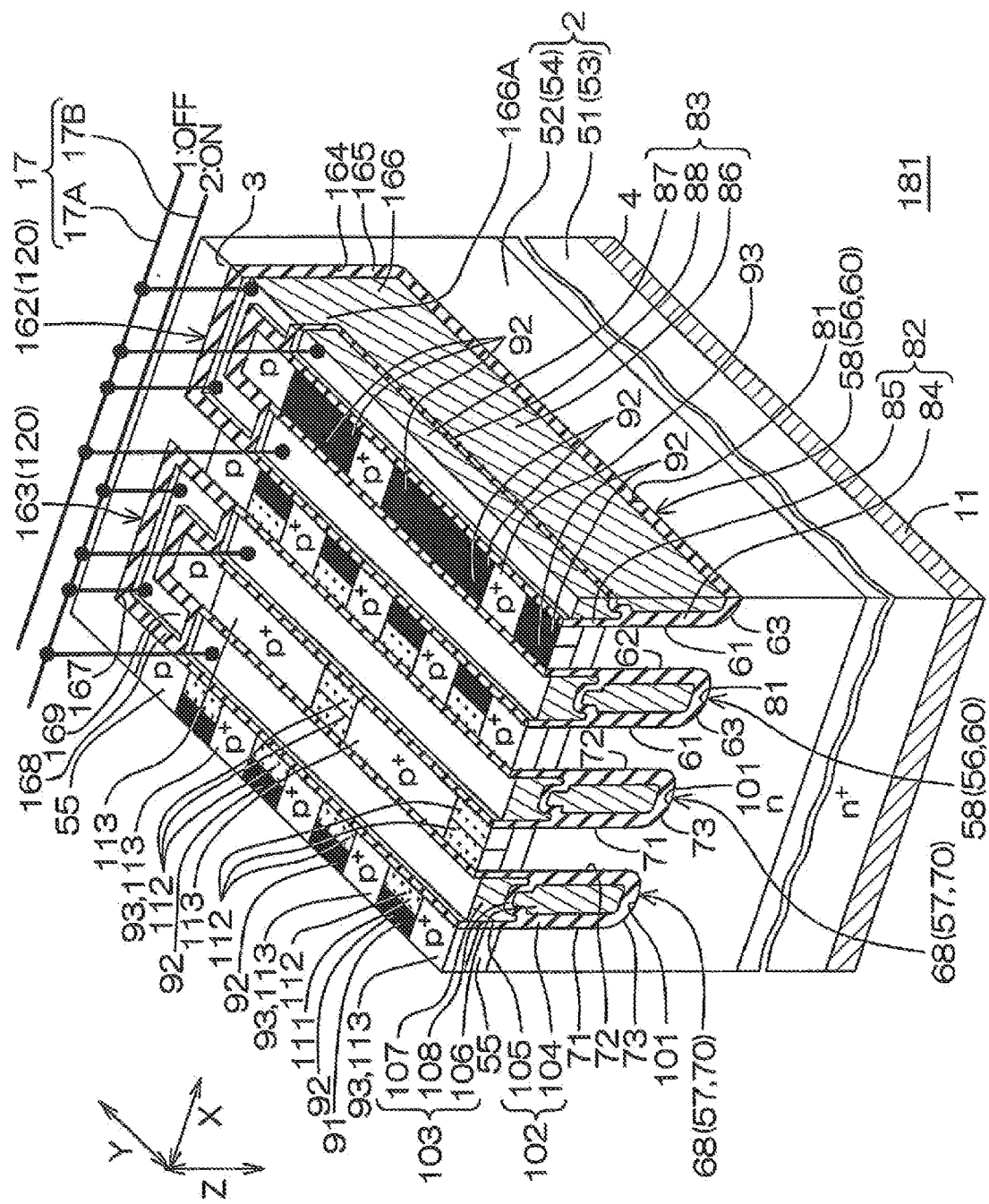
FIG. 30B is a sectional perspective view for describing active clamp operation according to the second control example of the semiconductor device shown in FIG. 28.

FIG. 30A is a sectional perspective view for describing the normal operation according to a second control example of the semiconductor device 181 shown in FIG. 28. FIG. 30B is a sectional perspective view for describing the active clamp operation according to the second control example of the semiconductor device 181 shown in FIG. 28. In FIG. 30A and FIG. 30B, for convenience of description, structures in the first main surface 3 are omitted to simplify the gate control wiring 17.

With reference to FIG. 30A, when the power MISFET 9 is in the normal operation, an ON signal Von is input to the gate control wiring 17A and an OFF signal Voff is input to the second gate control wiring 17B. The ON signal Von and the OFF signal Voff are each input from the control IC 10. The ON signal Von has a voltage not less than the gate threshold voltage Vth. The OFF signal Voff has a voltage (for example, the reference voltage) less than the gate threshold voltage Vth.

In this case, the first bottom-side electrode 86 and the first opening-side electrode 87 are each put into the ON state, and the second bottom-side electrode 106 and the second opening-side electrode 107 are each put into the OFF state. That is, while the first bottom-side electrode 86 and the first opening-side electrode 87 each function as a gate electrode, the second bottom-side electrode 106 and the second opening-side electrode 107 each function as a field electrode.

Thereby, the first channel region 91 is controlled to be in the ON state and the second channel region 111 is controlled to be in the OFF state. In FIG. 30A, the first channel region 91 in the ON state is indicated by dotted hatching, and the second channel region 111 in the ON state is indicated by filled hatching.

As a result, while the first MISFET 56 is controlled to be in the ON state, the second MISFET 57 is controlled to be in the OFF state (first Half-ON control). Thereby, the second channel region 111 having the second channel rate R2 (R2<R1) less than the first channel rate R1 is controlled to be in the OFF state, and the characteristics channel rate RC in the normal operation therefore becomes less than the average channel rate RAV.

The channel utilization rate RU in the normal operation is 62.5%. Further, the characteristics channel rate RC in the normal operation is 31.25%. Thereby, the area resistivity Ron·A approaches the area resistivity Ron·A indicated by the third plot point P3 in the graph of FIG. 13.

On the other hand, with reference to FIG. 30B, when the power MISFET 9 is in the active clamp operation, an OFF signal Voff is input to the first gate control wiring 17A, and a clamp ON signal VCon is input to the second gate control wiring 17B. The OFF signal Voff and the clamp ON signal VCon are both input from the control IC 10.

The OFF signal Voff has a voltage (for example, the reference voltage) less than the gate threshold voltage Vth. The clamp ON signal VCon has a voltage not less than the gate threshold voltage Vth. The clamp ON signal VCon may have a voltage not more than or less than a voltage in the normal operation.

In this case, the first bottom-side electrode 86 and the first opening-side electrode 87 are each put into the OFF state, and the second bottom-side electrode 106 and the second opening-side electrode 107 are each put into the ON state. That is, while the first bottom-side electrode 86 and the first opening-side electrode 87 each function as a field electrode, the second bottom-side electrode 106 and the second opening-side electrode 107 each function as a gate electrode.

Thereby, the first channel region 91 is controlled to be in the OFF state, and the second channel region 111 is controlled to be in the ON state. In FIG. 30B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). The second channel region 111 having the second channel rate R2 less than the first channel rate R1 (R2<R1) is controlled to be in the ON state, and the channel utilization rate RU in the active clamp operation therefore becomes in excess of zero and less than the channel utilization rate RU in the normal operation.

The channel utilization rate RU in the active clamp operation is 37.5%. Further, the characteristics channel rate RC in the active clamp operation is 18.75%. Thereby, the active clamp capability Eac approaches the active clamp capability Eac indicated by the second plot point P2 in the graph of FIG. 13 or exceeds the active clamp capability Eac.

As described above, the same effects as those described for the semiconductor device 171 can be exhibited as well by the semiconductor device 181. In particular, according to the semiconductor device 181, the second channel rate R2 is different from the first channel rate R1 (R1≠R2). Specifically, the second channel rate R2 is less than the first channel rate R1 (R1>R2).

In the above-described structure, the control IC 10 controls the first MISFET 56 and the second MISFET 57 such that the channel utilization rate RU in the active clamp operation becomes in excess of zero and less than the channel utilization rate RU in the normal operation. Thereby, it is possible to enhance the effects of improving the active clamp capability Eac.

Further, according to the semiconductor device 181, as shown in the second control example, the first Half-ON control can be applied in the normal operation and the second Half-ON control can be applied in the active clamp operation. Further, according to the semiconductor device 181, the second Half-ON control can be applied in the normal operation and the first Half-ON control can be applied in the active clamp operation. That is, according to the semiconductor device 181, by only changing a control pattern, it becomes possible to realize various types of area resistivity Ron·A and active clamp capability Eac, while having the same average channel rate RAV.

Figure 31:
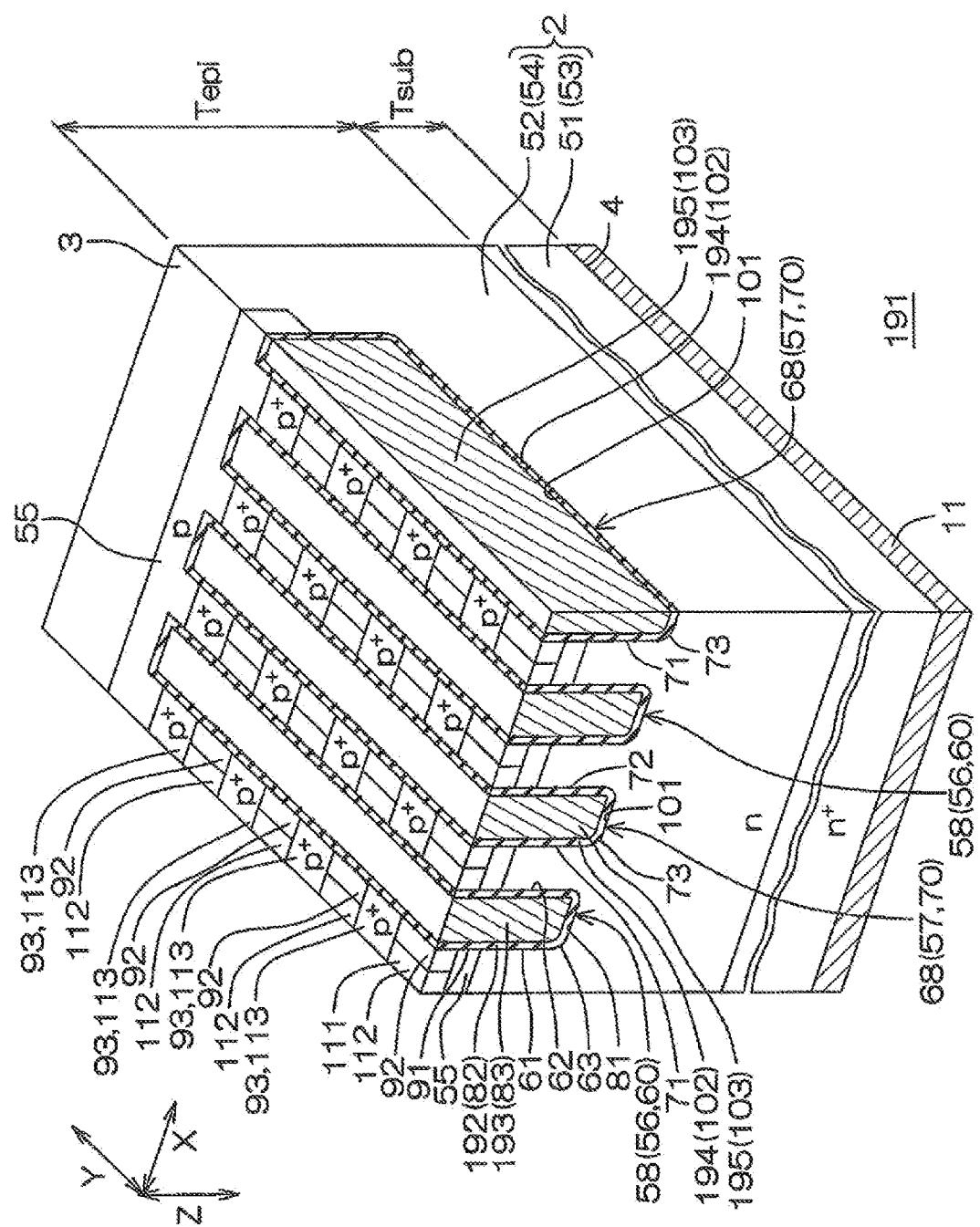
FIG. 31 is a sectional perspective view of a region corresponding to FIG. 7 and is a sectional perspective view for showing a semiconductor device according to a sixth preferred embodiment of the present invention.

FIG. 31 is a sectional perspective view of a region corresponding to FIG. 7 and is a sectional perspective view of a semiconductor device 191 according to a sixth preferred embodiment of the present invention. Hereinafter, structures corresponding to the structures described for the semiconductor device 1 shall be provided with the same reference symbols and description thereof shall be omitted.

According to the semiconductor device 1, the first insulation layer 82 includes the first bottom-side insulation layer 84 and the first opening-side insulation layer 85 in the first trench gate structure 60, and the first electrode 83 includes the first bottom-side electrode 86, the first opening-side electrode 87 and the first intermediate insulation layer 88.

In contrast thereto, in the semiconductor device 191, the first insulation layer 82 does not include the first bottom-side insulation layer 84, and the first electrode 83 does not include the first bottom-side electrode 86 and the first intermediate insulation layer 88. That is, in the semiconductor device 191, the first insulation layer 82 includes a first gate insulation layer 192 which corresponds to the first opening-side insulation layer 85, and the first electrode 83 includes a first gate electrode 193 which corresponds to the first opening-side electrode 87.

Further, according to the semiconductor device 1, the second insulation layer 102 includes the second bottom-side insulation layer 104 and the second opening-side insulation layer 105 in the second trench gate structure 70, and the second electrode 103 includes the second bottom-side electrode 106, the second opening-side electrode 107 and the second intermediate insulation layer 108.

In contrast thereto, in the semiconductor device 191, the second insulation layer 102 does not include the second bottom-side insulation layer 104, and the second electrode 103 does not include the second bottom-side electrode 106 and the second intermediate insulation layer 108. That is, in the semiconductor device 191, the second insulation layer 102 includes a second gate insulation layer 194 which corresponds to the second opening-side insulation layer 105, and the second electrode 103 includes a second gate electrode 195 which corresponds to the second opening-side electrode 107.

Further, the semiconductor device 1 has the trench contact structure 120. In contrast thereto, the semiconductor device 191 does not have the trench contact structure 120. Hereinafter, a specific description will be given of a structure of the semiconductor device 191.

In the first trench gate structure 60, the first gate insulation layer 192 is formed in a film shape along the inner wall of the first gate trench 81. The first gate insulation layer 192 defines a concave space inside the first gate trench 81.

A part which covers the bottom wall 63 of the first gate trench 81 in the first gate insulation layer 192 may be larger in thickness than a part which covers the first side wall 61 and the second side wall 62 of the first gate trench 81 in the first gate insulation layer 192. As a matter of course, the first gate insulation layer 192 may have a uniform thickness.

The first gate electrode 193 is embedded in the first gate trench 81 across the first gate insulation layer 192. More specifically, the first gate electrode 193 is embedded as an integrated member into the concave space defined by the first gate insulation layer 192 in the first gate trench 81. The first gate control signal (first control signal) including the ON signal Von and the OFF signal Voff is applied to the first gate electrode 193.

The first gate electrode 193 may include at least any one of conductive polysilicon, tungsten, aluminum, copper, an aluminum alloy, and a copper alloy. In this embodiment, the first gate electrode 193 includes conductive polysilicon. The conductive polysilicon may include an n-type impurity or a p-type impurity. The conductive polysilicon preferably includes an n-type impurity.

In the second trench gate structure 70, the second gate insulation layer 194 is formed in a film shape along an inner wall of the second gate trench 101. The second gate insulation layer 194 defines a concave space inside the second gate trench 101.

In the second gate insulation layer 194, a part which covers the bottom wall 73 of the second gate trench 101 may be larger in thickness than a part which covers the first side wall 71 and the second side wall 72 in the second gate insulation layer 194. As a matter of course, the second gate insulation layer 194 may have a uniform thickness.

The second gate electrode 195 is embedded in the second gate trench 101 across the second gate insulation layer 194. More specifically, the second gate electrode 195 is embedded as an integrated member into the concave space defined by the second gate insulation layer 194 in the second gate trench 101. The second gate control signal (second control signal) including the ON signal Von and the OFF signal Voff is applied to the second gate electrode 195.

The second gate electrode 195 may include at least any one of conductive polysilicon, tungsten, aluminum, copper, an aluminum alloy, and a copper alloy. It is preferable that the second gate electrode 195 includes the same conductive material as the first gate electrode 193. In this embodiment, the second gate electrode 195 includes conductive polysilicon. The conductive polysilicon may include an n-type impurity or a p-type impurity. The conductive polysilicon preferably includes an n-type impurity.

Although not specifically shown in the drawing, the first gate control wiring 17A is electrically connected to the first gate electrode 193, and the second gate control wiring 17B is electrically connected to the second gate electrode 195.

Figure 32A:
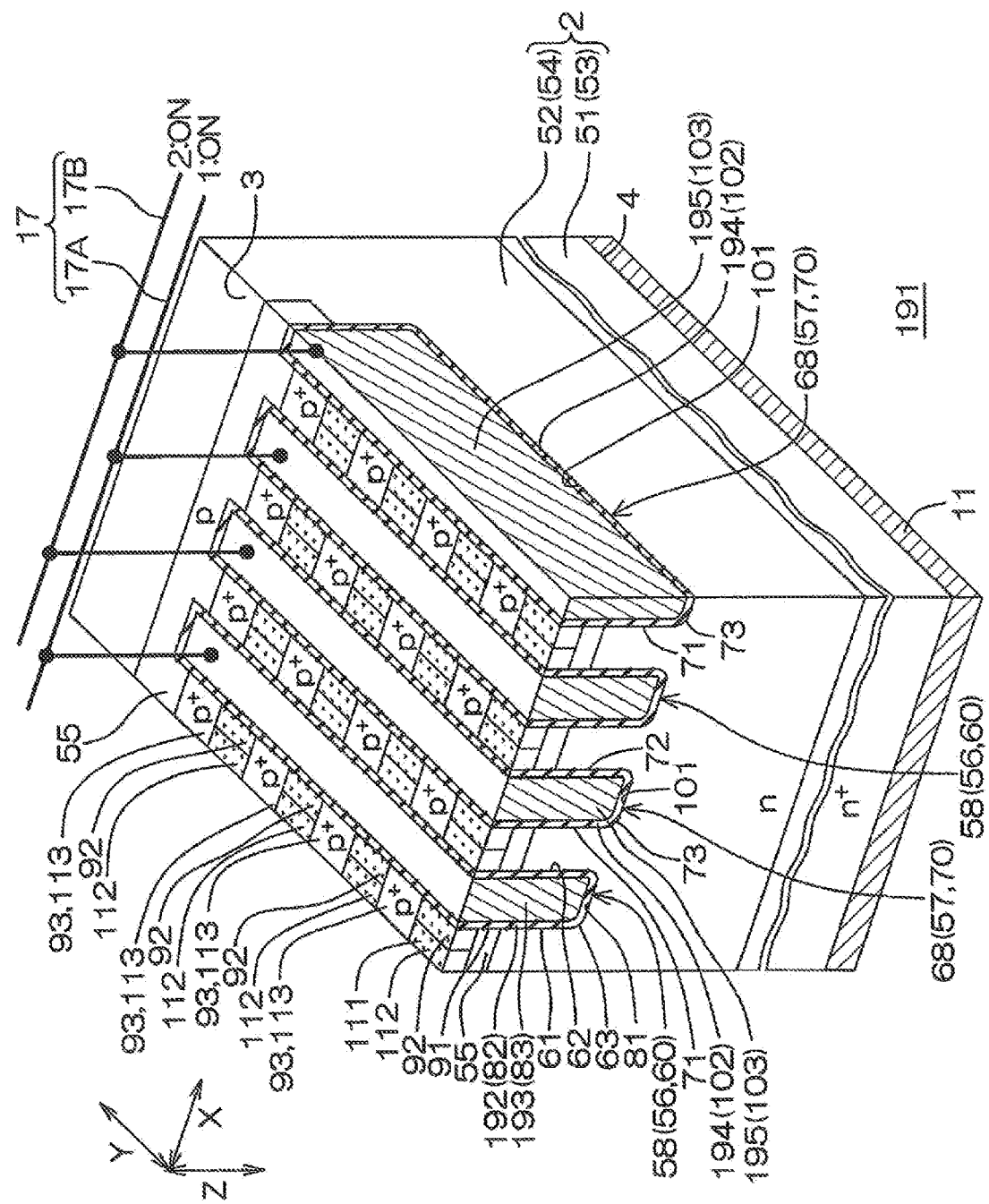
FIG. 32A is a sectional perspective view for describing normal operation of the semiconductor device shown in FIG. 31.
Figure 32B:
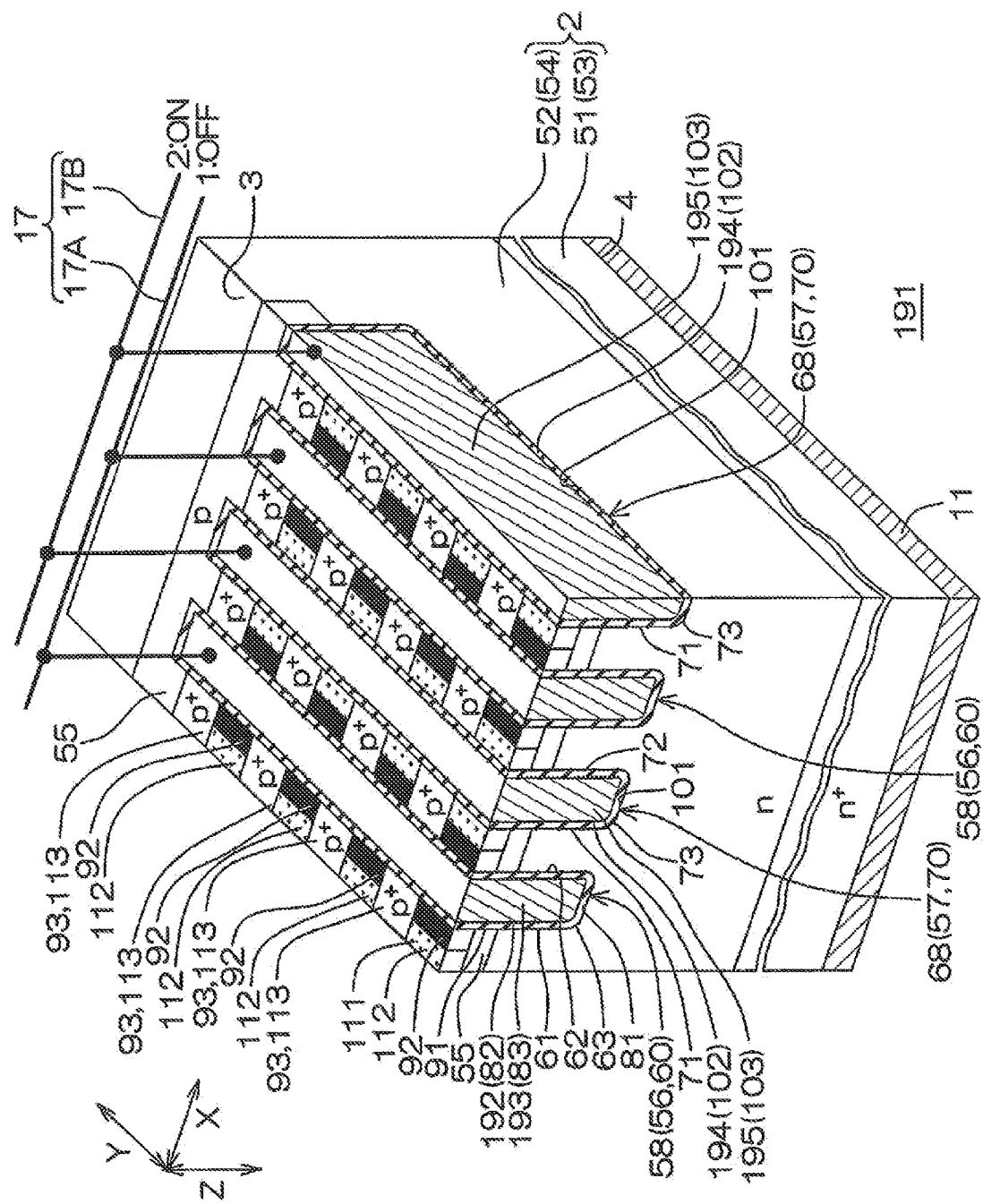
FIG. 32B is a sectional perspective view for describing active clamp operation of the semiconductor device shown in FIG. 31.

FIG. 32A is a sectional perspective view for describing the normal operation of the semiconductor device 191 shown in FIG. 31. FIG. 32B is a sectional perspective view for describing the active clamp operation of the semiconductor device 191 shown in FIG. 31.

With reference to FIG. 32A, when the power MISFET 9 is in the normal operation, a first ON signal Von1 is input to the first gate control wiring 17A and a second ON signal Von2 is input to the second gate control wiring 17B. The first ON signal Von1 and the second ON signal Von2 are each input from the control IC 10.

The first ON signal Von1 and the second ON signal Von2 each have a voltage not less than the gate threshold voltage Vth. The first ON signal Von1 and the second ON signal Von2 may each have an equal voltage.

In this case, the first gate electrode 193 and the second gate electrode 195 are each put into the ON state. Thereby, the first channel region 91 and the second channel region 111 are both controlled to be in the ON states. In FIG. 32A, the first channel region 91 and the second channel region 111 in the ON states are indicated by dotted hatching.

As a result, the first MISFET 56 and the second MISFET 57 are both driven (Full-ON control). The channel utilization rate RU in the normal operation is 100%. The characteristics channel rate RC in the normal operation is 50%. Thereby, the area resistivity Ron·A is lowered as compared with a case where the characteristics channel rate RC is less than 50%.

On the other hand, with reference to FIG. 32B, when the power MISFET 9 is in the active clamp operation, the OFF signal Voff is input to the first gate control wiring 17A, and a clamp ON signal VCon is input to the second gate control wiring 17B.

The OFF signal Voff and the clamp ON signal VCon are each input from the control IC 10. The OFF signal Voff has a voltage (for example, the reference voltage) less than the gate threshold voltage Vth. The clamp ON signal VCon has a voltage not less than the gate threshold voltage Vth. The clamp ON signal VCon may have a voltage not more than or less than a voltage in the normal operation.

In this case, the first gate electrode 193 is put into the OFF state, and the second gate electrode 195 is put into the ON state. Thereby, the first channel region 91 is controlled to be in the OFF state, and the second channel region 111 is controlled to be in the ON state. In FIG. 32B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation.

The channel utilization rate RU in the active clamp operation is 50%. Further, the characteristics channel rate RC in the active clamp operation is 25%. Thereby, the active clamp capability Eac is improved as compared with a case where the characteristics channel rate RC is in excess of 25%.

In this control example, a description has been given of an example in which the second Half-ON control is applied in the active clamp operation. However, the first Half-ON control may be applied in the active clamp operation.

As described above, the same effects as those described for the semiconductor device 1 can be exhibited as well by the semiconductor device 191. In this embodiment, an example is shown in which the second channel rate R2 (second channel area S2) is equal to the first channel rate R1 (first channel area Si). However, the second channel rate R2 may be different from the first channel rate R1 (R1≠R2) as in a case of the second preferred embodiment (refer to FIG. 16). The second channel rate R2 may be less than the first channel rate R1 (R2<R1).

Figure 33:
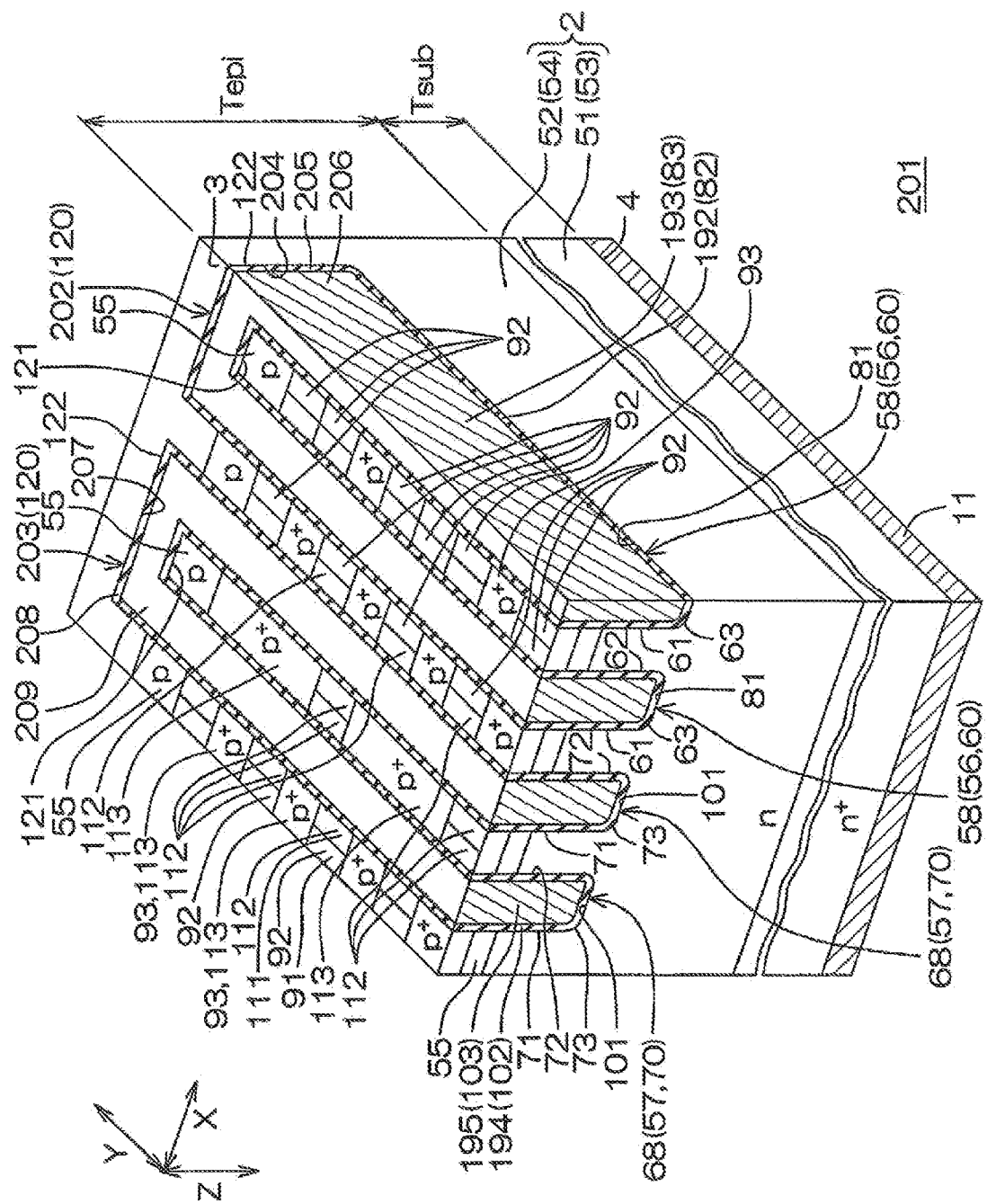
FIG. 33 is a sectional perspective view of a region corresponding to FIG. 7 and is a perspective view which shows a semiconductor device according to a seventh preferred embodiment of the present invention.

FIG. 33 is a sectional perspective view of a region corresponding to FIG. 31 and is a perspective view which shows a semiconductor device 201 according to a seventh preferred embodiment of the present invention. Hereinafter, structures corresponding to the structures described for the semiconductor device 191 shall be provided with the same reference symbols and description thereof shall be omitted.

In the semiconductor device 191, the plurality of first FET structures 58 and the plurality of second FET structures 68 are formed in a manner that one first FET structure 58 and one second FET structure 68 are alternately arrayed. In contrast thereto, in the semiconductor device 201, the plurality of first FET structures 58 and the plurality of second FET structures 68 are formed in a manner that a group of a plurality (in this embodiment, two) of first FET structures 58 and a group of a plurality (in this embodiment, two) of second FET structures 68 are alternately arrayed.

Further, the semiconductor device 191 does not have the trench contact structure 120. In contrast thereto, the semiconductor device 201 has the trench contact structure 120. More specifically, the semiconductor device 201 includes the plurality of trench contact structures 120 which are each connected to the first trench gate structure 60 and the second trench gate structure 70 in a manner that the first trench gate structure 60 and the second trench gate structure 70 are electrically insulated from each other.

Further, in the semiconductor device 191, the second channel rate R2 (second channel area S2) is equal to the first channel rate R1 (first channel area Si). In contrast thereto, in the semiconductor device 201, the second channel rate R2 is different from the first channel rate R1 (R1≠R2). More specifically, the second channel rate R2 is less than the first channel rate R1 (R2<R1). Hereinafter, a specific description will be given of a structure of the semiconductor device 201.

With reference to FIG. 33, the plurality of cell regions 75 are each defined to a region between two first FET structures 58 which are adjacent to each other, a region between one first FET structure 58 and one second FET structure 68 which are adjacent to each other, and a region between two second FET structures 68 which are adjacent to each other.

In this embodiment, three types of total channel rates RT which are different in value from each other are applied to the plurality of cell regions 75. The three types of total channel rates RT include a first total channel rate RT1, a second total channel rate RT2, and a third total channel rate RT3.

The first total channel rate RT1 is applied to the region between two first FET structures 58 which are adjacent to each other. No second channel region 111 is formed in the region between two first FET structures 58 which are adjacent to each other, due to its structure.

The first total channel rate RT1 is a total value of the first channel rates R1 of two first FET structures 58 which are adjacent to each other. The first total channel rate RT1 may be adjusted to a range from not less than 60% to not more than 80% as an example. In this embodiment, the first total channel rate RT1 is adjusted to 75%. In the first total channel rate RT1, the first channel rate R1 on one side and the first channel rate R1 on the other side are each 37.5%.

The second total channel rate RT2 is applied to the region between one first FET structure 58 and one second FET structure 68 which are adjacent to each other. The first channel region 91 and the second channel region 111 are formed in the region between one first FET structure 58 and one second FET structure 68 which are adjacent to each other, due to its structure.

The second total channel rate RT2 is a total value of the first channel rate R1 and the second channel rate R2. The second total channel rate RT2 may be adjusted to a range in excess of 40% and less than 60% as an example. In this embodiment, the second total channel rate RT2 is adjusted to 50%. In the second total channel rate RT2, the first channel rate R1 is 25% and the second channel rate R2 is 25%.

The third total channel rate RT3 is applied to the region between two second FET structures 68 which are adjacent to each other. No first channel region 91 is formed in the region between two second FET structures 68 which are adjacent to each other, due to its structure.

The third total channel rate RT3 is a total value of the second channel rates R2 of two second FET structures 68 which are adjacent to each other. The third total channel rate RT3 may be adjusted to a range from not less than 20% to not more than 40% as an example. In this embodiment, the third total channel rate RT3 is adjusted to 25%. In the third total channel rate RT3, the second channel rate R2 on one side and the second channel rate R2 on the other side are each 12.5%.

The first channel region 91 occupies a rate in excess of 50% (½) of a total channel. In this embodiment, the first channel region 91 occupies 62.5% of the total channel, and the second channel region 111 occupies 37.5% of the total channel. That is, the second channel rate R2 is less than the first channel rate R1 (R2<R1). In this embodiment, the average channel rate RAV is 50%.

The plurality of trench contact structures 120 include a plurality of first trench contact structures 202 and a plurality of second trench contact structures 203. Each of the first trench contact structures 202 is connected to one end portion of corresponding one of the plurality of first trench gate structures 60 at an interval from the plurality of second trench gate structure 70. The plurality of first trench contact structures 202 are formed in an arch shape in plan view.

Each of the second trench contact structures 203 is connected to one end portion of corresponding one of the plurality of second trench gate structures 70 at an interval from the plurality of first trench gate structures 60. The plurality of second trench contact structures 203 are formed in an arch shape in plan view.

Each of the first trench contact structures 202 includes a first contact trench 204, a first contact insulation layer 205, and a first contact electrode 206. In this embodiment, the first contact trench 204, the first contact insulation layer 205, and the first contact electrode 206 have structures respectively corresponding to the first gate trench 81, the first gate insulation layer 192, and the first gate electrode 193.

In each of the first trench contact structures 202, the first contact trench 204 communicates with one end portions of the plurality of first gate trenches 81 which are adjacent to each other. The first contact insulation layer 205 is integrally formed with the first gate insulation layer 192 at a communication portion between each of the first gate trenches 81 and the first contact trench 204. The first contact electrode 206 is integrally formed with the first gate electrode 193 at the communication portion between each of the first gate trenches 81 and the first contact trench 204.

Each of the second trench contact structures 203 includes a second contact trench 207, a second contact insulation layer 208, and a second contact electrode 209. In this embodiment, the second contact trench 207, the second contact insulation layer 208, and the second contact electrode 209 have structures respectively corresponding to the second gate trench 101, the second gate insulation layer 194, and the second gate electrode 195.

In each of the second trench contact structures 203, the second contact trench 207 communicates with one end portions of the plurality of second gate trenches 101 which are adjacent to each other. The second contact insulation layer 208 is integrally formed with the second gate insulation layer 194 at a communication portion between each of the second gate trenches 101 and the second contact trench 207. The second contact electrode 209 is integrally formed with the second gate electrode 195 at the communication portion between each of the second gate trenches 101 and the second contact trench 207.

Although not specifically shown in the drawing, the first gate control wiring 17A is electrically connected to the first gate electrode 193 and the first contact electrode 206, and the second gate control wiring 17B is electrically connected to the second gate electrode 195 and the second contact electrode 209.

Figure 34A:
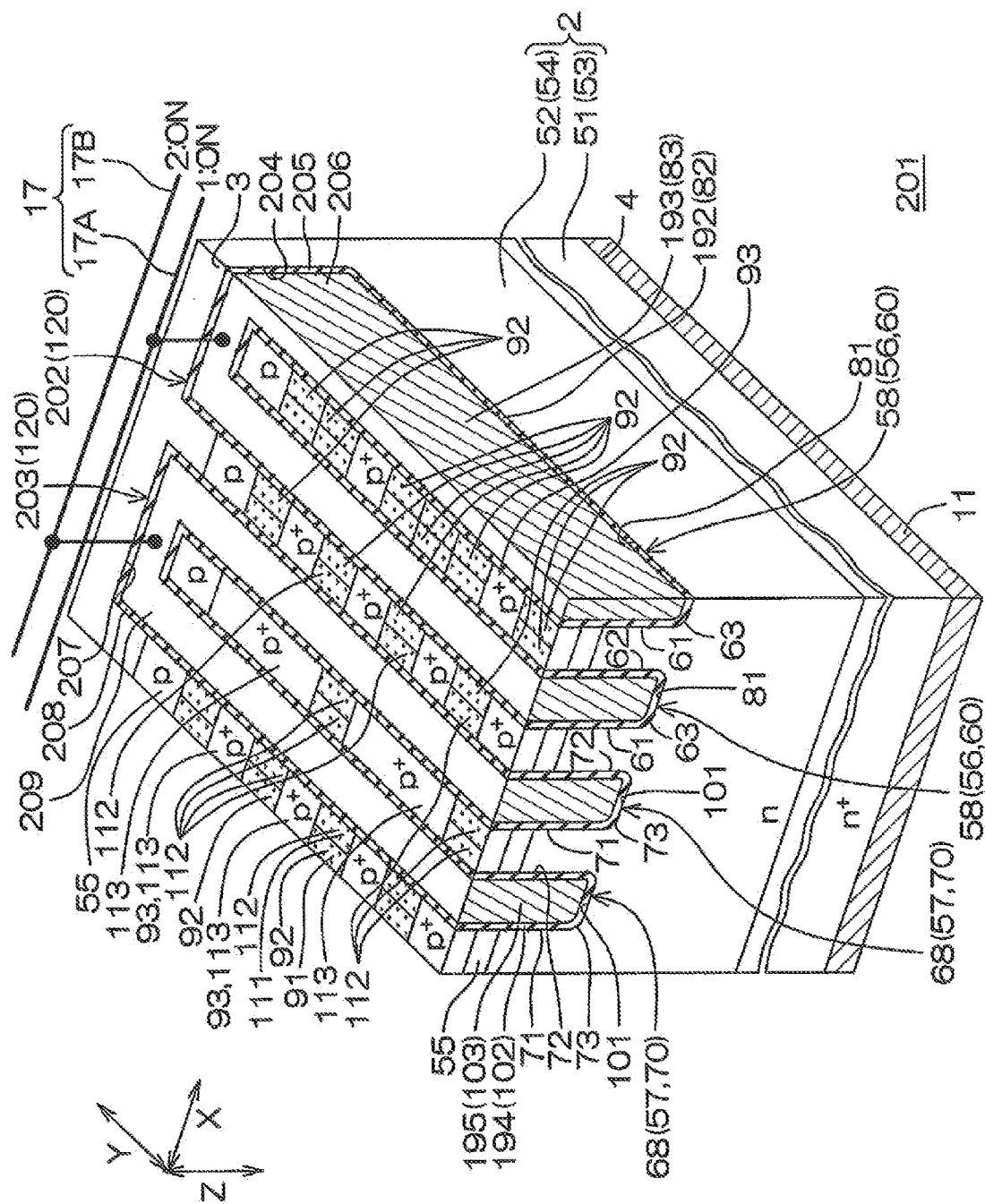
FIG. 34A is a sectional perspective view for describing normal operation of the semiconductor device shown in FIG. 33.
Figure 34B:
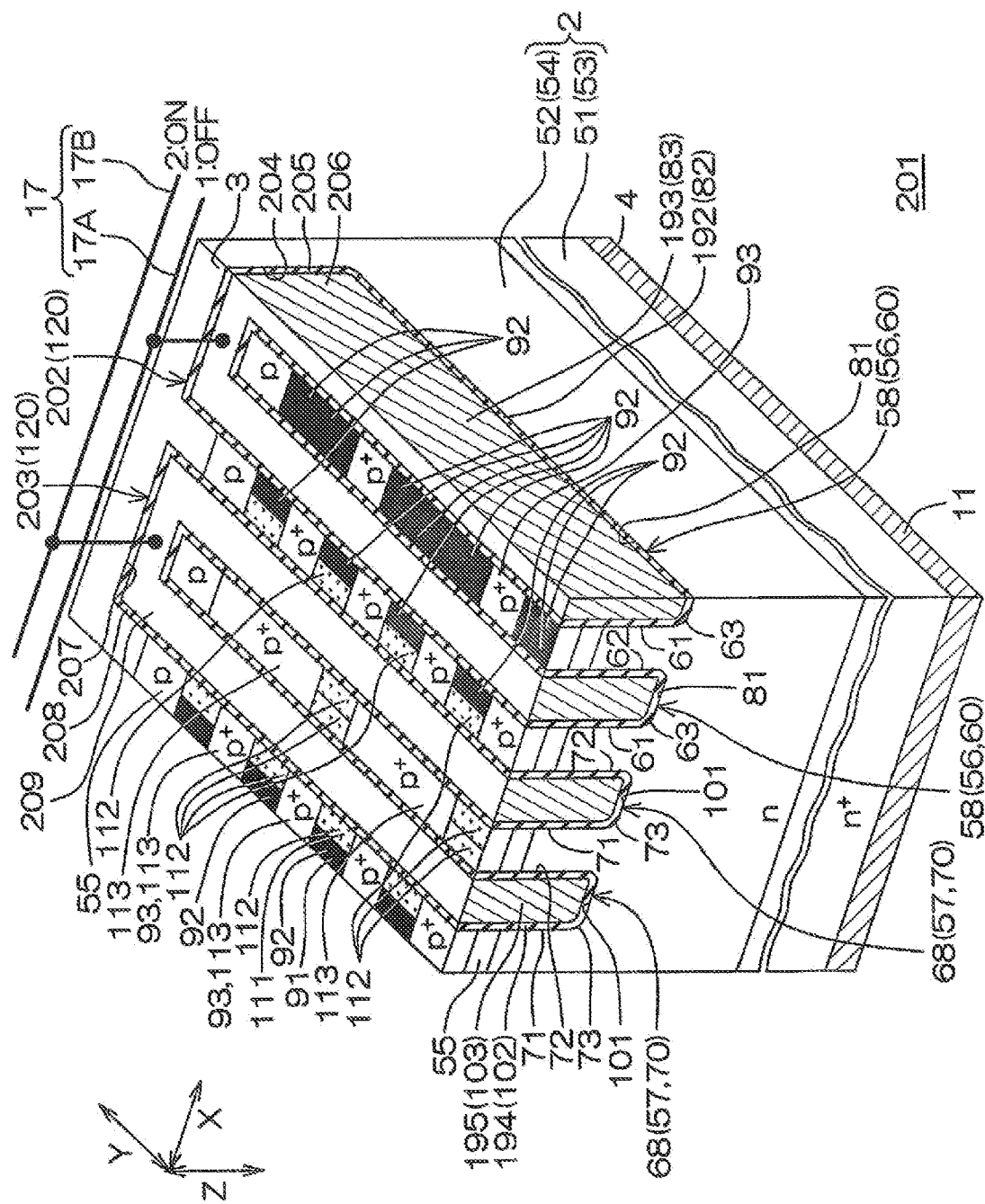
FIG. 34B is a sectional perspective view for describing active clamp operation of the semiconductor device shown in FIG. 33.

FIG. 34A is a sectional perspective view for describing the normal operation of the semiconductor device 201 shown in FIG. 33. FIG. 34B is a sectional perspective view for describing the active clamp operation of the semiconductor device 201 shown in FIG. 33. In FIG. 34A and FIG. 34B, for convenience of description, structures in the first main surface 3 are omitted to simplify the gate control wiring 17.

With reference to FIG. 34A, when the power MISFET 9 is in the normal operation, a first ON signal Von1 is input to the first gate control wiring 17A and a second ON signal Von2 is input to the second gate control wiring 17B. The first ON signal Von1 and the second ON signal Von2 are each input from the control IC 10.

The first ON signal Von1 and the second ON signal Von2 each have a voltage not less than the gate threshold voltage Vth. The first ON signal Von1 and the second ON signal Von2 may each have an equal voltage.

In this case, the first gate electrode 193 and the second gate electrode 195 are each put into the ON state. Thereby, the first channel region 91 and the second channel region 111 are both controlled to be in the ON states. In FIG. 34A, the first channel region 91 and the second channel region 111 in the ON states are indicated by dotted hatching.

As a result, the first MISFET 56 and the second MISFET 57 are both driven (Full-ON control). A channel utilization rate RU in the normal operation is 100%. A characteristics channel rate RC in the normal operation is 50%. Thereby, the area resistivity Ron·A is lowered as compared with a case where the characteristics channel rate RC is less than 50%.

On the other hand, with reference to FIG. 34B, when the power MISFET 9 is in the active clamp operation, an OFF signal Voff is input to the first gate control wiring 17A, and a clamp ON signal VCon is input to the second gate control wiring 17B. The OFF signal Voff and the clamp ON signal VCon are each input from the control IC 10.

The OFF signal Voff has a voltage (for example, the reference voltage) less than the gate threshold voltage Vth. The clamp ON signal VCon has a voltage not less than the gate threshold voltage Vth. The clamp ON signal VCon may have a voltage not more than or less than a voltage in the normal operation.

In this case, the first gate electrode 193 is put into the OFF state, and the second gate electrode 195 is put into the ON state. Thereby, the first channel region 91 is controlled to be in the OFF state, and the second channel region 111 is controlled to be in the ON state. In FIG. 34B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation. More specifically, the channel utilization rate RU in the active clamp operation is less than ½ of the channel utilization rate RU in the normal operation.

The channel utilization rate RU in the active clamp operation is 37.5%. Further, the characteristics channel rate RC in the active clamp operation is 18.75%. Thereby, the active clamp capability Eac is improved as compared with a case where the characteristics channel rate RC exceeds 18.75%.

As described above, the same effects as those described for the semiconductor device 191 can be exhibited as well by the semiconductor device 201. Further, in the semiconductor device 201, the plurality of first FET structures 58 and the plurality of second FET structures 68 are formed in a manner that the group of the plurality (in this embodiment, two) of first FET structures 58 and the group of the plurality (in this embodiment, two) of second FET structures 68 are alternately arrayed.

According to a structure in which the plurality of first FET structures 58 are adjacent to each other, the first channel region 91 can be formed, without being connected to the second channel region 111, in the region between the plurality of first FET structures 58 which are adjacent to each other. Therefore, it is possible to appropriately form the first channel region 91 and appropriately adjust the first channel rate R1.

Similarly, according to a structure in which the plurality of second FET structures 68 are adjacent to each other, the second channel region 111 can be formed, without being connected to the first channel region 91, in the region between the plurality of second FET structures 68 which are adjacent to each other. Therefore, it is possible to appropriately form the second channel region 111 and appropriately adjust the second channel rate R2. Thereby, the average channel rate RAV and the characteristics channel rate RC can be appropriately adjusted.

Figure 35:
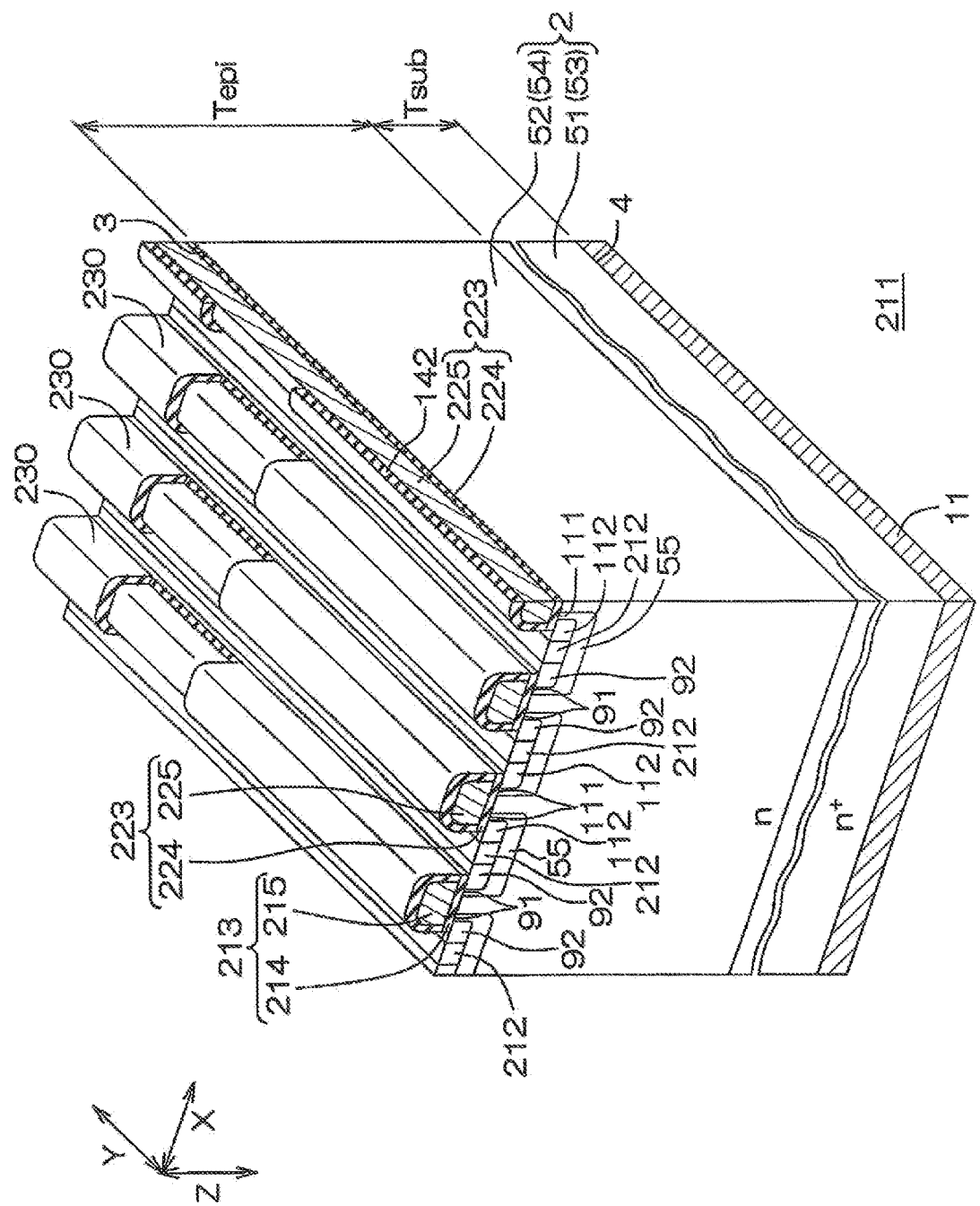
FIG. 35 is a sectional perspective view of a region corresponding to FIG. 7 and is a partially cutaway sectional perspective view which shows a semiconductor device according to an eighth preferred embodiment of the present invention.

FIG. 35 is a sectional perspective view of a region corresponding to FIG. 7 and is a partially cutaway sectional perspective view which shows a semiconductor device 211 according to an eighth preferred embodiment of the present invention. Hereinafter, structures corresponding to the structures described for the semiconductor device 1 shall be provided with the same reference symbols and description thereof shall be omitted.

The semiconductor device 1 includes the trench gate-type first FET structures 58 and the trench-gate type second FET structures 68. In contrast thereto, the semiconductor device 211 includes a planar gate-type first FET structure 58 and a planar gate-type second FET structure 68. Hereinafter, a description will be given of a specific structure of the semiconductor device 211.

With reference to FIG. 35, a plurality of body regions 55 are formed in the surface layer portion of the first main surface 3 of the semiconductor layer 2. The plurality of body regions 55 are regions which serve as bases of the power MISFET 9. The plurality of body regions 55 are formed at intervals along the first direction X, and each extend in a band shape along the second direction Y. The plurality of body regions 55 are formed in a stripe shape as a whole in plan view.

Each of the first FET structures 58 includes the first source region 92 formed in the surface layer portion of each of the body regions 55. The first source region 92 extends in a band shape along the second direction Y. Each of the second FET structures 68 includes the second source region 112 formed in the surface layer portion of each of the body regions 55. More specifically, the second source region 112 is formed with an interval along the first direction X and extends in a band shape along the second direction Y.

Each of the first FET structures 58 and each of the second FET structures 68 include the p$^+$-type contact region 212 formed in the surface layer portion of each of the body regions 55. The contact region 212 is shared by the first FET structure 58 and the second FET structure 68. The contact region 212 is formed in a region between the first source region 92 and the second source region 112. The contact region 212 extends in a band shape along the second direction Y.

The first FET structure 58 includes a first planar gate structure 213 formed on the first main surface 3 of the semiconductor layer 2. The first planar gate structure 213 extends in a band shape along the second direction Y and faces the drift region 54, the body region and the first source region 92.

More specifically, each of the first planar gate structures 213 includes a first gate insulation layer 214 and a first gate electrode 215. The first gate insulation layer 214 is formed on the first main surface 3. The first gate insulation layer 214 covers the drift region 54, the body region 55, and the first source region 92 on the first main surface 3. The first gate electrode 215 faces the drift region 54, the body region 55, and the first source region 92 across the first gate insulation layer 214.

In this embodiment, the first channel region 91 of the first MISFET 56 is formed in a region between the drift region 54 and the first source region 92 in the body region 55. The first channel region 91 faces the first gate electrode 215 across the first gate insulation layer 214.

The second FET structure 68 includes a second planar gate structure 223 formed on the second main surface 4 of the semiconductor layer 2. The second planar gate structure 223 extends in a band shape along the second direction Y and faces the drift region 54, the body region 55, and the second source region 112.

More specifically, each of the second planar gate structures 223 includes a second gate insulation layer 224 and a second gate electrode 225. The second gate insulation layer 224 is formed on the second main surface 4. The second gate insulation layer 224 covers the drift region 54, the body region 55, and the second source region 112 on the second main surface 4. The second gate electrode 225 faces the drift region 54, the body region 55, and the second source region 112 across the second gate insulation layer 224.

In this embodiment, the second channel region 111 of the second MISFET 57 is formed in a region between the drift region 54 and the second source region 112 in the body region 55. The second channel region 111 faces the second gate electrode 225 across the second gate insulation layer 224.

The interlayer insulation layer 142 is formed on the first main surface 3. A plurality of source openings 230 are formed in the interlayer insulation layer 142. The source openings 230 are each formed in a part which covers a region between the first planar gate structure 213 and the second planar gate structure 223 which are adjacent to each other in the interlayer insulation layer 142. The source openings 230 each expose the first source region 92, the second source region 112, and the contact region 212.

Although not specifically shown in the drawing, the source electrode 12 is formed on the interlayer insulation layer 142 in a manner that enters each of the source openings 230. The source electrode 12 is electrically connected to the first source region 92, the second source region 112, and the contact region 212 inside each of the source openings 230. Further, although not specifically shown in the drawing, the first gate control wiring 17A is electrically connected to the first gate electrode 193, and the second gate control wiring 17B is electrically connected to the second gate electrode 195.

Figure 36A:
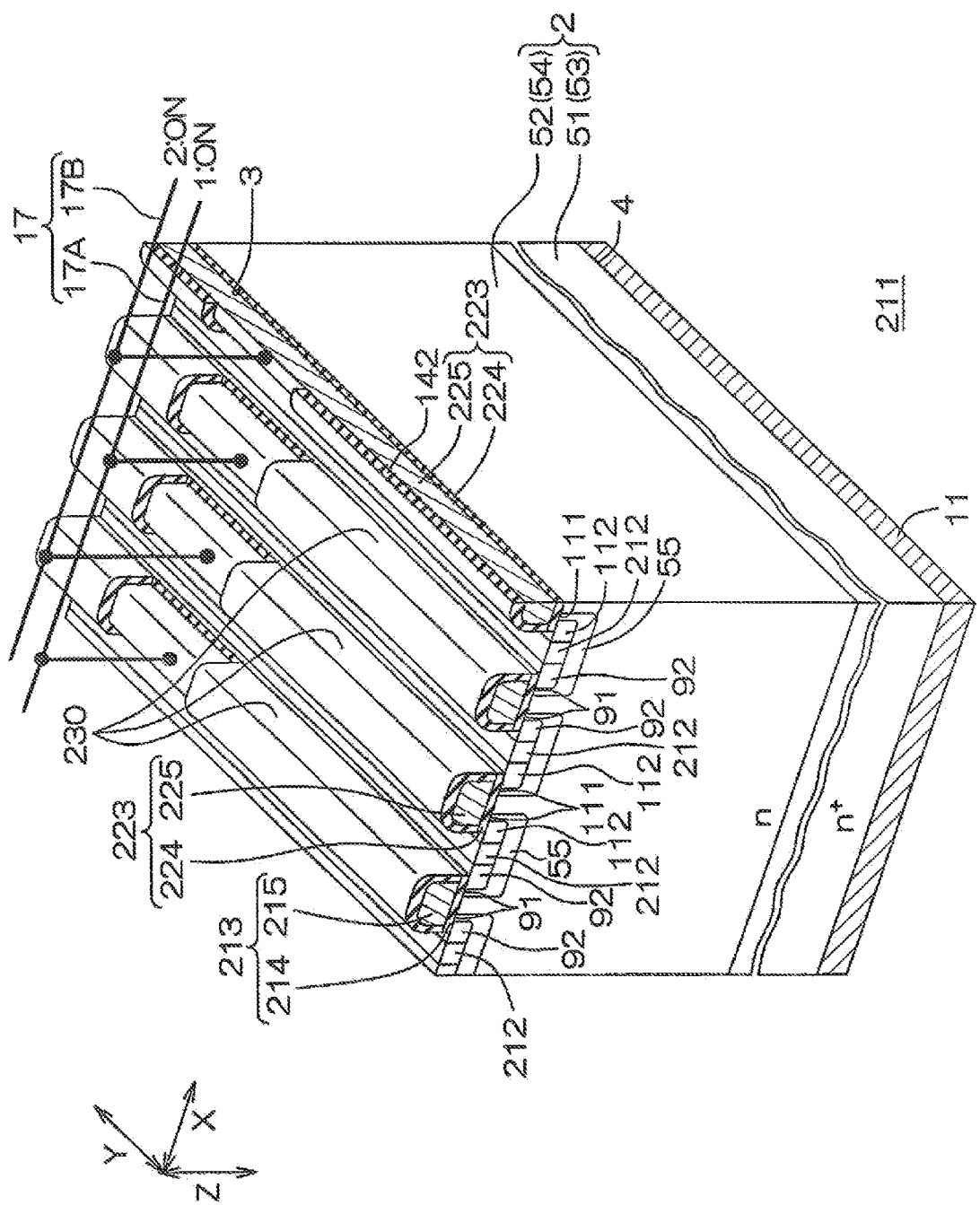
FIG. 36A is a sectional perspective view for describing normal operation of the semiconductor device shown in FIG. 35.
Figure 36B:
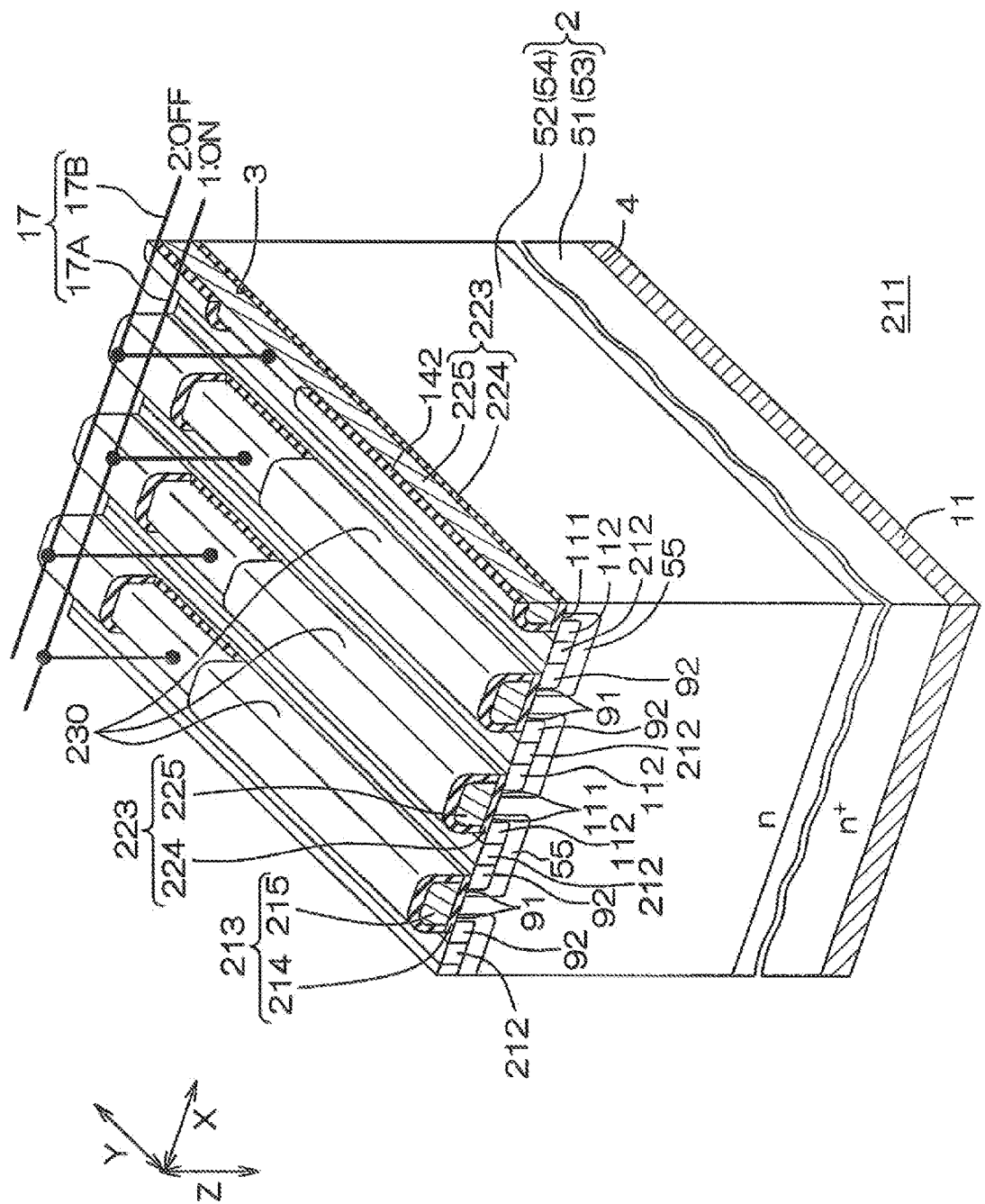
FIG. 36B is a sectional perspective view for describing active clamp operation of the semiconductor device shown in FIG. 35.

FIG. 36A is a sectional perspective view for describing the normal operation of the semiconductor device 211 shown in FIG. 35. FIG. 36B is a sectional perspective view for describing the active clamp operation of the semiconductor device 211 shown in FIG. 35.

With reference to FIG. 36A, when the power MISFET 9 is in the normal operation, a first ON signal Von1 is input to the first gate control wiring 17A and a second ON signal Von2 is input to the second gate control wiring 17B. The first ON signal Von1 and the second ON signal Von2 are each input from the control IC 10.

The first ON signal Von1 and the second ON signal Von2 each have a voltage not less than the gate threshold voltage Vth. The first ON signal Von1 and the second ON signal Von2 may have an equal voltage.

In this case, the first gate electrode 193 and the second gate electrode 195 are each put into the ON state. Thereby, the first channel region 91 and the second channel region 111 are both controlled to be in the ON states.

As a result, the first MISFET 56 and the second MISFET 57 are both driven (Full-ON control). The channel utilization rate RU in the normal operation is 100%. The characteristics channel rate RC in the normal operation is 50%. Thereby, the area resistivity Ron·A is lowered as compared with a case where the characteristics channel rate RC is less than 50%.

On the other hand, with reference to FIG. 36B, when the power MISFET 9 is in the active clamp operation, the OFF signal Voff is input to the first gate control wiring 17A, and a clamp ON signal VCon is input to the second gate control wiring 17B. The OFF signal Voff and the clamp ON signal VCon are each input from the control IC 10.

The OFF signal Voff has a voltage (for example, the reference voltage) less than the gate threshold voltage Vth. The clamp ON signal VCon has a voltage not less than the gate threshold voltage Vth. The clamp ON signal VCon may have a voltage not more than or less than a voltage in the normal operation.

In this case, the first gate electrode 193 is put into the OFF state, and the second gate electrode 195 is put into the ON state. Thereby, the first channel region 91 is controlled to be in the OFF state, and the second channel region 111 is controlled to be in the ON state.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation. The channel utilization rate RU in the active clamp operation is 50%. Further, the characteristics channel rate RC in the active clamp operation is 25%. Thereby, the active clamp capability Eac is improved as compared with a case where the characteristics channel rate RC is in excess of 25%.

As described above, the same effects as those described for the semiconductor device 1 can be exhibited as well by the semiconductor device 211.

Figure 37:
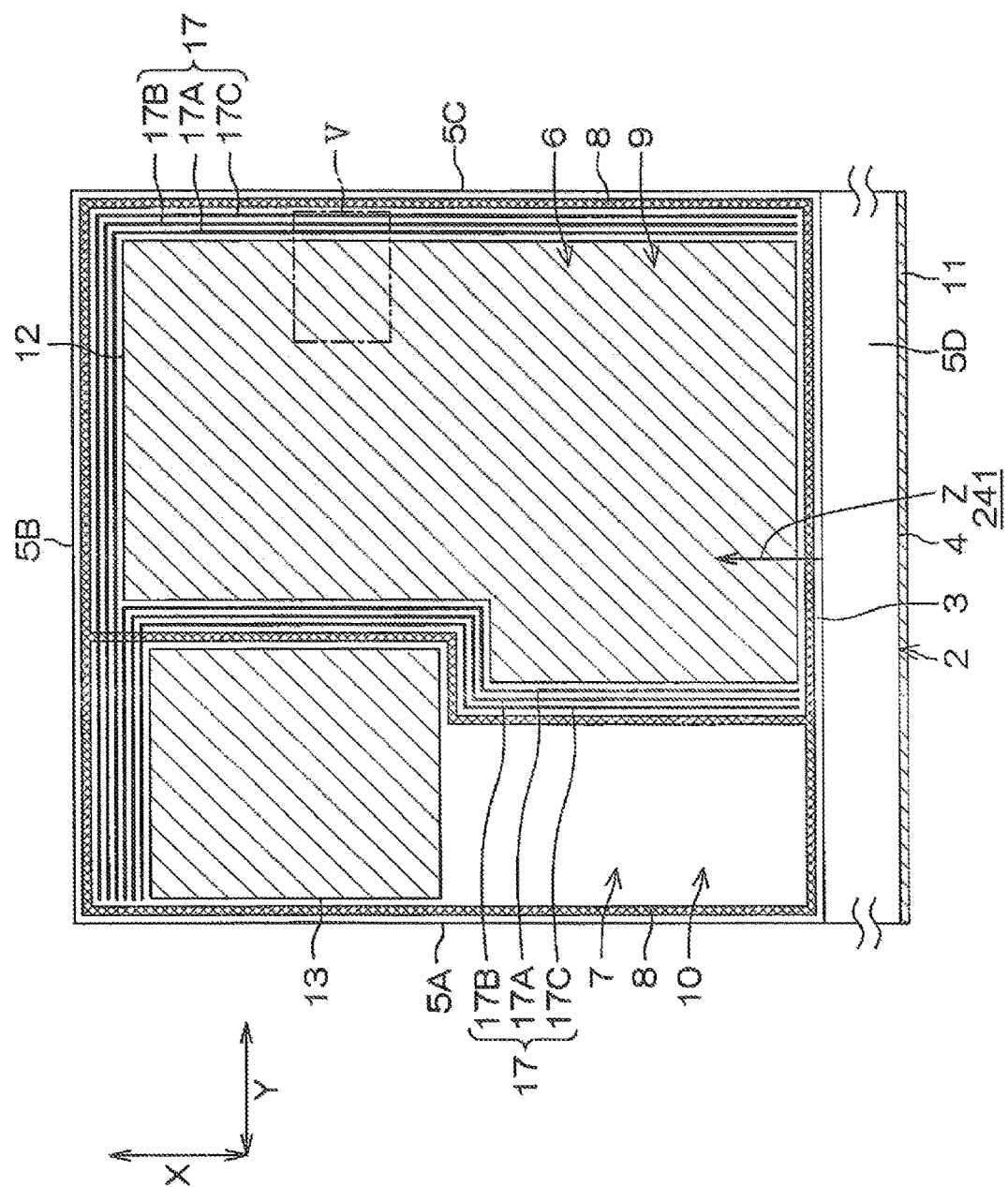
FIG. 37 is a perspective view of a semiconductor device according to a ninth preferred embodiment of the present invention which is viewed from one direction.

FIG. 37 is a perspective view of a semiconductor device 241 according to a ninth preferred embodiment of the present invention which is viewed from one direction. Hereinafter, structures corresponding to the structures described for the semiconductor device 1 shall be provided with the same reference symbols and description thereof shall be omitted.

In the aforementioned first preferred embodiment, a description has been given of a configuration example in which the semiconductor device 1 is the high-side switching device. However, the semiconductor device 1 may be provided as a low-side switching device. Here, a configuration example of the semiconductor device 1 which is manufactured as the low-side switching device shall be described as the semiconductor device 241 according to the ninth preferred embodiment.

As a structure (control example) of the power MISFET 9 which is incorporated into the semiconductor device 241, without being restricted to the structure (control example) of the power MISFET 9 according to the first preferred embodiment, any one of the structures (control examples) of the power MISFETs 9 shown in the second preferred embodiment, third preferred embodiment, fourth preferred embodiment, fifth preferred embodiment, sixth preferred embodiment, seventh preferred embodiment, and eighth preferred embodiment is applied. It shall be deemed that a description of any one of the structures (control examples) of the power MISFETs 9 according to the first to the eighth preferred embodiments is applied with modifications to a description of the structure (control example) of the power MISFET 9 of the semiconductor device 241 and a description thereof shall be omitted.

With reference to FIG. 37, the semiconductor device 241 includes the semiconductor layer 2, as with the first preferred embodiment, etc. The output region 6 and the input region 7 are defined in the semiconductor layer 2, as with the first preferred embodiment, etc. The output region 6 includes the power MISFET 9. The input region 7 includes the control IC 10.

The plurality (in this embodiment, three) of electrodes 11, 12, and 13 are formed on the semiconductor layer 2. In FIG. 37, the plurality of electrode 11 to 13 are shown by hatching. The number, the arrangement, and the planar shape of the plurality of electrodes 11 to 13 are arbitrary, and they are not restricted to the configuration shown in FIG. 37.

The number, the arrangement, and the planar shape of the plurality of electrodes 11 to 13 are adjusted according to the specification of the power MISFET 9 and/or the specification of the control IC 10. In this embodiment, the plurality of electrodes 11 to 13 include the drain electrode 11 (output electrode), the source electrode 12 (reference voltage electrode), and the input electrode 13.

The drain electrode 11 is formed on the second main surface 4 of the semiconductor layer 2, as with the first preferred embodiment, etc. The drain electrode 11 transmits to the outside an electrical signal generated by the power MISFET 9.

The source electrode 12 is formed in the output region 6 on the first main surface 3, as with the first preferred embodiment, etc. The source electrode 12 supplies the reference voltage (for example, the ground voltage) to the power MISFET 9 and/or various functional circuits of the control IC 10.

The input electrode 13 is formed in the input region 7 on the first main surface 3, as with the first preferred embodiment, etc. The input electrode 13 transmits an input voltage for driving the control IC 10.

The gate control wiring 17 as one example of the control wiring is formed on the semiconductor layer 2, as with the first preferred embodiment, etc. In this embodiment, the gate control wiring 17 includes the first gate control wiring 17A, the second gate control wiring 17B, and the third gate control wiring 17C. The gate control wiring 17 is selectively laid around in the output region 6 and the input region 7. The gate control wiring 17 is electrically connected to the gate of the power MISFET 9 in the output region 6 and electrically connected to the control IC 10 in the input region 7.

Figure 38:
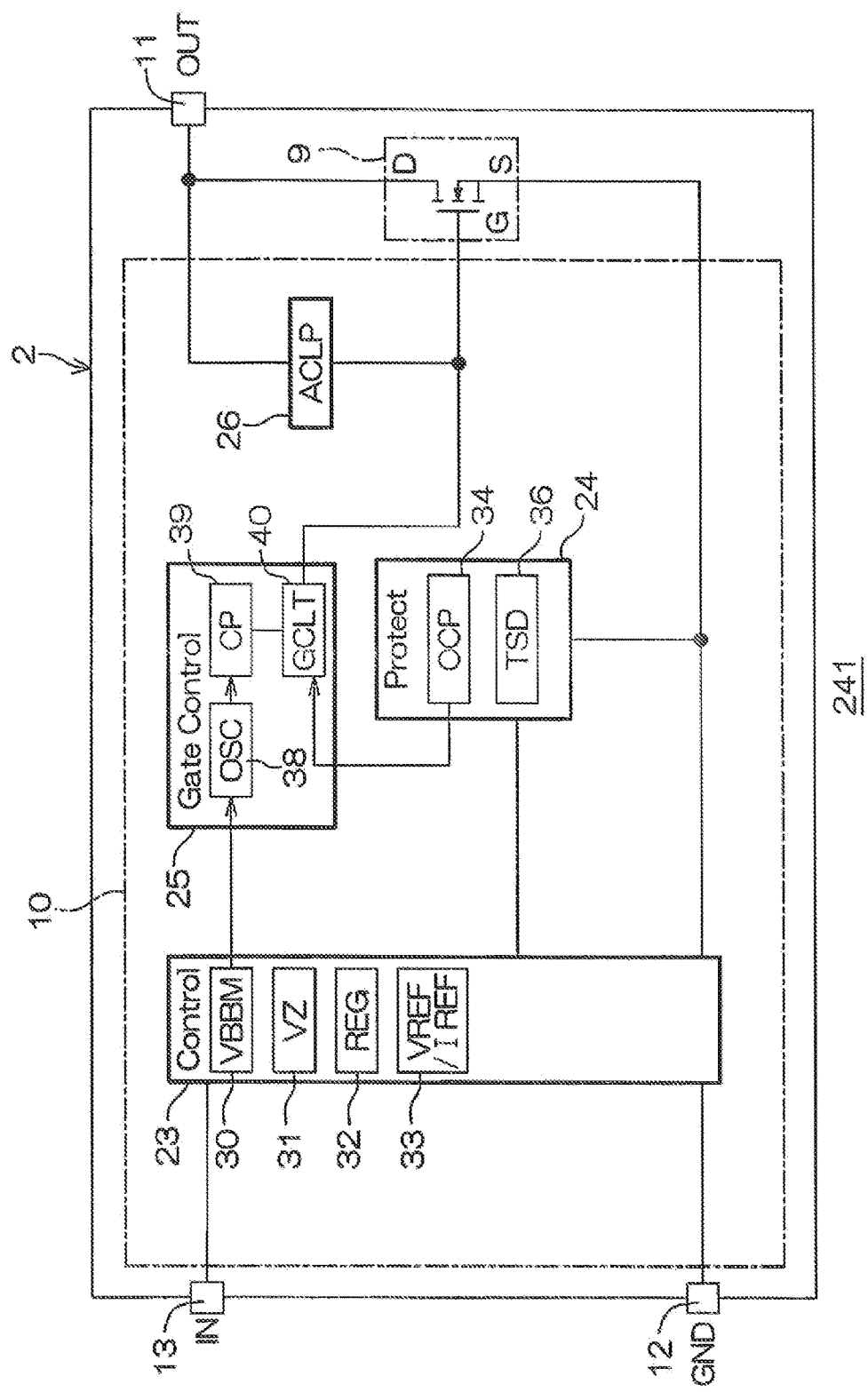
FIG. 38 is a block circuit diagram which shows an electrical configuration of the semiconductor device shown in FIG. 37.

FIG. 38 is a block circuit diagram which shows an electrical configuration of the semiconductor device 241 shown in FIG. 37. Hereinafter, an example in which the semiconductor device 241 is adopted into a vehicle shall be described.

The semiconductor device 241 includes the drain electrode 11 as an output electrode, the source electrode 12 as the reference voltage electrode, the input electrode 13, the gate control wiring 17, the power MISFET 9, and the control IC 10.

The drain electrode 11 is electrically connected to the drain of the power MISFET 9. The drain electrode 11 is connected to a load. The source electrode 12 is electrically connected to the source of the power MISFET 9. The source electrode 12 supplies the reference voltage to the power MISFET 9 and the control IC 10.

The input electrode 13 may be connected to an MCU, a DC/DC converter, a LDO, etc. The input electrode 13 supplies an input voltage to the control IC 10. The gate of the power MISFET 9 is connected to the control IC 10 (the gate control circuit 25 to be described later) through the gate control wiring 17.

In this embodiment, the control IC 10 includes the current-voltage control circuit 23, the protection circuit 24, the gate control circuit 25, and the active clamp circuit 26.

The current-voltage control circuit 23 is connected to the source electrode 12, the input electrode 13, the protection circuit 24, and the gate control circuit 25. The current-voltage control circuit 23 generates various voltages in response to an electrical signal from the input electrode 13 and an electrical signal from the protection circuit 24. In this embodiment, the current-voltage control circuit 23 includes a driving voltage generation circuit 30, the first constant voltage generation circuit 31, the second constant voltage generation circuit 32, and the reference voltage-reference current generation circuit 33.

The driving voltage generation circuit 30 generates the driving voltage for driving the gate control circuit 25. The driving voltage generated by the driving voltage generation circuit 30 is input to the gate control circuit 25.

The first constant voltage generation circuit 31 generates a first constant voltage for driving the protection circuit 24. The first constant voltage generation circuit 31 may include a Zener diode and/or a regulator circuit. The first constant voltage is input to the protection circuit 24 (for example, the overcurrent protection circuit 34).

The second constant voltage generation circuit 32 generates a second constant voltage for driving the protection circuit 24. The second constant voltage generation circuit 32 may include a Zener diode and/or a regulator circuit. A second constant voltage is input to the protection circuit 24 (for example, the overheat protection circuit 36).

The reference voltage-reference current generation circuit 33 generates a reference voltage and a reference current for various types of circuits. The reference voltage and the reference current are input to various types of circuits. In a case where the various types of circuits include the comparator, the reference voltage and the reference current may be input to the comparator.

The protection circuit 24 is connected to the current-voltage control circuit 23, the gate control circuit 25, and the source of the power MISFET 9. The protection circuit 24 includes the overcurrent protection circuit 34 and the overheat protection circuit 36.

The overcurrent protection circuit 34 protects the power MISFET 9 from an overcurrent. The overcurrent protection circuit 34 is connected to the gate control circuit 25. The overcurrent protection circuit 34 may include the current monitor circuit. A signal generated by the overcurrent protection circuit 34 is input to the gate control circuit 25 (specifically, the driving signal output circuit 40 to be described later).

The overheat protection circuit 36 protects the power MISFET 9 from an excessive temperature rise. The overheat protection circuit 36 is connected to the current-voltage control circuit 23. The overheat protection circuit 36 monitors a temperature of the semiconductor device 241. The overheat protection circuit 36 may include a temperature sensitive device such as a diode and a thermistor. A signal generated by the overheat protection circuit 36 is input to the current-voltage control circuit 23.

The gate control circuit 25 controls the ON state and the OFF state of the power MISFET 9. The gate control circuit 25 is connected to the current-voltage control circuit 23, the protection circuit 24, and the gate of the power MISFET 9.

The gate control circuit 25 generates plural types of gate control signals according to the number of the gate control wirings 17 in response to an electrical signal from the current-voltage control circuit 23 and an electrical signal from the protection circuit 24. The plural types of gate control signals are input to the gate of the power MISFET 9 through the gate control wiring 17.

Specifically, the gate control circuit 25 includes the oscillation circuit 38, the charge pump circuit 39, and the driving signal output circuit 40. The oscillation circuit 38 oscillates in response to an electrical signal from the current-voltage control circuit 23 to generate a predetermined electrical signal. The electrical signal generated by the oscillation circuit 38 is input to the charge pump circuit 39. The charge pump circuit 39 boosts the electrical signal from the oscillation circuit 38. The electrical signal boosted by the charge pump circuit 39 is input to the driving signal output circuit 40.

The driving signal output circuit 40 generates plural types of gate control signals in response to an electrical signal from the charge pump circuit 39 and an electrical signal from the protection circuit 24 (specifically, the overcurrent protection circuit 34). The plural types of gate control signals are input to the gate of the power MISFET 9 through the gate control wiring 17. Thereby, the power MISFET 9 is driven and controlled.

The active clamp circuit 26 protects the power MISFET 9 from the counter electromotive force. The active clamp circuit 26 is connected to the drain electrode 11 and the gate of the power MISFET 9.

Figure 39:
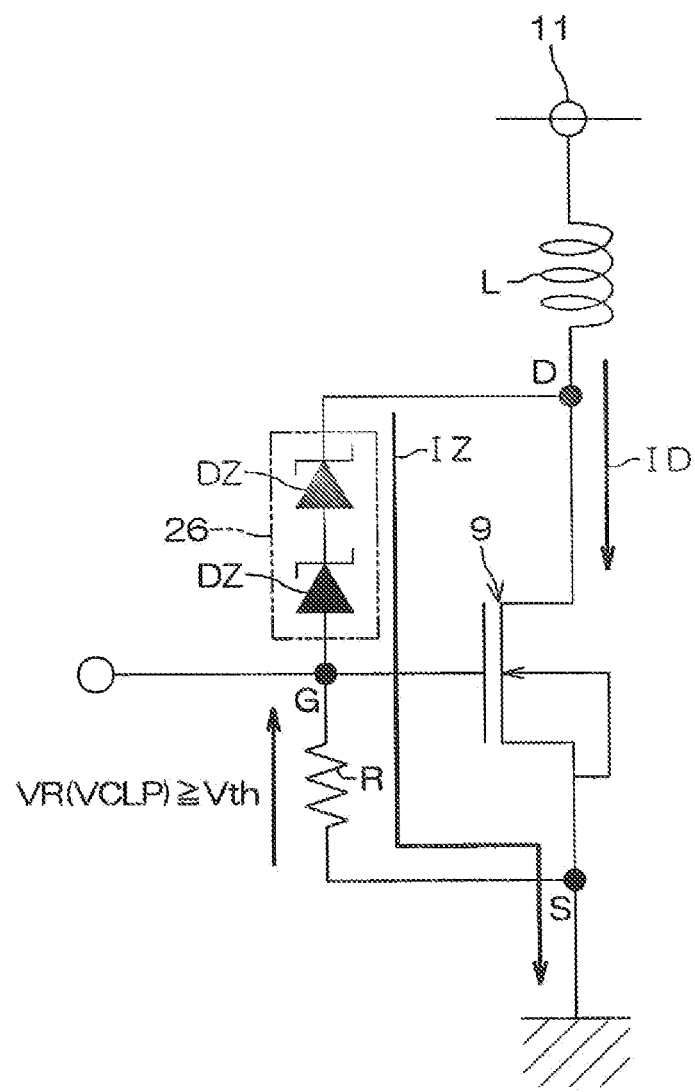
FIG. 39 is a circuit diagram for describing normal operation and active clamp operation of the semiconductor device shown in FIG. 37.
Figure 40:
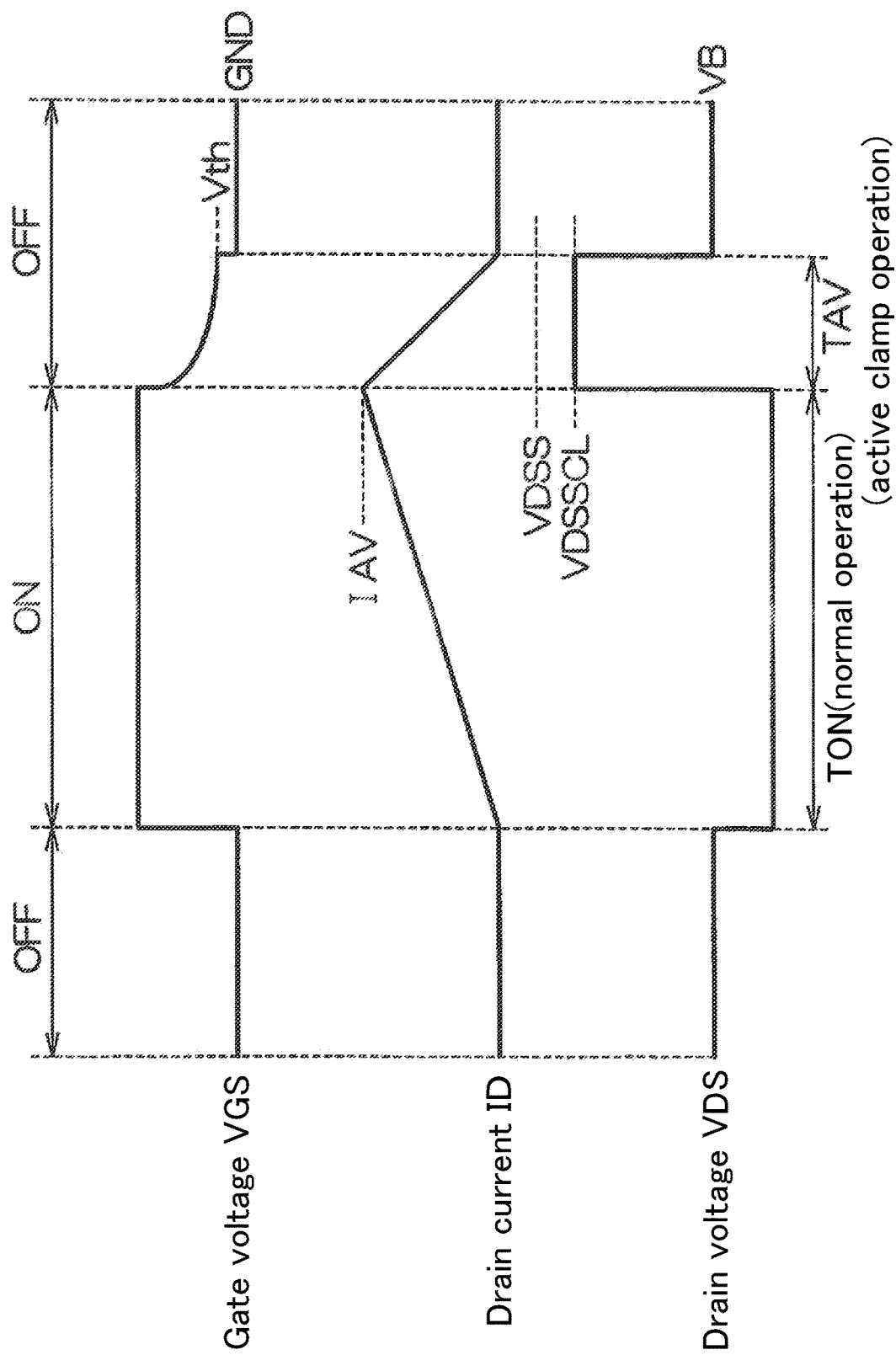
FIG. 40 is a waveform chart of a main electrical signal applied to the circuit diagram shown in FIG. 39.

FIG. 39 is a circuit diagram for describing the normal operation and the active clamp operation of the semiconductor device 241 shown in FIG. 37. FIG. 40 is a waveform chart of a main electrical signal applied to the circuit diagram shown in FIG. 39.

Here, a circuit example in which the inductive load L is connected to the power MISFET 9 is used to describe the normal operation and the active clamp operation of the semiconductor device 241. A device which uses a solenoid, a motor, a transformer, and a winding (coil) such as a relay, etc., is shown as an example of the inductive load L. The inductive load L is also called the L load.

With reference to FIG. 39, the source of the power MISFET 9 is connected to the ground. The drain of the power MISFET 9 is electrically connected to the inductive load L. The gate and the drain of the power MISFET 9 are connected to the active clamp circuit 26. The gate and the source of the power MISFET 9 are connected to a resistance R. In this circuit example, the active clamp circuit 26 includes the k number (k is a natural number) of Zener diodes DZ which are connected to each other in a biased manner.

With reference to FIG. 39 and FIG. 40, when the ON signal Von is input to the gate of the power MISFET 9 in the OFF state, the power MISFET 9 is switched from the OFF state to the ON state (the normal operation). The ON signal Von has a voltage equal to or larger than the gate threshold voltage Vth (Vth≤Von). The power MISFET 9 is kept in the ON state only for a predetermined ON time TON.

When the power MISFET 9 is switched to the ON state, a drain current ID starts to flow from the drain of the power MISFET 9 to the source thereof. The drain current ID is increased proportionally in accordance with the ON time TON of the power MISFET 9. The inductive load L allows an inductive energy to accumulate due to an increase in the drain current ID.

When the OFF signal Voff is input to the gate of the power MISFET 9, the power MISFET 9 is switched from the ON state to the OFF state. The OFF signal Voff has a voltage less than the gate threshold voltage Vth (Voff<Vth). The OFF signal Voff may be the reference voltage (for example, the ground voltage). When the power MISFET 9 is switched to the OFF state, an inductive energy of the inductive load L is applied to the power MISFET 9 as the counter electromotive force.

Thereby, the power MISFET 9 is shifted to the active clamp state (the active clamp operation). When the power MISFET 9 is shifted to the active clamp state, a drain voltage VDS is sharply raised to a clamp voltage VDSSCL.

In a case where the clamp voltage VDSSCL exceeds a maximum rated drain voltage VDSS (VDSS<VDSSCL), the power MISFET 9 reaches breakdown. The power MISFET 9 is designed such that the clamp voltage VDSSCL becomes equal to or less than the maximum rated drain voltage VDSS (VDSSCL≤VDSS).

In a case where the clamp voltage VDSSCL is equal to or less than the maximum rated drain voltage VDSS (VDSSCL≤VDSS), a reverse current IZ flows to the active clamp circuit 26. Thereby, a limit voltage VL is formed between terminals of the active clamp circuit 26. In this embodiment, the limit voltage VL is a sum of voltages across terminals VZ of Zener diodes DZ in the active clamp circuit 26 (VL=k·VZ).

Further, the reverse current IZ passes through the resistance R and reaches a ground. Thereby, a voltage VR between terminals is formed between terminals of the resistance R. The voltage VR between terminals of the resistance R (=IZ×R) is adjusted to a voltage not less than the gate threshold voltage Vth (Vth≤VR). The voltage VR between terminals is applied between the gate and the source of the power MISFET 9 as the clamp ON voltage VCLP. Therefore, the power MISFET 9 keeps the ON state in the active clamp state. The clamp ON voltage VCLP (voltage VR between terminals) may have a voltage less than the ON signal Von.

Thereby, the inductive energy of the inductive load L is consumed (absorbed) in the power MISFET 9. After an active clamp time TAV, the drain current ID is reduced to zero from a peak value IAV which is immediately before the power MISFET 9 becomes the OFF state. Thereby, the gate voltage VGS becomes the ground voltage and the drain voltage VDS becomes the power supply voltage VB, and the power MISFET 9 is switched from the ON state to the OFF state.

The active clamp capability Eac of the power MISFET 9 is defined by the capability in the active clamp operation. More specifically, the active clamp capability Eac is defined by the capability with respect to the counter electromotive force caused by an inductive energy of the inductive load L in transition when the power MISFET 9 is switched from the ON state to the OFF state.

More specifically, the active clamp capability Eac is defined by a capability with respect to an energy caused by the clamp voltage VDSSCL, as apparent from the circuit example of FIG. 36.

As described above, the same effects as those described for the semiconductor device 1 can be exhibited as well by the semiconductor device 241.

While the preferred embodiments of the present invention have been described above, the present invention may be implemented in yet other embodiments.

In each of the aforementioned preferred embodiments, in a case where the first bottom-side electrode 86 and the second bottom-side electrode 106 which are electrically connected to the third gate control wiring 17C each function as a field electrode, the third gate control wiring 17C may be electrically connected to the source electrode 12 in place of the control IC.

In this case, the third gate control wiring 17C may be led out from the source electrode 12. Therefore, the reference voltage (for example, the ground voltage) is transmitted to the first bottom-side electrode 86 and the second bottom-side electrode 106 from the source electrode 12 through the third gate control wiring 17C. The same effects as those described for the semiconductor device 1, etc., can be exhibited as well by the above-described structure.

In each of the aforementioned preferred embodiments, as long as the channel utilization rate RU in the active clamp operation and the channel utilization rate RU in the normal operation can be appropriately controlled, the plurality of first FET structures 58 and the plurality of second FET structures 68 may be arrayed in an arbitrary manner.

For example, the plurality of second FET structures 68 may be alternately arrayed with the plurality of first FET structure 58 in a manner that the plurality of first FET structures 58 are held therebetween. The plurality of second FET structures 68 may be alternately arrayed with the plurality of first FET structures 58 in a manner that 2, 3, 4, 5, 6, 7, 8, 9, or 10 of the first FET structures 58 are held therebetween.

Similarly, the plurality of first FET structures 58 may be alternately arrayed with the plurality of second FET structures 68 in a manner that the plurality of second FET structures 68 are held therebetween. The plurality of first FET structures 58 may be alternately arrayed with the plurality of second FET structures 68 in a manner that 2, 3, 4, 5, 6, 7, 8, 9, or 10 of the second FET structures 68 are held therebetween.

As a matter of course, a group of the plurality (two or more) of first FET structures 58 and a group of the plurality (two or more) of second FET structures 68 may be alternately arrayed with each other. Further, the plurality of first FET structures 58 and the plurality of second FET structures 68 may be formed in a manner that a group of the plurality of first FET structures 58 and one second FET structure 68 are alternately arrayed. Further, the plurality of first FET structures 58 and the plurality of second FET structures 68 may be formed in a manner that one first FET structure 58 and a group of the plurality of second FET structures 68 are alternately arrayed.

However, in a case where the plurality of first FET structures 58 and/or the plurality of second FET structures 68 are arrayed in a group, a biased temperature distribution is easily formed in the semiconductor layer 2. Therefore, it is preferable that not more than four of the first FET structures 58 and/or not more than four of the second FET structures 68 are arrayed in a group.

In each of the aforementioned preferred embodiments, as long as the channel utilization rate RU in the active clamp operation and the channel utilization rate RU in the normal operation can be appropriately controlled, a value of the total channel rate RT in each cell region 75 may take any arbitrary value.

For example, in some of the aforementioned preferred embodiments, a description has been given of an example in which a total channel rate RT including the first total channel rate RT1, the second total channel rate RT2, and the third total channel rate RT3 is applied to the plurality of cell regions 75.

However, plural (two or more) types of total channel rates RT different in value from each other may be applied to the plurality of cell regions 75. For example, 2, 3, 4, 5 or 6 or more of the total channel rates RT different in value from each other may be applied to the plurality of cell regions 75.

Further, in each of the aforementioned preferred embodiments, a description has been given of an example in which the power MISFET 9 includes the first MISFET 56 and the second MISFET 57. However, the power MISFET 9 may include 2, 3, 4, 5 or 6 or more of the MISFETs which can be controlled in a mutually independent mode. The plurality (two or more) of the MISFETs can be formed only by changing the number of the gate control wirings 17 connected to the trench gate structure.

In this case, the control IC 10 controls the plurality (two or more) of the MISFETs such that the channel utilization rate RU in the active clamp operation becomes in excess of zero and less than the channel utilization rate RU in the normal operation.

In each of the aforementioned preferred embodiments, the gate control wiring 17 may be formed in a layer different from the drain electrode 11, the source electrode 12, the input electrode 13, the reference voltage electrode 14, the ENABLE electrode 15, or the SENSE electrode 16 or may be formed in the same layer. Further, in the gate control wiring 17, the first gate control wiring 17A, the second gate control wiring 17B, and the third gate control wiring 17C may be formed in a layer different from each other or may be formed in the same layer.

In each of the aforementioned preferred embodiments, a p-type semiconductor part may be given as an n-type semiconductor part, and an n-type semiconductor part may be given as a p-type semiconductor part. In this case, in a description of each of the aforementioned preferred embodiments, an "n-type" part is read as a "p-type" and a "p-type" part is read as an "n-type."

Figure 41:
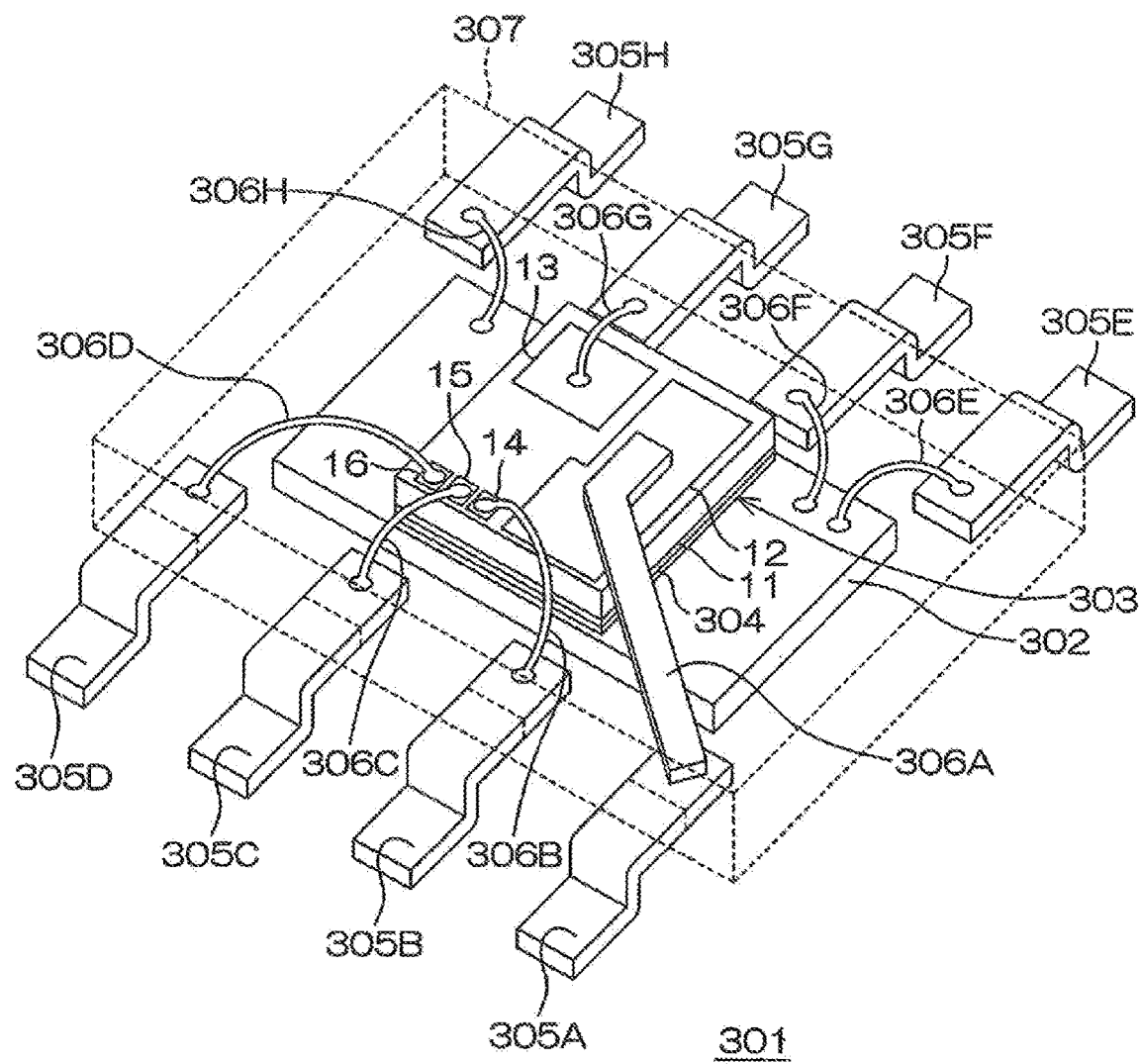
FIG. 41 is a perspective view which shows a semiconductor package as seen through a sealing resin.
Figure 42:
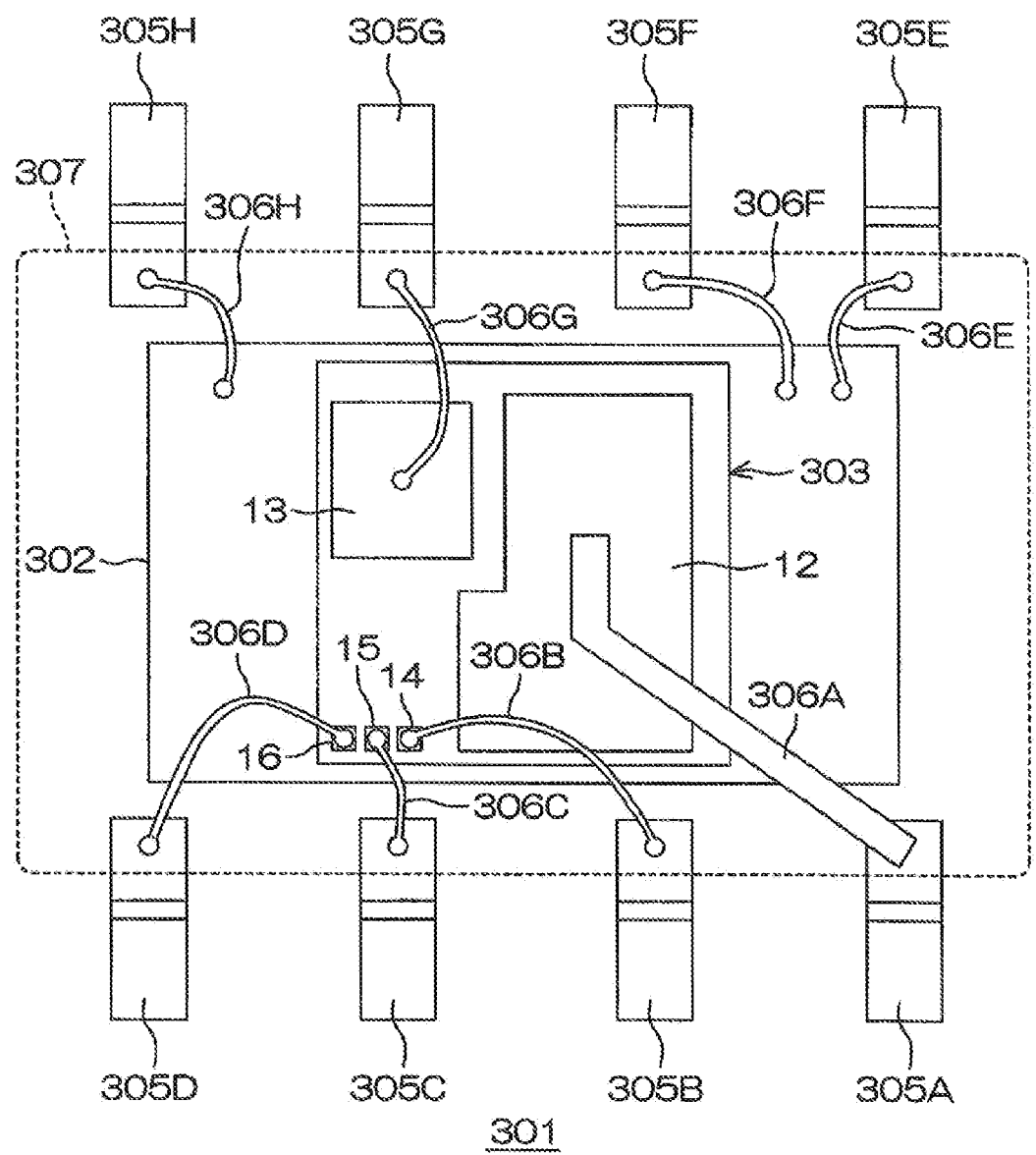
FIG. 42 is a plan view of FIG. 41.

The semiconductor devices 1, 151, 161, 171, 181, 191, 201, 211, and 241 according to each of the aforementioned preferred embodiments may be incorporated into a semiconductor package as shown in FIG. 41 and FIG. 42. FIG. 41 is a perspective view which shows a semiconductor package 301 as seen through a sealing resin 307. FIG. 42 is a plan view of FIG. 41.

With reference to FIG. 41 and FIG. 42, in this embodiment, the semiconductor package 301 is a so-called SOP (Small Outline Package). The semiconductor package 301 includes a die pad 302, a semiconductor chip 303, a conductive bonding material 304, a plurality (in this embodiment, eight) of lead electrodes 305A to 305H, a plurality (in this embodiment, eight) of lead wires 306A to 306H, and the sealing resin 307.

The die pad 302 is composed of a metal plate formed in a rectangular parallelepiped shape. The die pad 302 may include iron, aluminum, or copper. The semiconductor chip 303 is composed of any one of the semiconductor devices 1, 151, 161, 171, 181, 191, 201, 211, and 241 according to the first to the ninth preferred embodiment. Here, the semiconductor chip 303 is composed of the semiconductor device 1 according to the first preferred embodiment.

The semiconductor chip 303 is arranged on the die pad 302 in a posture such that the second main surface 4 faces the die pad 302. The drain electrode 11 of the semiconductor chip 303 is connected to the die pad 302 through the conductive bonding material 304. The conductive bonding material 304 may be metal paste or solder.

The plurality of lead electrodes 305A to 305H include a first lead electrode 305A, a second lead electrode 305B, a third lead electrode 305C, a fourth lead electrode 305D, a fifth lead electrode 305E, a sixth lead electrode 305F, a seventh lead electrode 305G, and an eighth lead electrode 305H. The number of lead electrodes is selected according to functions of the semiconductor chip 303 and is not restricted to the number shown in FIG. 41 and FIG. 42.

The plurality of lead electrodes 305A to 305H may include iron, aluminum, or copper. The plurality of lead electrodes 305A to 305H are arranged around the die pad 302 at an interval from the die pad 302.

Specifically, the four lead electrodes 305A to 305D are arrayed at intervals along one side of the die pad 302. The remaining four lead electrodes 305E to 305H are arrayed at intervals along a side facing the side at which the lead electrodes 305A to 305D are arrayed in the die pad 302.

The plurality of lead electrodes 305A to 305H are each formed in a band shape extending along a direction orthogonal to a direction of arrangement. The plurality of lead electrodes 305A to 305H have one end portion which faces the die pad 302 and the other end portion which is the opposite side. One end portions of the plurality of lead electrodes 305A to 305H are internally connected to the semiconductor chip 303. The other end portions of the plurality of lead electrodes 305A to 305H are externally connected to connection targets such as a mounting substrate, etc.

The plurality of lead wires 306A to 306H include a first lead wire 306A, a second lead wire 306B, a third lead wire 306C, a fourth lead wire 306D, a fifth lead wire 306E, a sixth lead wire 306F, a seventh lead wire 306G, and an eighth lead wire 306H. The number of lead wires is selected according to functions of the semiconductor chip 303 (semiconductor device) and is not restricted to the number shown in FIG. 41 and FIG. 42.

The first lead wire 306A is electrically connected to one end portion of the first lead electrode 305A and the source electrode 12. In this embodiment, the first lead wire 306A is composed of a metal clip. The first lead wire 306A may include iron, gold, aluminum, or copper. The first lead wire 306A effectively releases to the outside heat generated in the power MISFET 9. As a matter of course, the first lead wire 306A may be composed of a bonding wire.

The second lead wire 306B is electrically connected to one end portion of the second lead electrode 305B and the reference voltage electrode 14. The third lead wire 306C is electrically connected to one end portion of the third lead electrode 305C and the ENABLE electrode 15. The fourth lead wire 306D is electrically connected to one end portion of the fourth lead electrode 305D and the SENSE electrode 16.

The fifth lead wire 306E is electrically connected to one end portion of the fifth lead electrode 305E and the die pad 302. The sixth lead wire 306F is electrically connected to one end portion of the sixth lead electrode 305F and the die pad 302. The seventh lead wire 306G is electrically connected to one end portion of the seventh lead electrode 305G and the input electrode 13. The eighth lead wire 306H is electrically connected to one end portion of the eighth lead electrode 305H and the die pad 302.

In this embodiment, the second to the eighth lead wire 306B to 306H are composed of a bonding wire. The second to the eighth lead wire 306B to 306H may each include gold, aluminum, or copper. The connection configuration of the plurality of lead wires 306A to 306H to the semiconductor chip 303 and the plurality of lead electrodes 305A to 305H are arbitrary and not restricted to the connection configuration shown in FIG. 41 and FIG. 42.

The sealing resin 307 seals the semiconductor chip 303, the die pad 302, one end portions of the plurality of lead electrodes 305A to 305H, and the plurality of lead wires 306A to 306H such as to expose the other end portions of the plurality of lead electrodes 305A to 305H. The sealing resin 307 is formed in a rectangular parallelepiped shape. The sealing resin 307 may include an epoxy resin.

The configuration of the semiconductor package 301 is not restricted to SOP. TO (Transistor Outline), QFN (Quad For Non Lead Package), DFP (Dual Flat Package), DIP (Dual Inline Package), QFP (Quad Flat Package), SIP (Single Inline Package), SOJ (Small Outline J-leaded Package), or any of various similar configurations may be applied as the semiconductor package 301.

Figure 43:
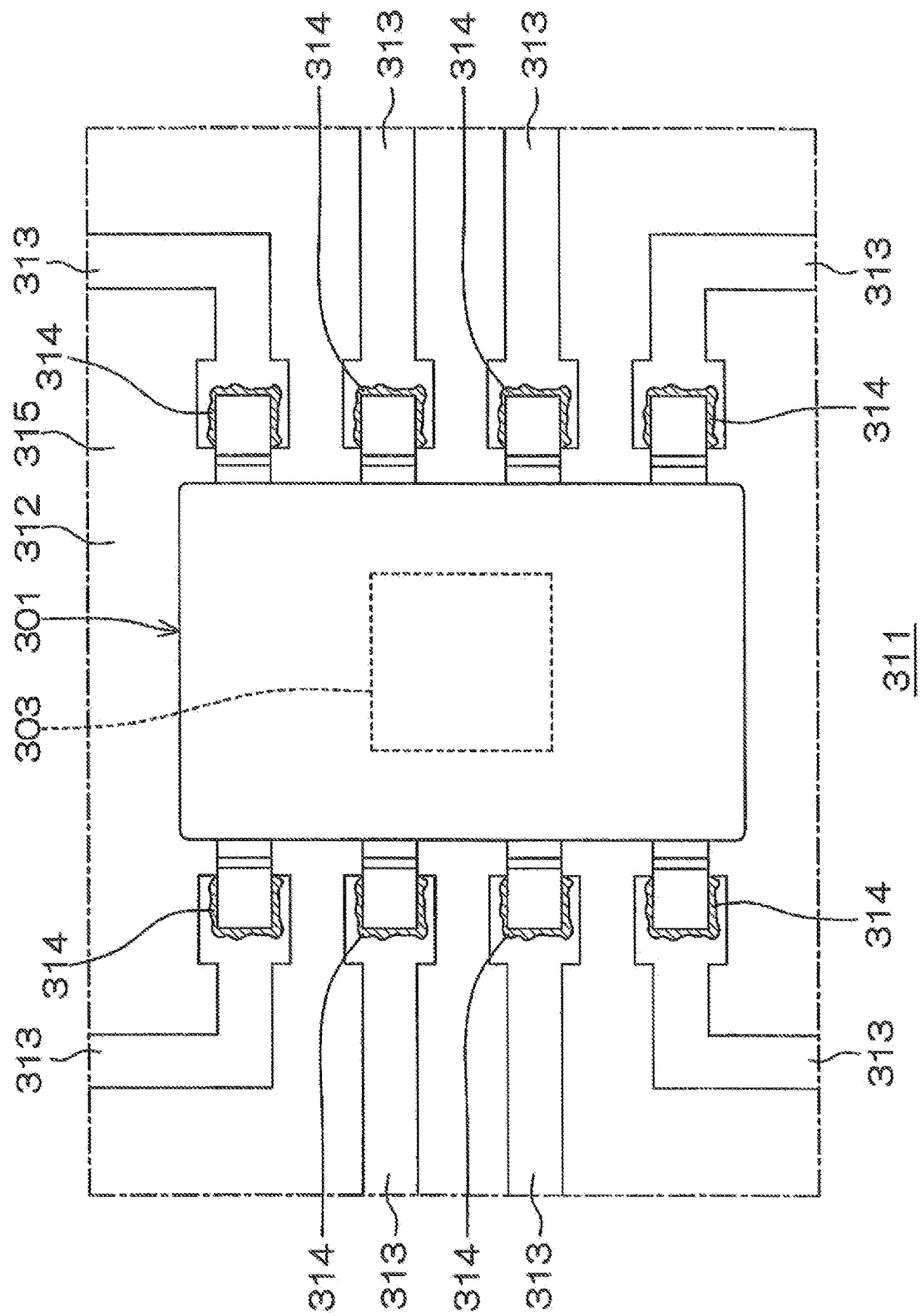
FIG. 43 is a plan view which shows a part of a circuit module according to the first configuration example.

The semiconductor package 301 (semiconductor devices 1, 151, 161, 171, 181, 191, 201, 211, or 241) may be incorporated into a circuit module, as shown in FIG. 43. FIG. 43 is a plan view which shows a part of a circuit module 311 according to the first configuration example.

With reference to FIG. 43, the circuit module 311 includes a mounting substrate 312, a plurality of wirings 313, the semiconductor package 301 (semiconductor device 1, 151, 161, 171, 181, 191, 201, 211 or 241), and a conductive bonding material 314.

The mounting substrate 312 includes a main surface 315. The plurality of wirings 313 are formed on the main surface 315 of the mounting substrate 312. The semiconductor package 301 (semiconductor device 1, 151, 161, 171, 181, 191, 201, 211 or 241) is mounted on the mounting substrate 312 such as to be electrically connected to the plurality of wirings 313 through a conductive bonding material 314. The conductive bonding material 314 may be metal paste or solder.

In each of the aforementioned preferred embodiments, a description has been given of an example in which the semiconductor device 1, 151, 161, 171, 181, 191, 201, 211 or 241 is integrally formed with the power MISFET 9 and the control IC 10.

However, the semiconductor device 1, 151, 161, 171, 181, 191, 201, 211 or 241 which only has the power MISFET 9 may be adopted. Further, the semiconductor device 1, 151, 161, 171, 181, 191, 201, 211 or 241 which only has the power MISFET 9 may be incorporated into the semiconductor package 301 aforementioned.

Figure 44:
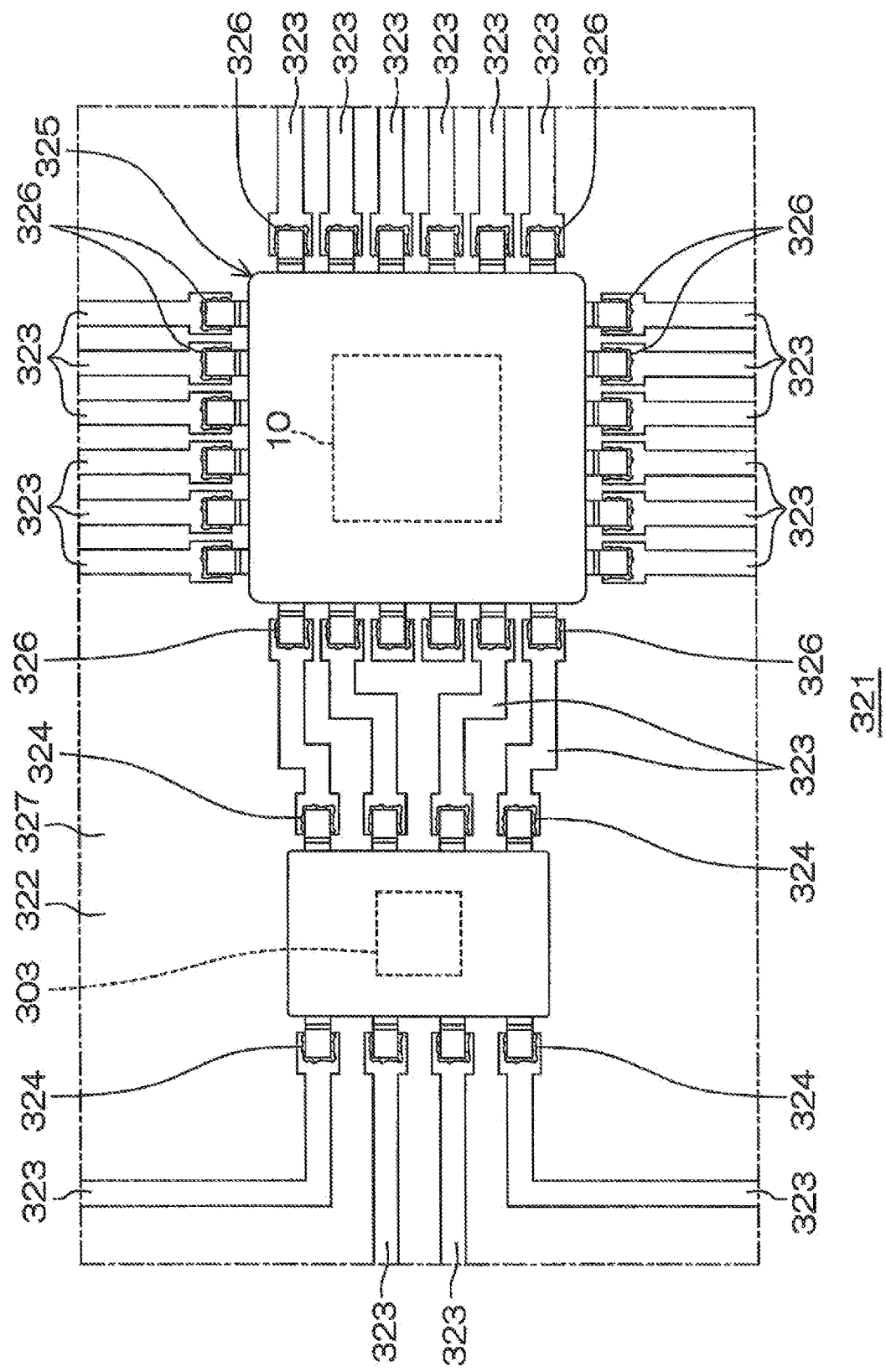
FIG. 44 is a plan view which shows a part of a circuit module according to the second configuration example.

As shown in FIG. 44, the semiconductor package 301 (semiconductor device 1, 151, 161, 171, 181, 191, 201, 211 or 241) which only has the power MISFET 9 may be incorporated into a circuit module. FIG. 44 is a plan view which shows a part of a circuit module 321 according to the second configuration example.

With reference to FIG. 44, the circuit module 321 includes a mounting substrate 322, a plurality of wirings 323, the semiconductor package 301 (semiconductor device 1, 151, 161, 171, 181, 191, 201, 211 or 241), a first conductive bonding material 324, a control IC device 325, and a second conductive bonding material 326.

The mounting substrate 322 includes a main surface 327. The plurality of wirings 323 are formed on the main surface 327 of the mounting substrate 322. The semiconductor package 301 is mounted on the mounting substrate 322. The semiconductor package 301 is electrically connected to the plurality of wirings 323 through the first conductive bonding material 324. The first conductive bonding material 324 may be metal paste or solder.

The control IC device 325 includes the control IC 10 (refer to FIG. 2 and FIG. 38). The control IC device 325 is mounted on the mounting substrate 322. The control IC device 325 is electrically connected to the plurality of wirings 323 through the second conductive bonding material 326. The control IC device 325 is also electrically connected to the semiconductor package 301 through the plurality of wirings 323.

The control IC device 325 is electrically connected to the semiconductor package 301 in a manner similar to that shown in FIG. 2 previously referred to. The control IC device 325 externally controls the semiconductor package 301 (semiconductor device 1, 151, 161, 171, 181, 191, 201, 211 or 241).

The same effects as those described in each of the aforementioned preferred embodiments can be exhibited as well by the above-described structure. In this embodiment, a description has been given of an example in which the one-chip control IC device 325 including the control IC 10 is mounted on the mounting substrate 322.

However, in place of the control IC device 325, a circuit network which has functions similar to those of the control IC 10 may be mounted on the mounting substrate 322. The circuit network which has functions similar to those of the control IC 10 may be configured by mounting on the mounting substrate 322 a plurality of discrete devices and IC chips having any arbitrary functions.

As a matter of course, the control IC 10 in each of the aforementioned preferred embodiments and the circuit network having functions similar to those of the control IC 10 may be configured in any given manner, and it is not necessary to include all of the functional circuits (that is, the sensor MISFET 21, the input circuit 22, the current-voltage control circuit 23, the protection circuit 24, the gate control circuit 25, the active clamp circuit 26, the current detecting circuit 27, the power-supply reverse connection protection circuit 28, and the malfunction detection circuit 29), and some of the functional circuits may be removed.

The present specification does not restrict any combined configuration of features illustrated with the first to ninth preferred embodiments. The first to ninth preferred embodiments may be combined among each other in any mode or any configuration. That is, a semiconductor device in which the features illustrated with the first to ninth preferred embodiments are combined in any mode or any configuration may be adopted.

Any modifications in design may be made within the scope of what is recited in the appended claims.

In the following, a detailed description will be given of an electrical structure for performing first Half-ON control (or second Half-ON control) of the power MISFET 9 during active clamp operation by raising specific examples.

Figure 45:
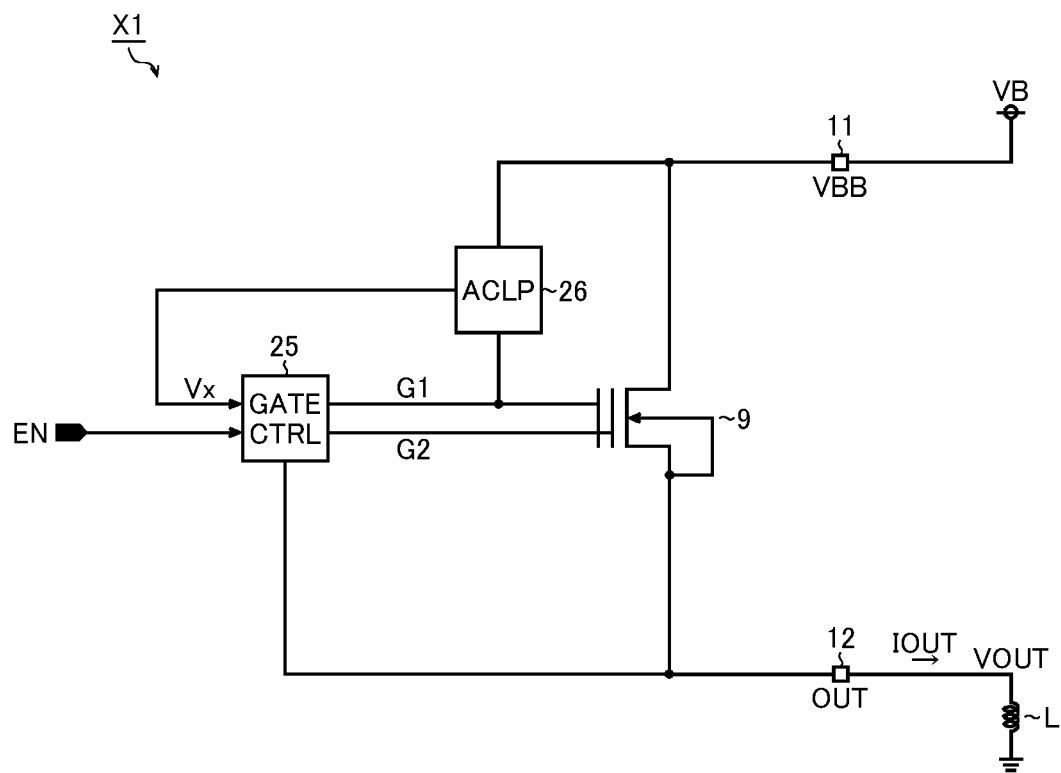
FIG. 45 is a block circuit diagram which shows an electrical structure for performing first Half-ON control of a power MISFET in active clamp operation.

FIG. 45 is a block circuit diagram which shows an electrical structure for performing first Half-ON control of a power MISFET during active clamp operation. The semiconductor device X1 of this configuration example has a drain electrode 11 (=power supply electrode VBB), a source electrode 12 (=output electrode OUT), a power MISFET 9, a gate control circuit 25, and an active clamp circuit 26. Components already mentioned are provided with the same symbols as before.

Further, in this figure, only part of the components are illustrated by extraction for the sake of simplification of description; however, it may be understood that the semiconductor device X1 basically includes the same components as those of the foregoing semiconductor device 1.

Figure 46:
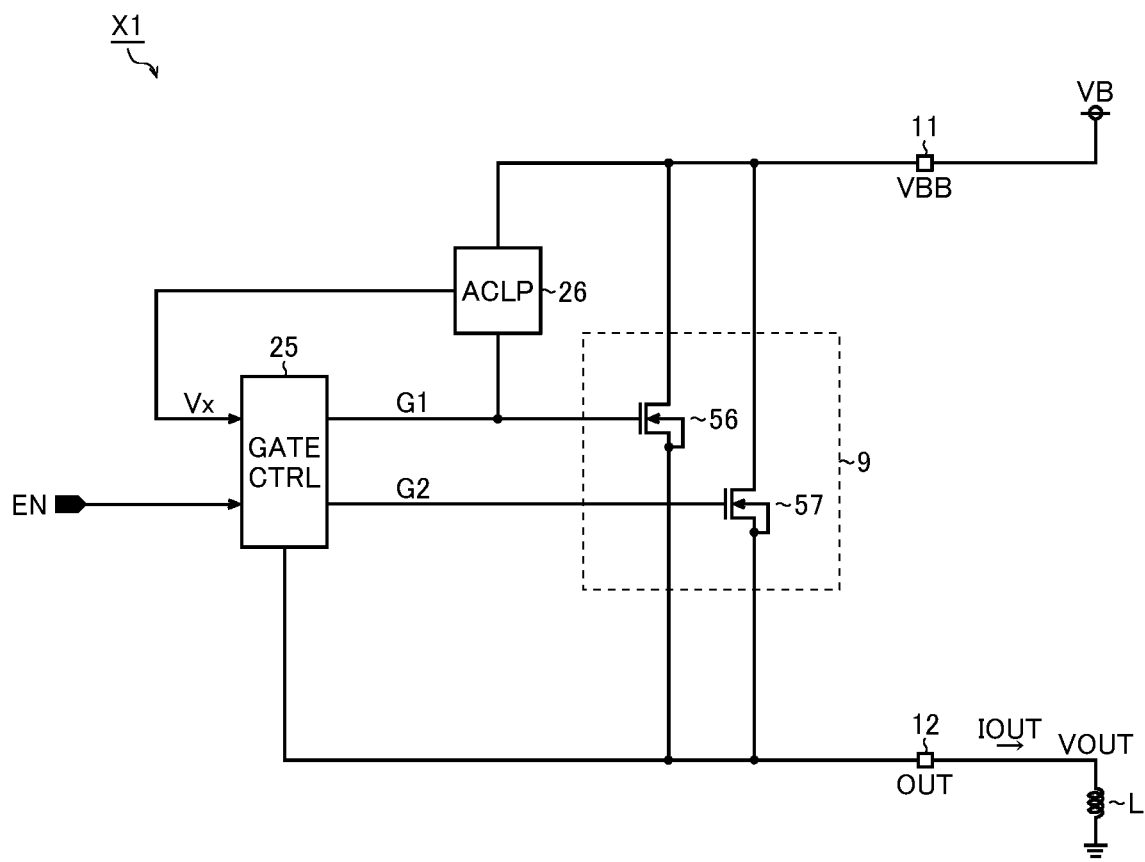
FIG. 46 is an equivalent circuit diagram in which the power MISFET in FIG. 45 is represented in the form of a first and a second MISFFET.

The power MISFET 9 is a gate divided device (split-gate device) the structure of which has been described in detail by giving various types of preferred embodiments as examples so far. That is, as shown in FIG. 46, the power MISFET 9 can be equivalently represented as a first MISFET 56 and a second MISFET 57 (=which respectively correspond to the first transistor and the second transistor) that are in parallel connection.

From another point of view, it can also be understood that the first MISFET 56 and the second MISFET 57 which are respectively controlled in an independent manner are formed integrally as the power MISFET 9 that is a single gate divided device.

The gate control circuit 25 control the gate of the power MISFET 9 (and consequently, controls the gate of each of the first MISFET 56 and the second MISFET 57). For example, the gate control circuit 25 generates gate signals G1 and G2 for the first MISFET 56 and the second MISFET 57, respectively, such as to turn on both of the first MISFET 56 and the second MISFET 57 in an enable state (=which corresponds to a first operation state) in which an enable signal EN is made high level, while turning off both of the first MISFET 56 and the second MISFET 57 in a disable state (=which corresponds to a second operation state) in which the enable signal EN is made low level.

Further, the gate control circuit 25 accepts an input of an internal node voltage Vx from the active clamp circuit 26, and has a function of short-circuiting between a gate and a source of the second MISFET 57 after transition from the enable state (EN=H) to the disable state (EN=L), before the active clamp circuit 26 operates, that is, a function of realizing the first Half-ON control of the power MISFET 9 by completely stopping the second MISFET 57 by making G2=VOUT.

The active clamp circuit 26 is connected between a drain and a gate of the first MISFET 56, and limits a drain-source voltage (=VB−VOUT) of each of the first MISFET 56 and the second MISFET 57 to be equal to or less than a predetermined clamp voltage Vclp by forcibly turning on the first MISFET 56 when the output voltage VOUT of the source electrode 12 has reached a negative voltage. Since the second MISFET 57 does not contribute to the active clamp operation, no active clamp circuit 26 is connected between the drain and gate of the second MISFET 57.

Figure 47:
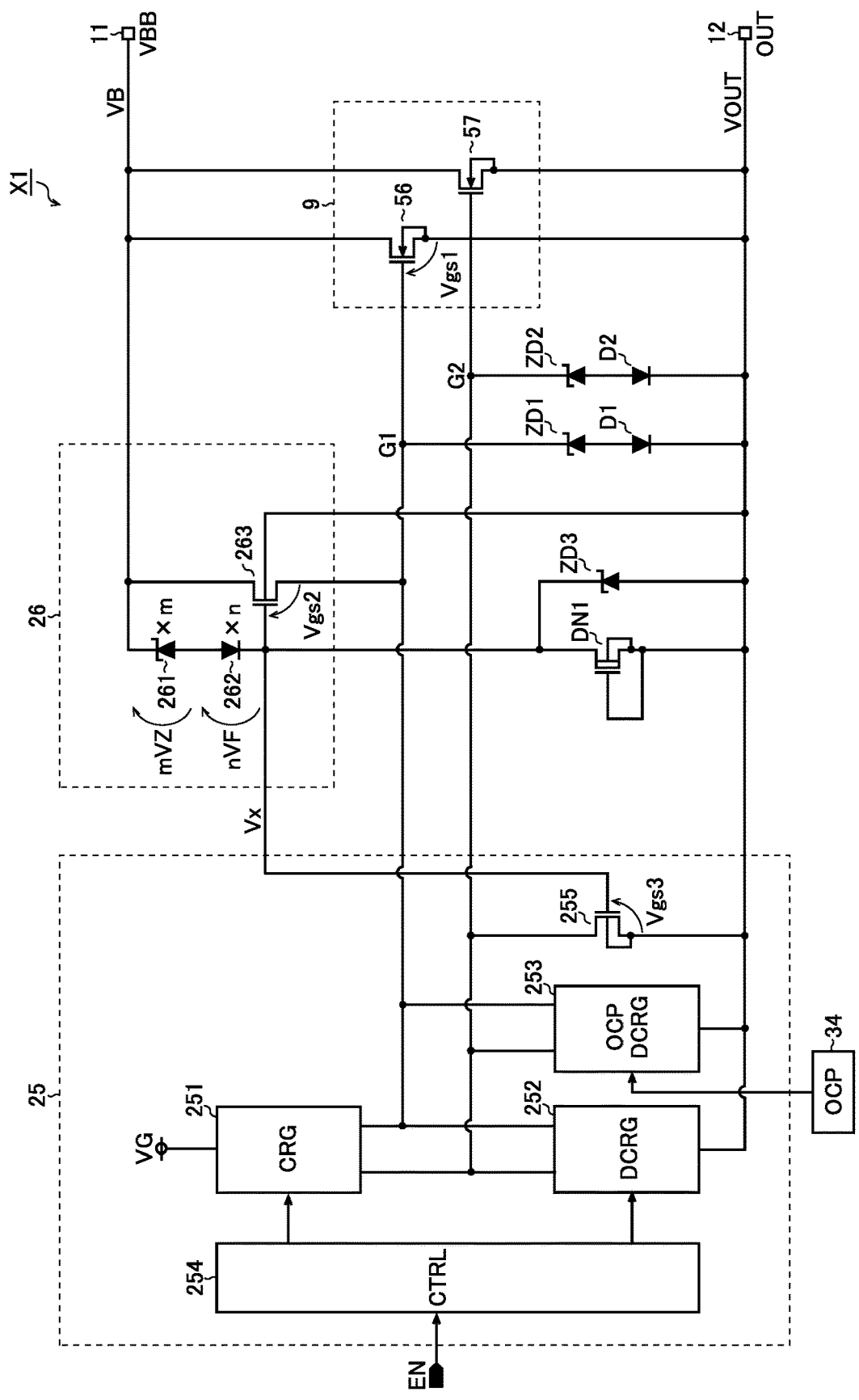
FIG. 47 is a circuit diagram which shows one configuration example of a gate control circuit and an active clamp circuit.

FIG. 47 is a circuit diagram which shows a configuration example of the gate control circuit 25 and the active clamp circuit 26. The gate control circuit 25 and the active clamp circuit 26 are an example of a charger-discharger.

First, a specific description will be given of a configuration of the active clamp circuit 26. The active clamp circuit 26 of the this configuration example includes an m-stage (for example, m=8) Zener diode array 261, an n-stage (for example, n=3) diode array 262, and an N-channel type MISFET 263.

A cathode of the Zener diode array 261 and the drain of the MISFET 263 are connected to the drain electrode 11 (=which corresponds to the power supply electrode VBB to which the power supply voltage VB is applied) together with the drain of each of the first MISFET 56 and the second MISFET 57. An anode of the Zener diode array 261 is connected to an anode of the diode array 262. A cathode of the diode array 262 is connected to a gate of the MISFET 263. A source of the MISFET 263 is connected to the gate of the first MISFET 56 (=application terminal of the gate signal G1). A back gate of the MISFET 263 is connected to the source electrode 12 (=which corresponds to the output electrode OUT to which the output voltage VOUT is applied) together with the source of each of the first MISFET 56 and the second MISFET 57. As shown in the foregoing FIG. 45 and FIG. 46, the source electrode 12 may be connected with the inductive load L such as a coil, a solenoid, etc.

Next, a specific description will be given of a configuration of the gate control circuit 25. The gate control circuit 25 of this configuration example includes a charger 251, a discharger 252, an overcurrent protection discharger 253, a controller 254, and an N-channel type MISFET 255.

The charger 251 is connected between an application terminal of a boost voltage VG (=charge pump output) and the gate of each of the first MISFET 56 and the second MISFET 57. The charger 251 makes a current flow into the gate of each of the first MISFET 56 and the second MISFET 57.

The discharger 252 is connected between the gate of each of the first MISFET 56 and the second MISFET 57 and an application terminal of the output voltage VOUT (=source electrode 12). The discharger 252 draws out a current from the gate of each of the first MISFET 56 and the second MISFET 57.

The overcurrent protection discharger 253 is connected between the gate of each of the first MISFET 56 and the second MISFET 57 and the application terminal of the output voltage VOUT (=source electrode 12). The overcurrent protection discharger 253 draws out a current from the gate of each of the first MISFET 56 and the second MISFET 57 when the overcurrent protection circuit 34 protects the power MISFET 9 from an overcurrent. Thus, when the overcurrent protection circuit 34 protects the power MISFET 9 from an overcurrent, the gate of each of the first MISFET 56 and the second MISFET 57 is forcibly discharged, and the first MISFET 56 and the second MISFET 57 are forcibly turned off. While, in this configuration example, the first MISFET 56 and the second MISFET 57 are forcibly turned off during overvoltage protection, the overvoltage protection here is merely one example; the first MISFET 56 and the second MISFET 57 may be forcibly turned off during any other protection.

The controller 254 keeps the charger 251 in operation and the discharger 252 out of operation in the enable state (EN=H) (=first control of the charger-discharger). Thus, the gate of each of the first MISFET 56 and the second MISFET 57 is charged, and the first MISFET 56 and the second MISFET 57 turn on.

On the other hand, the controller 254 keeps the charger 251 out of operation and the discharger 252 in operation in the disable state (EN=L) (=second control of the charger-discharger). Thus, the gate of each of the first MISFET 56 and the second MISFET 57 is discharged, and the first MISFET 56 and the second MISFET 57 turn off.

The MISFET 255 is connected between the gate and source of the second MISFET 57, and is turned on/off according to the internal node voltage Vx in the active clamp circuit 26. As the internal node voltage Vx, for example, as shown in this figure, it is preferable that a gate voltage of the MISFET 263 be input. However, the internal node voltage Vx is not restricted to this, and for example, it is also possible to use an anode voltage of any of the n-stage of diodes that form the diode array 262 as the internal node voltage Vx.

Further, besides the components described above, Zener diodes ZD1 to ZD3, diodes D1 and D2, and a depression N-channel type MISFET DN1 are provided as electrostatic breakdown protective devices in the semiconductor device X1. The connecting relationship among these components will be briefly described.

Cathodes of the Zener diodes ZD1 and ZD2 are respectively connected to the gates of the first MISFET 56 and the second MISFET 57. Anodes of the Zener diodes ZD1 and ZD2 are respectively connected to anodes of the diodes D1 and D2. A cathode of the Zener diode ZD3 and a drain of the MISFET DN1 are connected to the gate of the MISFET 263. A cathode of each of the diodes D1 and D2, an anode of the Zener diode ZD3, and a source, a gate, and a back gate of the MISFET DN1 are connected to the application terminal of the output voltage VOUT.

Hereinafter, a description will be given of the first Half-ON control of the power MISFET 9 in the active clamp operation, assuming a case where a gate-source voltage of the first MISFET 56 is Vgs1, a gate-source voltage of the MISFET 263 is Vgs2, a gate-source voltage of the MISFET 255 is Vgs3, a breakdown voltage of the Zener diode array 261 is mVZ, and a forward drop voltage of the diode array 262 is nVF.

Figure 48:
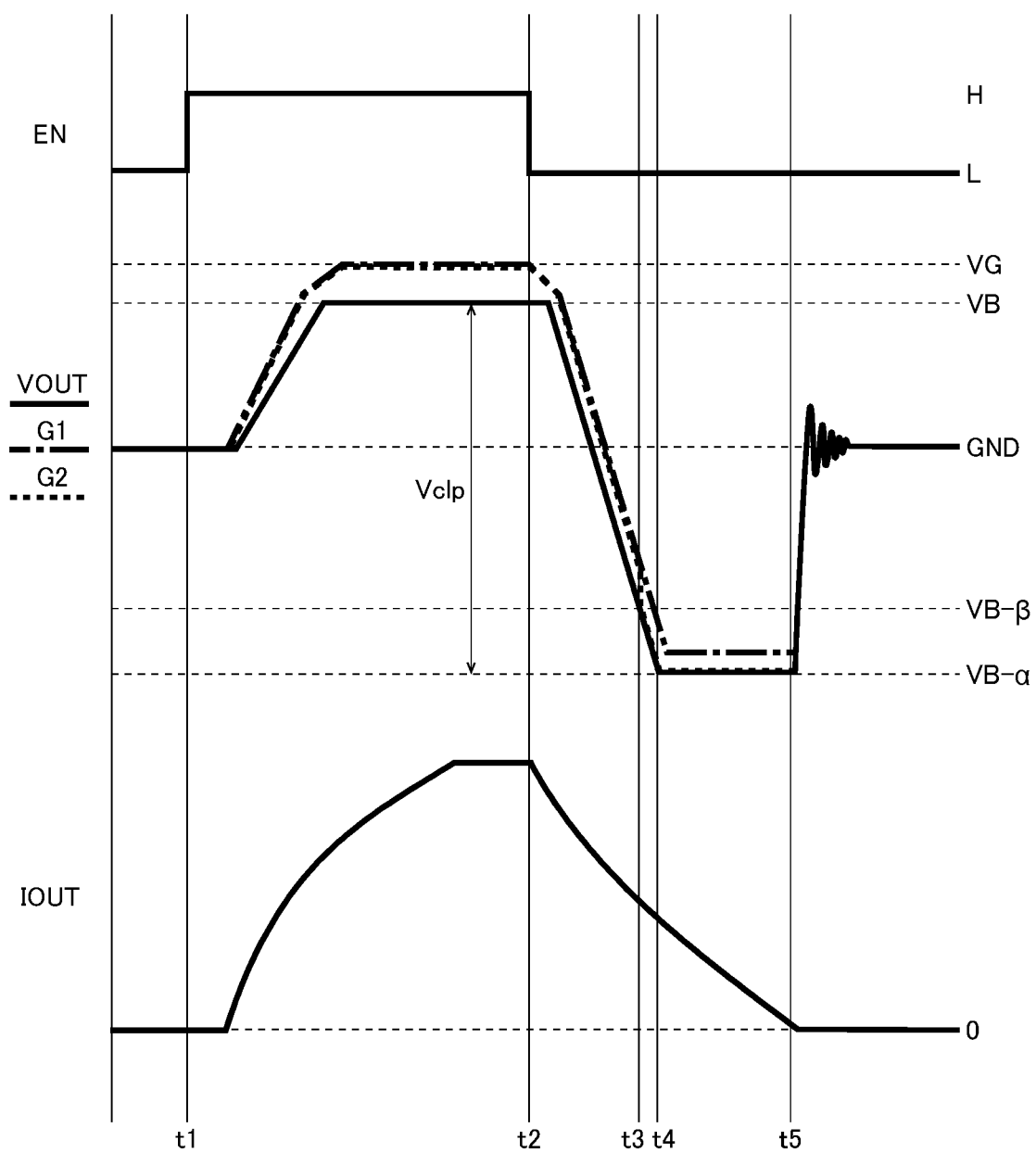
FIG. 48 is a timing chart which shows how first Half-ON control of a power MISFET is performed in active clamp operation.

FIG. 48 is a timing chart which shows how the first Half-ON control of the power MISFET 9 is performed during active clamp operation, depicting, in order from the top, an enable signal EN, an output voltage VOUT (solid line), a gate signal G1 (alternate long and short dashed line), a gate signal G2 (broken line), and an output current IOUT. In this figure, it is assumed that the inductive load L is connected to the source electrode 12.

When the enable signal EN is raised to a high level (=logic level when turning on the power MISFET 9) at time t1, the gate signals G1 and G2 rise to high levels VG), and the first MISFET 56 and the second MISFET 57 are both turned on. As a result, the output current IOUT starts to flow, so that the output voltage VOUT is increased to nearly the power supply voltage VB. This state corresponds to a Full-ON state of the power MISFET 9.

Thereafter, when the enable signal EN is made to fall to a low level (=logic level when turning off the power MISFET 9) at time t2, the first MISFET 56 and the second MISFET 57 both turn off and thus the gate signals G1 and G2 fall to low levels VOUT).

At this time, the inductive load L continues to allow the output current IOUT to flow until it has released energy accumulated during the ON period of the power MISFET 9. As a result, the output VOUT is sharply reduced to a negative voltage lower than a ground voltage GND.

However, when the output voltage VOUT is reduced to a lower limit voltage VB−α (for example, VB−50V) that is lower by a predetermined value α (=m·VZ+nVF+Vgs1+Vgs2) than the power supply voltage VB at time t4, the first MISFET 56 is turned on by the operation of the active clamp circuit 26, so that the output current IOUT is discharged through the first MISFET 56. Therefore, the output voltage VOUT is limited to be equal to or more than the lower limit voltage VB−α.

That is, the active clamp circuit 26 limits a drain-source voltage Vds (=VB−VOUT) of the power MISFET 9 to be equal to or less than the predetermined clamp voltage Vclp (=α) by limiting the output voltage VOUT with reference to the power supply voltage VB. The above-described active clamp operation is continued until time t5 at which the energy accumulated in the inductive load L has been completely released and the output current IOUT no longer flows.

On the other hand, in terms of the second MISFET 57, after transition from an enable state (EN=H) to a disable state (EN=L), when the output voltage VOUT is reduced to a channel switching voltage VB−β (>VB−α) that is lower by a predetermined value β (=m·VZ+nVF+Vgs3) than the power supply voltage VB at time t3, the internal node voltage Vx becomes higher than the gate-source voltage Vgs3, so that the MISFET 255 is turned on to short-circuit (G2=VOUT) between the gate and source of the second MISFET 57.

That is, the second MISFET 57 is completely stopped, by the operation of the MISFET 255, before the active clamp circuit 26 operates (before time t4). This state corresponds to a first Half-ON state of the power MISFET 9.

As described above, by performing switching from the Full-ON state to the first Half-ON state, the channel utilization rate RU in the active clamp operation (=time t4 to t5) becomes in excess of zero and less than the channel utilization rate RU in the normal operation (=time t1 to t2). In the active clamp operation (=time t4 to t5), from the perspective of the entire operation of the gate control circuit 25 and the active clamp circuit 26, the charger-discharger performs third control in which it discharges only the gate of the second MISFET 57.

Therefore, the characteristics channel rate RC relatively increases in the normal operation (for example, RC=50%). Thereby, the current path is relatively increased, and it becomes possible to reduce the area resistivity Ron·A (ON resistance). On the other hand, the characteristics channel rate RC relatively reduces in the active clamp operation (for example, RC=25%). Thereby, it is possible to suppress a sharp temperature rise due to the counter electromotive force of the inductive load L and therefore it is possible to improve the active clamp capability Eac.

Thus, it becomes possible to provide a semiconductor device 1 which can realize an excellent area resistivity Ron·A and an excellent active clamp capability Eac at the same time independently of the trade-off relationship shown in FIG. 13. Particularly, in the field of IPDs, the active clamp capability Eac is one of the characteristics that are crucial for driving a greater inductive load L.

With FIG. 45 to FIG. 48, a description has been given of an example in which first Half-ON control is applied in the active clamp operation. However, second Half-ON control may be applied in the active clamp operation. In that case, it suffices to replace the first MISFET 56 and the second MISFET 57 with each other for understanding.

As described above, the semiconductor device 1 realizes an excellent ON resistance and an excellent active clamp capability at the same time. However, even if an excellent ON resistance and an excellent active clamp capability are realized at the same time, increased variations in the characteristics of the semiconductor device 1 are undesirable.

Figure 49:
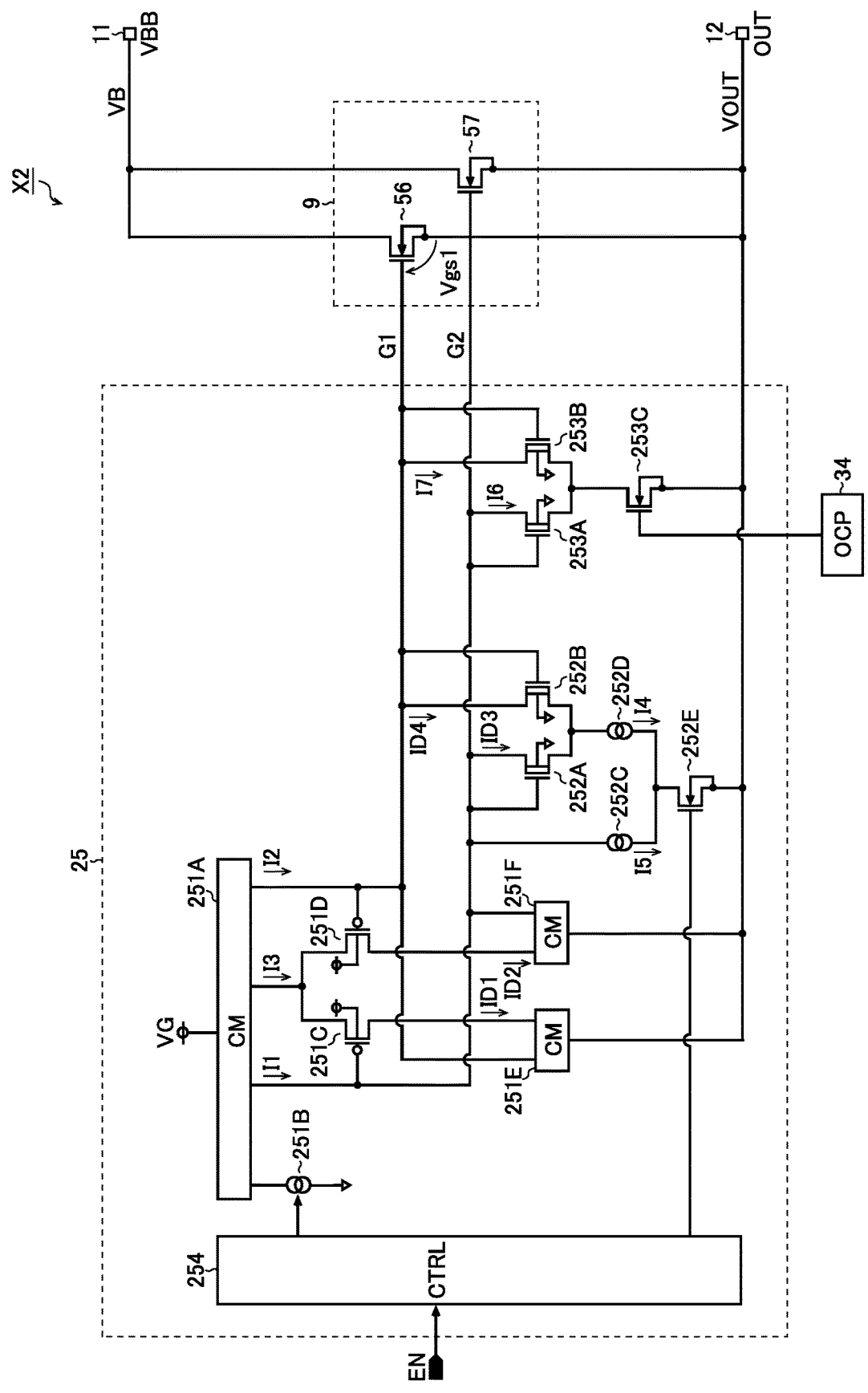
FIG. 49 is a circuit diagram which shows one configuration example of a semiconductor device including a gate voltage correction circuit.

It is therefore preferable to provide a gate voltage correction circuit for suppressing variations in characteristics. FIG. 49 is a circuit diagram which shows one configuration example of a semiconductor device that includes a gate voltage correction circuit. The semiconductor device X2 of this configuration example has the gate voltage correction circuit provided within the gate control circuit 25. For those components that have already been discussed, the same reference signs will be adhered to.

For the sake of simple description, the diagram only shows part of the components of the semiconductor device X2, which should be understood to basically include components similar to those in the semiconductor device X1 described previously.

The semiconductor device X2 includes a first adjuster. In the first control of the charger-discharger, the first adjuster adjusts, in accordance with the difference between the respective gate voltages of the first and second MISFETs 56 and 57, the distribution of the currents that are made to flow into the gates of the first and second MISFETs 56 and 57 respectively.

The first adjuster includes a current mirror circuit 251A, a constant current source 251B, a P-channel MISFET 251C, a P-channel MISFET 251D, a current mirror circuit 251E, and a current mirror circuit 251F.

The current mirror circuit 251A outputs a first mirror current I1, a second mirror current I2, and a third mirror current I3 according to the output current of the constant current source 251B.

The constant current source 251B is turned on and off by the controller 254. With the constant current source 251B off, the gate control circuit 25 does not charge the respective gates of the first and second MISFETs 56 and 57.

The differential pair constituted by the MISFETs 251C and 251D distributes the second mirror current at a distribution ratio according to the difference between the respectively gate voltages of the first and second MISFETs 56 and 57. The further the gate voltage of the first MISFET 56 is higher than the second MISFET 57, the further a first distributed current ID1 that passes through the MISFET 251C is higher than a second distributed current ID2 that passes through the MISFET 251D.

The first distributed current ID is turned back by the current mirror circuit 251E, so that a current equal to the second mirror current I2 minus the first distributed current ID1 is made to flow into the gate of the first MISFET 56. The second distributed current ID2 is turned back by the current mirror circuit 251F, so that a current equal to the first mirror current I1 minus the second distributed current ID2 is made to flow into the gate of the second MISFET 57.

In the first control of the charger-discharger, that is, when the charger 251 (see FIG. 47) is in operation and the discharger 252 (see FIG. 47) is out of operation, the first adjuster corrects the respective gate voltages of the first and second MISFETs 56 and 57 so as to eliminate the difference between the respective gate voltages of the first and second MISFETs 56 and 57. In this way, it is possible to reduce variations in the output characteristics of the semiconductor device X2 in the first control of the charger-discharger.

The semiconductor device X2 includes a second adjuster. In the second control of the charger-discharger, the second adjuster adjusts, in accordance with the difference between the respective gate voltages of the first and second MISFETs 56 and 57, the distribution of the currents that are drawn out from the gates of the first and second MISFETs 56 and 57 respectively.

The second adjuster includes a depression N-channel MISFET 252A, a depression N-channel MISFET 252B, a constant current source 252C, a constant current source 252D, and N-channel MISFET 252E.

The differential pair constituted by the MISFETs 252A and 252B distributes the output current I4 of the constant current source 252D at a distribution ratio according to the difference between the respectively gate voltages of the first and second MISFETs 56 and 57. The further the gate voltage of the first MISFET 56 is higher than the second MISFET 57, the further a fourth distributed current ID4 that passes through the MISFET 252B is higher than a third distributed current ID3 that passes through the MISFET 252A.

The third distributed current ID3 and a current ascribable to the constant current source 252C are drawn out from the gate of the second MISFET 57. The fourth distributed current ID4 is drawn out from the gate of the first MISFET 56.

The constant current source 252E is turned on and off by the controller 254. With the constant current source 252E off, the gate control circuit 25 does not discharge the respective gates of the first and second MISFETs 56 and 57.

In the second control of the charger-discharger, that is, when the charger 251 (see FIG. 47) is out of operation and the discharger 252 (see FIG. 47) is in operation, the second adjuster corrects the respective gate voltages of the first and second MISFETs 56 and 57 so as to eliminate the difference between the respective gate voltages of the first and second MISFETs 56 and 57. In this way, it is possible to reduce variations in the output characteristics of the semiconductor device X2 in the second control of the charger-di s charger.

The semiconductor device X2 includes a third adjuster. In overcurrent protection operation, the third adjuster adjusts, in accordance with the difference between the respective gate voltages of the first and second MISFETs 56 and 57, the distribution of the currents that are drawn out from the gates of the first and second MISFETs 56 and 57 respectively. While, in the configuration example under discussion, the third adjuster adjusts, according to the difference between the respective gates of the first and second MISFETs 56 and 57, the distribution of currents that are drawn out from the respective gates of the first and second MISFETs 56 and 57 in overcurrent protection operation, the overvoltage protection here is merely one example; the third adjuster may adjust, according to the difference between the respective gates of the first and second MISFETs 56 and 57, the distribution of currents that are drawn out from the respective gates of the first and second MISFETs 56 and 57 in any other operation.

The constant current source 252D may be kept off in active clamp operation. This helps prevent a current from being unnecessarily drawn out from the gate of the first MISFET 56 in active clamp operation. On the other hand, the constant current source 252C is kept on even in active clamp operation. This permits a current to be drawn out from the gate of the second MISFET 57 in active clamp operation, and thus, for example, even with the MISFET 255 (see FIG. 47) omitted, it is possible to perform the first Half-ON control.

The third adjuster includes a depression N-channel MISFET 253A, a depression N-channel MISFET 253B, and N-channel MISFET 253C.

The differential pair constituted by the MISFETs 253A and 253B adjusts, in accordance with the difference between the respective gate voltages of the second and first MISFETs 57 and 56, the distribution of the currents I6 and I7 that are drawn out from the respective gates of the first and second MISFETs 56 and 57 respectively. The further the gate voltage of the first MISFET 56 is higher than the gate voltage of the second MISFET 57, the further the current I7 is higher than the current I6.

The constant current source 253C is turned on and off by the overcurrent protection circuit 34. With the constant current source 253C off, the gate control circuit 25 does not discharge the respective gates of the first and second MISFETs 56 and 57.

In overcurrent protection operation, the third adjuster corrects the respective gate voltages of the first and second MISFETs 56 and 57 so as to eliminate the difference between the respective gate voltages of the first and second MISFETs 56 and 57. In this way, it is possible to reduce variations in the protection characteristics of the semiconductor device X2 in overcurrent protection operation.

Figure 50:
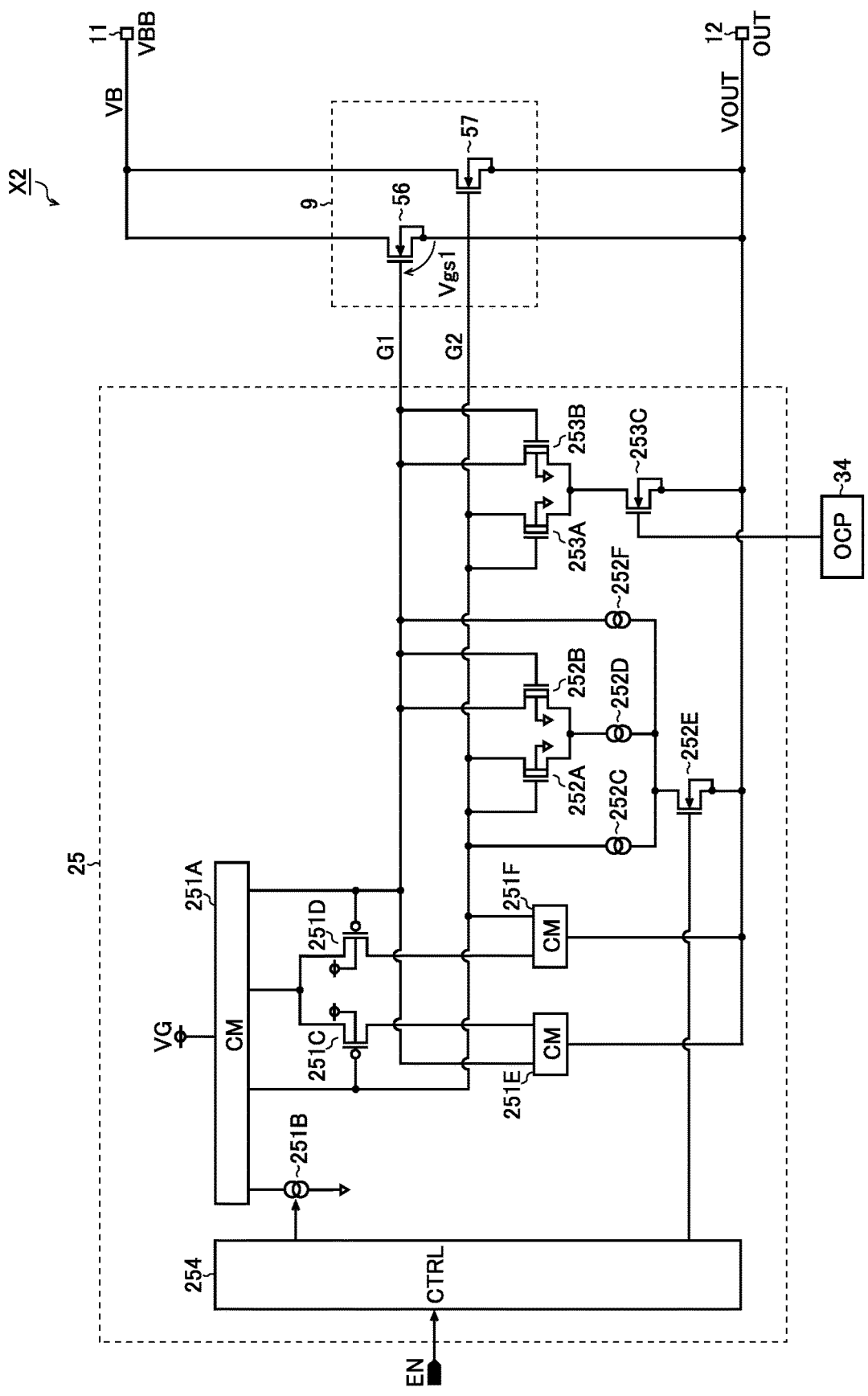
FIG. 50 is a circuit diagram which shows another configuration example of a semiconductor device including a gate voltage correction circuit.
Figure 51:
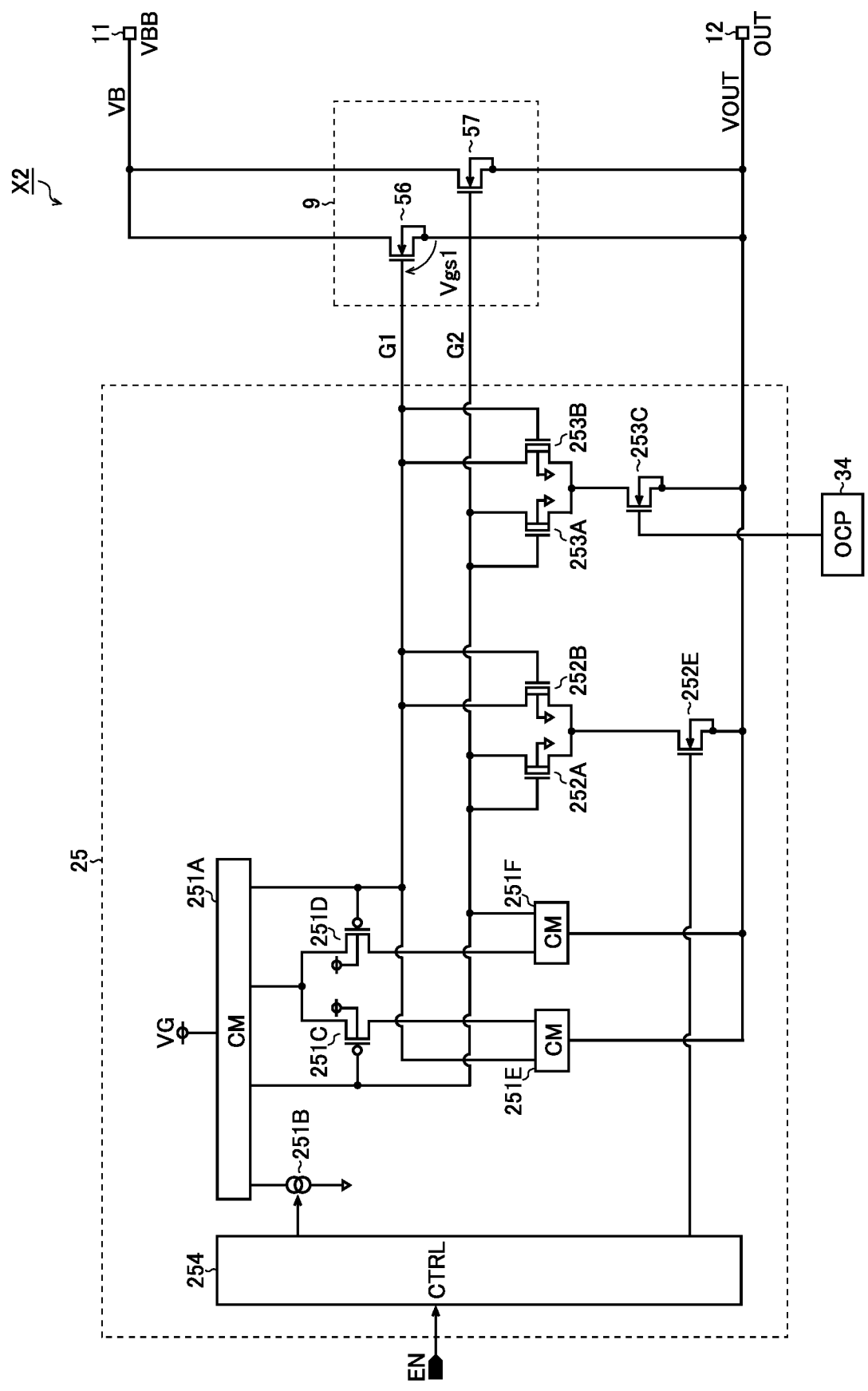
FIG. 51 is a circuit diagram which shows yet another configuration example of a semiconductor device including a gate voltage correction circuit.
Figure 52:
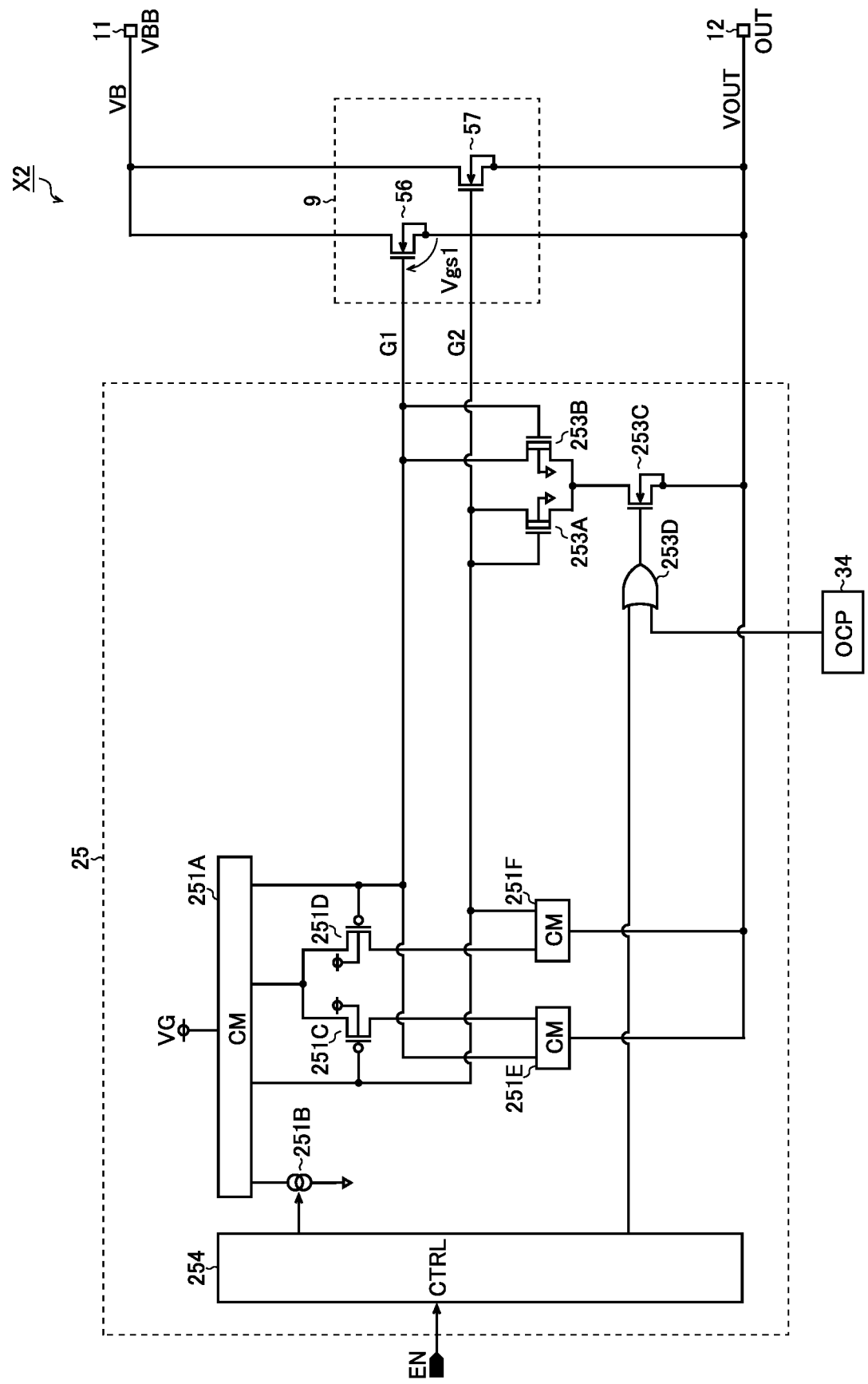
FIG. 52 is a circuit diagram which shows still another configuration example of a semiconductor device including a gate voltage correction circuit.

Modified examples of the semiconductor device X2 includes a configuration (see FIG. 50) where a constant current source 252F is added to the second adjuster so that the second adjuster has a symmetric circuit design, a configuration (see FIG. 51) where the constant current source 252C and the constant current source 252D are omitted from the second adjuster so that the second adjuster has a symmetric circuit design, and a configuration (see FIG. 52) where the MISFETs 253A, 253B, and 253C are shared as the second adjuster. In FIG. 52, the gate control circuit 25 includes an OR gate 253D, and the constant current source 253C is turned on and of by both the controller 254 and the overcurrent protection circuit 34.

Figure 53:
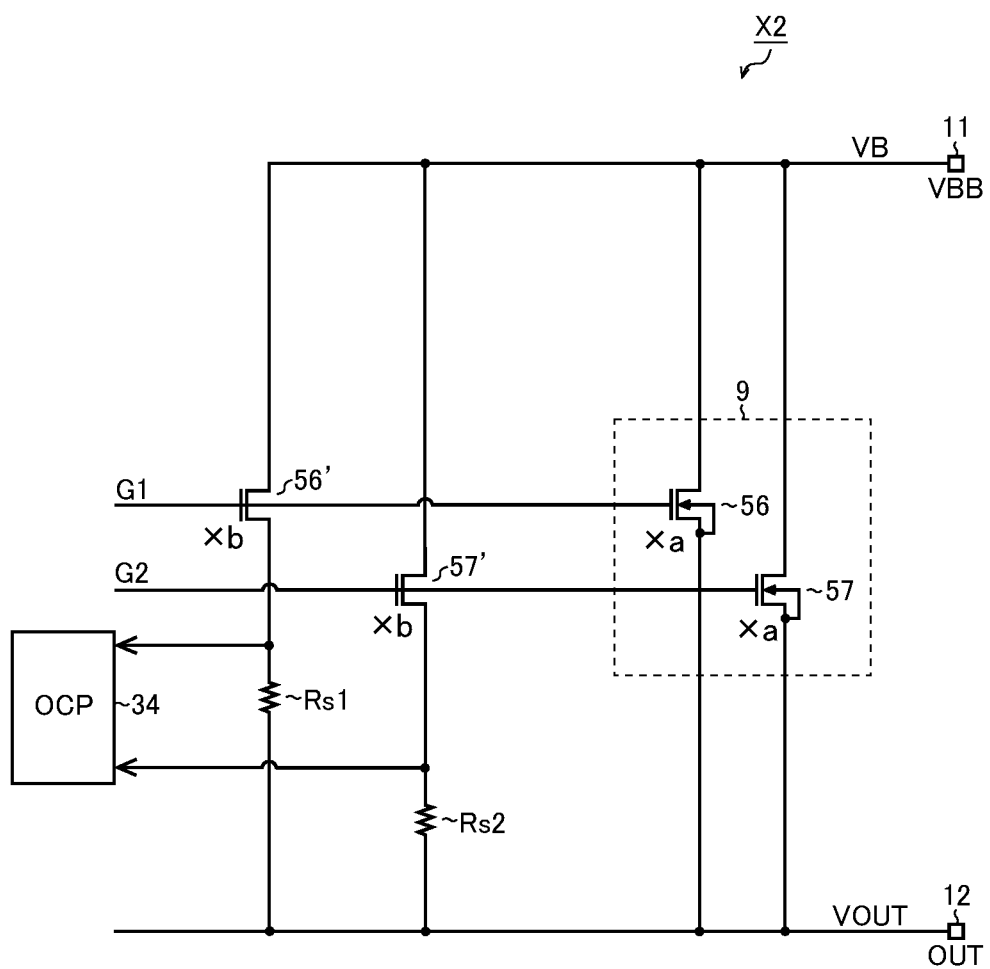
FIG. 53 is a diagram which shows one example of a current monitor.

FIG. 53 is a diagram which shows one example of a current monitor. For the sake of simple description, the diagram only shows part of its components. The semiconductor device X2 includes an N-channel MISFET 56', an N-channel MISFET 57', and resistors Rs1 and Rs2.

The MISFET 56' generates a mirror current according to the output current of the MISFET 56. The size ratio of the MISFET 56 to the MISFET 56' is a:b (where a>b; for example, a=1500 and b=0.5). Accordingly, the mirror current generated by the MISFET 56' equals the output current of the MISFET 56 reduced by a factor of b/a. Like the MISFET 56, the MISFET 56' is on when the gate signal G1 is at high level, and is off when the gate signal G1 is at low level.

The MISFET 57' generates a mirror current according to the output current of the MISFET 57. The size ratio of the MISFET 57 to the MISFET 57' is a:b. Accordingly, the mirror current generated by the MISFET 57' equals the output current of the MISFET 57 reduced by a factor of b/a. Like the MISFET 57, the MISFET 57' is on when the gate signal G2 is at high level, and is off when the gate signal G2 is at low level.

The overcurrent protection circuit 34 recognizes an overcurrent when the sum of the mirror currents generated by the MISFETs 56' and 57' respectively exceeds a predetermined reference value.

REFERENCE SIGNS LIST

1: Semiconductor device
2: Semiconductor layer
3: First main surface of the semiconductor layer
9: Power MISFET
10 Control IC
17: Gate control wiring
17A: First gate control wiring
17B: Second gate control wiring
17C: Third gate control wiring
25 Gate control circuit
251: Charger
252: Discharger
253: Overcurrent protection discharger
254: Controller
255: MISFET
26: Active clamp circuit
261: Zener diode
262: Diode
263: MISFET
56: First MISFET (First transistor)
57: Second MISFET (Second transistor)
58: First FET structure
60 First trench gate structure
68: Second FET structure
70 Second trench gate structure
81: First gate trench
82: First insulation layer 83: First electrode
86: First bottom-side electrode
87: First opening-side electrode
88: First intermediate insulation layer
91: First channel region
101: Second gate trench
102: Second insulation layer
103: Second electrode
106: Second bottom-side electrode
107: Second opening-side electrode
108: Second intermediate insulation layer
111: Second channel region
151: Semiconductor device
161: Semiconductor device
171: Semiconductor device
181: Semiconductor device
191: Semiconductor device
201: Semiconductor device
211: Semiconductor device
213: First planar gate structure
223: Second planar gate structure
241: Semiconductor device
311: Circuit module
312: Mounting substrate
321: Circuit module
322: Mounting substrate
325: Control IC device
R1: First channel rate
R2: Second channel rate
RU: Channel utilization rate
X1: Semiconductor device

The invention claimed is:

1. A semiconductor device comprising:
a first transistor of an insulated gate type and a second transistor of an insulated gate type, the first and second transistors being connected in parallel with each other;
a charger-discharger; and
a gate voltage correction circuit,
wherein
the charger-discharger is configured to be capable of performing
first control in which the charger-discharger charges both of respective gates of the first and second transistors,
second control in which the charger-discharger discharges both of the respective gates of the first and second transistors, and
third control in which the charger-discharger discharges only one of the respective gates of the first and second transistors, and
the gate voltage correction circuit is configured to correct respective gate voltages of the first and second transistors, and protection operation in which the first and second transistors are forcibly kept off.

2. The semiconductor device according to claim 1, wherein the gate voltage correction circuit is configured to correct the respective gate voltages of the first and second transistors so as to eliminate the difference between the respective gate voltages of the first and second transistors in each of the first control, the second control, and the protection operation.

3. The semiconductor device according to claim 2, wherein the gate voltage correction circuit includes a first adjuster configured to adjust, in accordance with the difference between the respective gate voltages of the first and second transistors, distribution of currents that are made to flow into the gates of the first and second transistors respectively in the first control.

4. The semiconductor device according to claim 3, wherein the gate voltage correction circuit includes a second adjuster configured to adjust, in accordance with the difference between the respective gate voltages of the first and second transistors, distribution of currents that are drawn out from the gates of the first and second transistors respectively in the second control.

5. The semiconductor device according to claim 4, wherein the gate voltage correction circuit includes a third adjuster configured to adjust, in accordance with the difference between the respective gate voltages of the first and second transistors, distribution of currents that are drawn out from the gates of the first and second transistors respectively in the protection operation.

6. The semiconductor device according to claim 5, comprising a single adjuster configured to be shared as the second and third adjusters.

7. The semiconductor device according to claim 1, wherein the first and second transistors are each formed as a single split-gate device.

8. The semiconductor device according to claim 1, wherein a channel region of the first transistor is formed with a first channel ratio and a channel region of the second transistor is formed with a second channel ratio different from the first channel ratio.

9. The semiconductor device according to claim 1, wherein a channel utilization rate in active clamp operation is more than zero but less than a channel utilization rate in normal operation.

10. An electronic appliance comprising:
the semiconductor device according to claim 1; and
an inductive load connected to the semiconductor device.

* * * * *